US012520716B2

(12) United States Patent
Ryu et al.

(10) Patent No.: US 12,520,716 B2
(45) Date of Patent: Jan. 6, 2026

(54) ORGANIC LIGHT EMITTING DIODE AND ORGANIC LIGHT EMITTING DEVICE INCLUDING THE SAME

(71) Applicant: LG DISPLAY CO., LTD., Seoul (KR)

(72) Inventors: Dae Won Ryu, Paju-si (KR); In Bum Song, Paju-si (KR); Seung Hee Yoon, Paju-si (KR); Sang Beom Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1039 days.

(21) Appl. No.: 17/622,101

(22) PCT Filed: Dec. 23, 2020

(86) PCT No.: PCT/KR2020/018957

§ 371 (c)(1),
(2) Date: Dec. 22, 2021

(87) PCT Pub. No.: WO2021/137512

PCT Pub. Date: Jul. 8, 2021

(65) Prior Publication Data

US 2023/0301175 A1 Sep. 21, 2023

(30) Foreign Application Priority Data

Dec. 30, 2019 (KR) ........................ 10-2019-0178652

(51) Int. Cl.

| | |
|---|---|
| ***H01L 51/50*** | (2006.01) |
| ***C09K 11/06*** | (2006.01) |
| ***H10K 50/13*** | (2023.01) |
| ***H10K 59/35*** | (2023.01) |
| ***H10K 85/60*** | (2023.01) |
| *H10K 50/12* | (2023.01) |
| *H10K 50/18* | (2023.01) |

(52) U.S. Cl.

CPC ............ *H10K 85/622* (2023.02); *C09K 11/06* (2013.01); *H10K 50/13* (2023.02); *H10K 59/35* (2023.02); *H10K 85/626* (2023.02); *H10K 85/633* (2023.02); *H10K 85/636* (2023.02); *H10K 85/654* (2023.02); *H10K 85/6572* (2023.02); *C09K 2211/1018* (2013.01); *H10K 50/12* (2023.02); *H10K 50/18* (2023.02); *H10K 50/181* (2023.02); *H10K 85/624* (2023.02)

(58) Field of Classification Search

None

See application file for complete search history.

(56) References Cited

U.S. PATENT DOCUMENTS

| | | | | |
|---|---|---|---|---|
| 2005/0142379 | A1* | 6/2005 | Juni | H10K 59/879 428/323 |
| 2011/0037057 | A1* | 2/2011 | LeCloux | H01L 51/54 257/40 |
| 2016/0164042 | A1 | 6/2016 | Cho et al. | |
| 2016/0211457 | A1 | 7/2016 | Ito et al. | |
| 2016/0225993 | A1* | 8/2016 | Huh | C07D 403/10 |
| 2018/0007641 | A1 | 1/2018 | Vishwanathan et al. | |
| 2018/0301629 | A1 | 10/2018 | Hatakeyama et al. | |
| 2018/0351101 | A1* | 12/2018 | Suruga | H10K 85/633 |
| 2019/0305227 | A1 | 10/2019 | Yoon et al. | |
| 2021/0351370 | A1 | 11/2021 | Zhang et al. | |

FOREIGN PATENT DOCUMENTS

| | | | | |
|---|---|---|---|---|
| CN | 108475736 | A | 8/2018 | |
| CN | 109427985 | A | 3/2019 | |
| CN | 110317186 | A | 10/2019 | |
| JP | 2015-109428 | A | 6/2015 | |
| KR | 10-2016-0069468 | A | 6/2016 | |
| KR | 10-2016-0090444 | A | 8/2016 | |
| KR | 10-2017-0130434 | A | 11/2017 | |
| KR | 2019-1211355 | * | 4/2018 | H01L 51/50 |
| KR | 10-1978651 | B1 | 5/2019 | |
| KR | 10-2019-0121355 | A | 10/2019 | |

OTHER PUBLICATIONS

International Search Report dated Dec. 23, 2020, issued in International Patent Application No. PCT/KR2020/018957.

Partial Translation First Office Action Report dated Aug. 28, 2023, issued in China Patent Application No. 202080044147.4.

Office Action dated Sep. 11, 2024, issued in corresponding Korean Patent Application No. 10-2019-0178652.

* cited by examiner

*Primary Examiner* — Gregory D Clark

(74) *Attorney, Agent, or Firm* — Morgan, Lewis & Bockius LLP

(57) ABSTRACT

The present disclosure relates to an OLED that includes a first electrode; a second electrode facing the first electrode; a first emitting material layer including a first host being an anthracene derivative and a first dopant being a pyrene derivative and positioned between the first and second electrodes; and a first electron blocking layer including an electron blocking material of a spirofluorene-substituted amine derivative and positioned between the first electrode and the first emitting material layer, wherein at least one of hydrogen atoms in the anthracene derivative and the pyrene derivative is deuterated.

30 Claims, 7 Drawing Sheets

【Figure 1】
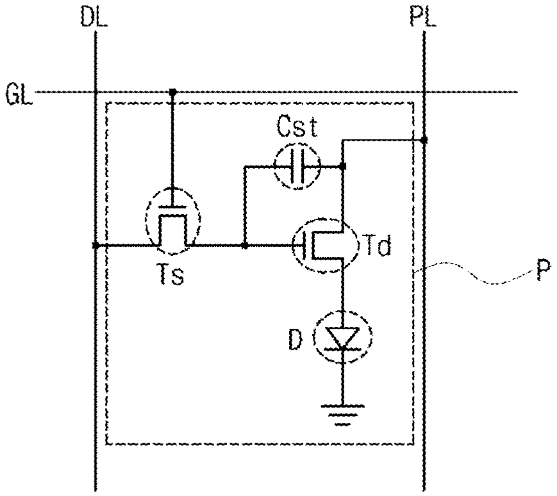

【Figure 2】
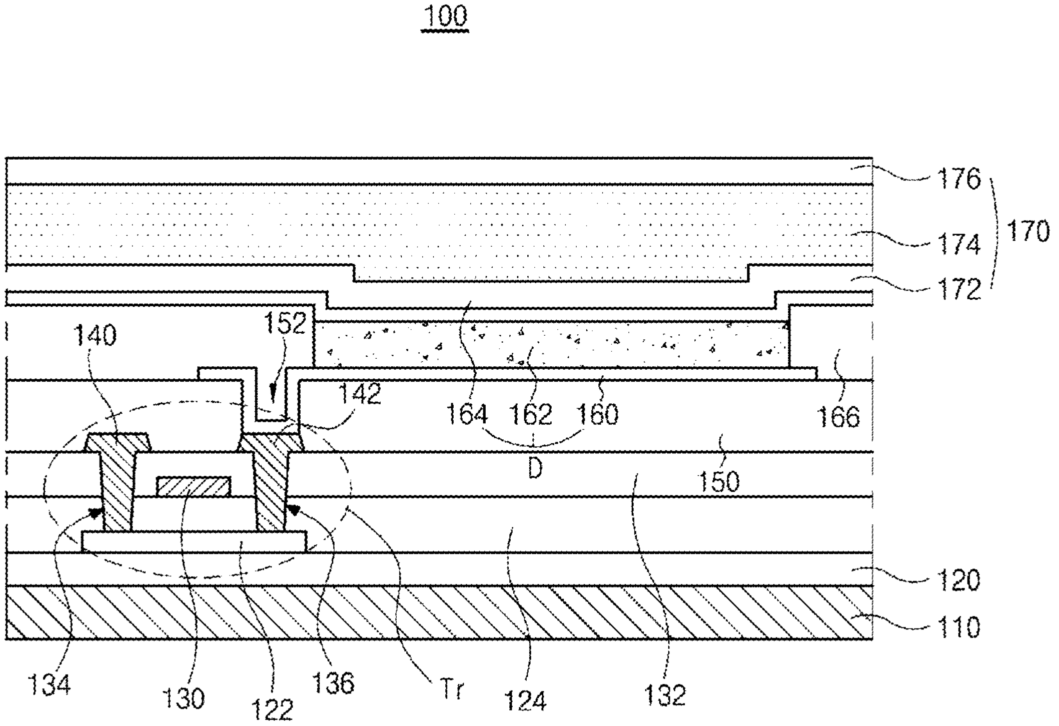

【Figure 3】
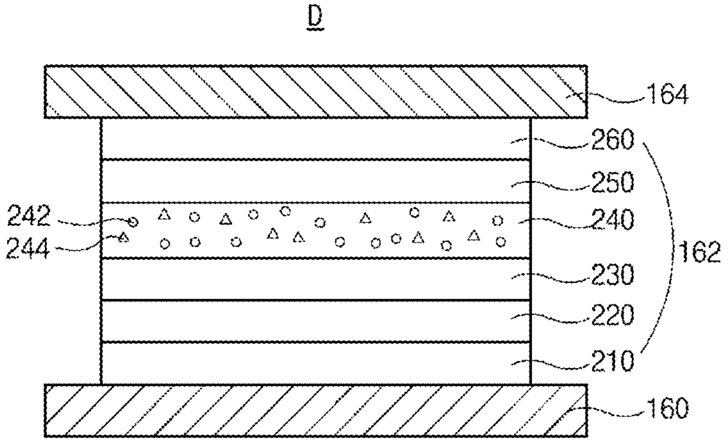

【Figure 4】
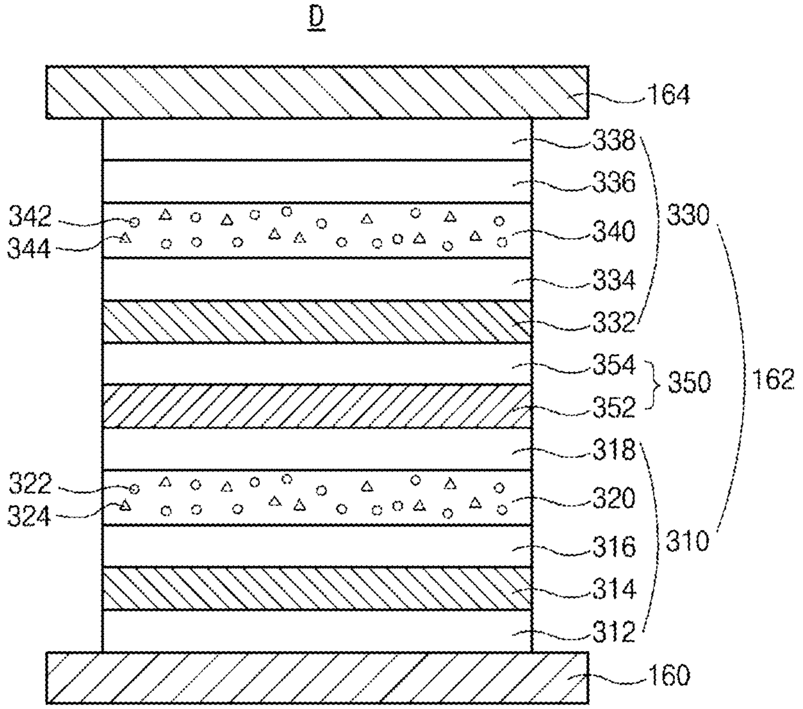

【Figure 5】
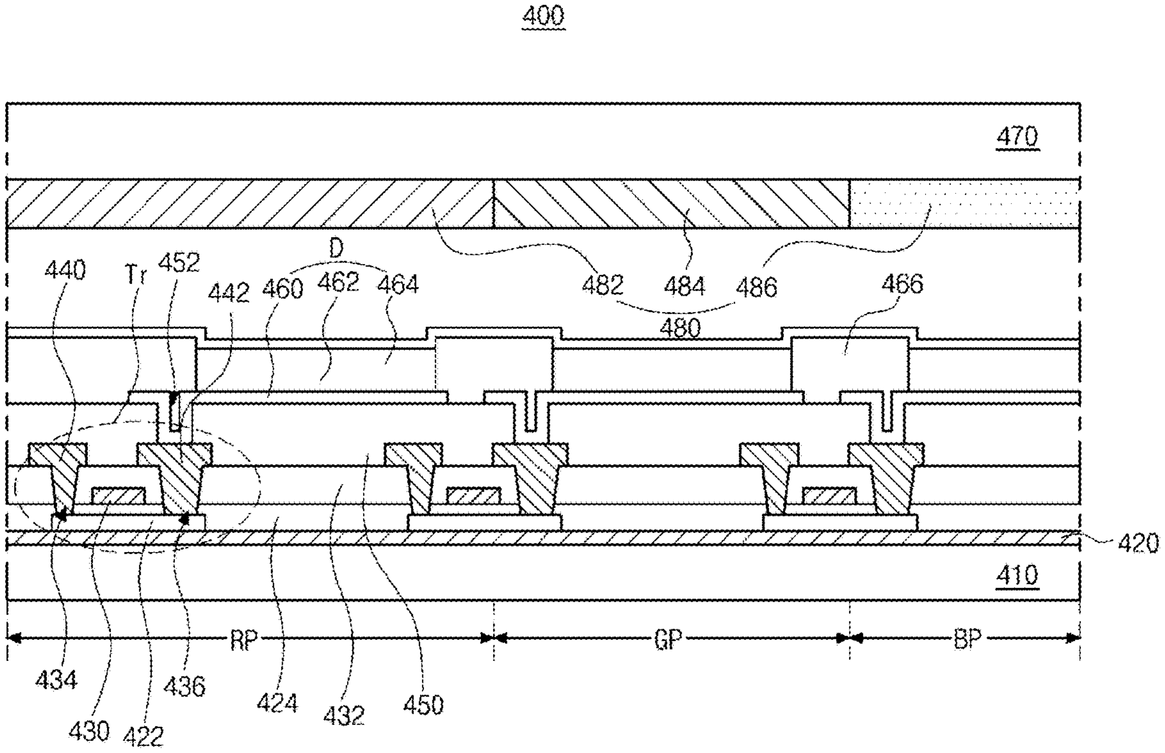

【Figure 6】
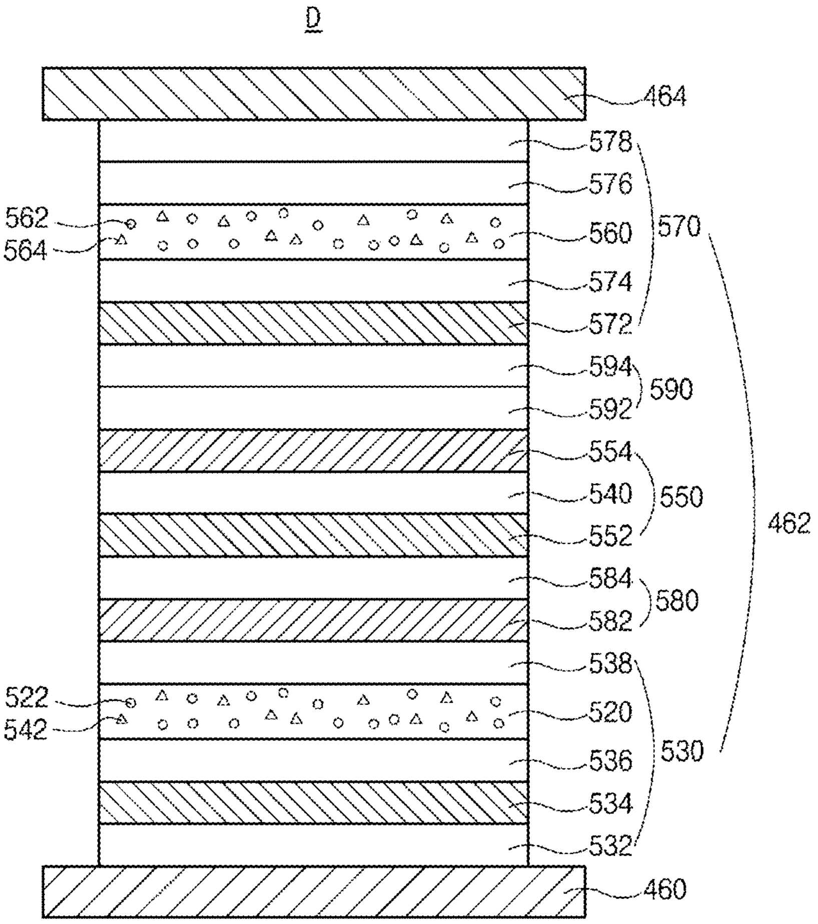

【Figure 7】
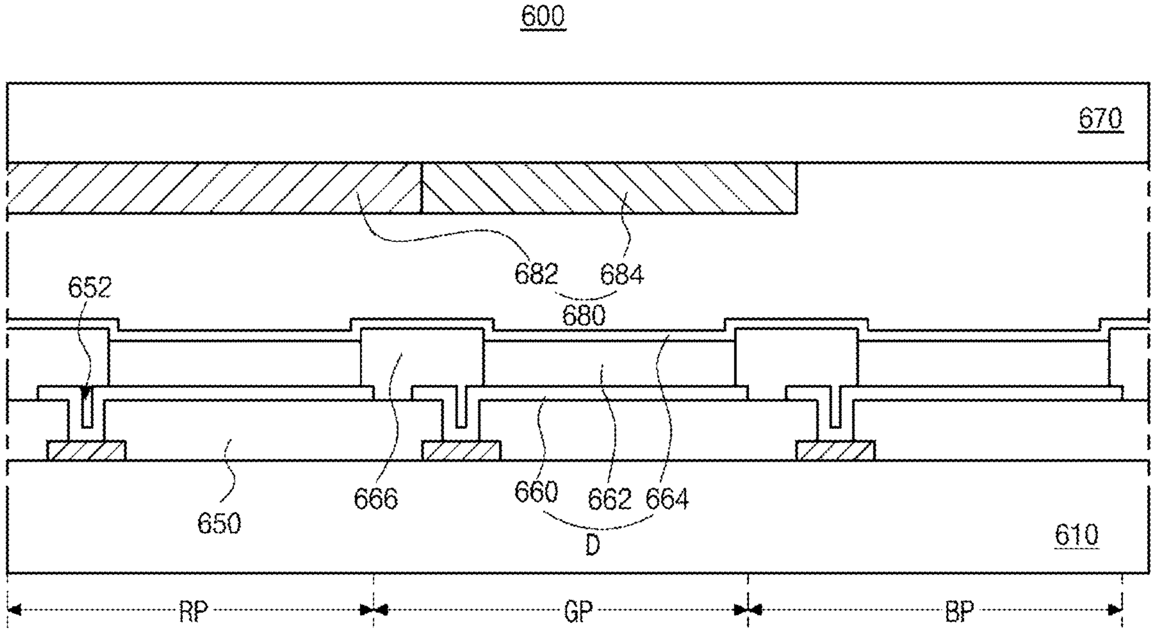

ORGANIC LIGHT EMITTING DIODE AND ORGANIC LIGHT EMITTING DEVICE INCLUDING THE SAME

TECHNICAL FIELD

The present disclosure relates to an organic light emitting diode (OLED), and more specifically, to an OLED having enhanced emitting efficiency and lifespan and an organic light emitting device including the same.

BACKGROUND ART

As requests for a flat panel display device having a small occupied area have been increased, an organic light emitting display device including an OLED has been research and development.

The OLED emits light by injecting electrons from a cathode as an electron injection electrode and holes from an anode as a hole injection electrode into an emitting material layer (EML), combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The OLED includes a first electrode as an anode over a substrate, a second electrode, which is spaced apart from and faces the first electrode, and an organic emitting layer therebetween.

For example, the organic light emitting display device may include a red pixel region, a green pixel region and a blue pixel region, and the OLED may be formed in each of the red, green and blue pixel regions.

However, the OLED in the blue pixel does not provide sufficient emitting efficiency and lifespan such that the organic light emitting display device has a limitation in the emitting efficiency and the lifespan.

DISCLOSURE

Technical Problem

Accordingly, the present disclosure is directed to an OLED and an organic light emitting device including the OLED that substantially obviate one or more of the problems due to the limitations and disadvantages of the related art.

An object of the present disclosure is to provide an OLED having enhanced emitting efficiency and lifespan and an organic light emitting device including the same.

Additional features and advantages of the disclosure will be set forth in the description which follows, and in part will be apparent from the description, or may be learned by practice of the disclosure. The objectives and other advantages of the disclosure will be realized and attained by the structure particularly pointed out in the written description and claims hereof as well as the appended drawings.

Technical Solution

According to an aspect, the present disclosure provides an OLED that includes a first electrode; a second electrode facing the first electrode; a first emitting material layer including a first host being an anthracene derivative and a first dopant being a pyrene derivative and positioned between the first and second electrodes; and a first electron blocking layer including an electron blocking material of a spirofluorene-substituted amine derivative and positioned between the first electrode and the first emitting material layer, wherein at least one of hydrogen atoms in the anthracene derivative and the pyrene derivative is deuterated.

As an example, all of the hydrogen atoms in at least one of the anthracene derivative and the pyrene derivative are deuterated.

As an example, at least one of an anthracene core of the anthracene derivative and a pyrene core of the pyrene derivative is deuterated.

The OLED may include a single emitting part or a tandem structure of a multiple emitting parts.

The tandem-structured OLED may emit blue color or white color light.

According to another aspect, the present disclosure provides an organic light emitting device comprising the OLED, as described above.

For example, the organic light emitting device may be an organic light emitting display device or a lightening device.

It is to be understood that both the foregoing general description and the following detailed description are examples and are explanatory and are intended to provide further explanation of the disclosure as claimed.

Advantageous Effects

An emitting material layer of an OLED of the present disclosure includes a host of an anthracene derivative and a dopant of a pyrene derivative, and at least one of the anthracene derivative and the pyrene derivative is deuterated. In addition, an electron blocking layer of the OLED of the present disclosure includes an electron blocking material being a spirofluorene-substituted amine derivative. As a result, an emitting efficiency and a lifespan of the OLED and an organic light emitting device including the OLED are improved.

Moreover, a hole blocking layer of the OLED includes at least one of an azine derivative and a benzimidazole derivative as a hole blocking material. Accordingly, the lifespan of the OLED and an organic light emitting device is further improved.

Further, since at least one of an anthracene core of the anthracene derivative and a pyrene core of the pyrene derivative is deuterated, an emitting efficiency and a lifespan of the OLED and an organic light emitting device including the OLED are improved with minimizing production cost increase.

DESCRIPTION OF DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

FIG. 1 is a schematic circuit diagram illustrating an organic light emitting display device of the present disclosure.

FIG. 2 is a schematic cross-sectional view illustrating an organic light emitting display device according to a first embodiment of the present disclosure.

FIG. 3 is a schematic cross-sectional view illustrating an OLED having a single emitting part for the organic light emitting display device according to the first embodiment of the present disclosure.

FIG. 4 is a schematic cross-sectional view illustrating an OLED having a tandem structure of two emitting parts according to the first embodiment of the present disclosure.

FIG. 5 is a schematic cross-sectional view illustrating an organic light emitting display device according to a second embodiment of the present disclosure.

FIG. 6 is a schematic cross-sectional view illustrating an OLED for the organic light emitting display device according to the second embodiment of the present disclosure.

FIG. 7 is a schematic cross-sectional view illustrating an organic light emitting display device according to a third embodiment of the present disclosure.

MODE FOR INVENTION

Reference will now be made in detail to aspects of the disclosure, examples of which are illustrated in the accompanying drawings.

FIG. 1 is a schematic circuit diagram illustrating an organic light emitting display device of the present disclosure.

As illustrated in FIG. 1, a gate line GL and a data line DL, which cross each other to define a pixel (pixel region) P, and a power line PL are formed in an organic light emitting display device. A switching thin film transistor (TFT) Ts, a driving TFT Td, a storage capacitor Cst and an OLED D are formed in the pixel region P. The pixel region P may include a red pixel, a green pixel and a blue pixel.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Td. The OLED D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

FIG. 2 is a schematic cross-sectional view illustrating an organic light emitting display device according to a first embodiment of the present disclosure.

As illustrated in FIG. 2, the organic light emitting display device 100 includes a substrate 110, a TFT Tr and an OLED D connected to the TFT Tr. For example, the organic light emitting display device 100 may include a red pixel, a green pixel and a blue pixel, and the OLED D may be formed in each of the red, green and blue pixels. Namely, the OLEDs D emitting red light, green light and blue light may be provided in the red, green and blue pixels, respectively.

The substrate 110 may be a glass substrate or a plastic substrate. For example, the substrate 110 may be a polyimide substrate.

A buffer layer 120 is formed on the substrate, and the TFT Tr is formed on the buffer layer 120. The buffer layer 120 may be omitted.

A semiconductor layer 122 is formed on the buffer layer 120. The semiconductor layer 122 may include an oxide semiconductor material or polycrystalline silicon.

When the semiconductor layer 122 includes the oxide semiconductor material, a light-shielding pattern (not shown) may be formed under the semiconductor layer 122. The light to the semiconductor layer 122 is shielded or blocked by the light-shielding pattern such that thermal degradation of the semiconductor layer 122 can be prevented. On the other hand, when the semiconductor layer 122 includes polycrystalline silicon, impurities may be doped into both sides of the semiconductor layer 122.

A gate insulating layer 124 is formed on the semiconductor layer 122. The gate insulating layer 124 may be formed of an inorganic insulating material such as silicon oxide or silicon nitride.

A gate electrode 130, which is formed of a conductive material, e.g., metal, is formed on the gate insulating layer 124 to correspond to a center of the semiconductor layer 122.

In FIG. 2, the gate insulating layer 124 is formed on an entire surface of the substrate 110. Alternatively, the gate insulating layer 124 may be patterned to have the same shape as the gate electrode 130.

An interlayer insulating layer 132, which is formed of an insulating material, is formed on the gate electrode 130. The interlayer insulating layer 132 may be formed of an inorganic insulating material, e.g., silicon oxide or silicon nitride, or an organic insulating material, e.g., benzocyclobutene or photo-acryl.

The interlayer insulating layer 132 includes first and second contact holes 134 and 136 exposing both sides of the semiconductor layer 122. The first and second contact holes 134 and 136 are positioned at both sides of the gate electrode 130 to be spaced apart from the gate electrode 130.

The first and second contact holes 134 and 136 are formed through the gate insulating layer 124. Alternatively, when the gate insulating layer 124 is patterned to have the same shape as the gate electrode 130, the first and second contact holes 134 and 136 is formed only through the interlayer insulating layer 132.

A source electrode 140 and a drain electrode 142, which are formed of a conductive material, e.g., metal, are formed on the interlayer insulating layer 132.

The source electrode 140 and the drain electrode 142 are spaced apart from each other with respect to the gate electrode 130 and respectively contact both sides of the semiconductor layer 122 through the first and second contact holes 134 and 136.

The semiconductor layer 122, the gate electrode 130, the source electrode 140 and the drain electrode 142 constitute the TFT Tr. The TFT Tr serves as a driving element. Namely, the TFT Tr may correspond to the driving TFT Td (of FIG. 1).

In the TFT Tr, the gate electrode 130, the source electrode 140, and the drain electrode 142 are positioned over the semiconductor layer 122. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 150, which includes a drain contact hole 152 exposing the drain electrode 142 of the TFT Tr, is formed to cover the TFT Tr.

A first electrode 160, which is connected to the drain electrode 142 of the TFT Tr through the drain contact hole 152, is separately formed in each pixel. The first electrode 160 may be an anode and may be formed of a conductive material having a relatively high work function. For example, the first electrode 160 may be formed of a transparent conductive material such as indium-tin-oxide (ITO) or indium-zinc-oxide (IZO).

When the OLED device 100 is operated in a top-emission type, a reflection electrode or a reflection layer may be formed under the first electrode 160. For example, the reflection electrode or the reflection layer may be formed of aluminum-palladium-copper (APC) alloy.

A bank layer 166 is formed on the passivation layer 150 to cover an edge of the first electrode 160. Namely, the bank layer 166 is positioned at a boundary of the pixel and exposes a center of the first electrode 160 in the pixel.

An organic emitting layer 162 is formed on the first electrode 160. The organic emitting layer 162 may have a single-layered structure of an emitting material layer including an emitting material. To increase an emitting efficiency of the OLED D and/or the organic light emitting display device 100, the organic emitting layer 162 may have a multi-layered structure.

The organic emitting layer 162 is separated in each of the red, green and blue pixels. As illustrated below, the organic emitting layer 162 in the blue pixel includes a host of an anthracene derivative and a dopant of a pyrene derivative, and at least one of the anthracene derivative and the pyrene derivative is deuterated. As a result, the emitting efficiency and the lifespan of the OLED D in the blue pixel are improved.

A second electrode 164 is formed over the substrate 110 where the organic emitting layer 162 is formed. The second electrode 164 covers an entire surface of the display area and may be formed of a conductive material having a relatively low work function to serve as a cathode. For example, the second electrode 164 may be formed of aluminum (Al), magnesium (Mg), silver (Ag), Al—Mg alloy (AlMg) or Mg—Ag alloy (MgAg).

The first electrode 160, the organic emitting layer 162 and the second electrode 164 constitute the OLED D.

An encapsulation film 170 is formed on the second electrode 164 to prevent penetration of moisture into the OLED D. The encapsulation film 170 includes a first inorganic insulating layer 172, an organic insulating layer 174 and a second inorganic insulating layer 176 sequentially stacked, but it is not limited thereto. The encapsulation film 170 may be omitted.

A polarization plate (not shown) for reducing an ambient light reflection may be disposed over the top-emission type OLED D. For example, the polarization plate may be a circular polarization plate.

In addition, a cover window (not shown) may be attached to the encapsulation film 170 or the polarization plate. In this instance, the substrate 110 and the cover window have a flexible property such that a flexible display device may be provided.

FIG. 3 is a schematic cross-sectional view illustrating an OLED having a single emitting part for the organic light emitting display device according to the first embodiment of the present disclosure.

As illustrated in FIG. 3, the OLED D includes the first and second electrodes 160 and 164, which face each other, and the organic emitting layer 162 therebetween. The organic emitting layer 162 includes an emitting material layer (EML) 240 between the first and second electrodes 160 and 164.

The first electrode 160 may be formed of a conductive material having a relatively high work function to serve as an anode. The second electrode 164 may be formed of a conductive material having a relatively low work function to serve as a cathode. One of the first and second electrodes 160 and 164 is a transparent electrode (or a semi-transparent electrode), and the other one of the first and second electrodes 160 and 164 is a reflective electrode.

The organic emitting layer 162 may further include an electron blocking layer (EBL) 230 between the first electrode 160 and the EML 240 and a hole blocking layer (HBL) 250 between the EML 240 and the second electrode 164.

In addition, the organic emitting layer 162 may further include a hole transporting layer (HTL) 220 between the first electrode 160 and the EBL 230.

Moreover, the organic emitting layer 162 may further include a hole injection layer (HIL) 210 between the first electrode 160 and the HTL 220 and an electron injection layer (EIL) 260 between the second electrode 164 and the HBL 250.

In the OLED D of the present disclosure, the HBL 250 may include a hole blocking material of an azine derivative and/or a benzimidazole derivative. The hole blocking material has an electron transporting property such that an electron transporting layer may be omitted. The HBL 250 directly contacts the EIL 260. Alternatively, the HBL may directly contact the second electrode without the EIL 260. However, an electron transporting layer may be formed between the HBL 250 and the EIL 260.

The organic emitting layer 162, e.g., the EML 240, includes the host 242 of an anthracene derivative, the dopant 244 of a pyrene derivative and provides blue emission. In this case, at least one of the anthracene derivative 242 and the pyrene derivative 244 is deuterated.

The anthracene derivative as the host 242 may be represented by Formula 1:

Formula 1

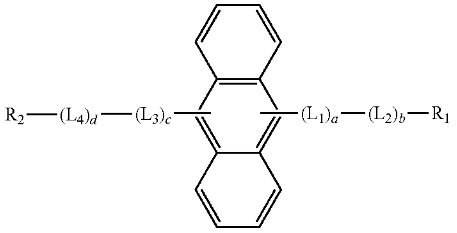

In Formula 1, each of $R_1$ and $R_2$ is independently $C_6$~$C_{30}$ aryl group or $C_5$~$C_{30}$ heteroaryl group, each of $L_1$, $L_2$, $L_3$ and $L_4$ is independently $C_6$~$C_{30}$ arylene group, and each of a, b, c and d is an integer of 0 or 1. Hydrogens in the anthracene derivative of Formula 1 are non-deuterated, partially deuterated or wholly deuterated.

For example, each of $R_1$ and $R_2$ may be selected from the group consisting of phenyl, naphthyl, dimethylfluorenyl, dibenzofuranyl, dibenzothiophenyl, phenanthrenyl, and carbazolyl. The dimethylfluorenyl, dibenzofuranyl, dibenzothiophenyl, phenanthrenyl, and carbazolyl may be substituted by $C_6$~$C_{30}$ aryl group, e.g., phenyl or naphthyl. Each of $L_1$, $L_2$, $L_3$ and $L_4$ may be phenylene or naphthylene, and at least one of a, b, c and d may be 0.

The pyrene derivative as the dopant 244 may be represented by Formula 2:

Formula 2

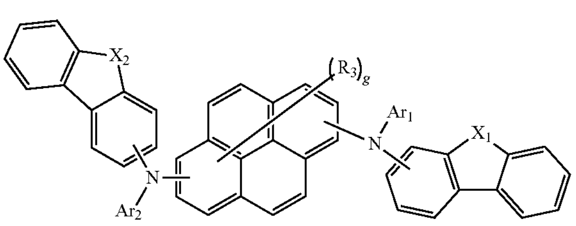

In Formula 2, each of $X_1$ and $X_2$ is independently O or S, each of $Ar_1$ and $Ar_2$ is independently $C_6$~$C_{30}$ aryl group or $C_5$~$C_{30}$ heteroaryl group, and $R_3$ is $C_1$~$C_{10}$ alkyl group or $C_1$~$C_{10}$ cycloalkyl group. In addition, g is an integer of 0 to 2. Hydrogens in the pyrene derivative of Formula 2 is non-deuterated, partially deuterated or wholly deuterated.

The EML 240 includes the anthracene derivative as the host 242 and the pyrene derivative as the dopant 244, and at least one hydrogen atom in the anthracene derivative and the pyrene derivative is substituted by a deuterium atom. Namely, at least one of the anthracene derivative and the pyrene derivative is deuterated.

In the EML 240, when the anthracene derivative as the host 242 is deuterated (e.g., "deuterated anthracene derivative"), the hydrogen atoms in the pyrene derivative as the dopant 244 may be non-deuterated (e.g., "non-deuterated pyrene derivative"), a part of the hydrogen atoms in the pyrene derivative as the dopant 244 may be deuterated (e.g., "partially-deuterated pyrene derivative"), or all of the hydrogen atoms in the pyrene derivative as the dopant 244 may be deuterated (e.g., "wholly-deuterated pyrene derivative"). On the other hand, when the pyrene derivative as the dopant 244 is deuterated (e.g., "deuterated pyrene derivative"), the hydrogen atoms in the anthracene derivative as the host 242 may be non-deuterated (e.g., "non-deuterated anthracene derivative"), a part of the hydrogen atoms in the anthracene derivative as the host 242 may be deuterated (e.g., "partially-deuterated anthracene derivative"), or all of the hydrogen atoms in the anthracene derivative as the host 242 may be deuterated (e.g., "wholly-deuterated anthracene derivative").

At least one of the anthracene derivative as the host 242 and the pyrene derivative as the dopant 244 may be wholly deuterated.

For example, when the anthracene derivative as the host 242 is wholly deuterated (e.g., "wholly-deuterated anthracene derivative"), the hydrogen atoms in the pyrene derivative as the dopant 244 may be non-deuterated (e.g., "non-deuterated pyrene derivative"), a part of the hydrogen atoms in the pyrene derivative as the dopant 244 may be deuterated (e.g., "partially-deuterated pyrene derivative"), or all of the hydrogen atoms in the pyrene derivative as the dopant 244 may be deuterated (e.g., "wholly-deuterated pyrene derivative"). On the other hand, when the pyrene derivative as the dopant 244 is wholly deuterated (e.g., "wholly-deuterated pyrene derivative"), the hydrogen atoms in the anthracene derivative as the host 242 may be non-deuterated (e.g., "non-deuterated anthracene derivative"), a part of the hydrogen atoms in the anthracene derivative as the host 242 may be deuterated (e.g., "partially-deuterated anthracene derivative"), or all of the hydrogen atoms in the anthracene derivative as the host 242 may be deuterated (e.g., "wholly-deuterated anthracene derivative").

As a result, the emitting efficiency and the lifespan of the OLED D are significantly increased.

At least one of an anthracene core of the host 242 and a pyrene core of the dopant 244 may be deuterated.

For example, when the anthracene core of the host 242 is deuterated (e.g., "core-deuterated anthracene derivative"), the dopant 244 may be non-deuterated (e.g., "non-deuterated pyrene derivative") or all of the pyrene core and a substituent of the dopant 244 may be deuterated (e.g., "wholly-deuterated pyrene derivative"). Alternatively, the pyrene core of the dopant 244 except the substituent may be deuterated (e.g., "core-deuterated pyrene derivative"), or the substituent of the dopant 244 except the pyrene core may be deuterated (e.g., "substituent-deuterated pyrene derivative").

On the other hand, in the EML 240, when the pyrene core of the dopant 244 is deuterated (e.g., "core-deuterated pyrene derivative"), the host 242 may be non-deuterated (e.g., "non-deuterated anthracene derivative") or all of the anthracene core and a substituent of the host 242 may be deuterated (e.g., "wholly-deuterated anthracene derivative"). Alternatively, the anthracene core of the host 242 except the substituent may be deuterated (e.g., "core-deuterated anthracene derivative"), or the substituent of the host 242 except the anthracene core may be deuterated (e.g., "substituent-deuterated anthracene derivative").

The anthracene derivative as the host 242, in which the anthracene core is deuterated, may be represented by Formula 3:

Formula 3

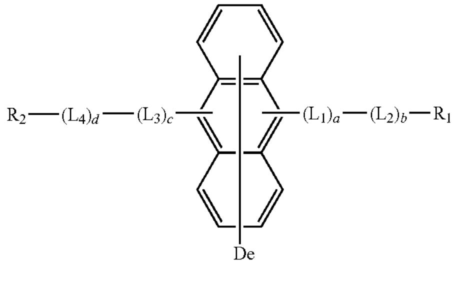

In Formula 3, each of $R_1$ and $R_2$ is independently $C_6$~$C_{30}$ aryl group or $C_5$~$C_{30}$ heteroaryl group, and each of $L_1$, $L_2$, $L_3$ and $L_4$ is independently $C_6$~$C_{30}$ arylene group, each of a, b, c and d is an integer of 0 or 1, and e is an integer of 1 to 8.

Namely, in the core-deuterated anthracene derivative as the host 242, the anthracene moiety as the core is substituted by deuterium (D), and the substituent except the anthracene moiety is not deuterated.

For example, each of $R_1$ and $R_2$ may be selected from the group consisting of phenyl, naphthyl, dimethylfluorenyl, dibenzofuranyl, dibenzothiophenyl, phenanthrenyl, and carbazolyl. The dimethylfluorenyl, dibenzofuranyl, dibenzothiophenyl, phenanthrenyl, and carbazolyl may be substituted by $C_6$~$C_{30}$ aryl group, e.g., phenyl or naphthyl. Each of $L_1$, $L_2$, $L_3$ and $L_4$ may be phenylene or naphthylene. At least one of a, b, c and d may be 0, and e may be 8.

In an exemplary embodiment, the host 242 may be a compound being one of the followings in Formula 4.

Formula 4

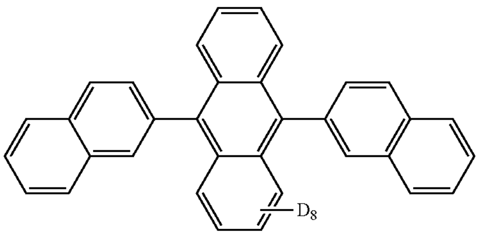

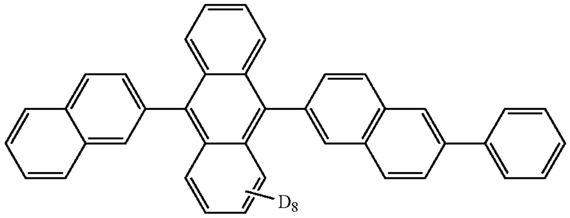

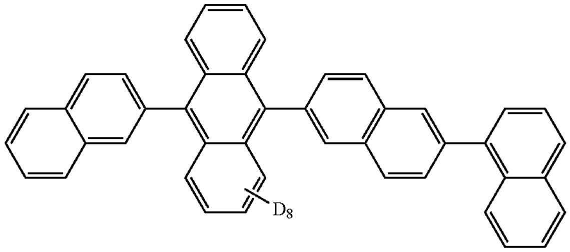

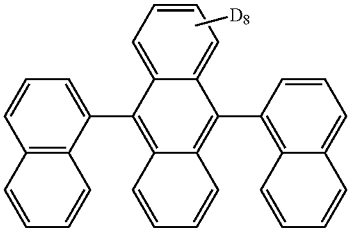

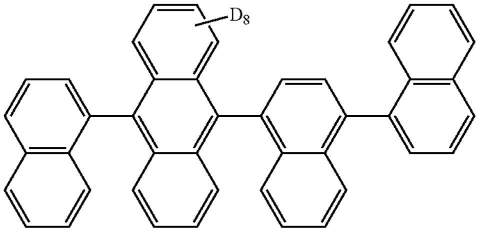

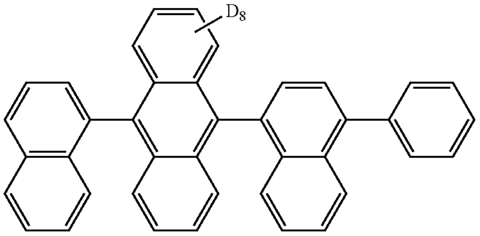

-continued

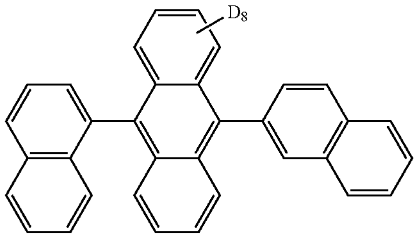

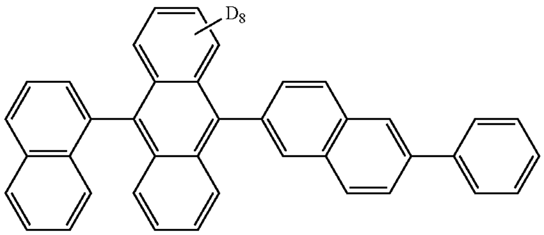

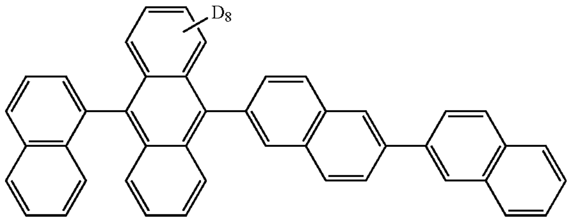

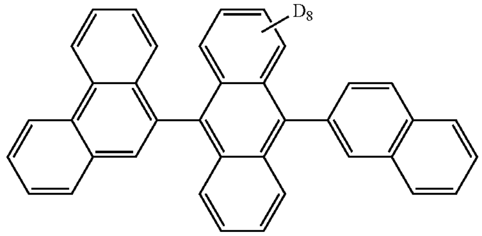

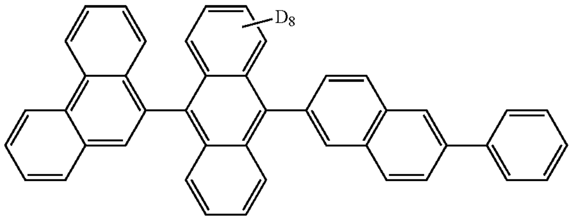

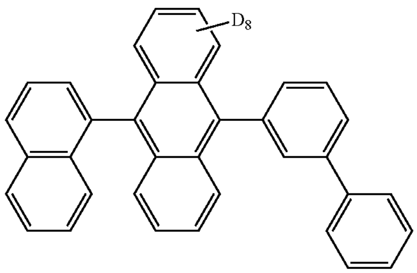

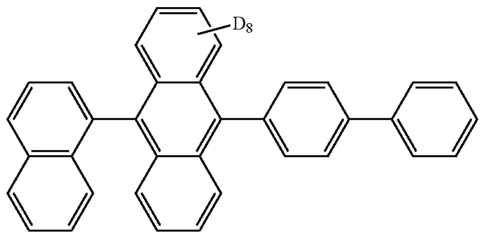

-continued
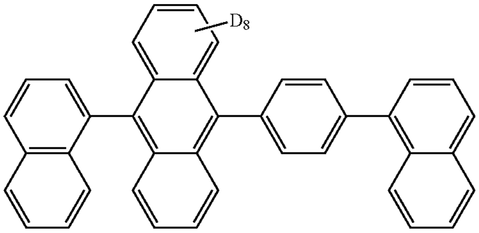
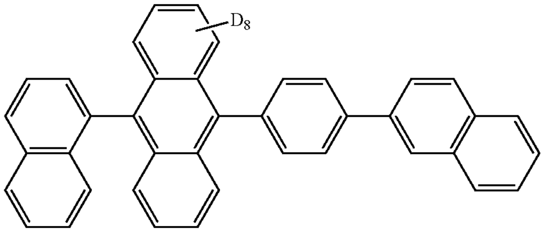
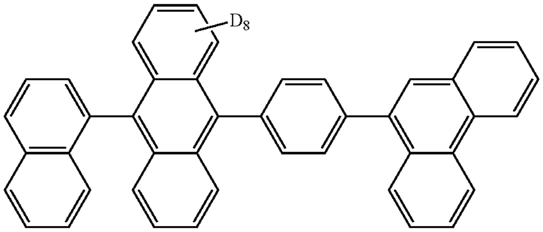
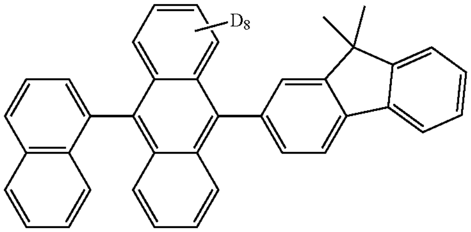
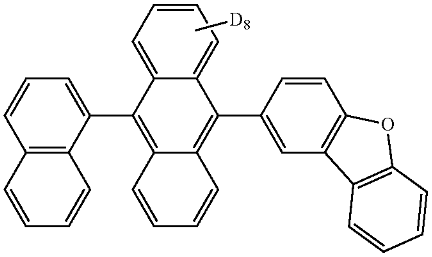
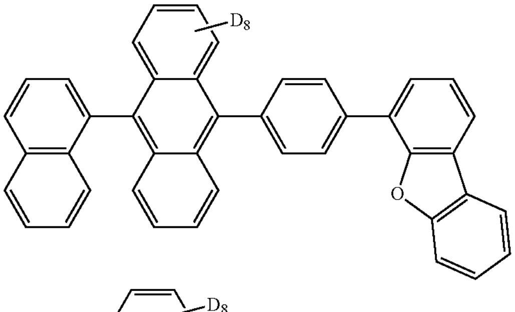
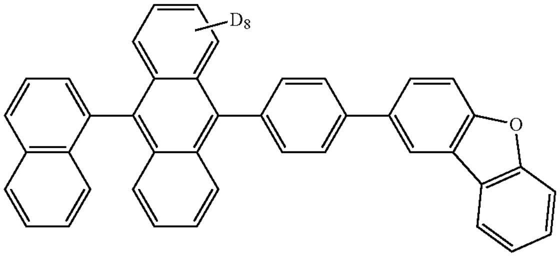
-continued
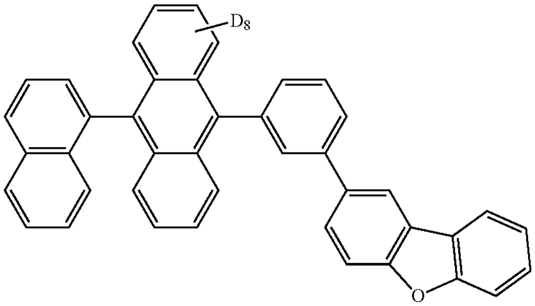
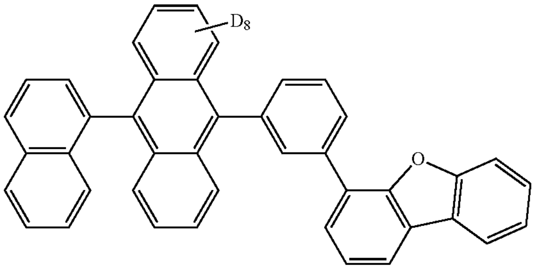
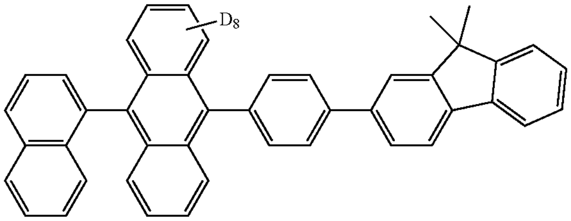
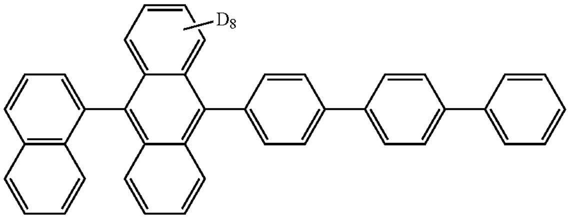
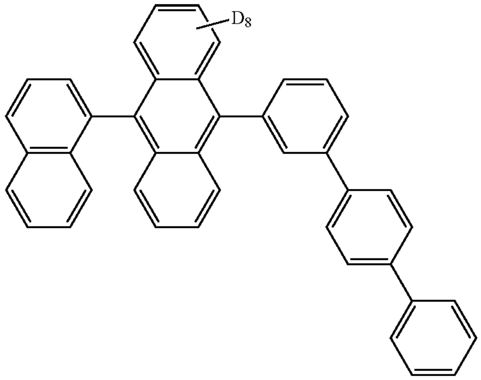
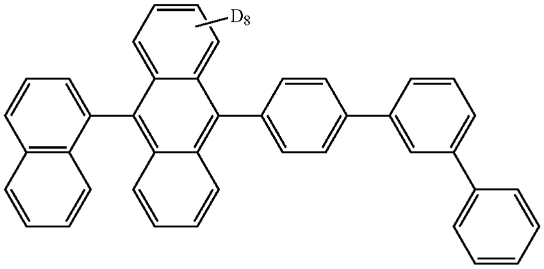

-continued
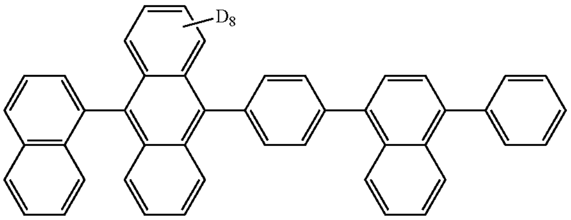
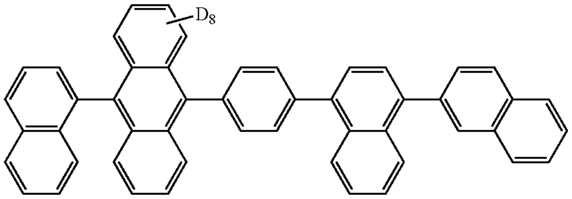
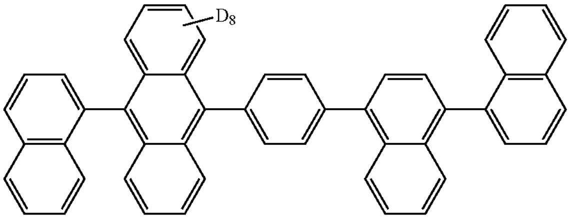
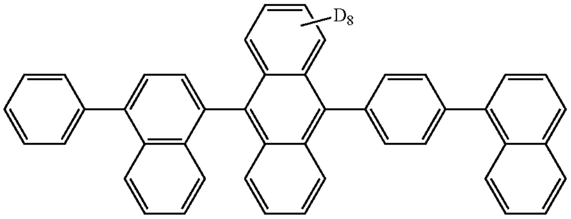
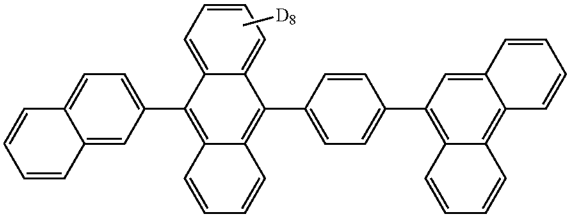
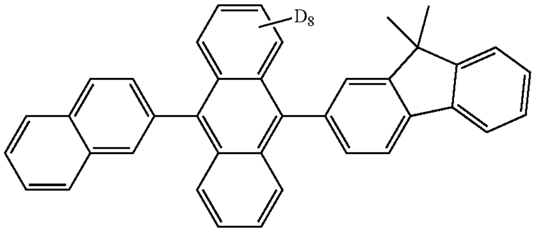
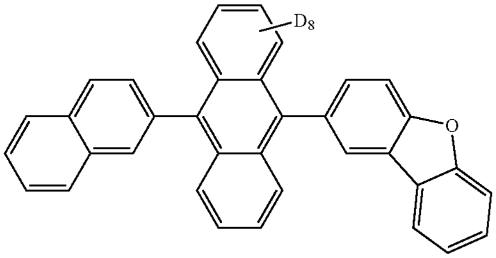
-continued
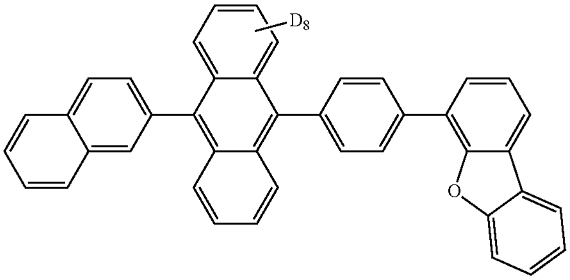
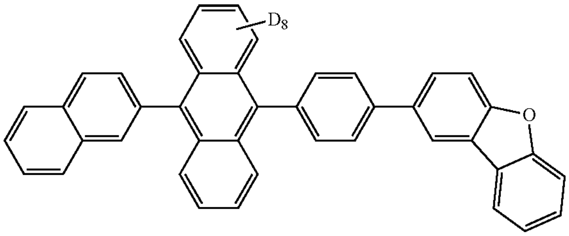
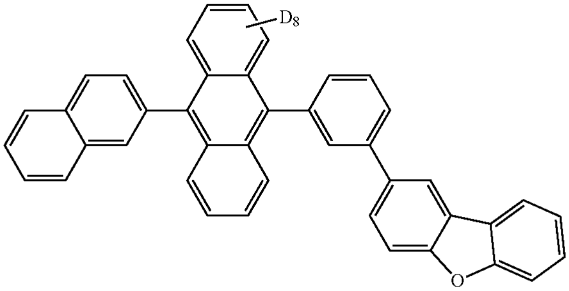
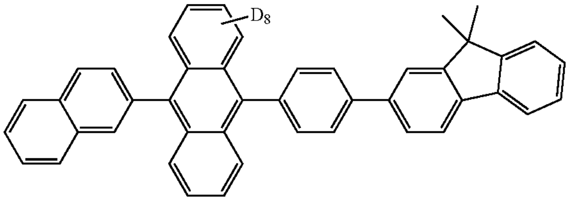
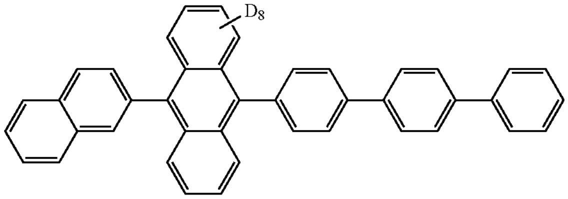
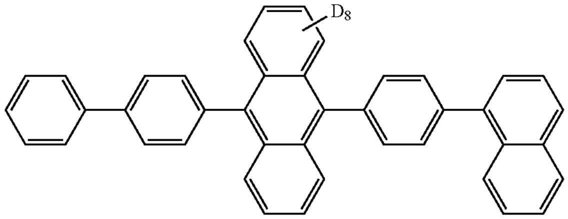
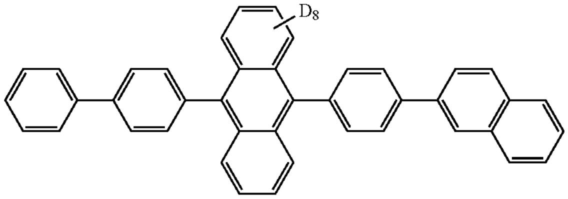

-continued
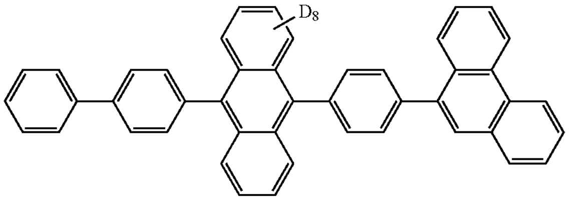
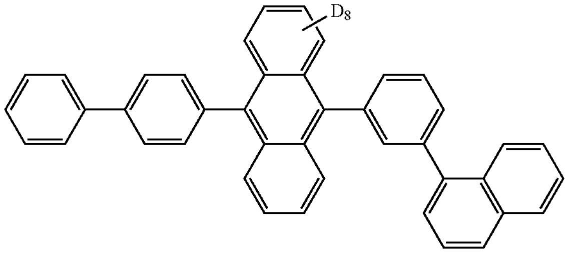
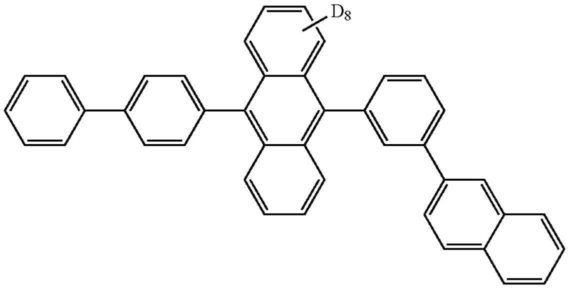
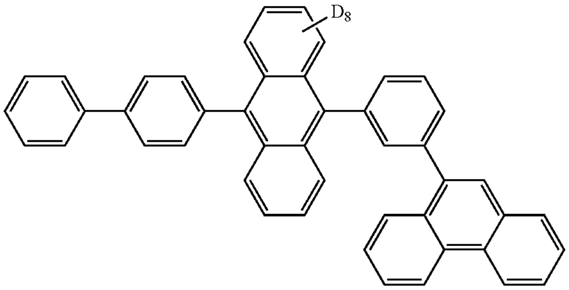
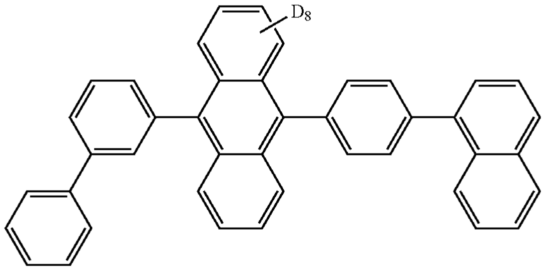
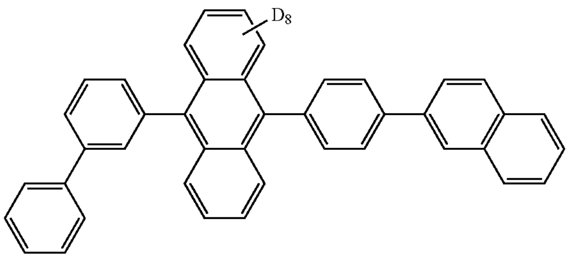
-continued
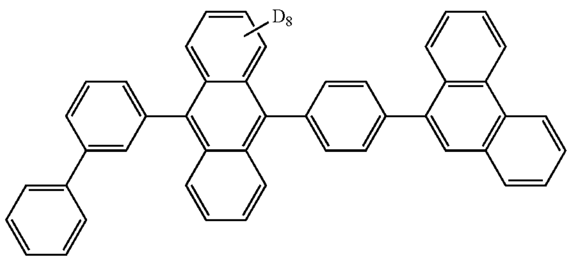
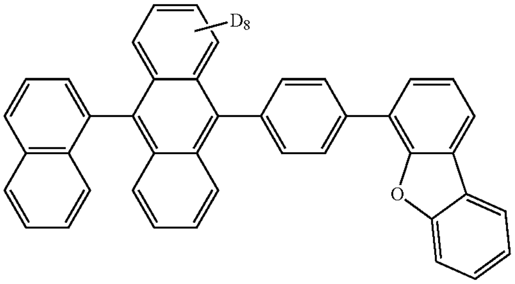
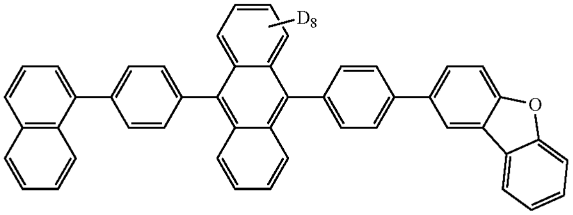
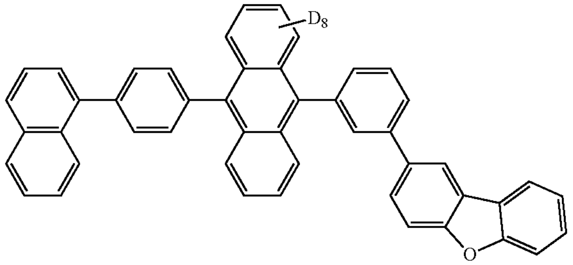
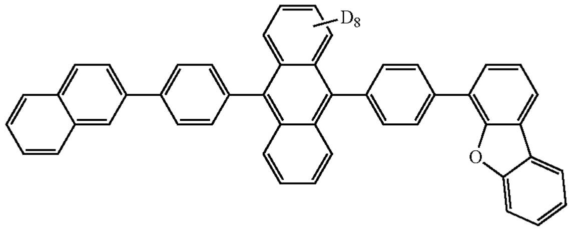
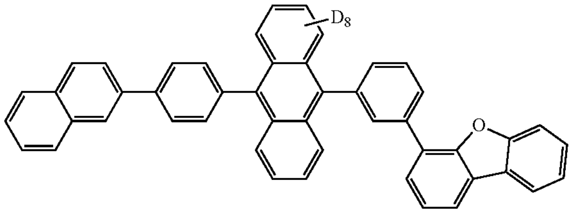
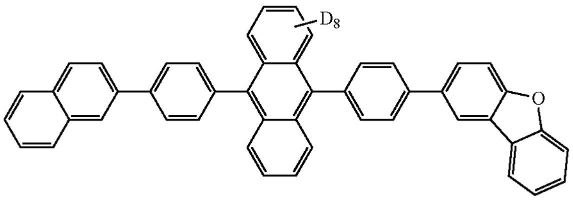

-continued
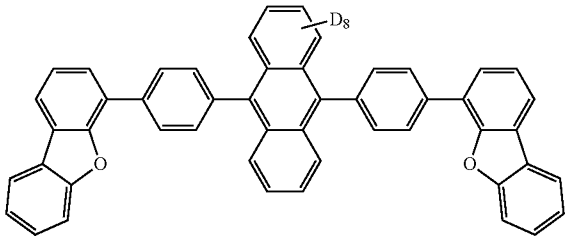
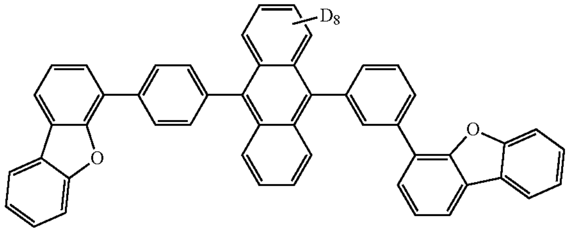
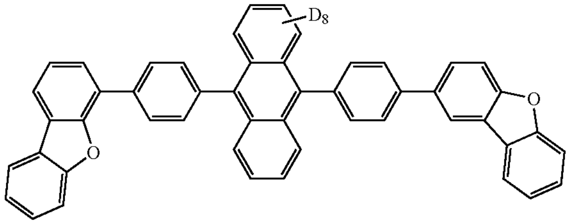
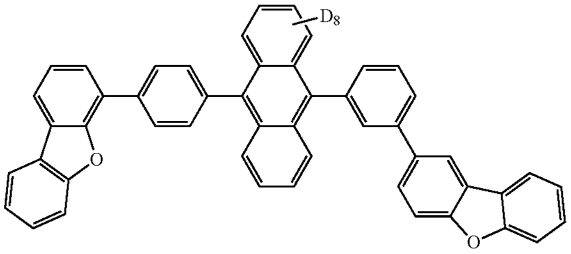
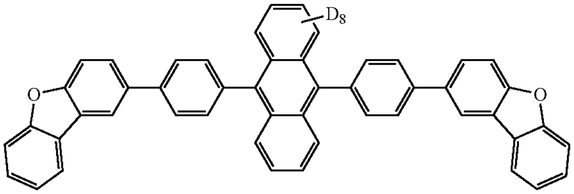
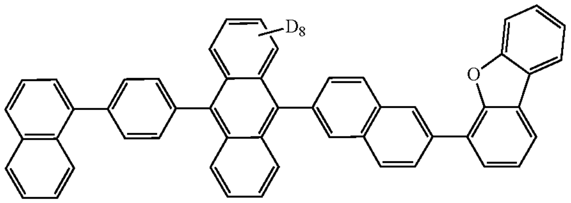
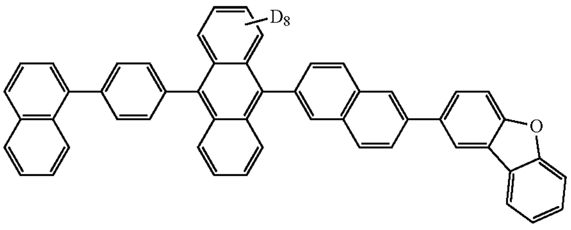
-continued
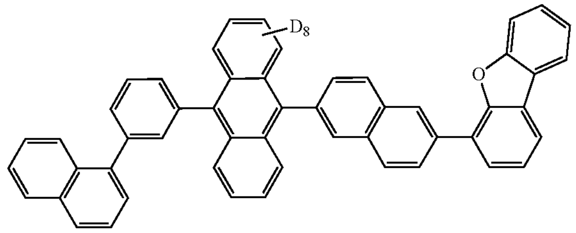
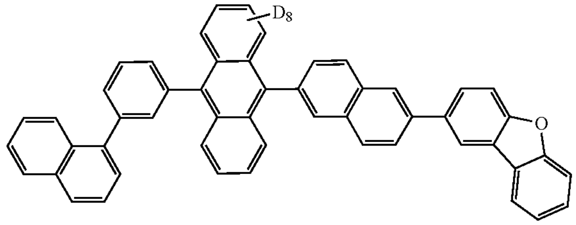
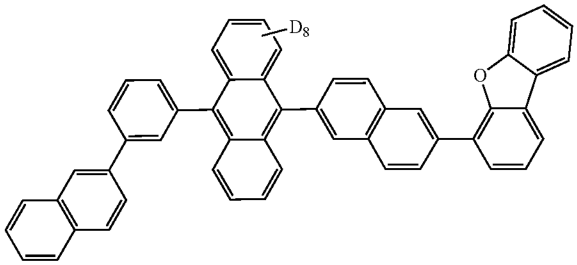
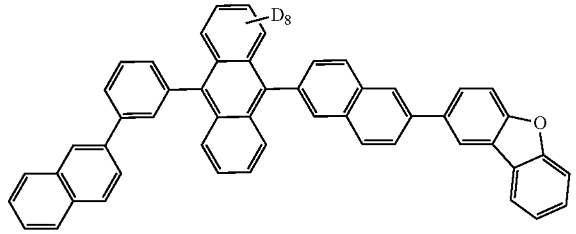
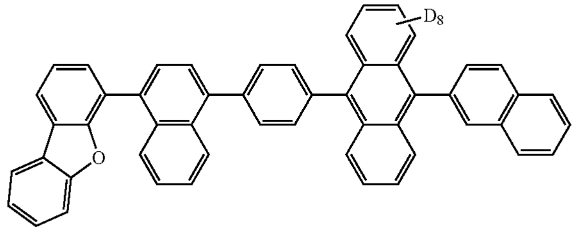
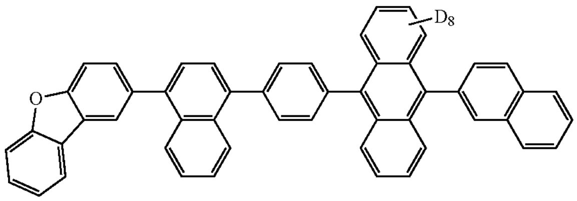
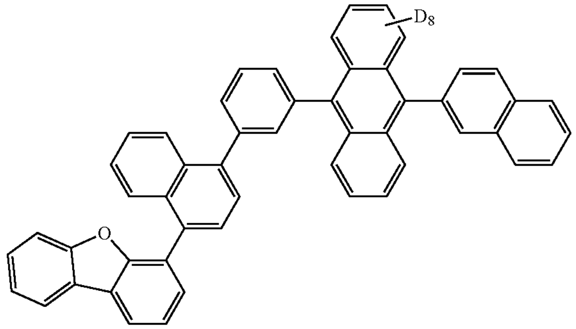

-continued
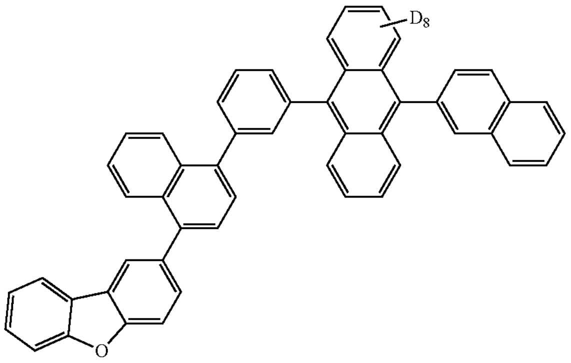
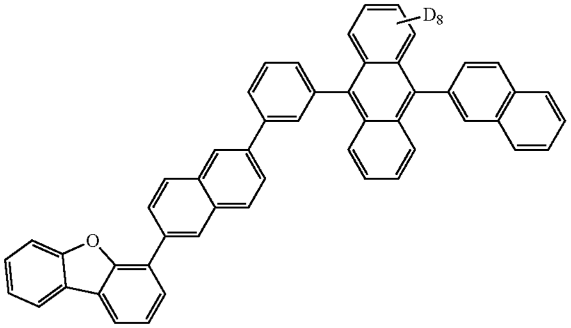
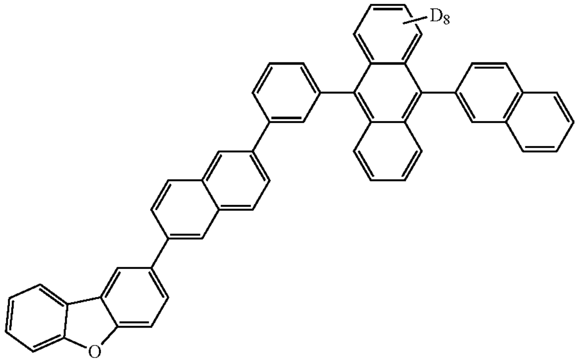
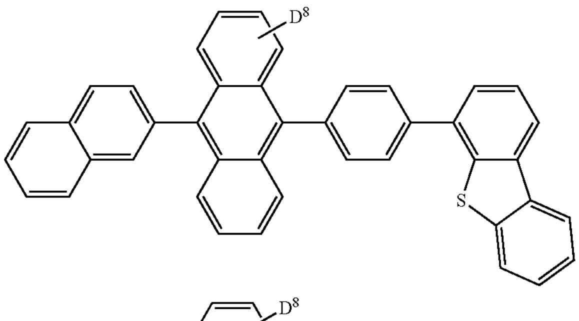
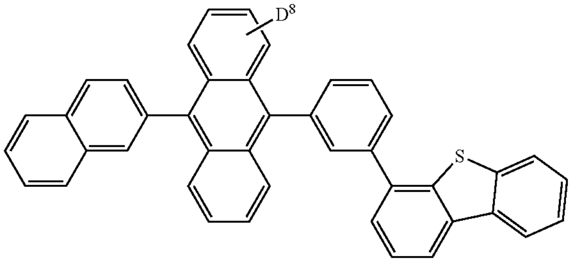
-continued
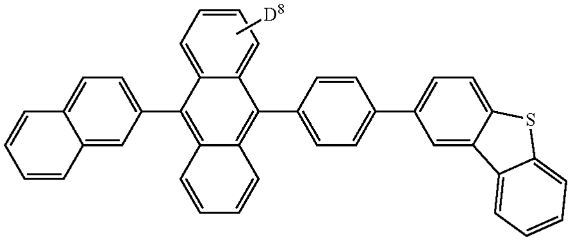
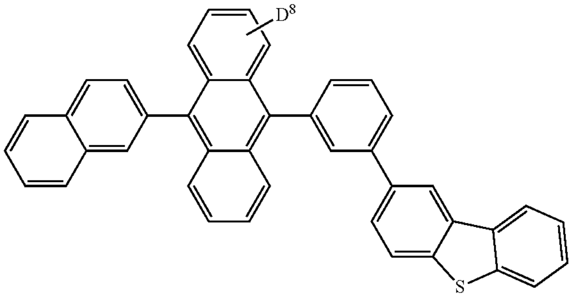
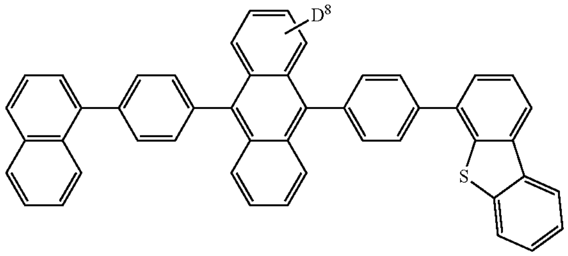
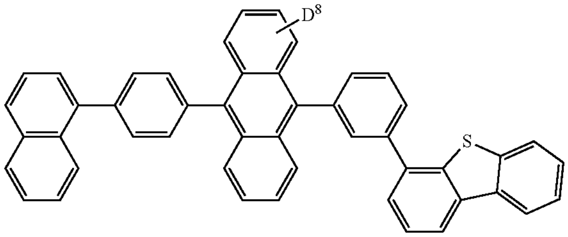
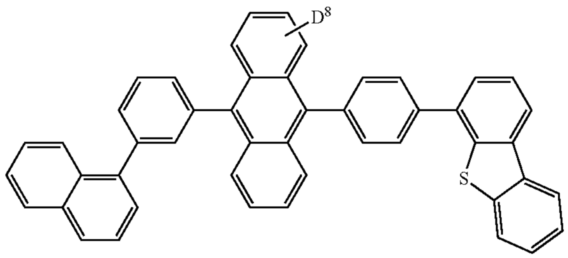
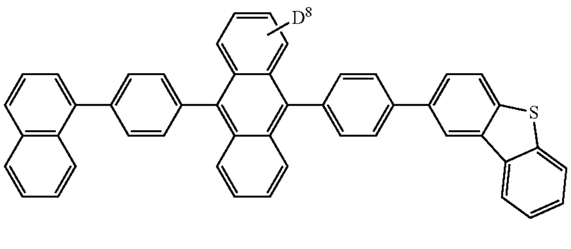

-continued
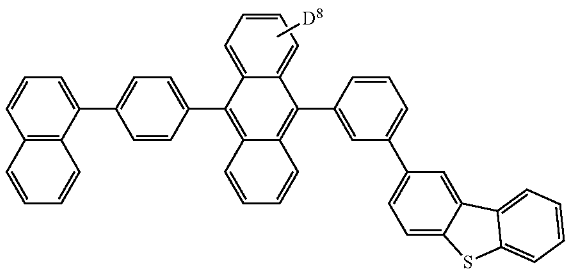
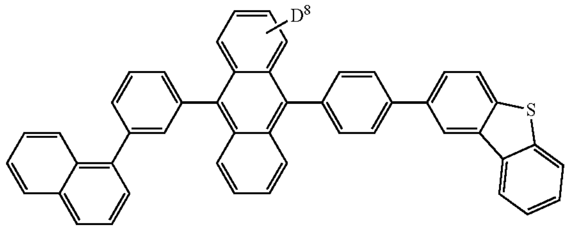
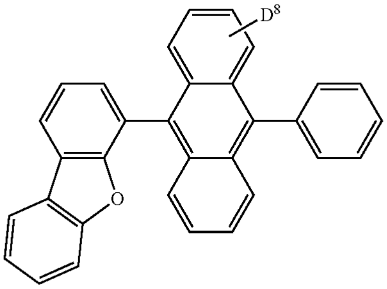
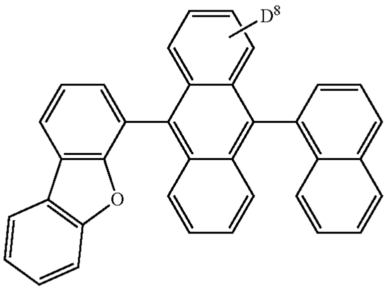
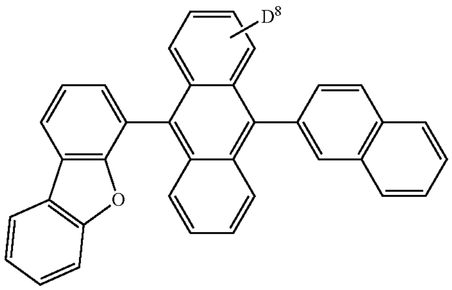
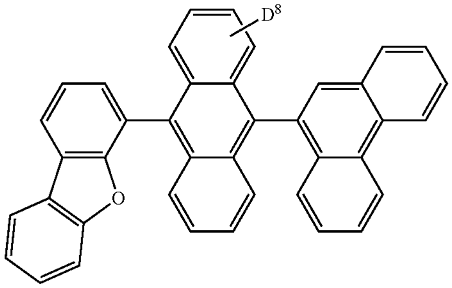
-continued
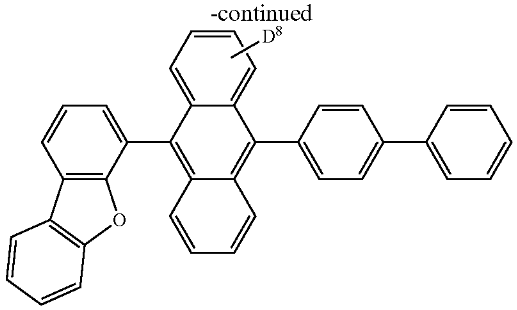
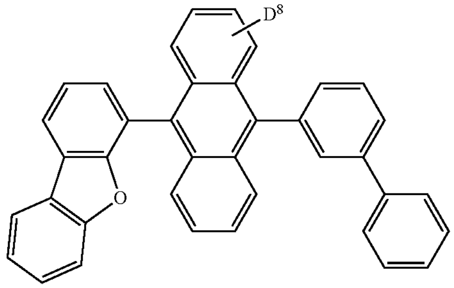
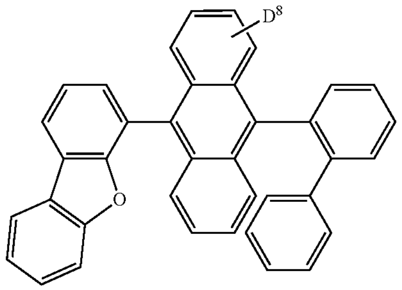
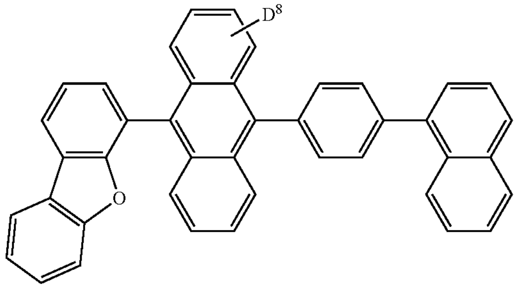
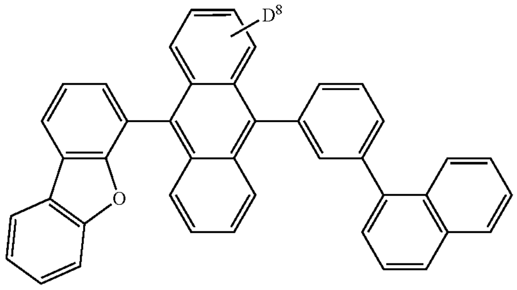
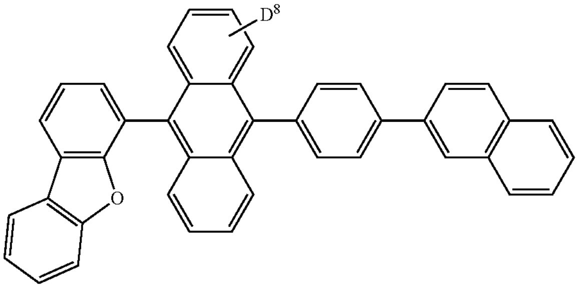

-continued
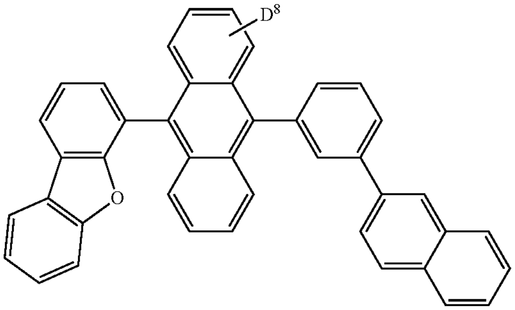
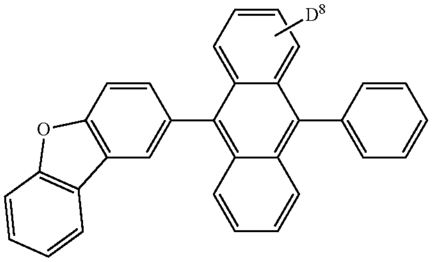
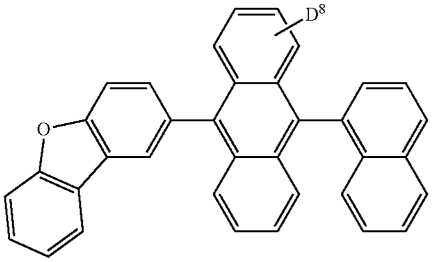
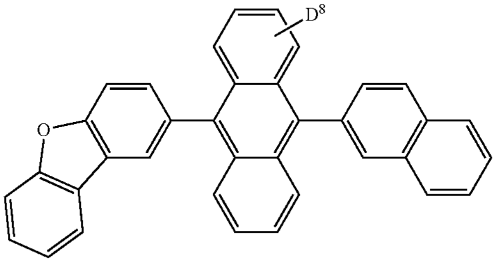
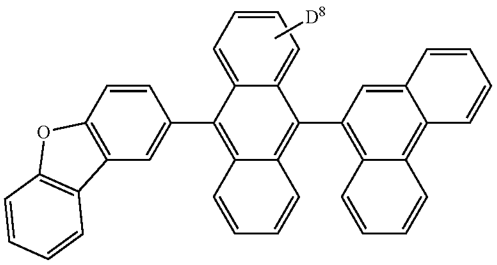
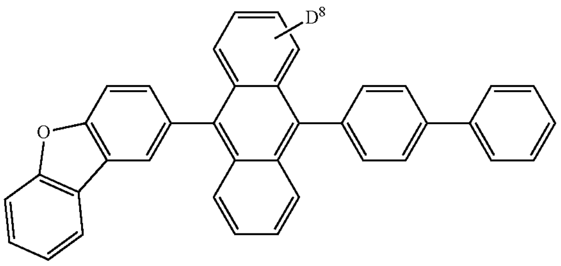
-continued
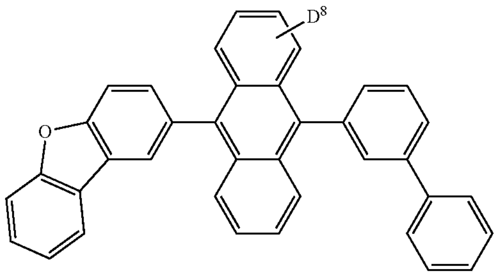
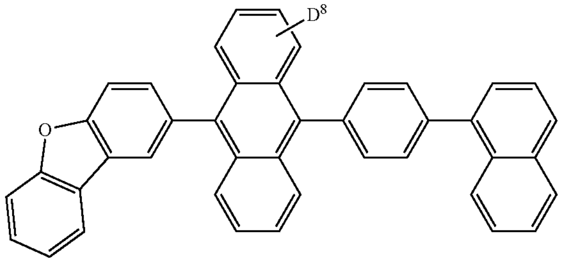
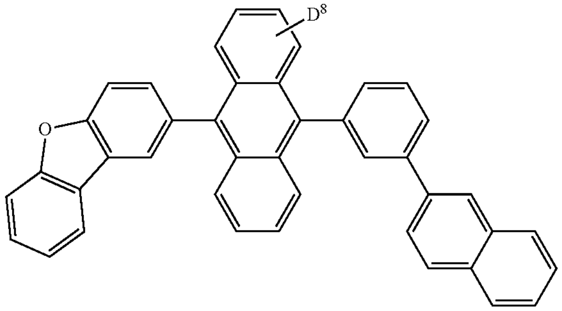
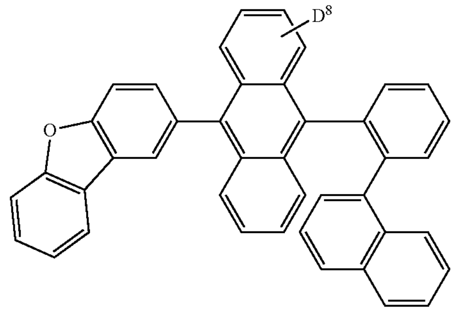
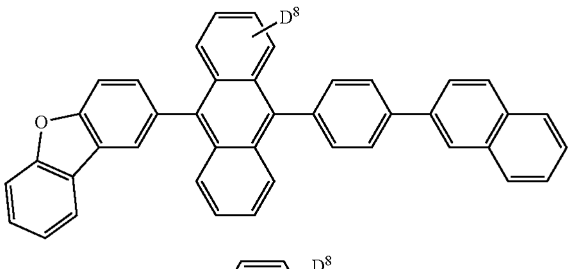
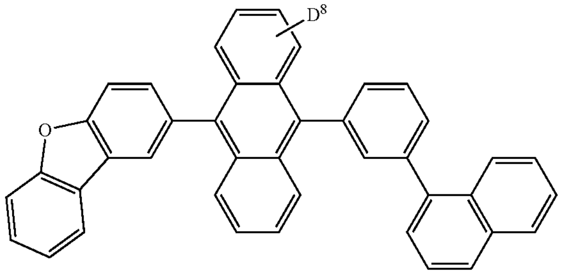

-continued
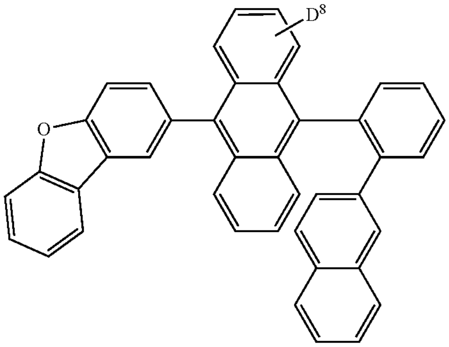
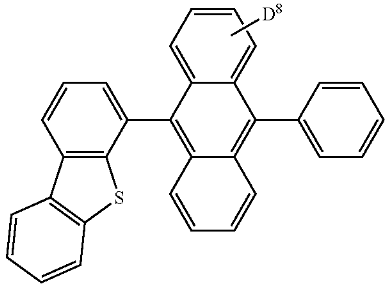
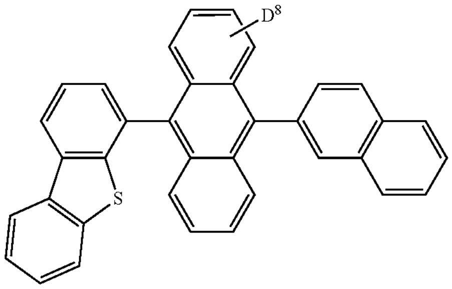
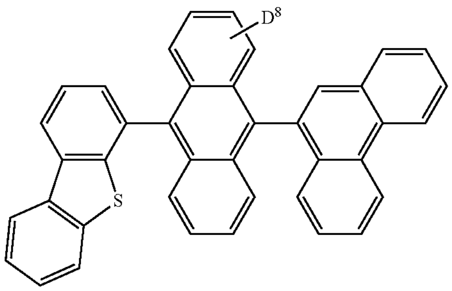
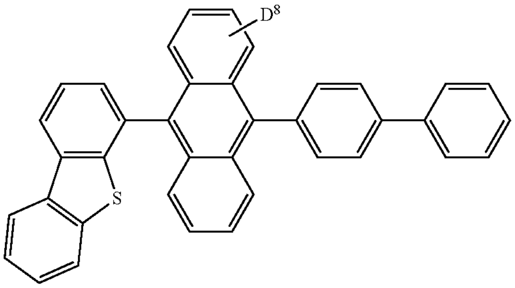
-continued
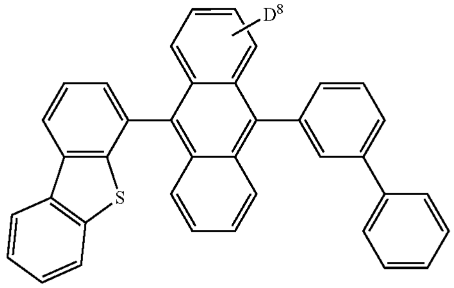
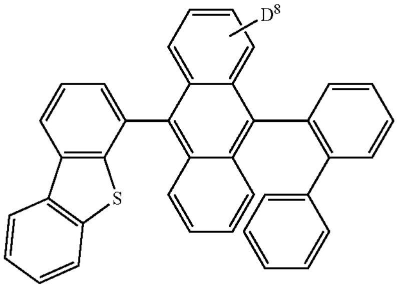
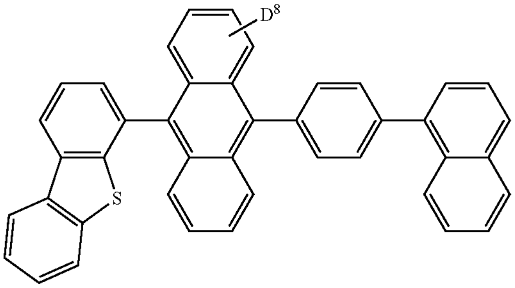
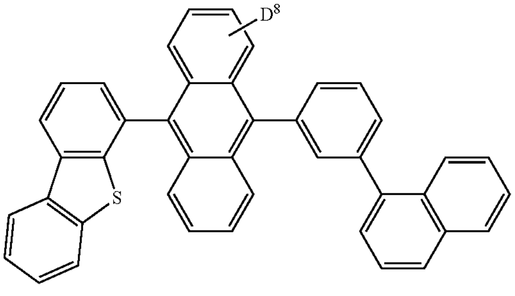
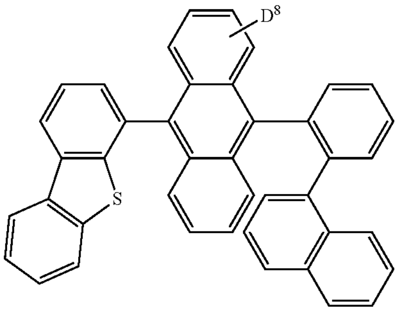

-continued
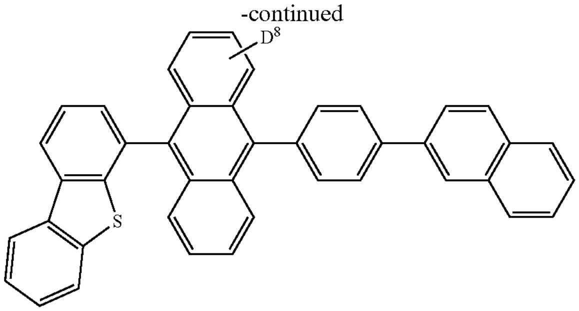
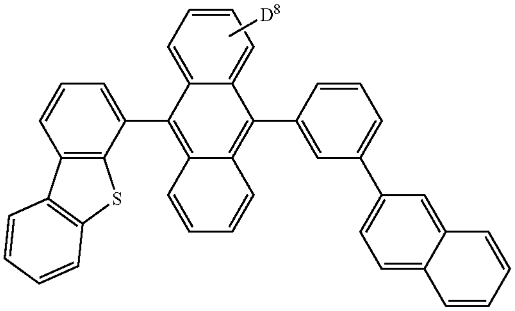
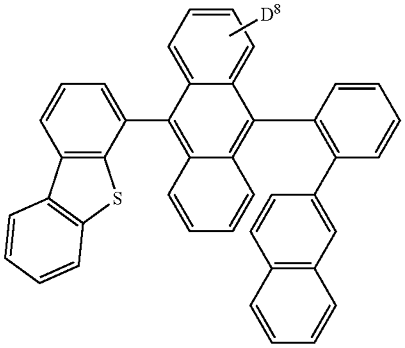
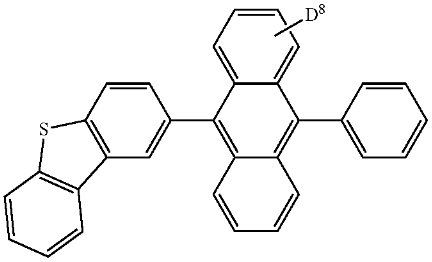
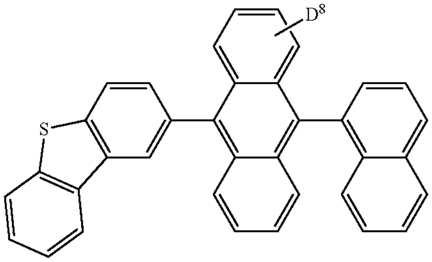
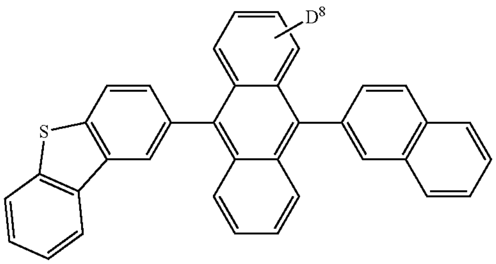
-continued
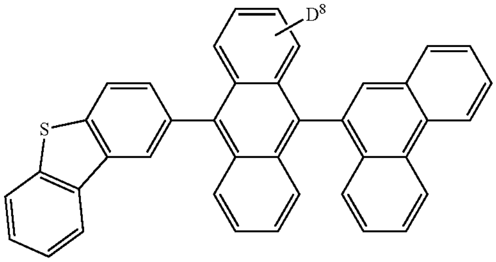
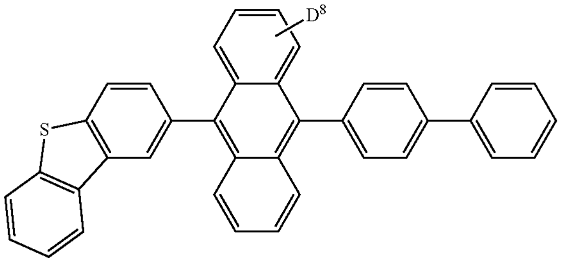
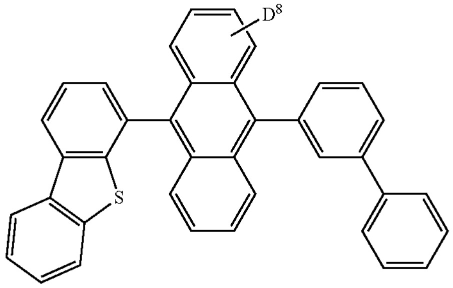
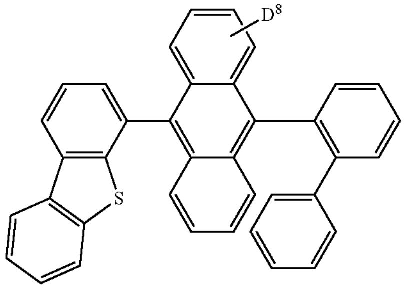
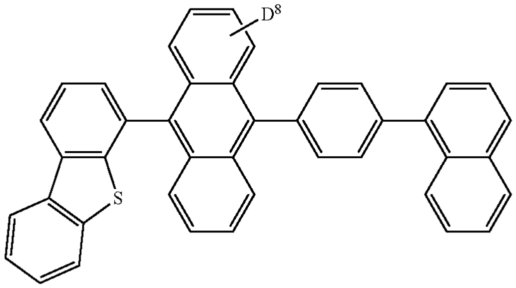
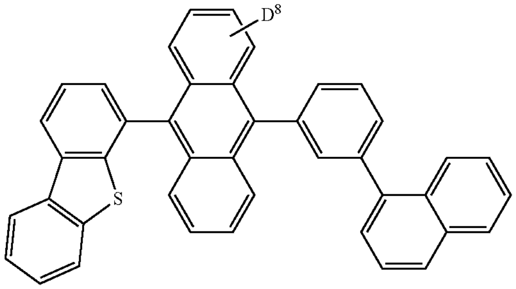

-continued
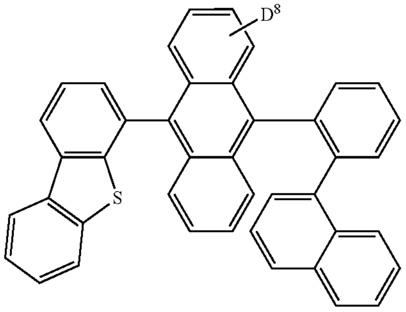
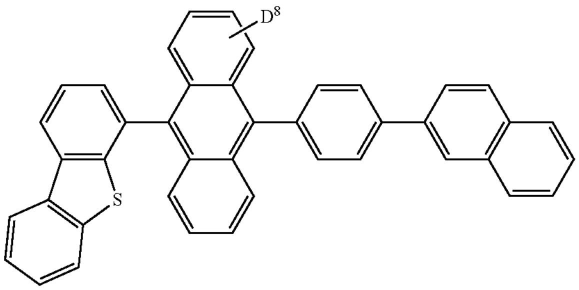
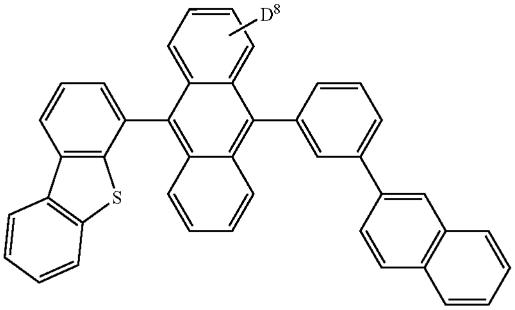
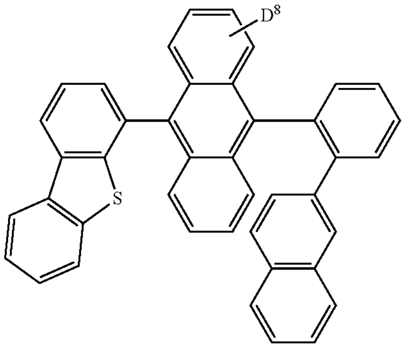
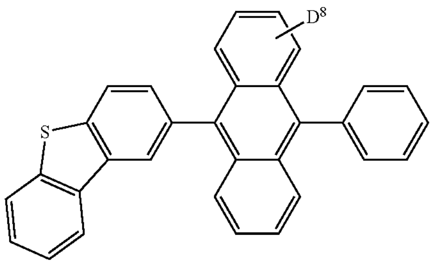
-continued
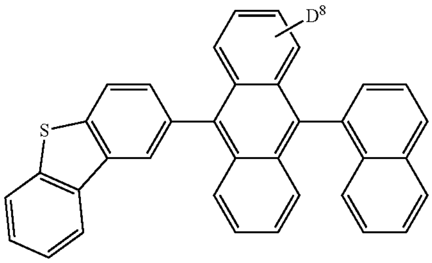
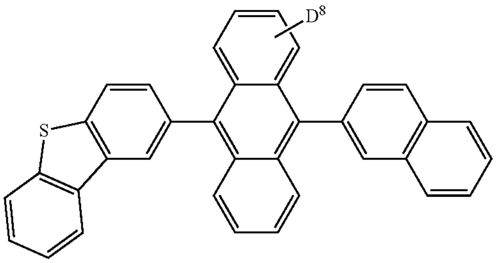
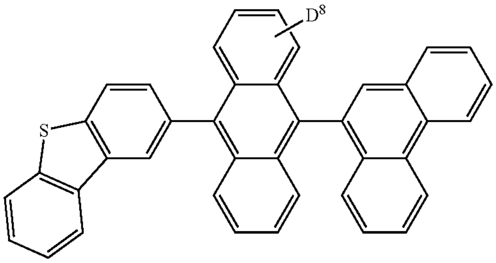
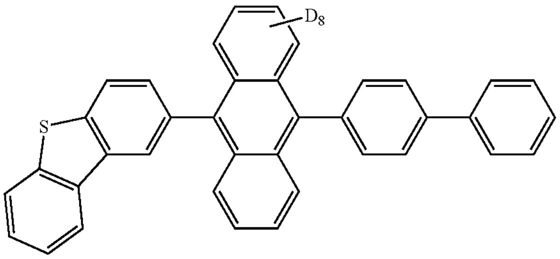
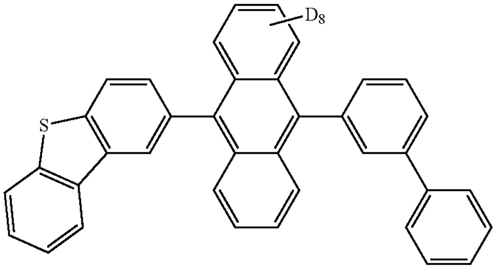
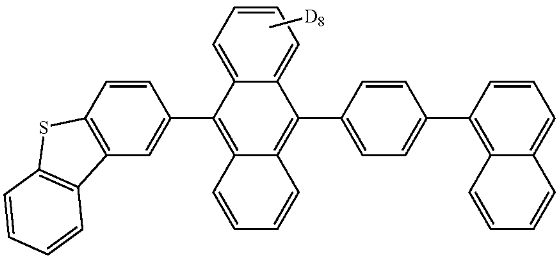

-continued
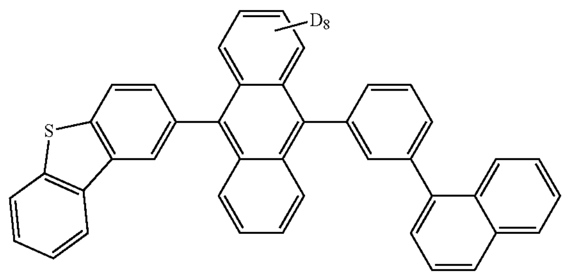
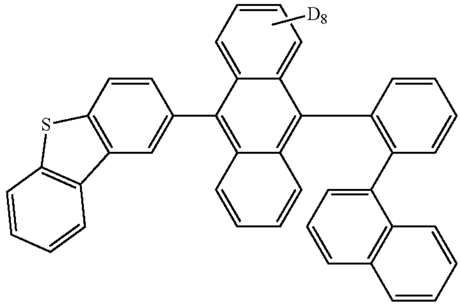
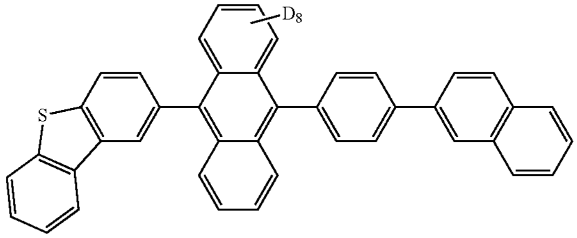
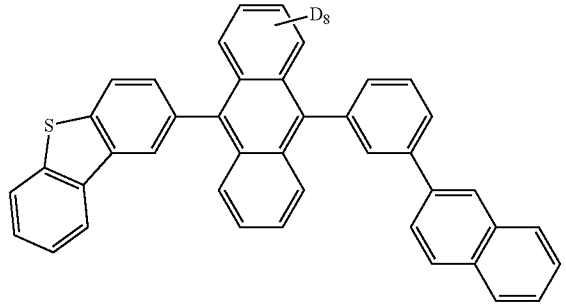
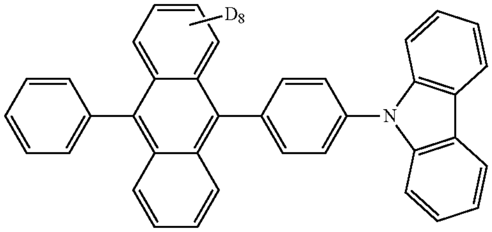
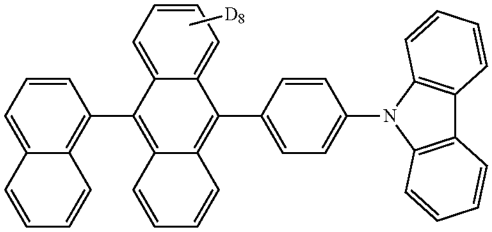
-continued
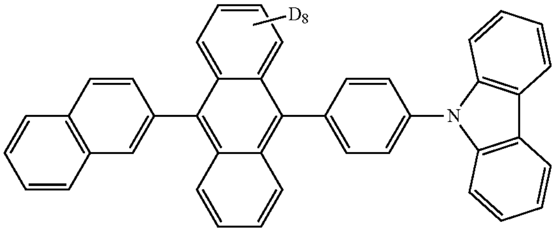
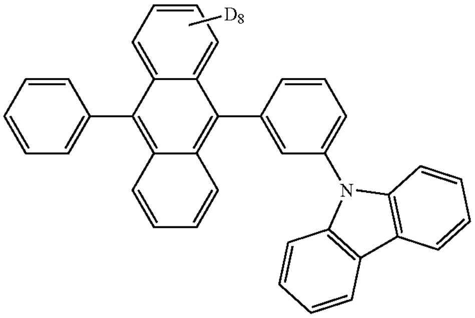
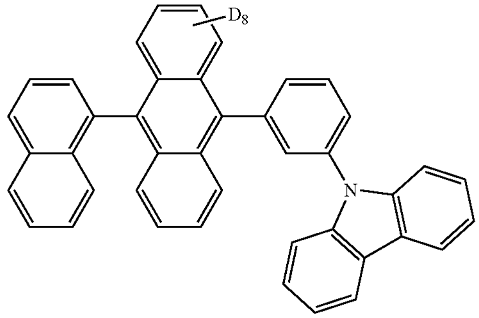
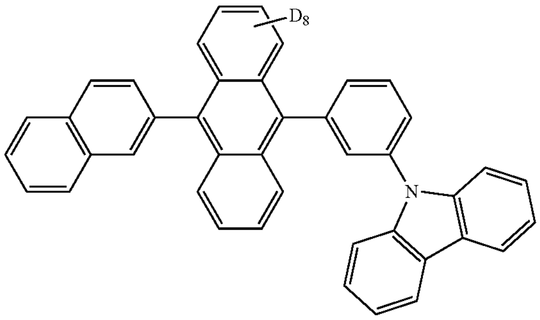
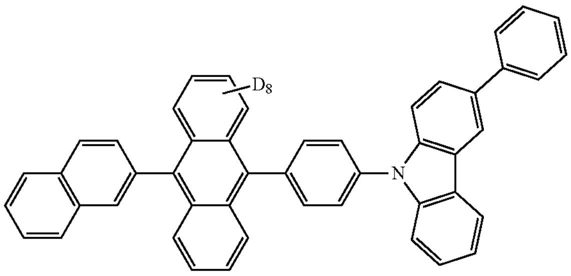
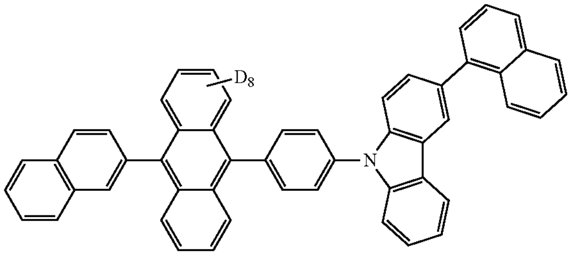

-continued

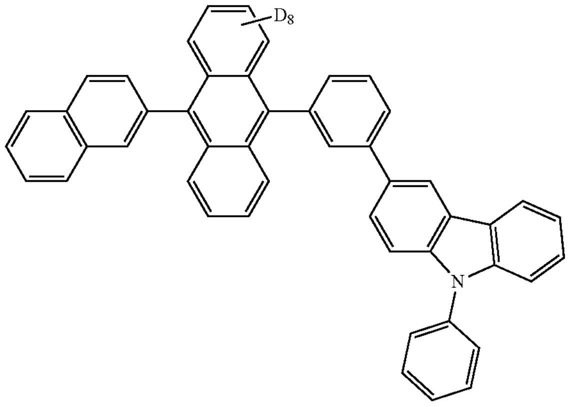

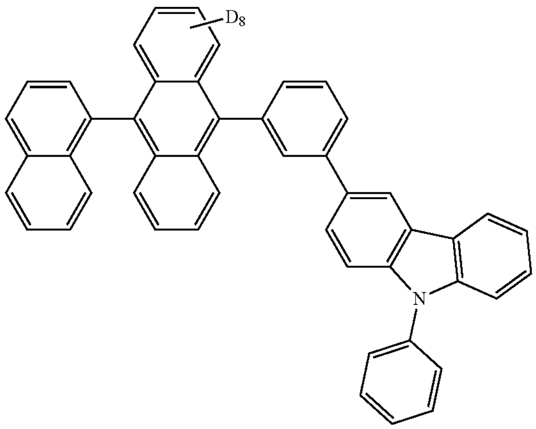

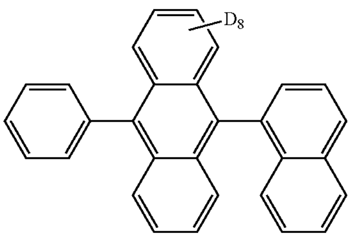

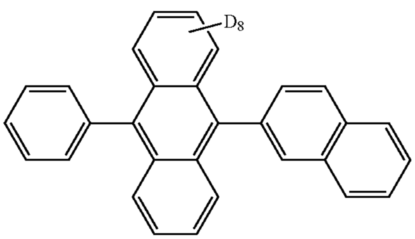

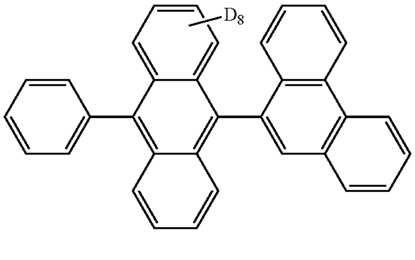

-continued

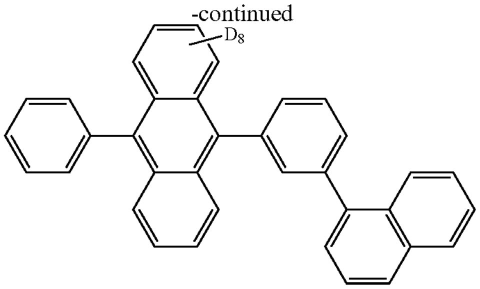

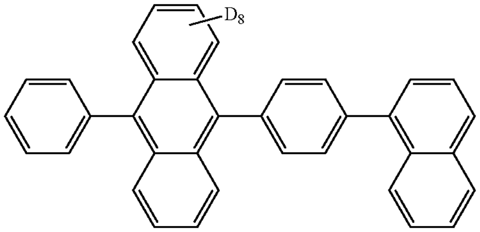

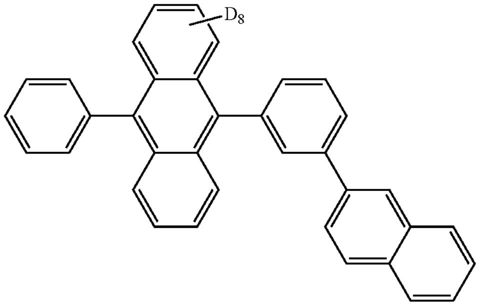

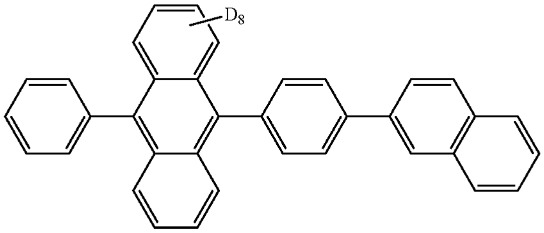

The pyrene derivative as the dopant 244, in which the pyrene core is deuterated, may be represented by Formula 5:

Formula 5

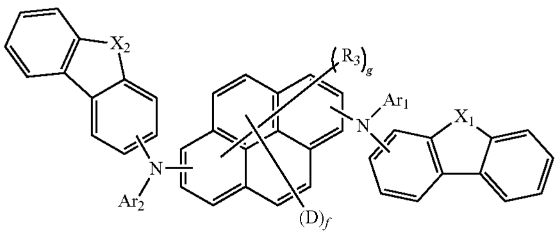

In Formula 5, each of $X_1$ and $X_2$ is independently O or S, each of $Ar_1$ and $Ar_2$ is independently $C_6$~$C_{30}$ aryl group or $C_5$~$C_{30}$ heteroaryl group, and $R_3$ is $C_1$~$C_{10}$ alkyl group or $C_1$~$C_{10}$ cycloalkyl group. In addition, f is an integer of 1 to 8, g is an integer of 0 to 2, and a summation of f and g is 8 or less.

Namely, in the core-deuterated pyrene derivative as the dopant 244, the pyrene moiety as the core is substituted by deuterium (D), and the substituent except the pyrene moiety is not deuterated.

For example, each of $Ar_1$ and $Ar_2$ may be selected from the group consisting of phenyl, dibenzofuranyl, dibenzothiophenyl, dimethylfluorenyl, pyridyl, and quinolinyl and may be substituted by $C_1$~$C_{10}$ alkyl group or $C_1$~$C_{10}$ cycloalkyl group, trimethylsilyl, or trifluoromethyl. In addition, $R_3$ may be methyl, ethyl, propyl, butyl, heptyl, cyclopentyl, cyclobutyl, or cyclopropyl.

In an exemplary embodiment, the dopant 244 may be a compound being one of the followings in Formula 6:

Formula 6

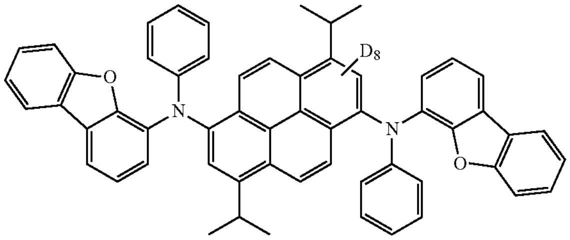

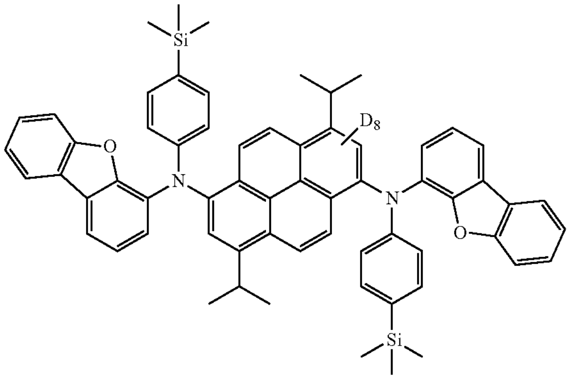

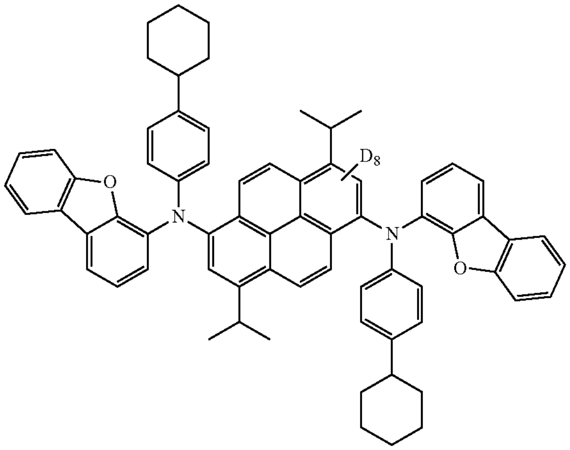

-continued

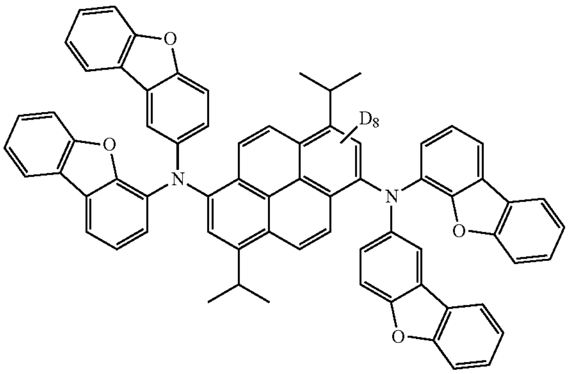

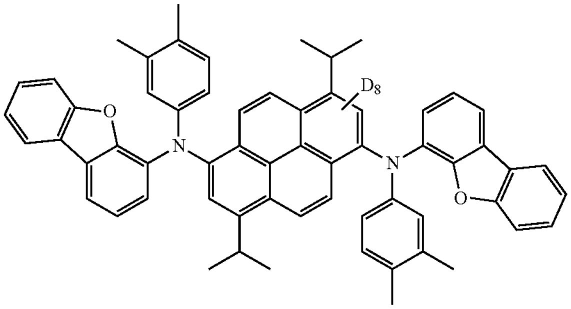

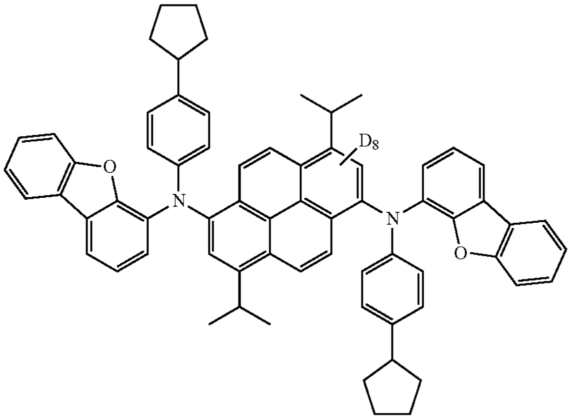

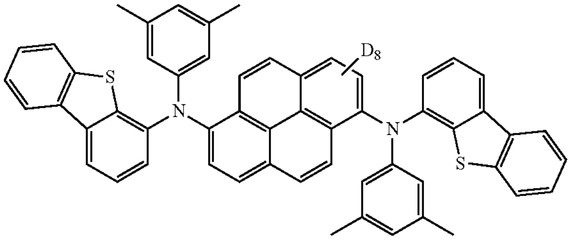

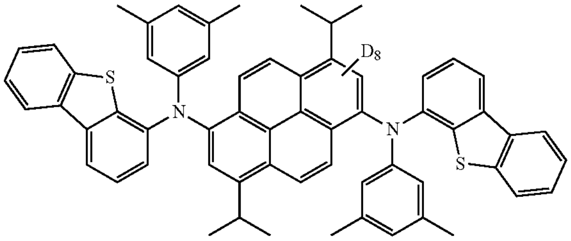

-continued
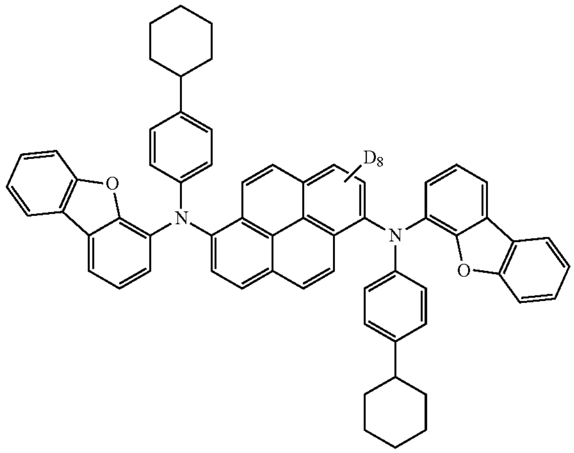
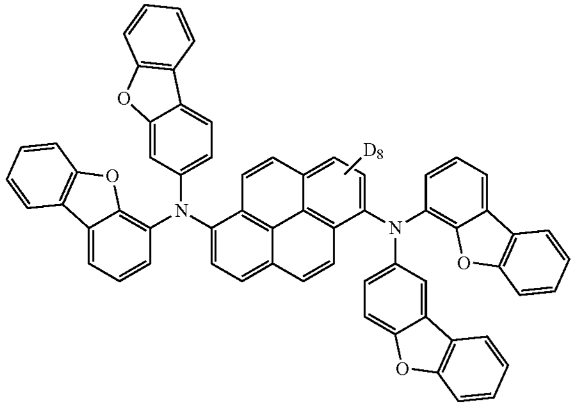
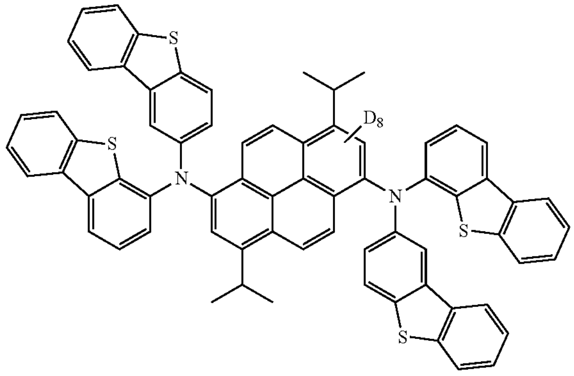
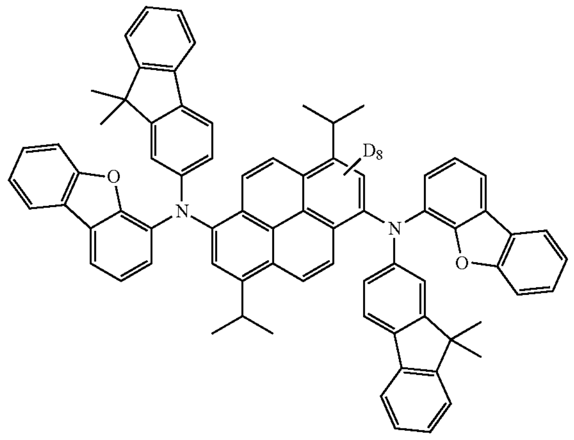
-continued
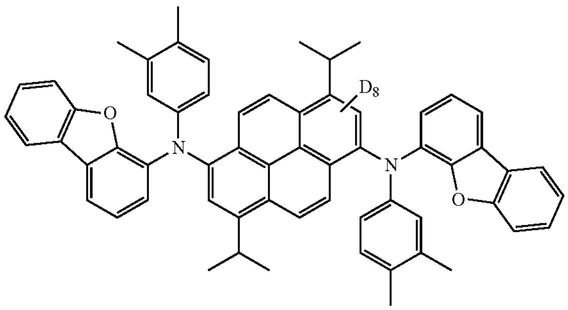
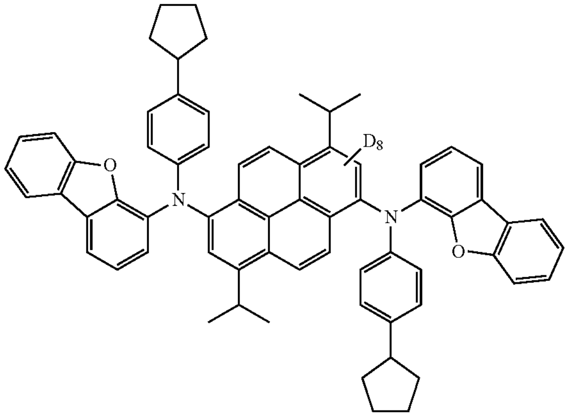
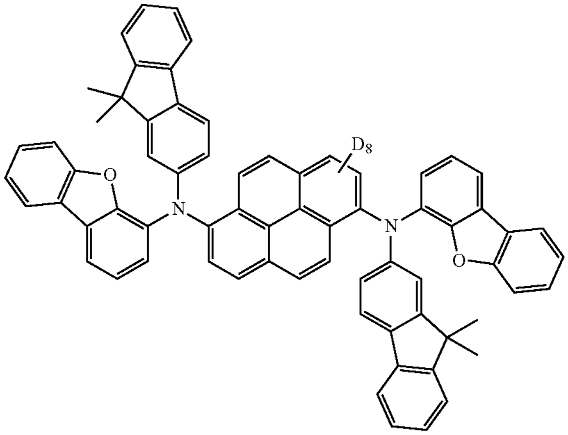
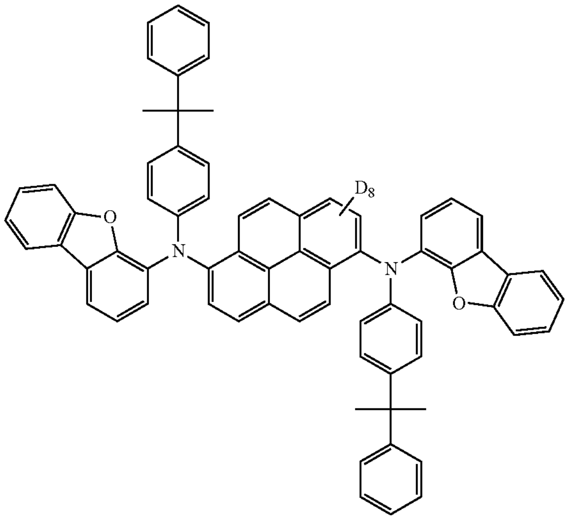

-continued
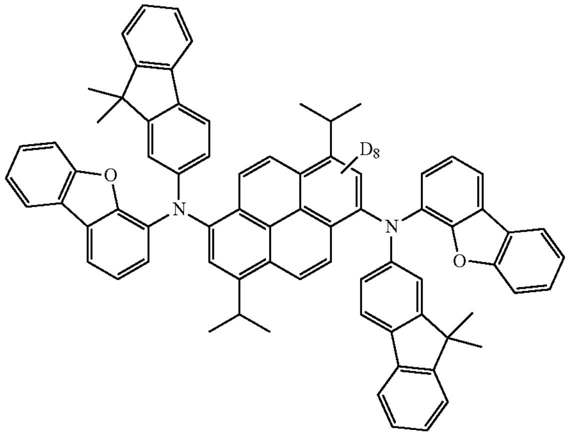
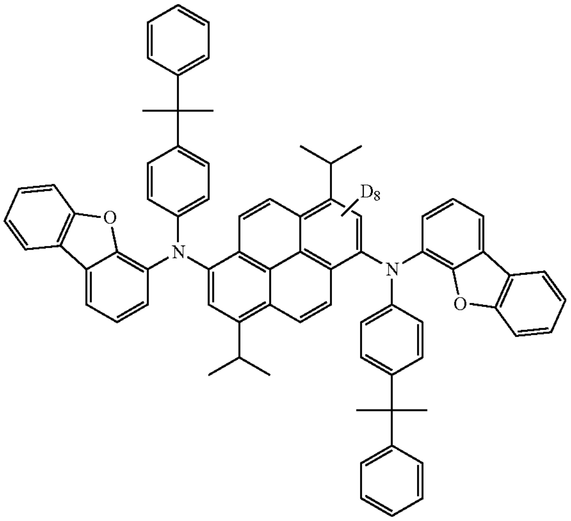
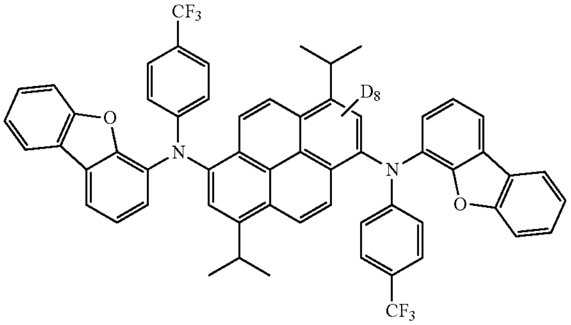
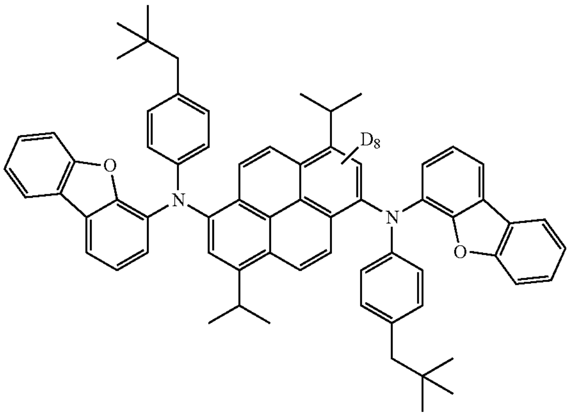
-continued
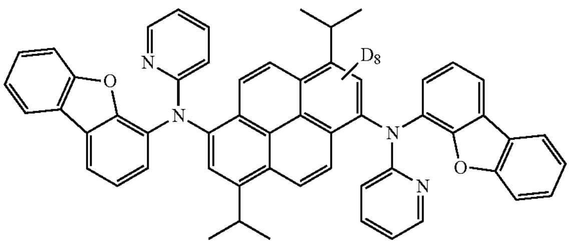
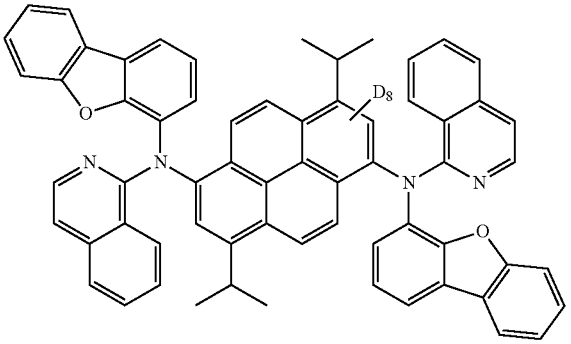
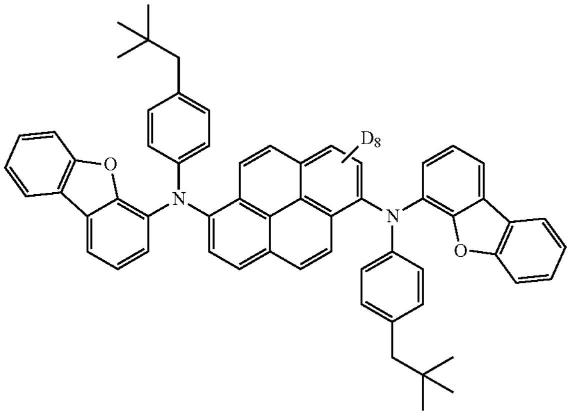
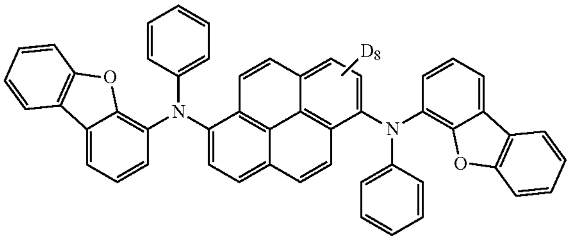
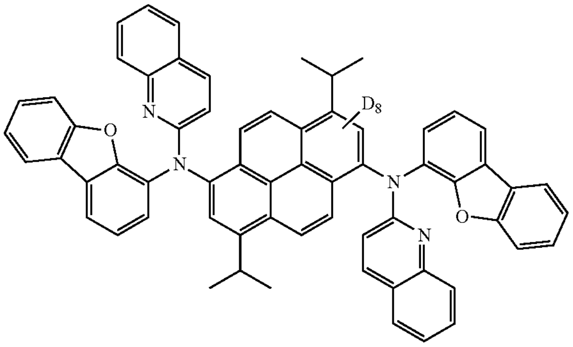

-continued
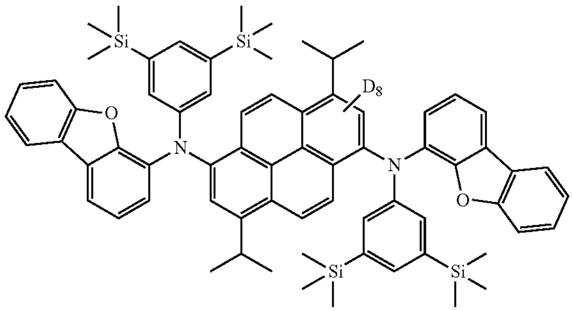
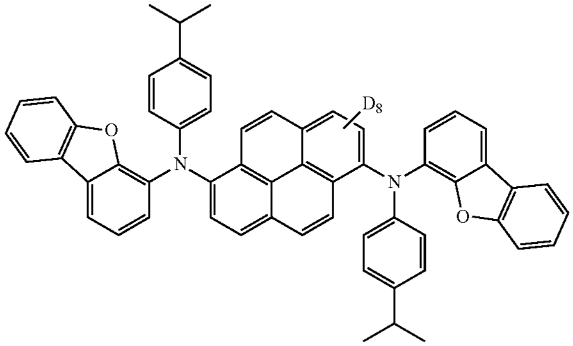
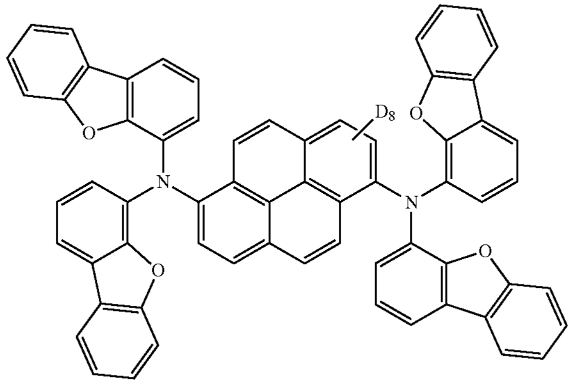
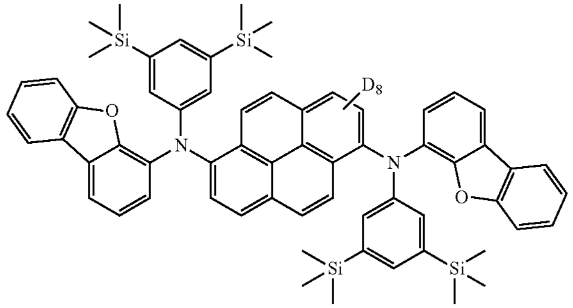
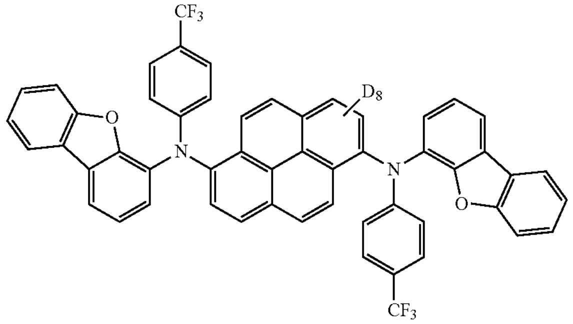
-continued
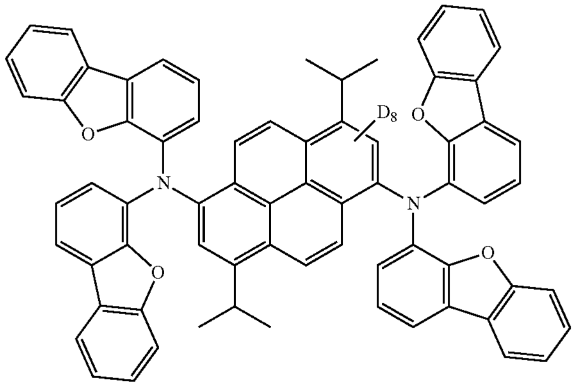
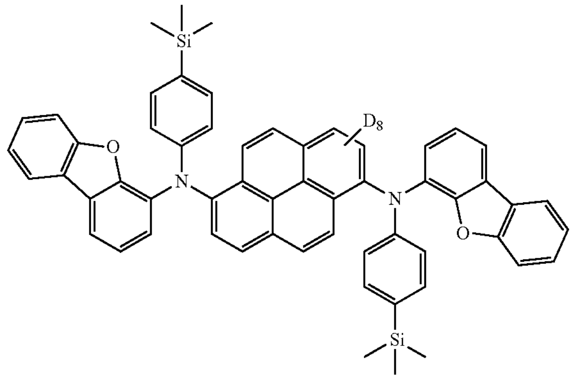
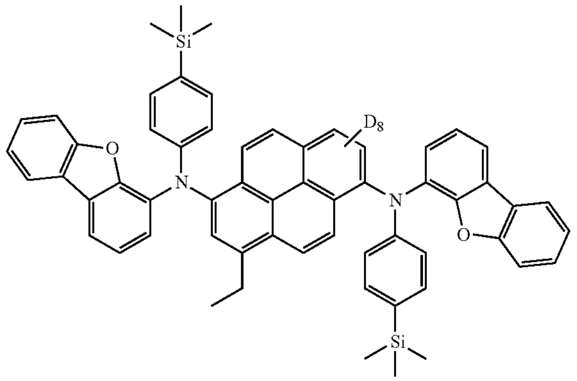
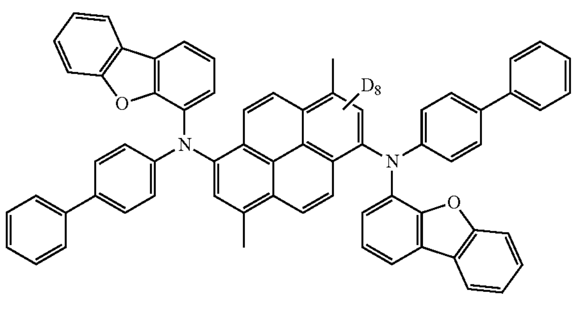

-continued
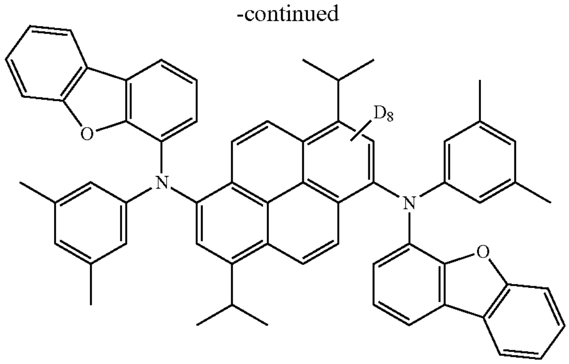
-continued
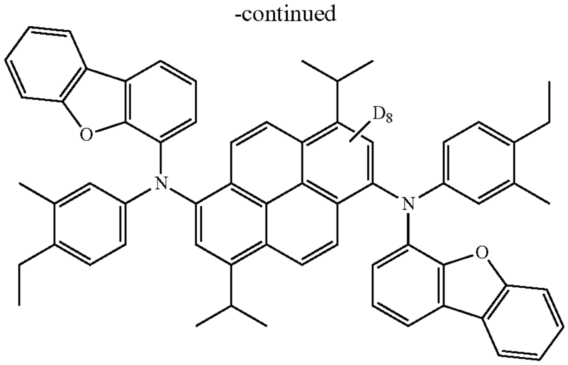
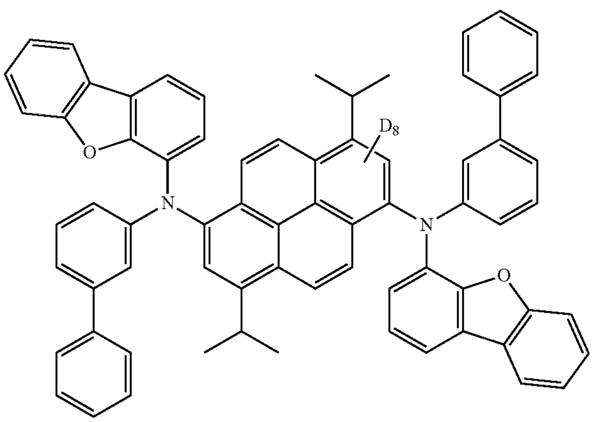
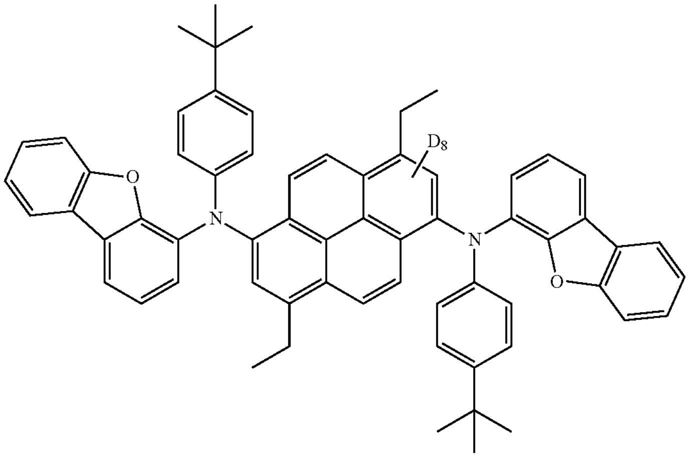
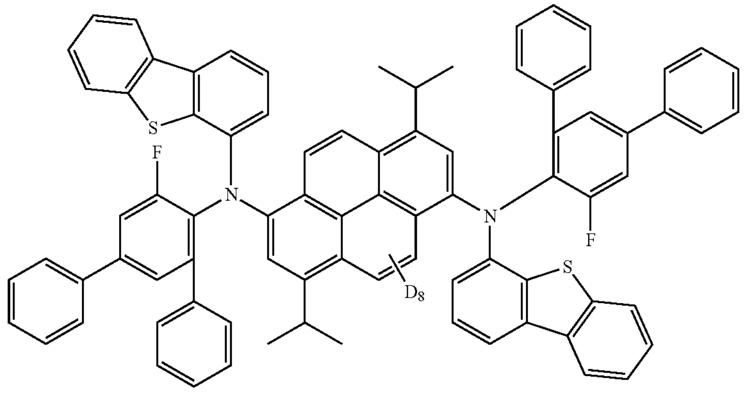

-continued
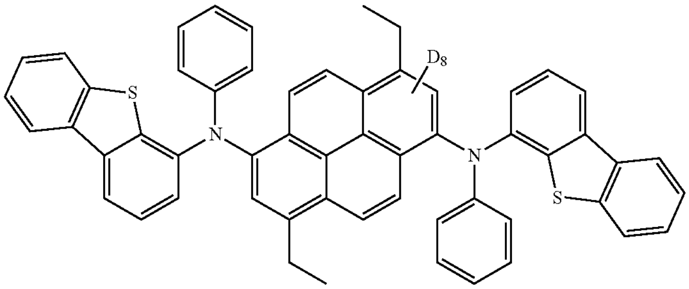
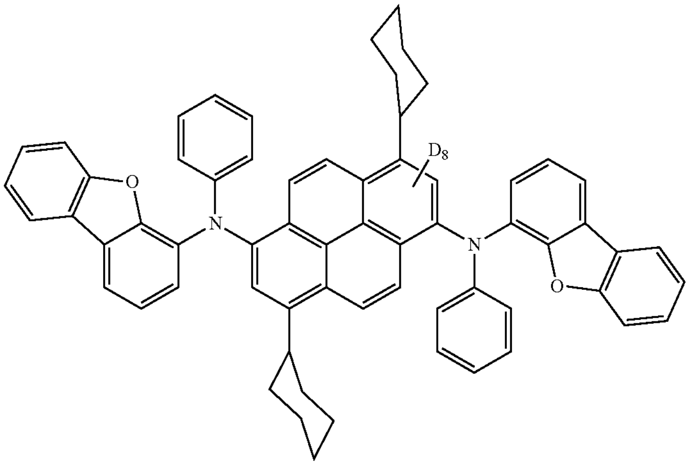
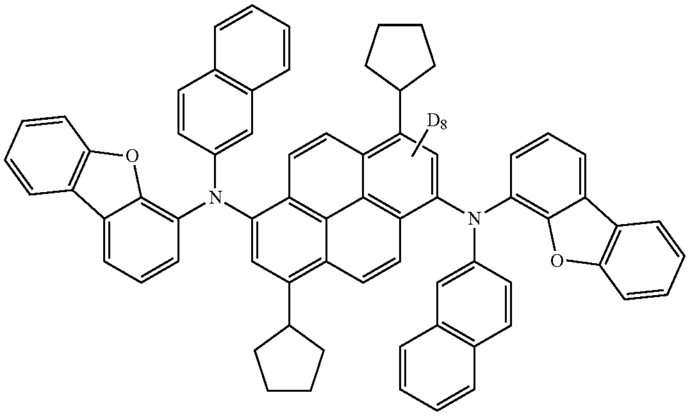
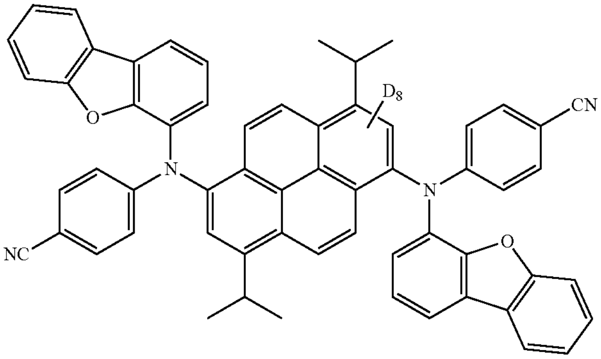

-continued
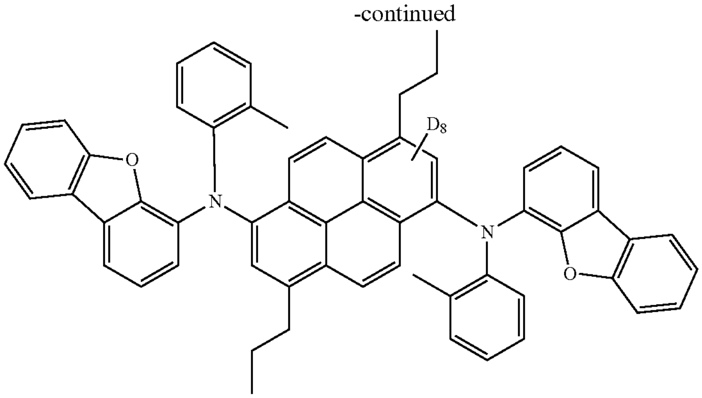
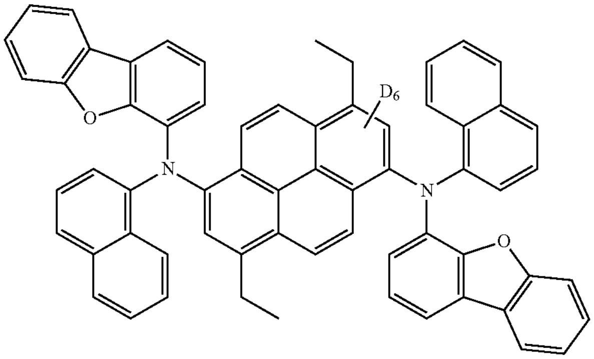
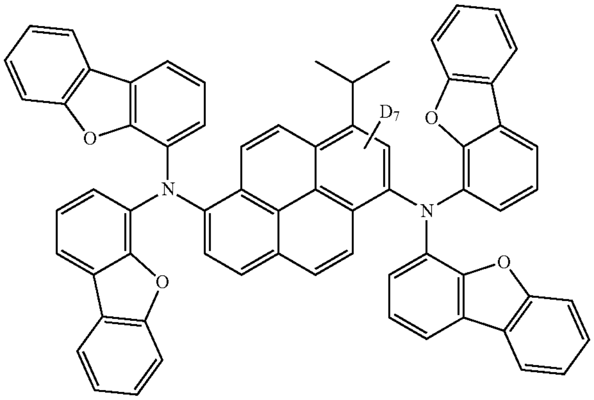
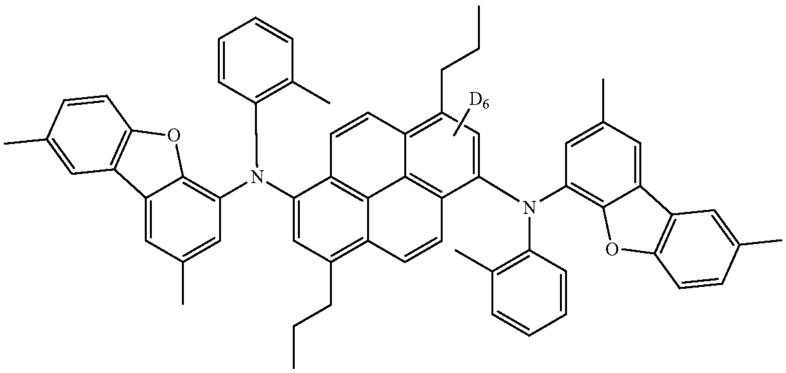

-continued
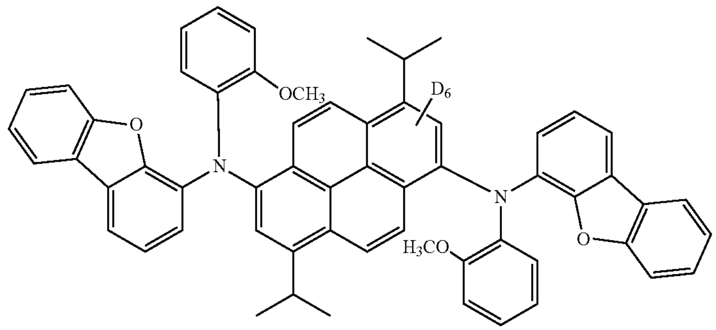
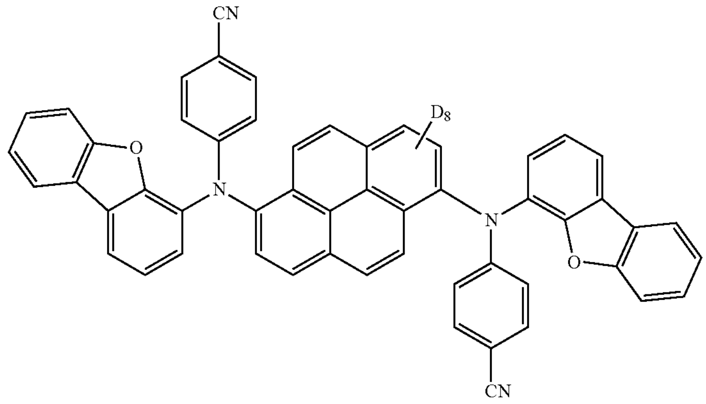
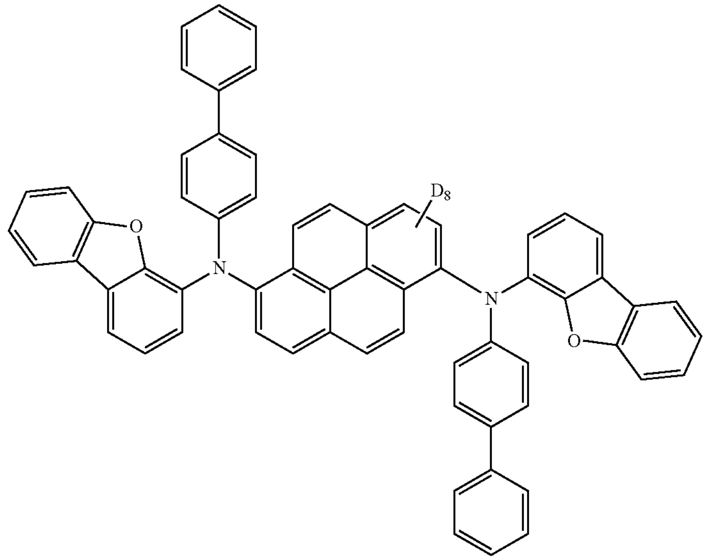
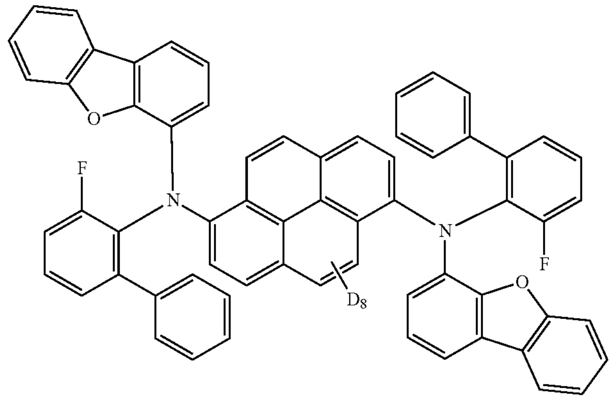

-continued
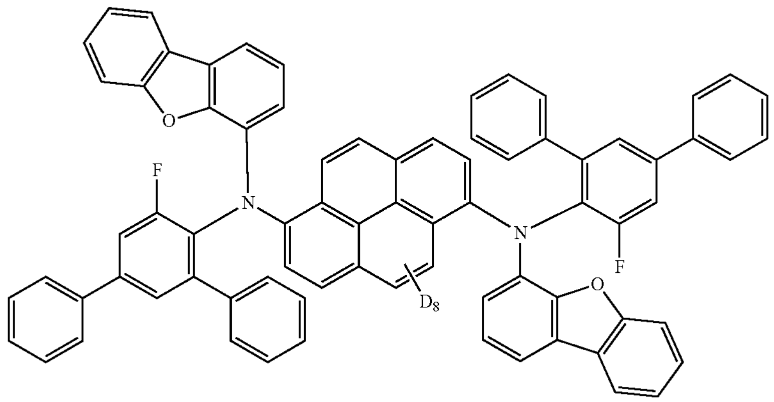
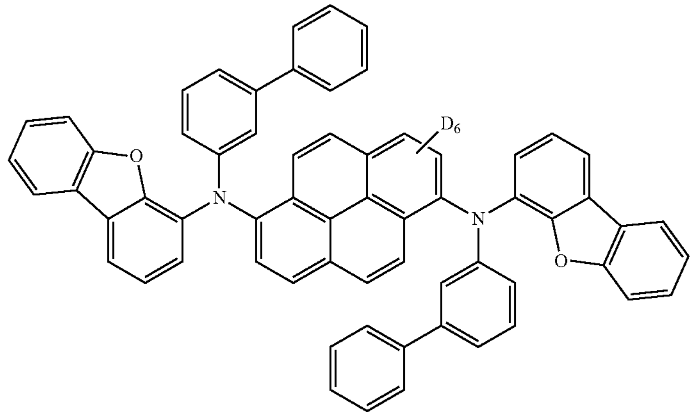
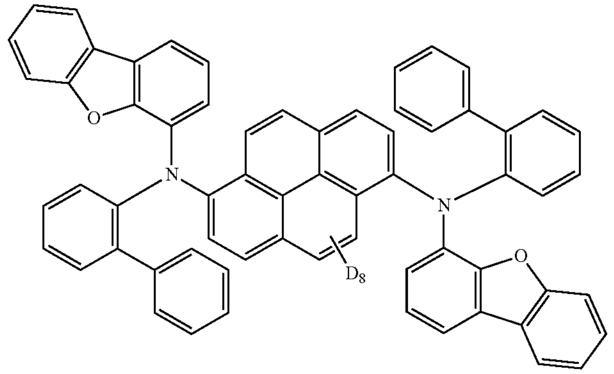
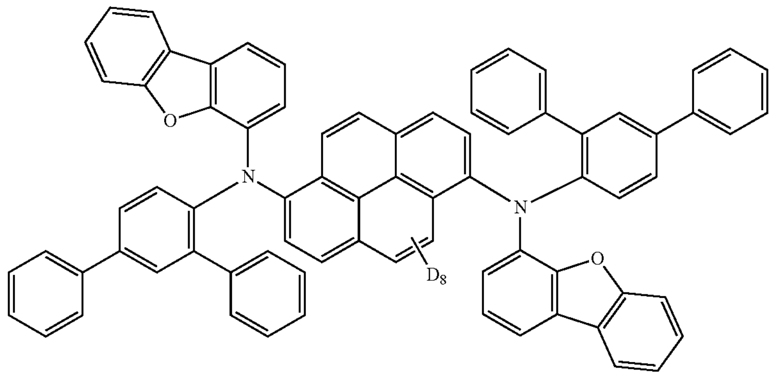

-continued
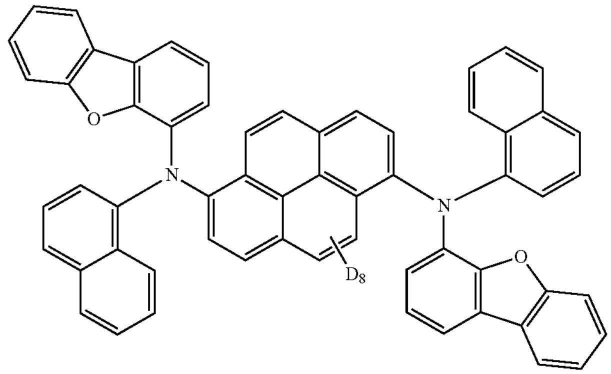
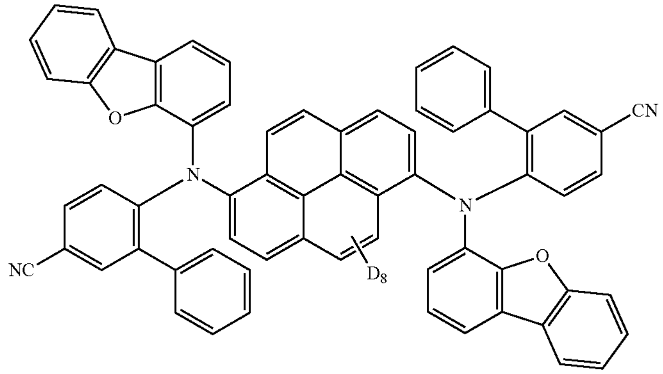
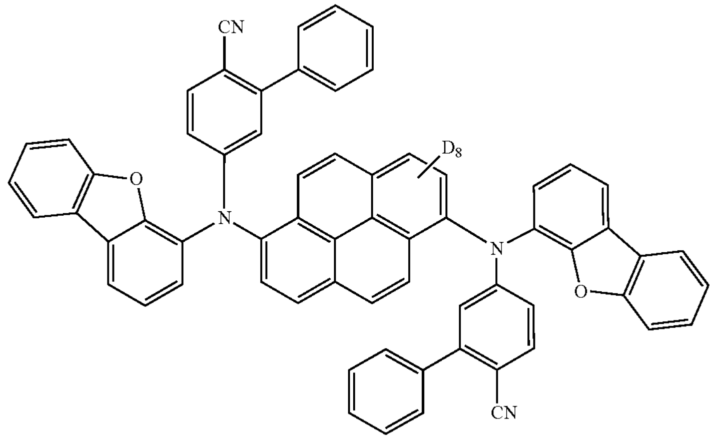
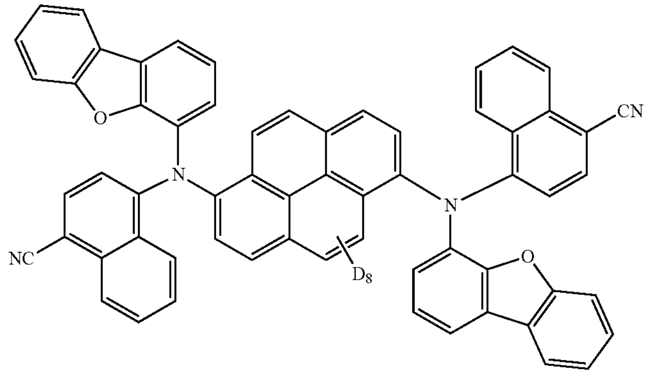

-continued
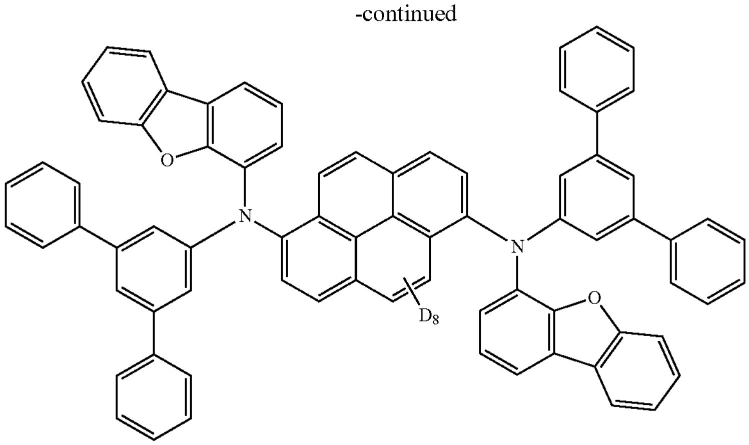
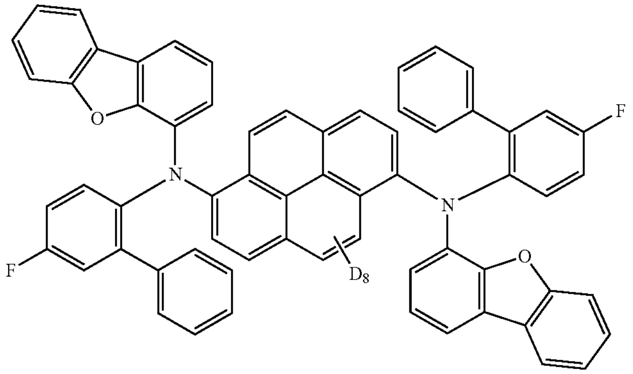
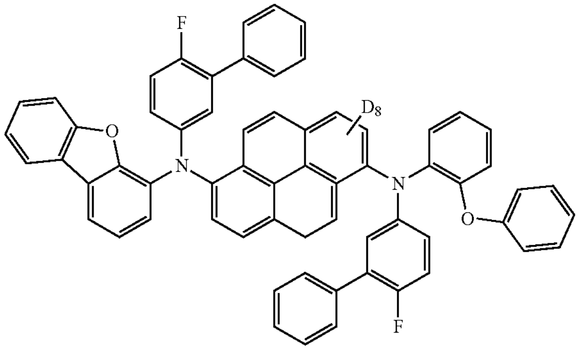
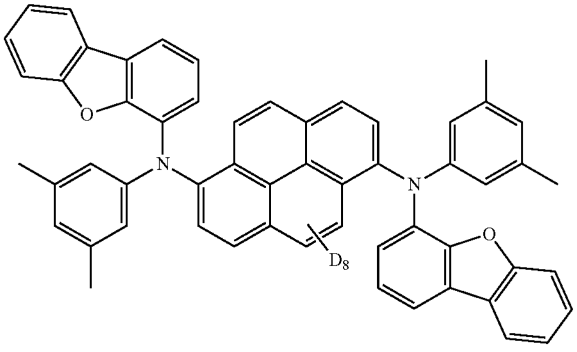
-continued
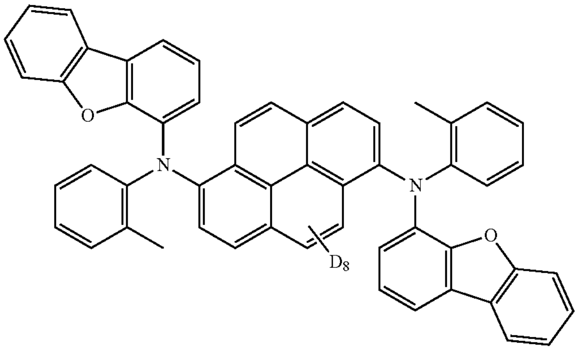
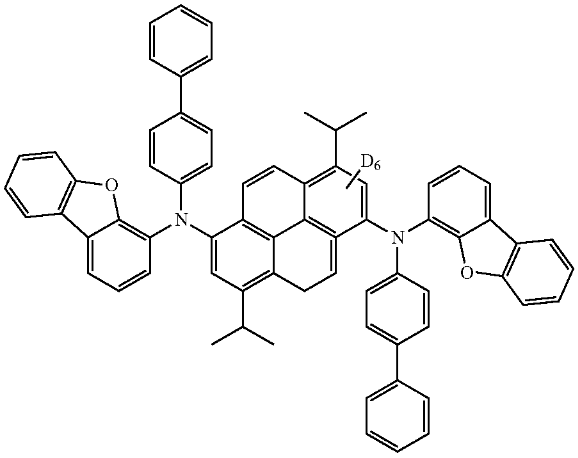

-continued
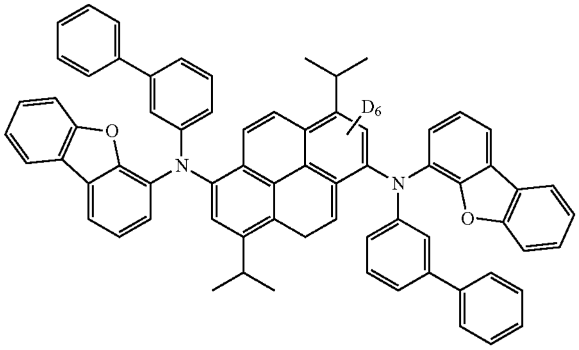
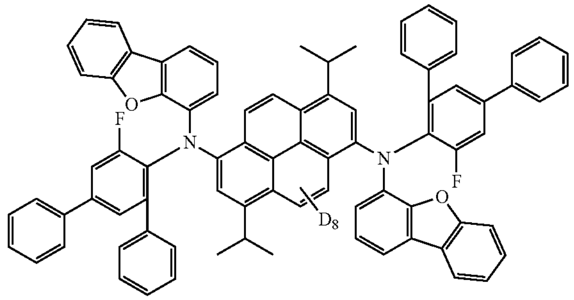
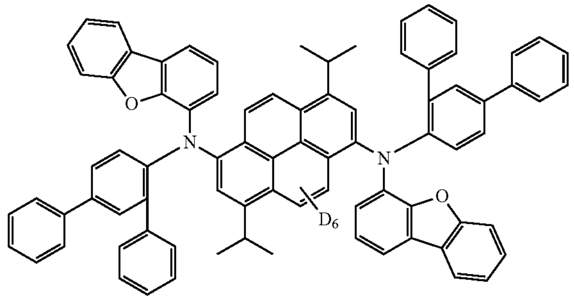
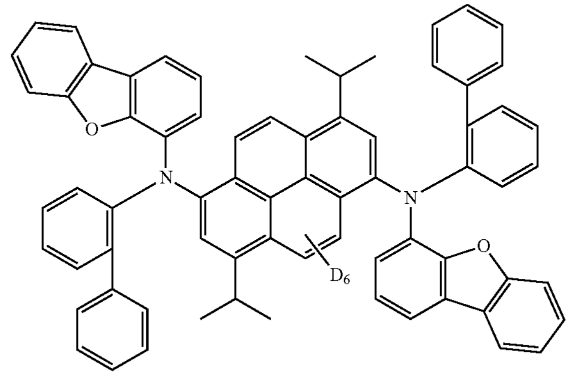
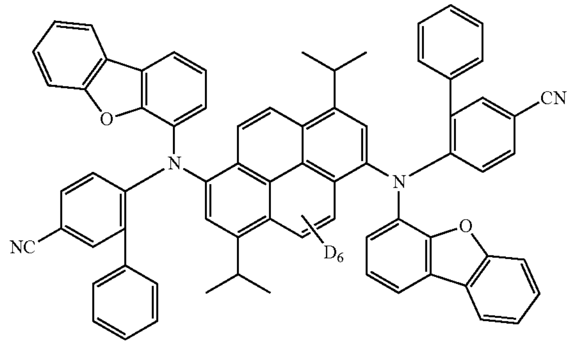
-continued
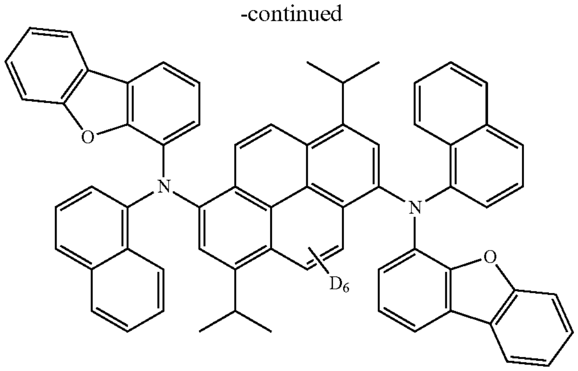
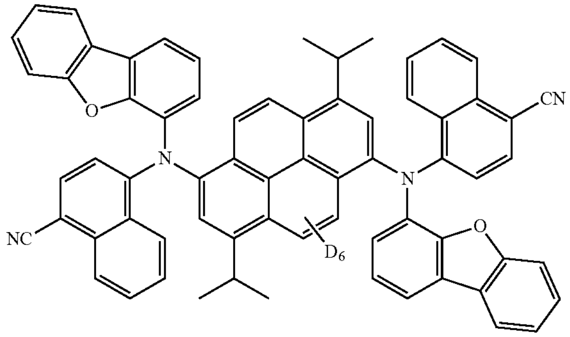
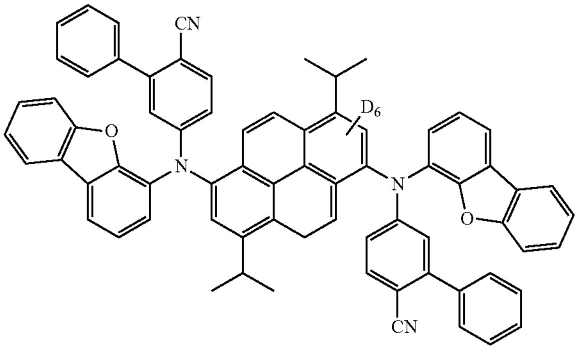
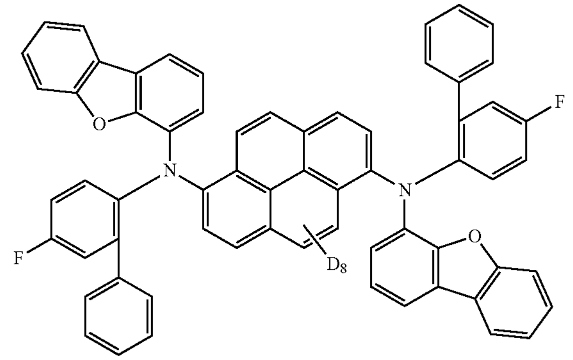
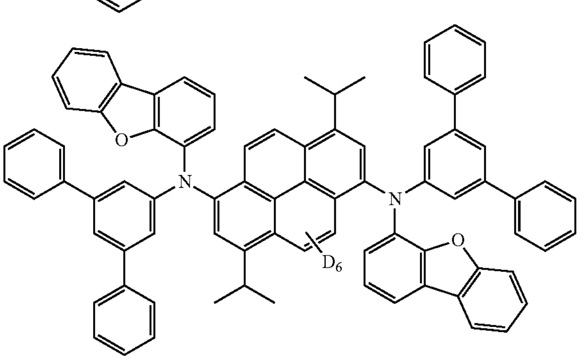

-continued
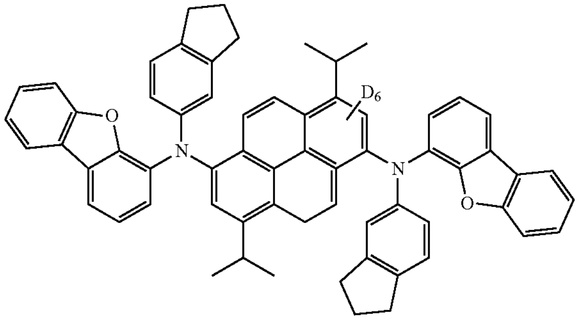
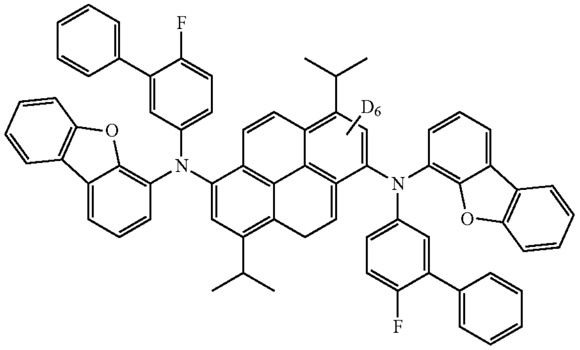
-continued
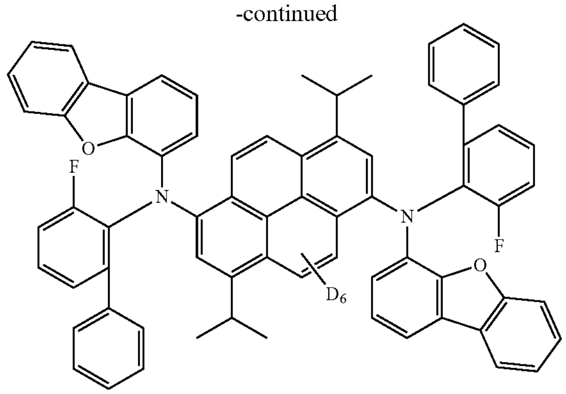
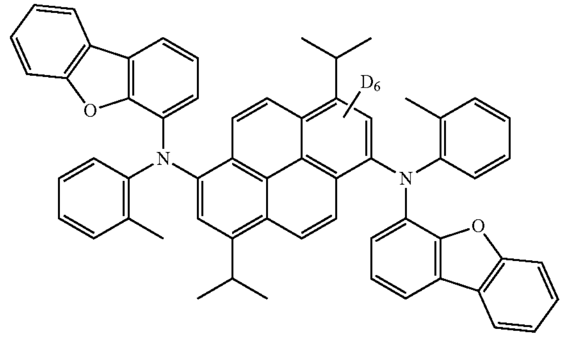
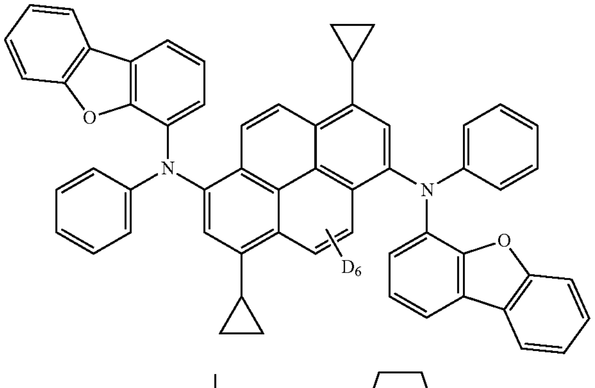
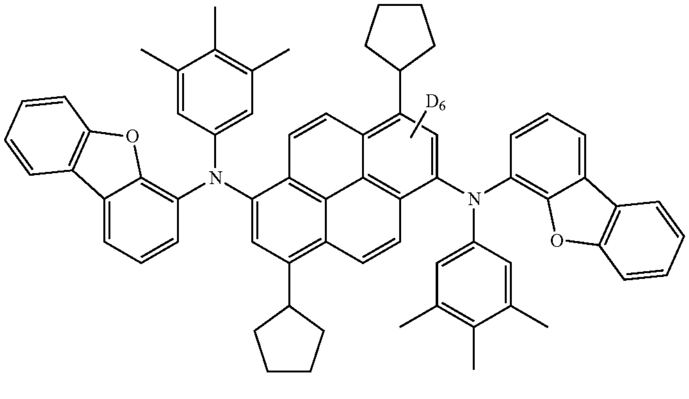

-continued
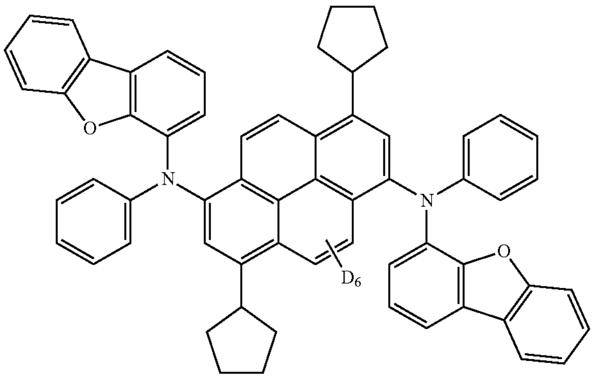
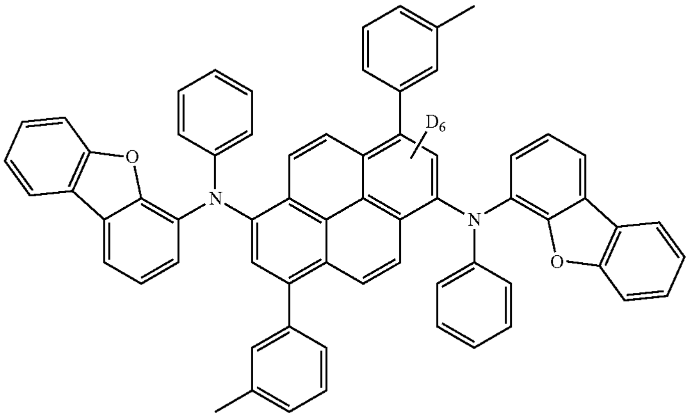
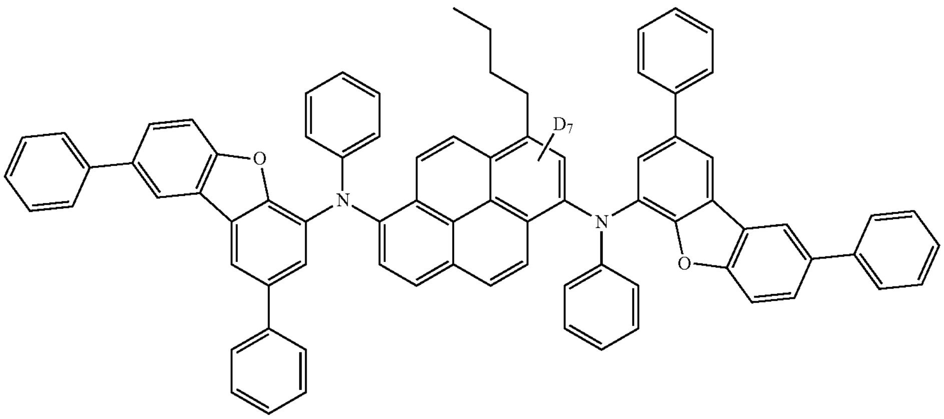
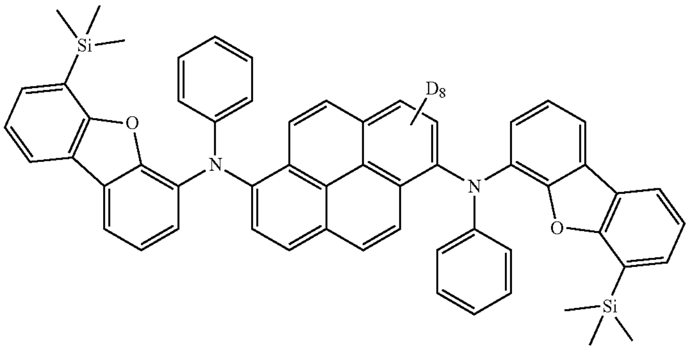

-continued
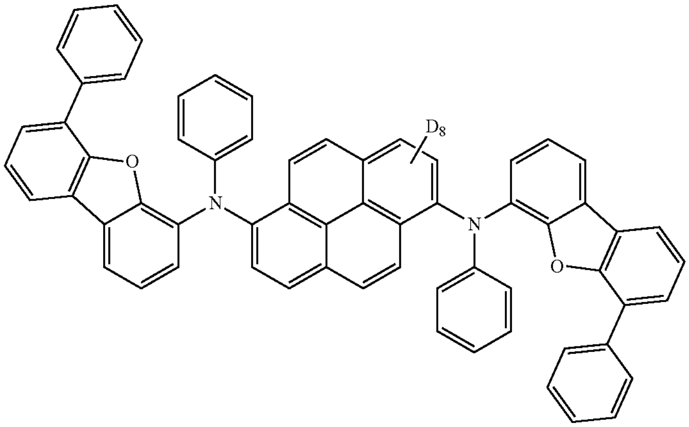
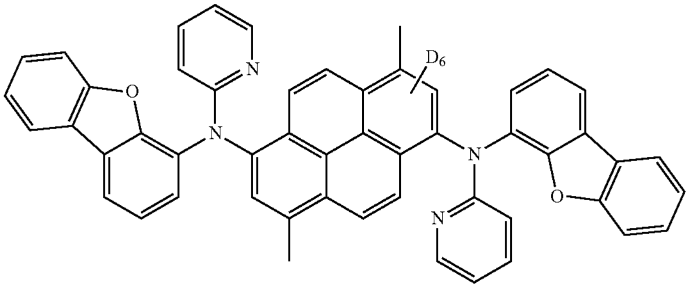
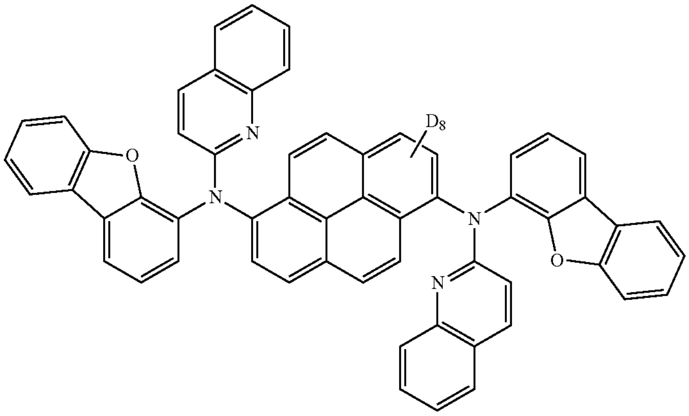
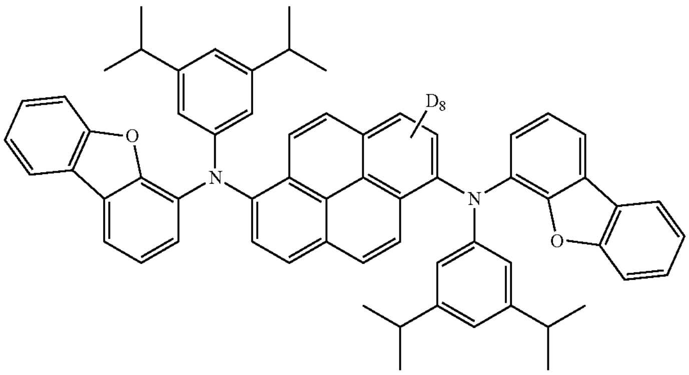

-continued
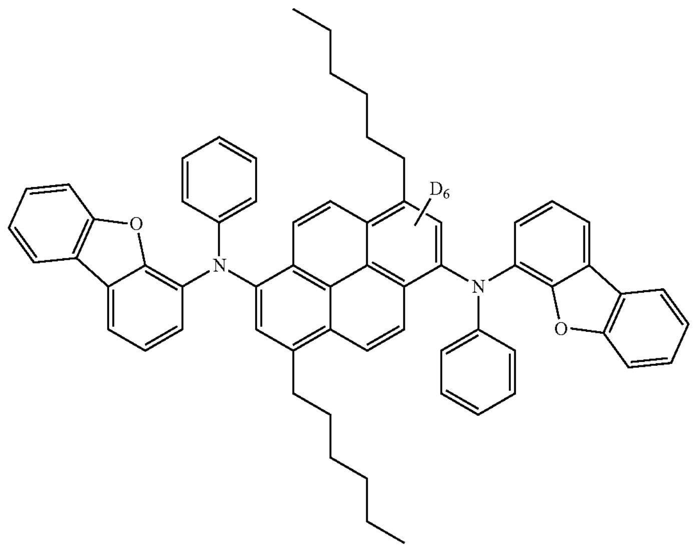
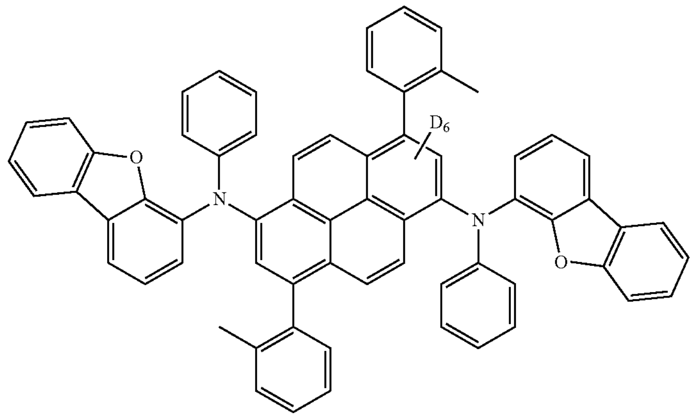
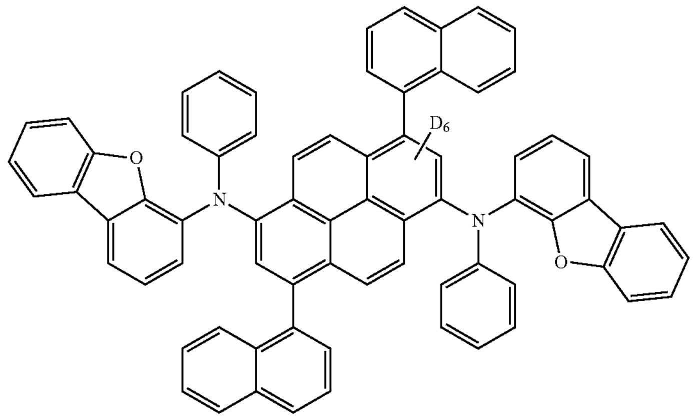

-continued
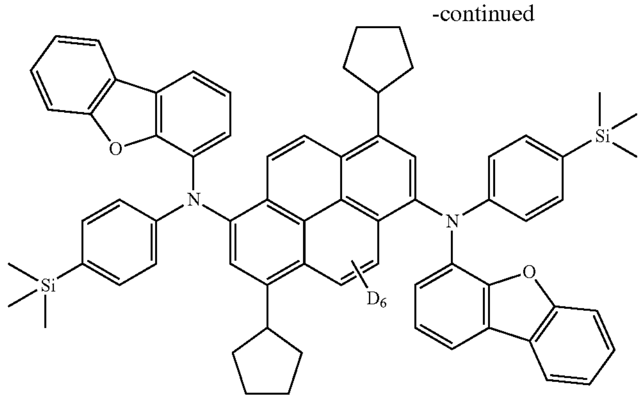
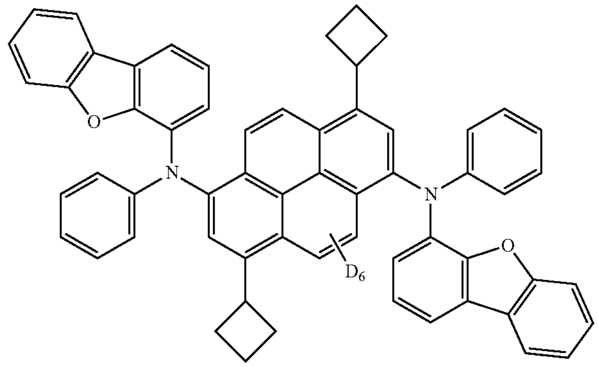
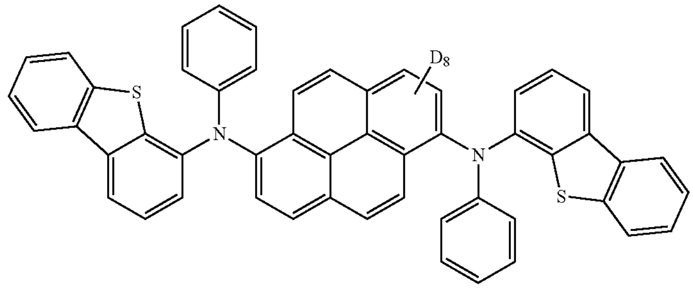
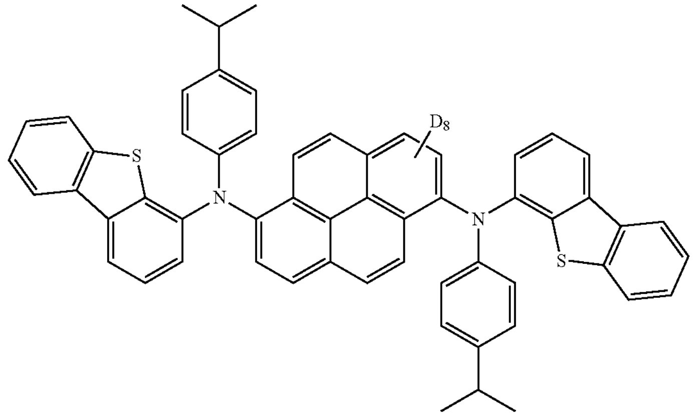
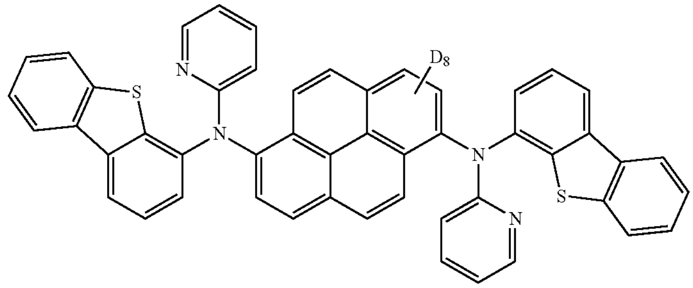

-continued
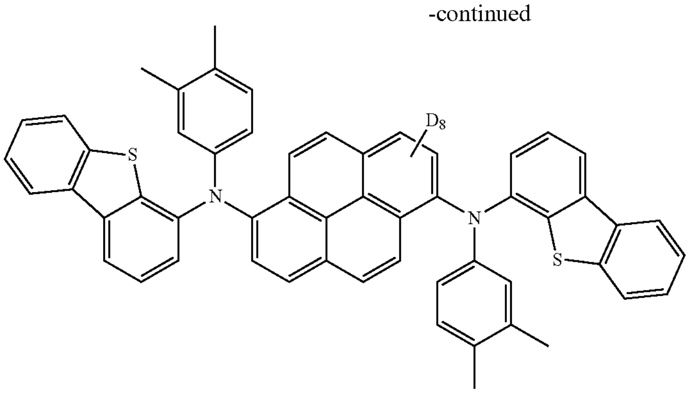
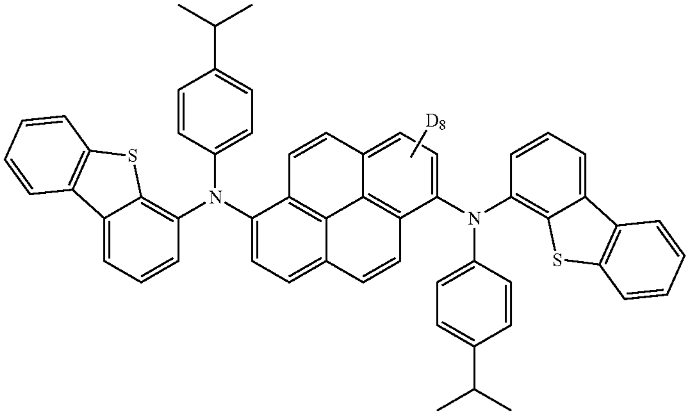
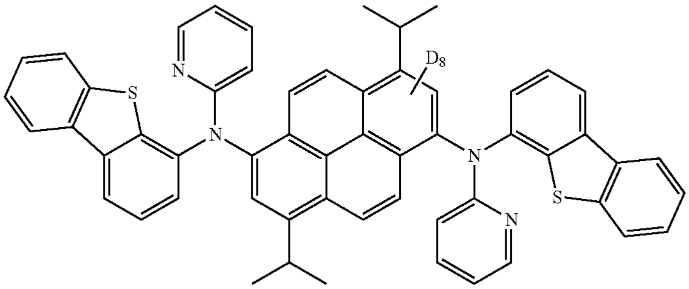
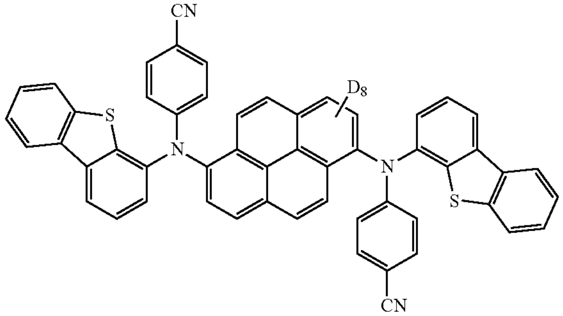
-continued
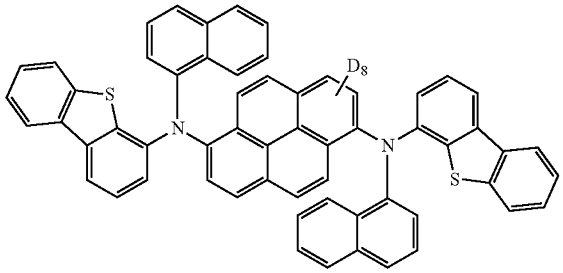

-continued
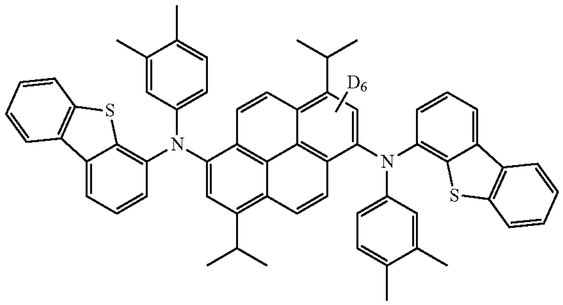
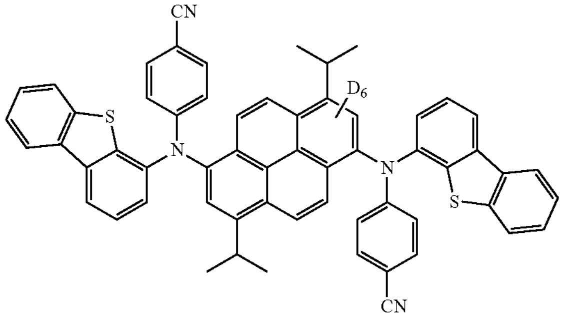
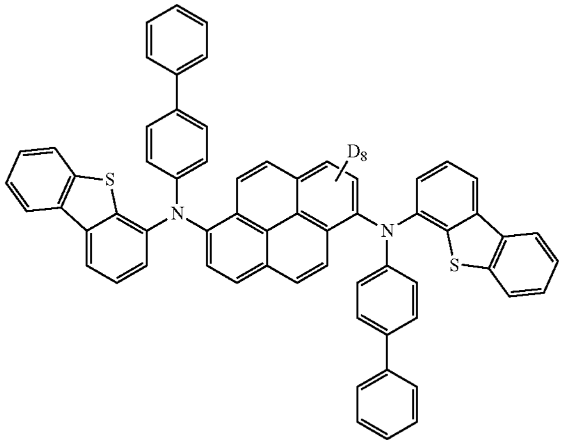
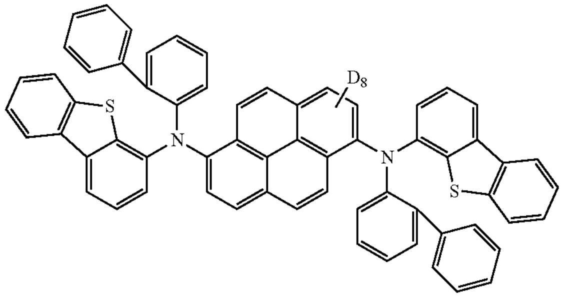
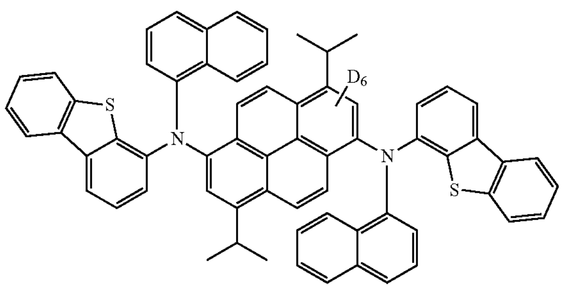
-continued
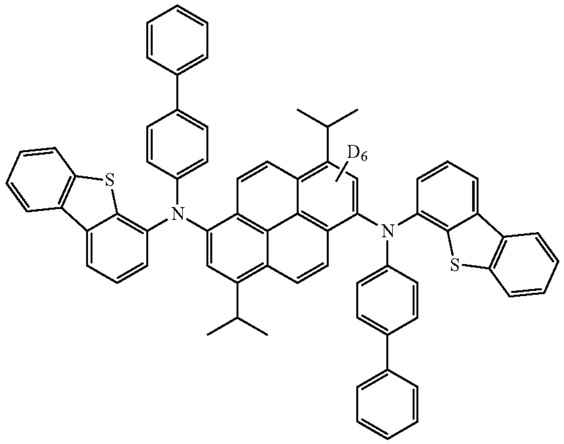
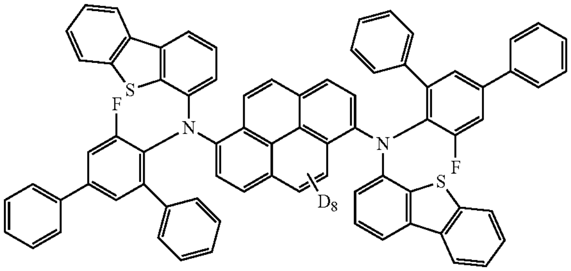
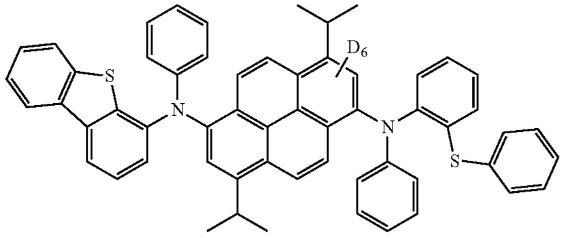
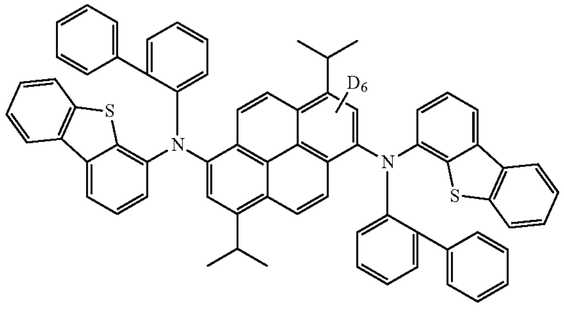
For example, when the host 242 is a compound of Formula 3, the dopant 244 may be a compound of one of Formula 5 and Formulas 7-1 to 7-3.

[Formula 7-1]

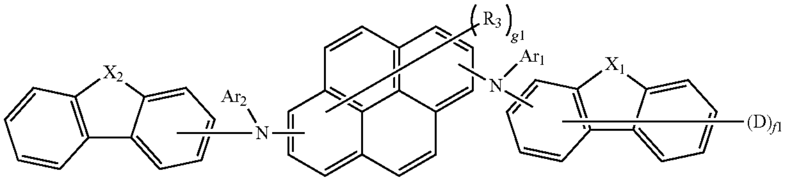

[Formula 7-2]

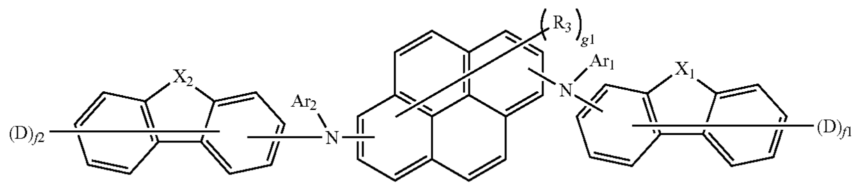

[Formula 7-3]

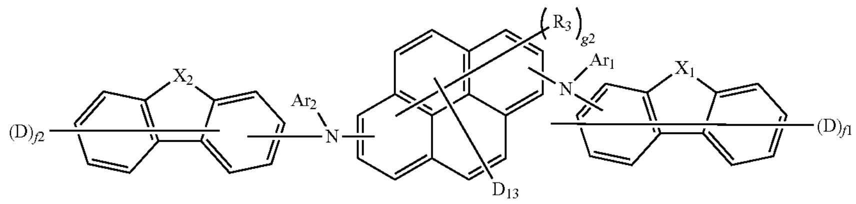

In Formulas 7-1 to 7-3, each of $X_1$ and $X_2$ is independently O or S, each of $Ar_1$ and $Ar_2$ is independently $C_6$~$C_{30}$ aryl group or $C_5$~$C_{30}$ heteroaryl group, and $R_3$ is $C_1$~$C_{10}$ alkyl group or $C_1$~$C_{10}$ cycloalkyl group. In addition, each of f1 and f2 is independently an integer of 1 to 7, and g1 is an integer of 0 to 8. In Formula 7-3, f3 is an integer of 1 to 8, g2 is an integer of 0 to 2, and a summation of f3 and g2 is 8. In addition, a part or all of hydrogen atoms of $Ar_1$ and $Ar_2$ may be substituted by D.

When the dopant 244 is a compound of Formula 5, the host 242 is a compound of Formula 3, a compound of Formula 3, in which at least one of L1, L2, L3, L4, R1 and R2 is deuterated, or a compound of Formula 3, in which the anthracene core is not deuterated (e=0) and at least one of L1, L2, L3, L4, R1 and R2 is deuterated. Namely, the host 242 may be the core-deuterated anthracene derivative, the wholly-deuterated anthracene derivative or the substituent-deuterated anthracene derivative.

In the EML 240 of the OLED D, the host 242 may have a weight % of about 70 to 99.9, and the dopant 244 may have a weight % of about 0.1 to 30. To provide sufficient emitting efficiency and lifespan, a weight % of the dopant 244 may be about 0.1 to 10, preferably about 1 to 5.

The EBL 230 includes an amine derivative as an electron blocking material. The material of the EBL 230 may be represented by Formula 8:

Formula 8

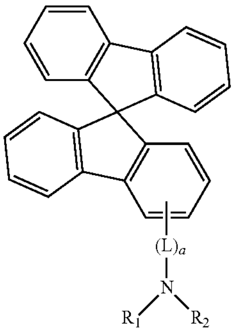

In Formula 8, L is arylene group, and a is 0 or 1. Each of $R_1$ and $R_2$ is independently selected from the group consisting of $C_6$ to $C_{30}$ arylene group and $C_5$ to $C_{30}$ heteroarylene group.

For example, L may be phenylene, and each of $R_1$ and $R_2$ may be selected from the group consisting of biphenyl, fluorenyl, phenylcarbazolyl, carbazolylphenyl, dibenzothiophenyl and dibenzofuranyl.

Namely, the electron blocking material may be an amine derivative substituted by spirofluorene (e.g., "spirofluorene-substituted amine derivative").

The electron blocking material of Formula 8 may be one of the followings of Formula 9:

Formula 9
H1
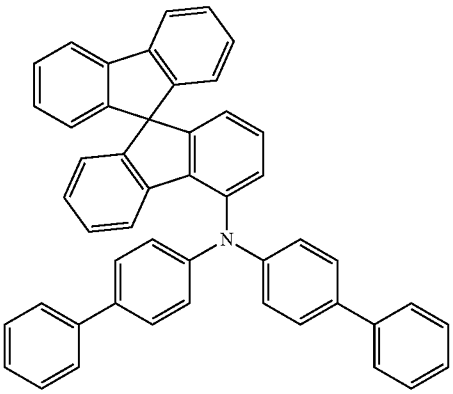
H2
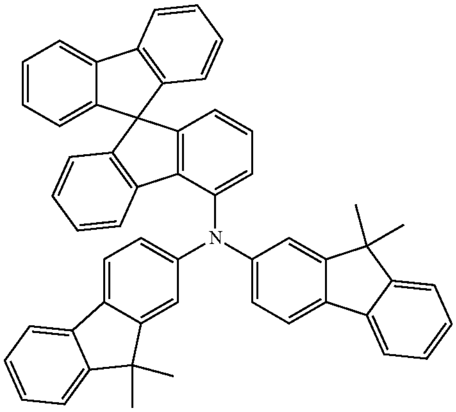
H3
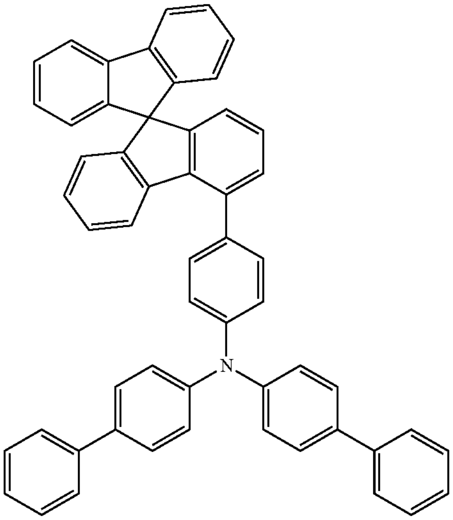
-continued
H4
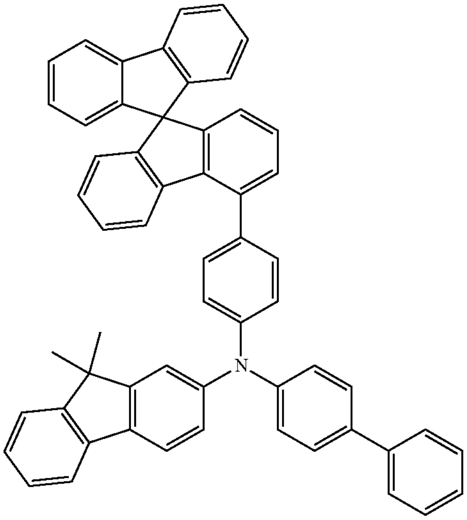
H5
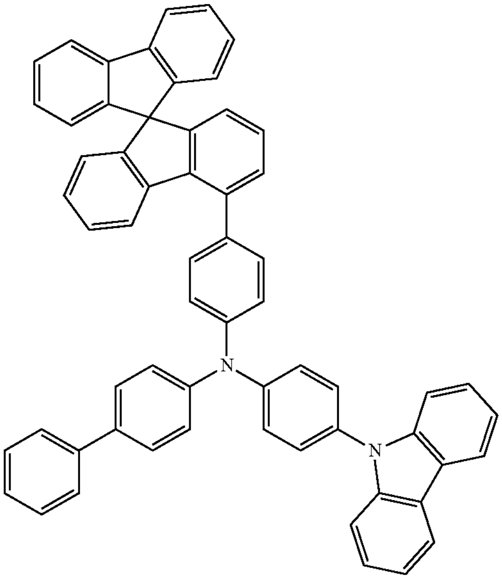
H6
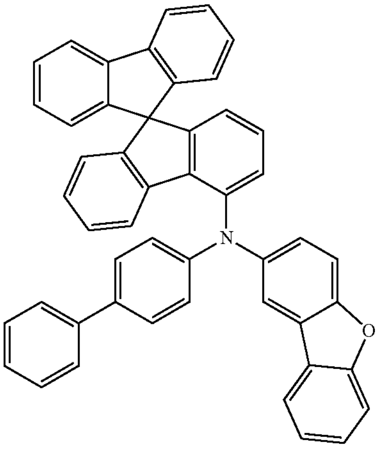

-continued

H7

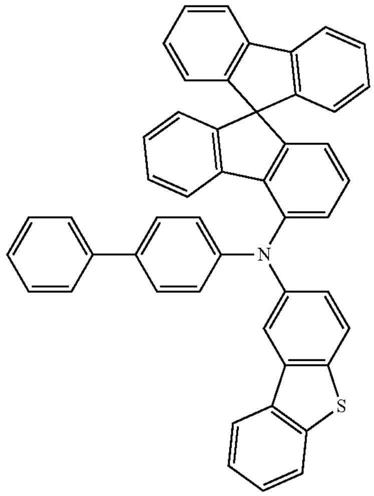

H8

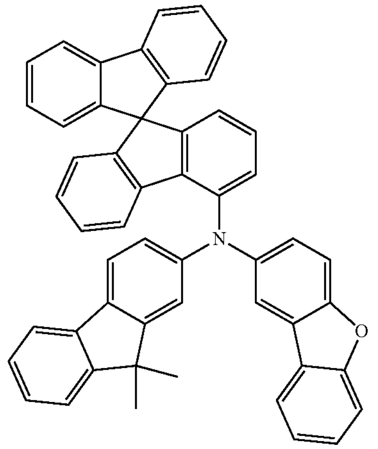

H9

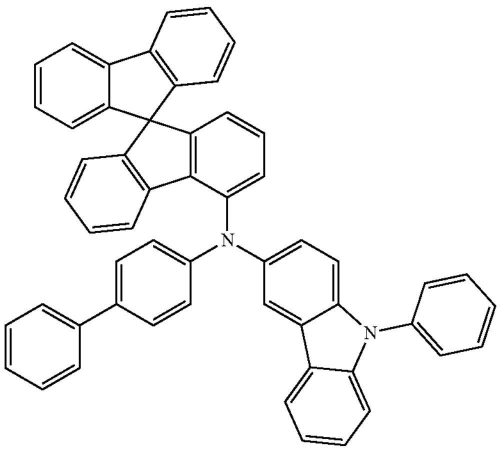

The HBL 250 may include an azine derivative as a hole blocking material. For example, the material of the HBL 250 may be represented by Formula 10:

Formula 10

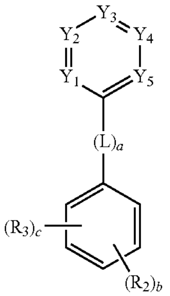

In Formula 10, each of $Y_1$ to $Y_5$ are independently $CR_1$ or N, and one to three of $Y_1$ to $Y_5$ is N. $R_1$ is independently hydrogen or $C_6$~$C_{30}$ aryl group. L is $C_6$~$C_{30}$ arylene group, and $R_2$ is $C_6$~$C_{30}$ aryl group or $C_5$~$C_{30}$ hetero aryl group. $R_3$ is hydrogen, or adjacent two of $R_3$ form a fused ring. "a" is 0 or 1, "b" is 1 or 2, and "c" is an integer of 0 to 4.

The hole blocking material of Formula 10 may be one of the followings of Formula 11:

Formula 11

E1

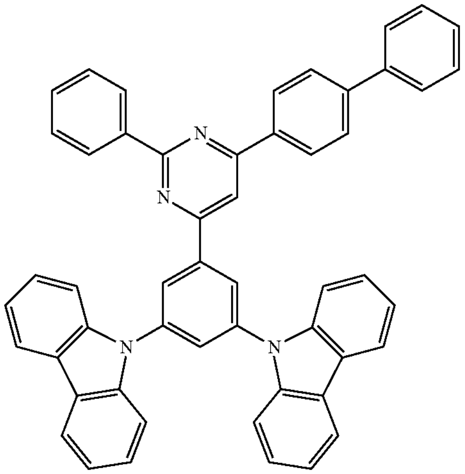

E2

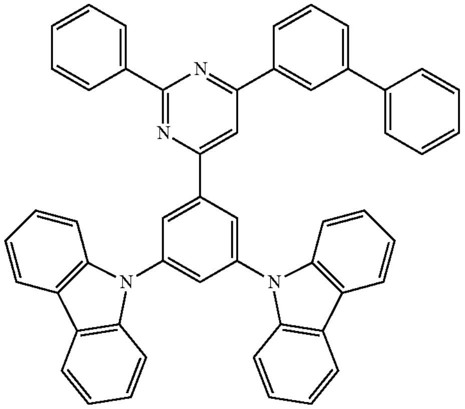

E3
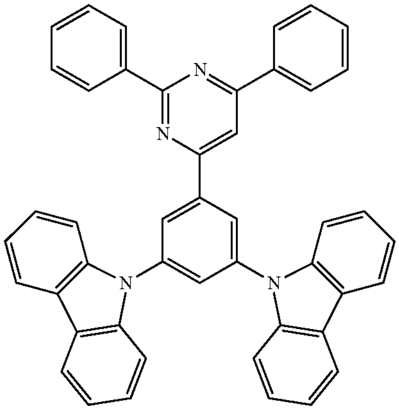
E4
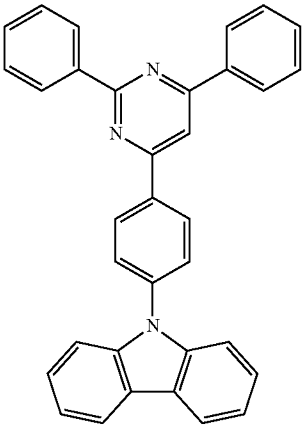
E5
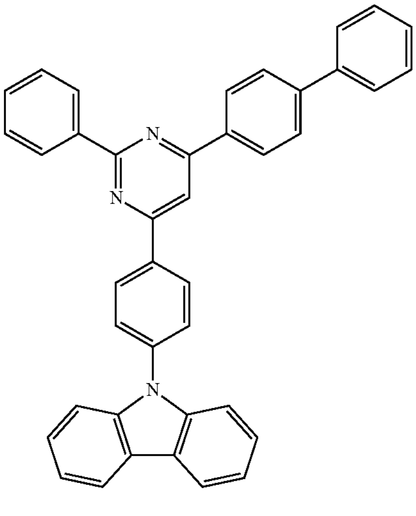
E6
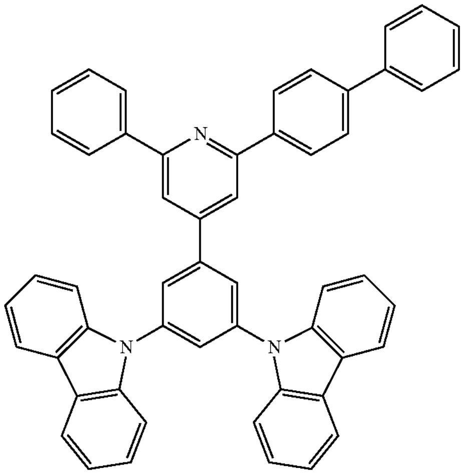
E7
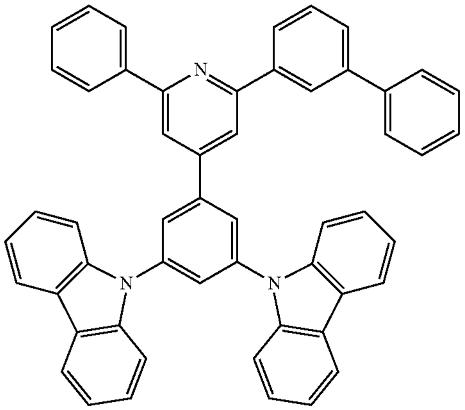
E8
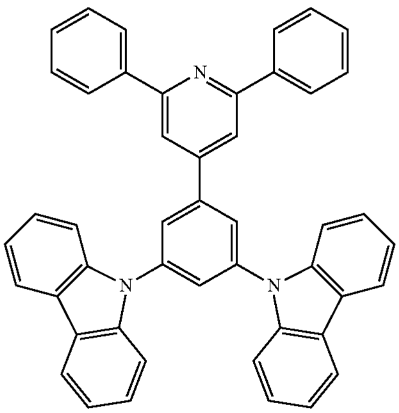

E9
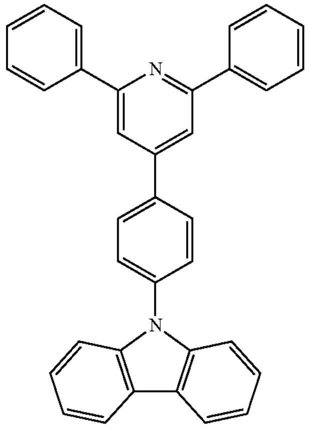
E10
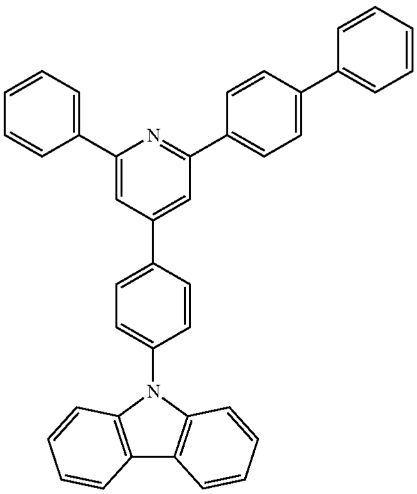
E11
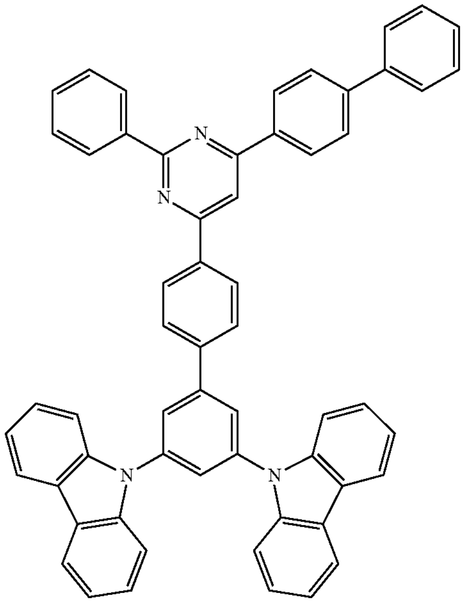
E12
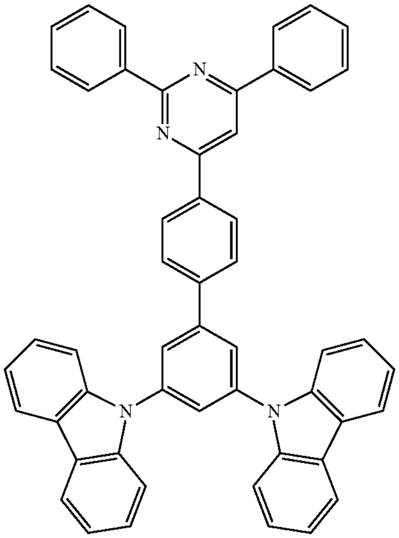
E13
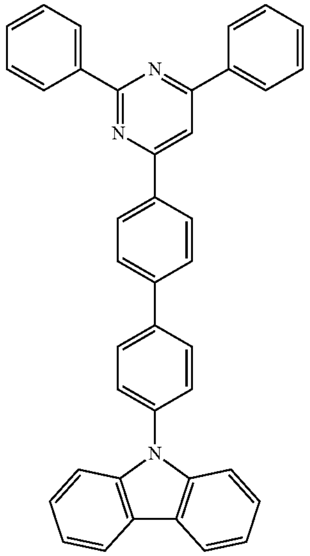

-continued
E14
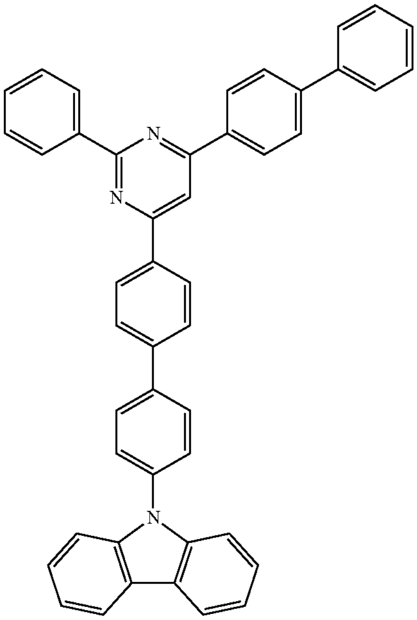
E15
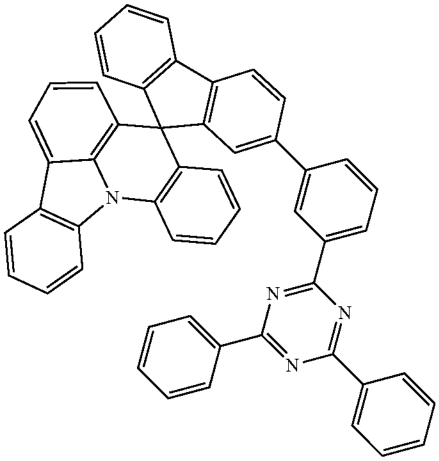
E16
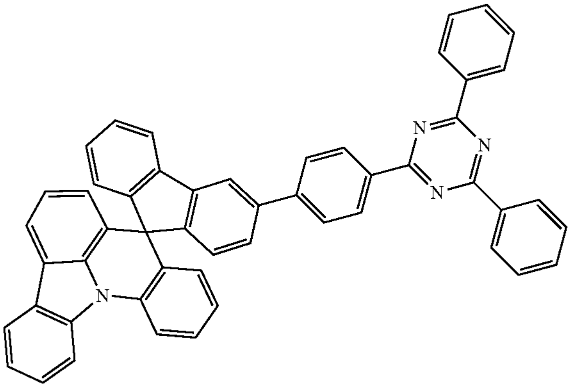
-continued
E17
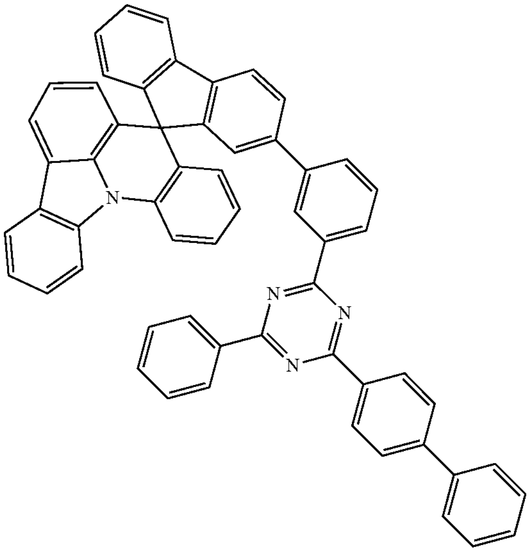
E18
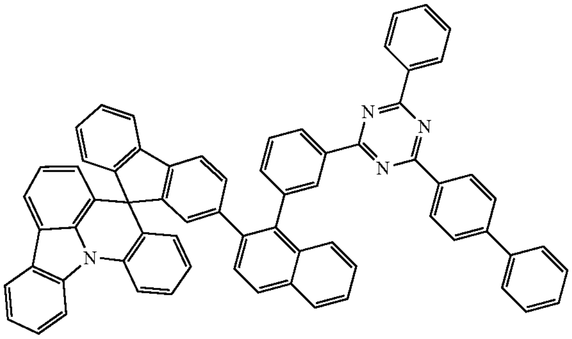
E19
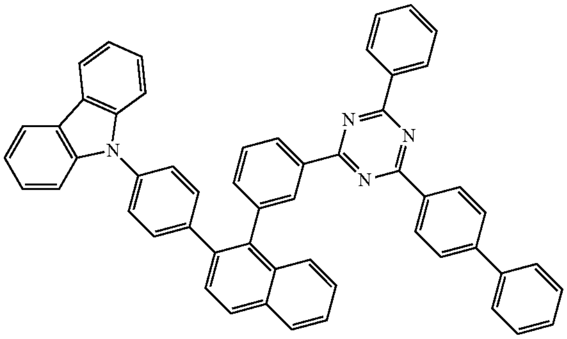

-continued

E20

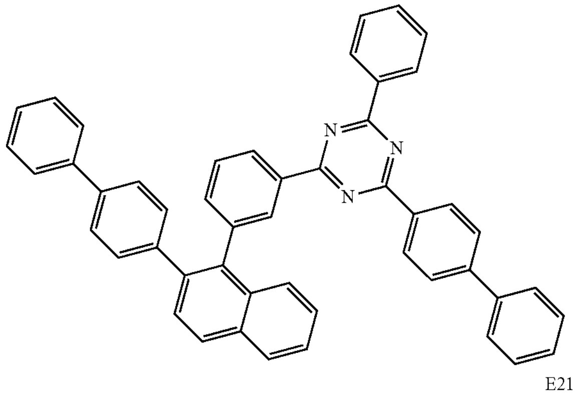

E21

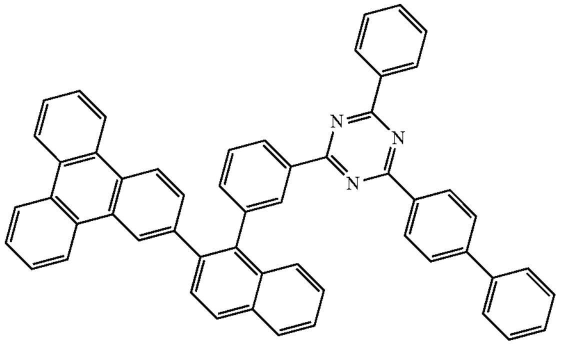

E22

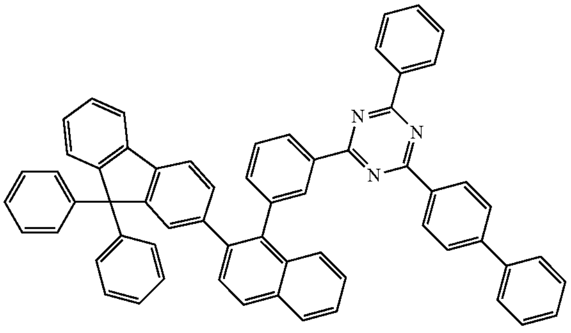

E23

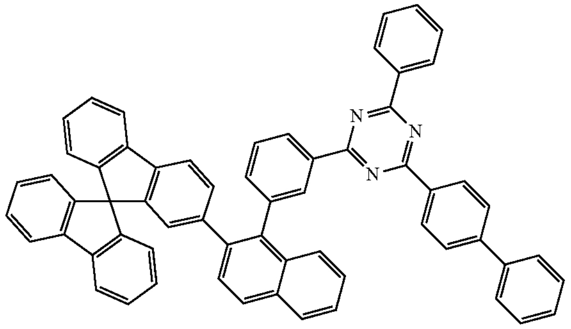

Alternatively, the HBL 250 may include a benzimidazole derivative as a hole blocking material. For example, the material of the HBL 250 may be represented by Formula 12:

Formula 12

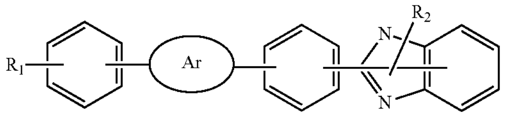

In Formula 12, Ar is $C_{10}$~$C_{30}$ arylene group, $R_1$ is $C_6$~$C_{30}$ aryl group or $C_5$~$C_{30}$ hetero aryl group, and $R_2$ is $C_1$~$C_{10}$ alkyl group or $C_6$~$C_{30}$ aryl group.

For example, Armay benaphthylene or anthracenylene, $R_1$ may be benzimidazole or phenyl, and $R_2$ may be methyl, ethyl or phenyl.

The hole blocking material of Formula 12 may be one of the followings of Formula 13:

Formula 13

F1

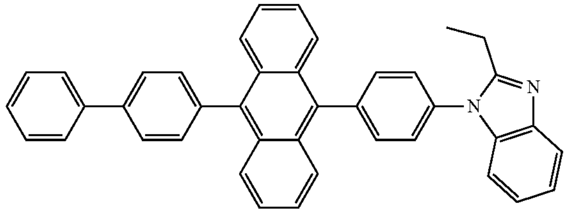

F2

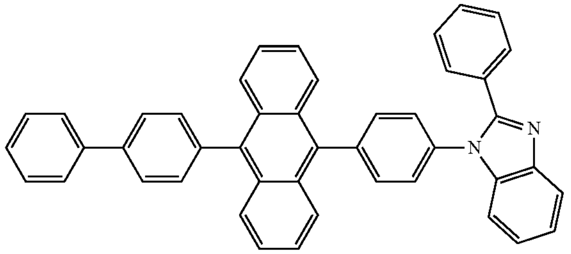

F3

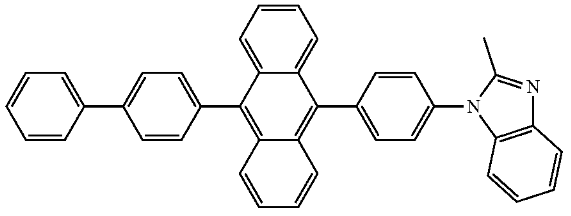

F4

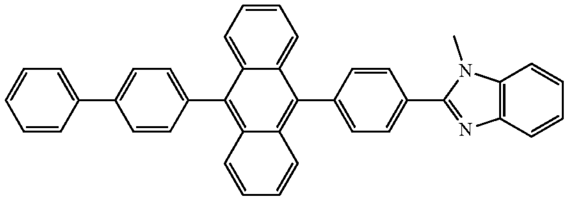

-continued

F5

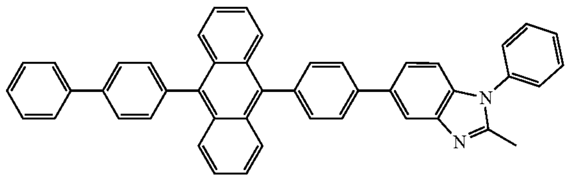

F6

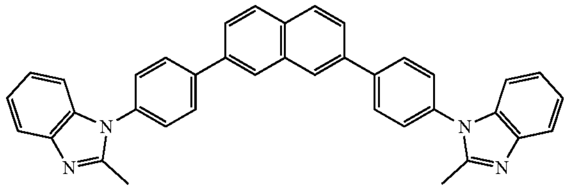

The HBL 250 may include one of the hole blocking material of Formula 10 and the hole blocking material of Formula 12.

In this instance, a thickness of the EML 240 may be greater than each of a thickness of the EBL 230 and a thickness of the HBL 250 and may be smaller than a thickness of the HTL 220. For example, the EML may have a thickness of about 150 to 250 Å, and each of the EBL 230 and the HBL 250 may have a thickness of about 50 to 150 Å. The HTL 220 may have a thickness of about 900 to 1100 Å. The EBL 230 and the HBL 250 may have the same thickness.

The HBL 250 may include both the hole blocking material of Formula 10 and the hole blocking material of Formula 12. For example, in the HBL 250, hole blocking material of Formula 10 and the hole blocking material of Formula 12 may have the same weight %.

In this instance, a thickness of the EML 240 may be greater than a thickness of the EBL 230 and may be smaller than a thickness of the HBL 250. In addition, the thickness of HBL 250 may be smaller than a thickness of the HTL 220. For example, the EML may have a thickness of about 200 to 300 Å, and the EBL 230 may have a thickness of about 50 to 150 Å. The HBL 250 may have a thickness of about 250 to 350 Å, and the HTL 220 may have a thickness of about 800 to 1000 Å.

The hole blocking material of Formula 10 and/or the hole blocking material of Formula 12 have an electron transporting property such that an electron transporting layer may be omitted. As a result, the HBL 250 directly contacts the EIL 260 or the second electrode 164 without the EIL 260.

As mentioned above, the EML 240 of the OLED D includes the host 242 of the anthracene derivative, the dopant 244 of the pyrene derivative, and at least one of the anthracene derivative 242 and the pyrene derivative 244 is deuterated. As a result, the OLED D and the organic light emitting display device 100 have advantages in the emitting efficiency and the lifespan.

When all of the hydrogen atoms of the anthracene derivative and/or all of the hydrogen atoms of the pyrene derivative are substituted by D, the emitting efficiency and the lifespan of the OLED D and the organic light emitting display device 100 are significantly increased.

When at least one of an anthracene core of the anthracene derivative 242 and a pyrene core of the pyrene derivative 244 is deuterated, the OLED D and the organic light emitting display device 100 have sufficient emitting efficiency and lifespan with minimizing the production cost increase.

In addition, the EBL 230 includes the electron blocking material of Formula 8 such that the emitting efficiency and the lifespan of the OLED D and the organic light emitting display device 100 are further improved.

Moreover, the HBL 250 includes at least one of the hole blocking material of Formula 10 and the hole blocking material of Formula 12 such that the lifespan of the OLED D and the organic light emitting display device 100 are further improved.

[Synthesis of the Host]

1. Synthesis of the Compound Host1D (1) Compound H-1

[Reaction Formula 1-1]

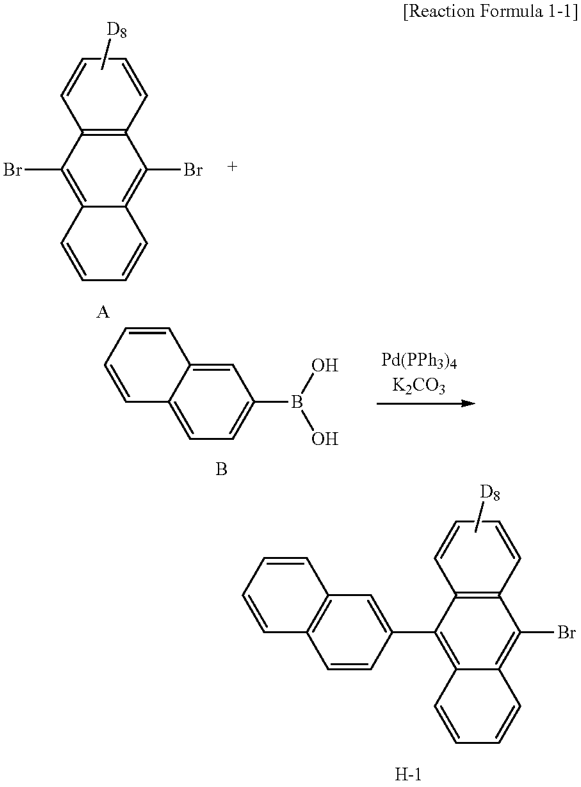

The compound A (11.90 mmol) and the compound B (13.12 mmol) were dissolved in toluene (100 mL), $Pd(PPh_3)_4$ (0.59 mmol) and 2M $K_2CO_3$ (24 mL) were slowly added into the mixture. The mixture was reacted for 48 hours. After cooling, the temperature is set to the room temperature, and the solvent was removed under the reduced pressure. The reaction mixture was extracted with chloroform. The extracted solution was washed twice with sodium chloride supersaturated solution and water, and then the organic layer was collected and dried over anhydrous magnesium sulfate. Thereafter, the solvent was evaporated to obtain a crude product, and the column chromatography using silica gel was performed to the crude product to obtain the compound H-1. (2.27 g, 57%)

(2) Compound Host1D

[Reaction Formula 1-2]

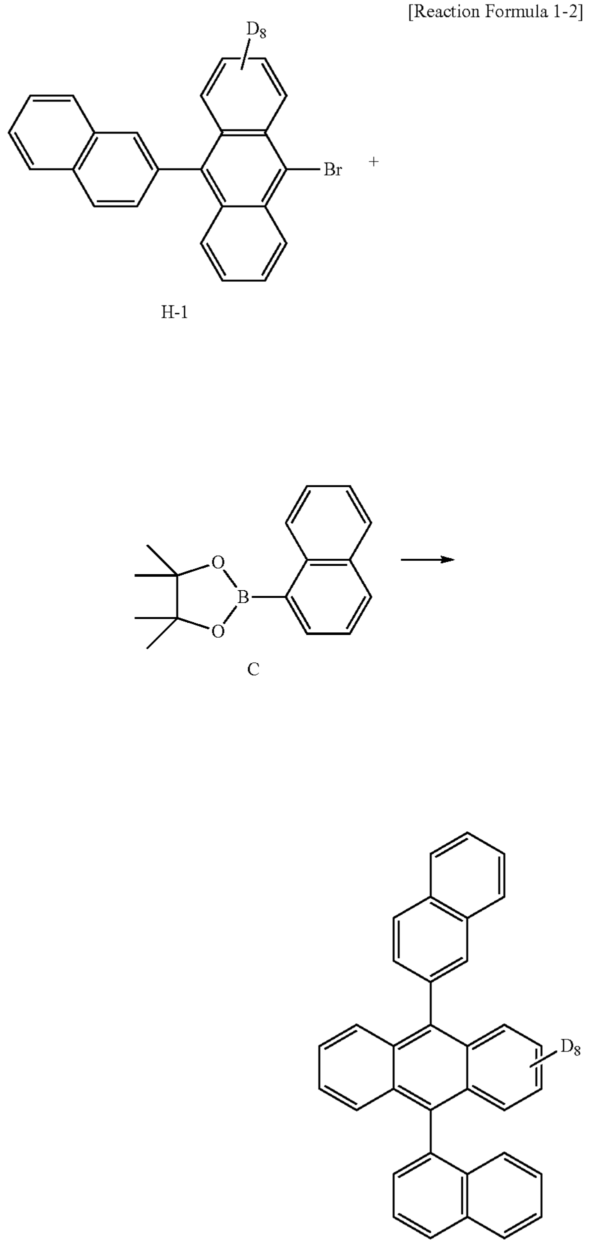

H-1

C

Host 1D

The compound H-1 (5.23 mmol), the compound C (5.74 mmol), tris(dibenzylideneacetone)dipalladium(0) (0.26 mmol) and toluene (50 mL) were added to the flask (250 mL) in a glove box. After the reaction flask was removed from the drying box, degassed aqueous sodium carbonate (2M, 20 mL) was added to the mixture. The mixture was stirred and heated at 90° C. overnight. The reaction was monitored by high-performance liquid chromatography (HPLC). After cooling to the room temperature, the organic layer was separated. The aqueous layer was washed twice with dichloromethane (DCM), and the organic layer was concentrated by rotary evaporation to obtain a gray powder. The compound Host1D was obtained by performing purification using neutral alumina, precipitation using hexane, and column chromatography using silica gel. (2.00 g, 89%)

2. Synthesis of the Compound Host2D (1) Compound H-2

[Reaction Formula 2-1]

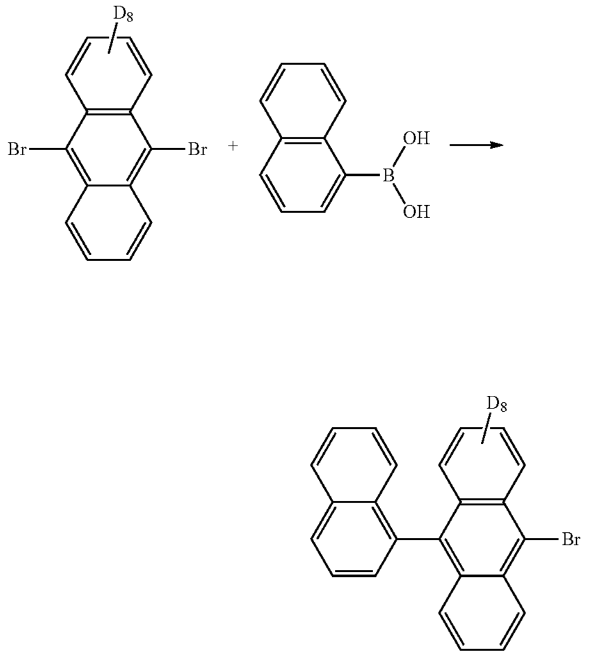

In the synthesis of the compound H-1, the compound D was used instead of the compound B to obtain the compound H-2.

(2) Compound Host2D

[Reaction Formula 2-2]

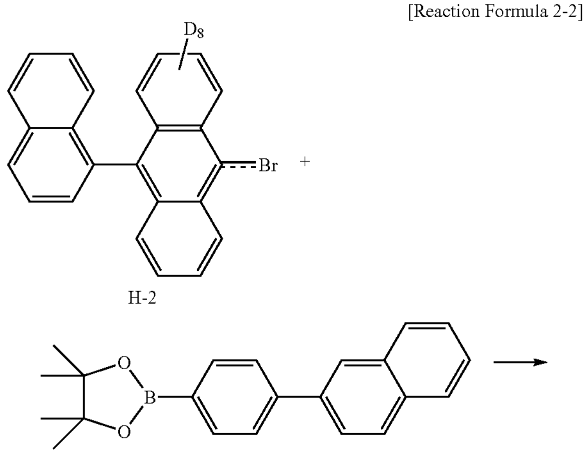

H-2

E

-continued

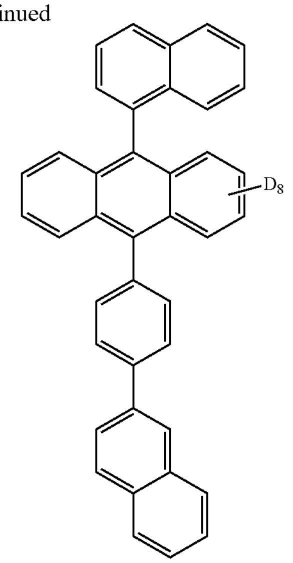

Host 2D

The compound H-2 (5.23 mmol), the compound E (5.74 mmol), tris(dibenzylideneacetone)dipalladium(0) (0.26 mmol) and toluene (50 mL) were added to the flask (250 mL) in a glove box. After the reaction flask was removed from the drying box, degassed aqueous sodium carbonate (2M, 20 mL) was added to the mixture. The mixture was stirred and heated at 90° C. overnight. The reaction was monitored by HPLC. After cooling to the room temperature, the organic layer was separated. The aqueous layer was washed twice with DCM, and the organic layer was concentrated by rotary evaporation to obtain a gray powder. The compound Host2D was obtained by performing purification using neutral alumina, precipitation using hexane, and column chromatography using silica gel. (2.28 g, 86%)

3. Synthesis of the Compound Host3D (1) Compound H-3

[Reaction Formula 3-1]

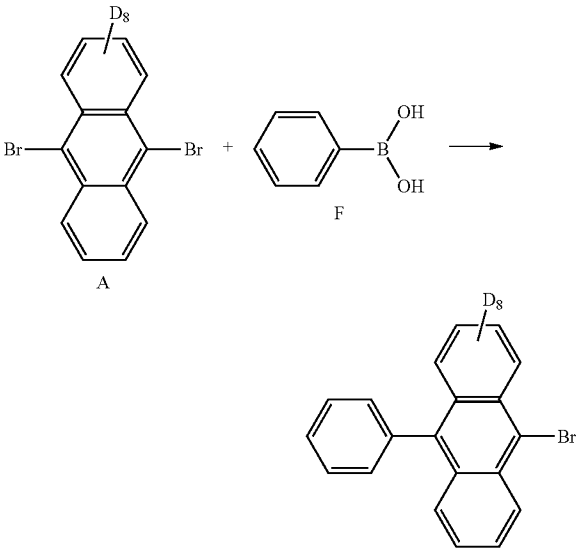

A

F

H-3

In the synthesis of the compound H-1, the compound F was used instead of the compound B to obtain the compound H-3.

(2) Compound Host3D

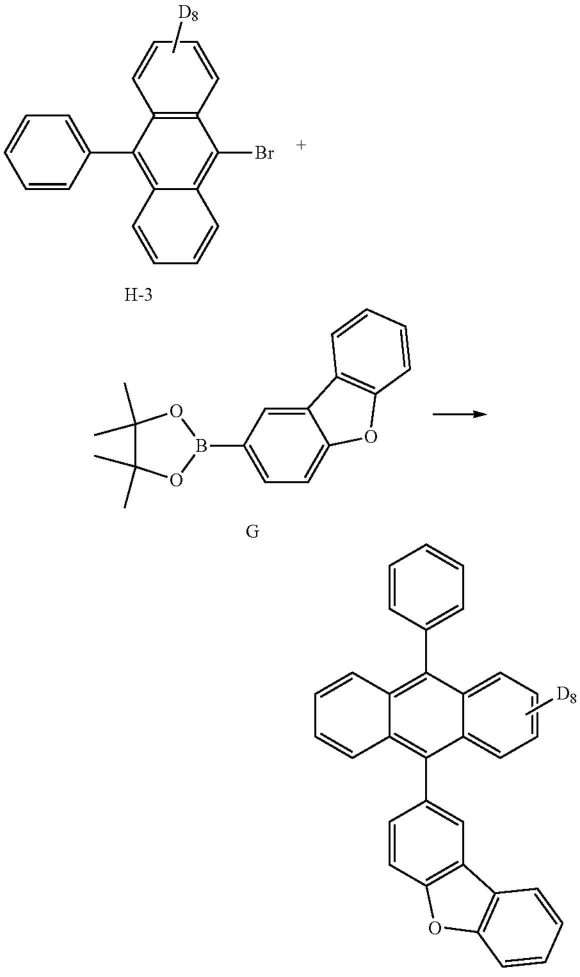

H-3

G

Host 3D

The compound H-3 (5.23 mmol), the compound G (5.74 mmol), tris(dibenzylideneacetone)dipalladium(0) (0.26 mmol) and toluene (50 mL) were added to the flask (250 mL) in a glove box. After the reaction flask was removed from the drying box, degassed aqueous sodium carbonate (2M, 20 mL) was added to the mixture. The mixture was stirred and heated at 90° C. overnight. The reaction was monitored by HPLC. After cooling to the room temperature, the organic layer was separated. The aqueous layer was washed twice with DCM, and the organic layer was concentrated by rotary evaporation to obtain a gray powder. The compound Host3D was obtained by performing purification using neutral alumina, precipitation using hexane, and column chromatography using silica gel. (1.71 g, 78%)

4. Synthesis of the Compound Host4D

[Reaction Formula 4]

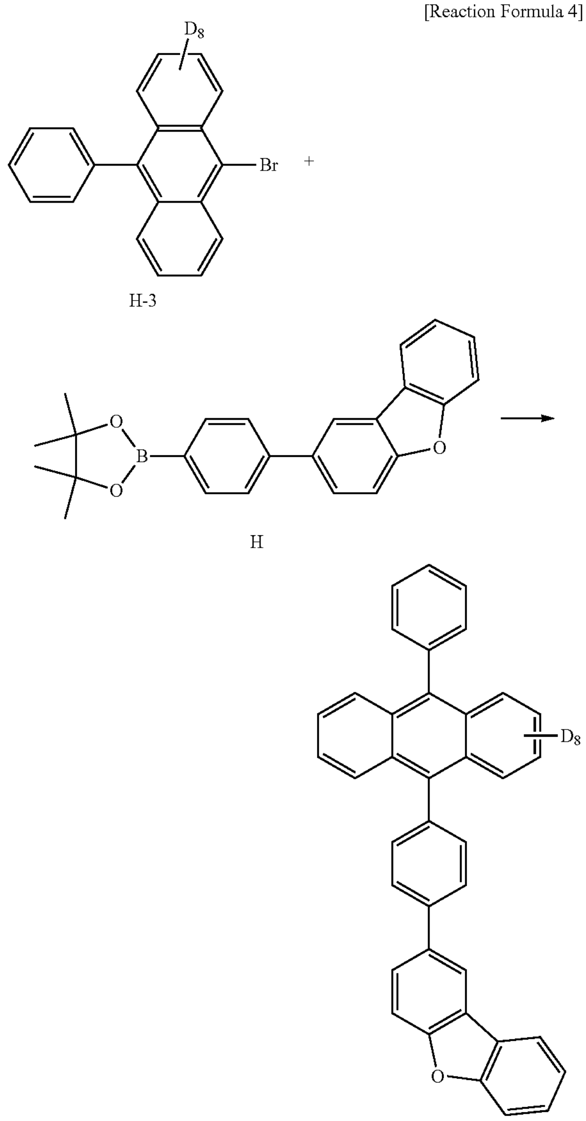

H-3

H

Host 4D

The compound H-3 (5.23 mmol), the compound H (5.74 mmol), tris(dibenzylideneacetone)dipalladium(0) (0.26 mmol) and toluene (50 mL) were added to the flask (250 mL) in a glove box. After the reaction flask was removed from the drying box, degassed aqueous sodium carbonate (2M, 20 mL) was added to the mixture. The mixture was stirred and heated at 90° C. overnight. The reaction was monitored by HPLC. After cooling to the room temperature, the organic layer was separated. The aqueous layer was washed twice with DCM, and the organic layer was concentrated by rotary evaporation to obtain a gray powder. The compound Host4D was obtained by performing purification using neutral alumina, precipitation using hexane, and column chromatography using silica gel. (1.75 g, 67%)

[Synthesis of the Dopant]

1. Synthesis of the Compound Dopant1D (1) Compound D-1

[Reaction Formula 5-1]

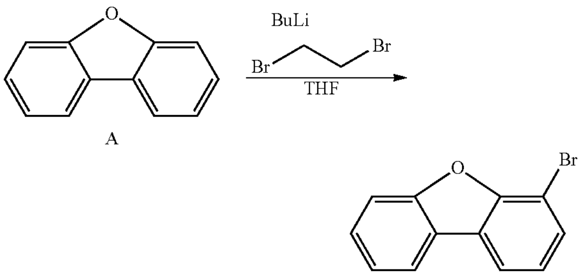

A

D-1

Under argon conditions, dibenzofuran (30.0 g) and dehydrated tetrahydrofuran (THF, 300 mL) were added to a distillation flask (1000 mL). The mixture was cooled to −65° C., and n-butyllithium hexane solution (1.65 M, 120 mL) was added. The mixture was slowly heated up and reacted at the room temperature for 3 hours. After the mixture was cooled to −65° C. again, 1,2-dibromoethane (23.1 mL) was added. The mixture was slowly heated up and reacted at the room temperature for 3 hours. 2N hydrochloric acid and ethyl acetate were added into the mixture for separation and extraction, and the organic layer was washed with water and saturated brine and dried over sodium sulfate. The crude product obtained by concentration was purified by silica gel chromatography using methylene chloride, and the obtained solid was dried under reduced pressure to obtain the compound D-1. (43.0 g)

(2) Compound D-2

[Reaction Formula 5-2]

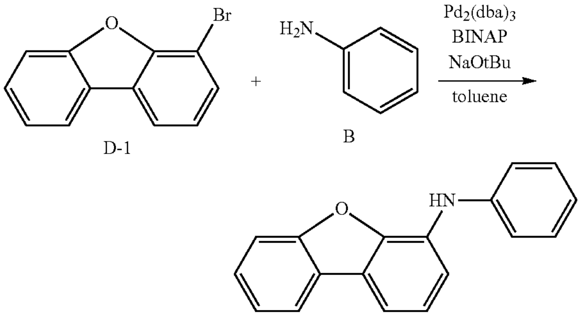

D-1

B

D-2

Under argon conditions, the compound D-1 (11.7 g), the compound B (10.7 mL), tris(dibenzylideneacetone)dipalladium(0) (Pd2(dba)$_3$, 0.26 mmol), 2,2'-bis(diphenylphosphino)-1,1'-binapthyl (BINAP, 0.87 g), sodium tert-butoxide (9.1 g), and dehydrated toluene (131 mL) were added to a distillation flask (300 mL) and reacted at 85° C. for 6 hours. After cooling, the reaction solution was filtered through celite. The obtained crude product was purified by silica gel chromatography using n-hexane and methylene chloride (volume ratio=3:1), and the obtained solid was dried under reduced pressure to obtain compound D-2. (10.0 g)

(3) Compound Dopant1D

[Reaction Formula 5-3]

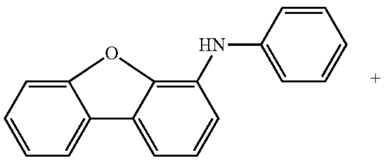

D-2

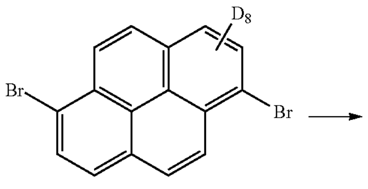

C

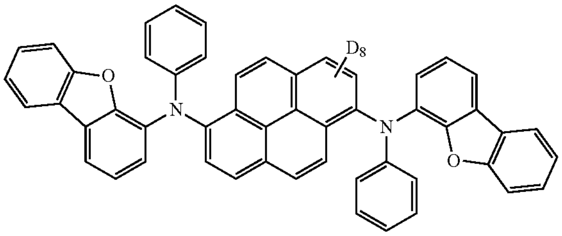

Dopant 1D

Under argon conditions, the compound D-2 (8.6 g), the compound C (4.8 g), sodium tert-butoxide (2.5 g), palladium (II)acetate (Pd(OAc)$_2$, 150 mg), tri-tert-butylphosphine (135 mg), and dehydrated toluene (90 mL) were added into a distillation flask (300 mL) and reacted at 85° C. for 7 hours. The reaction solution was filtered, and the obtained crude product was purified by silica gel chromatography using toluene. The obtained solid was recrystallized using toluene and dried under reduced pressure to obtain the compound Dopant1D. (8.3 g)

2. Synthesis of the Compound Dopant2D

[Reaction Formula 6]

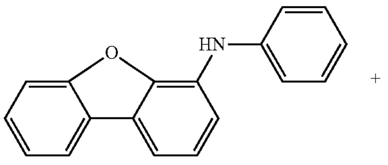

D-2

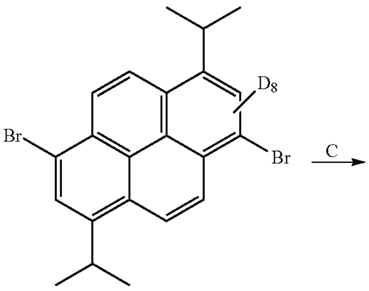

D

-continued

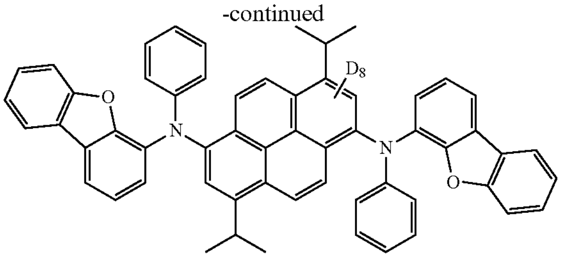

Dopant 2D

In the synthesis of the compound Dopant1D, the compound D was used instead of the compound C to obtain the compound Dopant2D.

[Organic Light Emitting Diode]

The anode (ITO, 0.5 mm), the HIL (Formula 13 (97 wt %) and Formula 14 (3 wt %), 100 Å), the HTL (Formula 13, 1000 Å), the EBL (100 Å), the EML (host (98 wt %) and dopant (2 wt %), 200 Å), the HBL (100 Å), the EIL (Formula 15 (98 wt %) and $L_1$ (2 wt %), 200 Å) and the cathode (Al, 500 Å) was sequentially deposited, and an encapsulation film was formed on the cathode using UV epoxy resin and moisture getter to form the OLED.

[Formula 13]

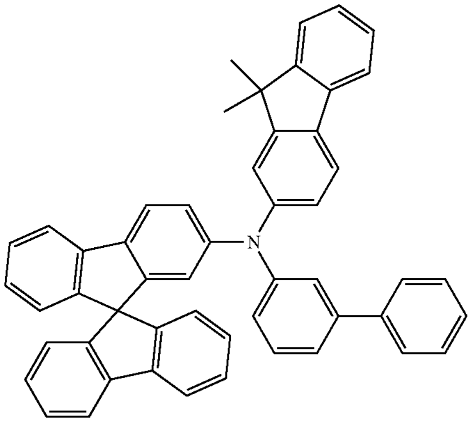

[Formula 14]

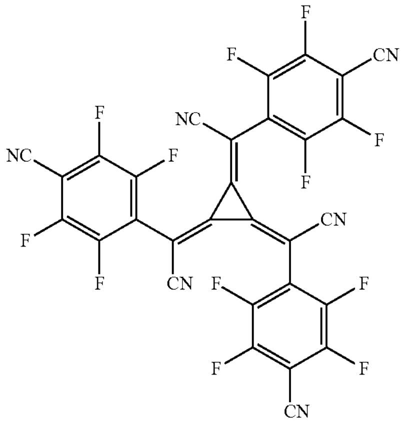

[Formula 15]

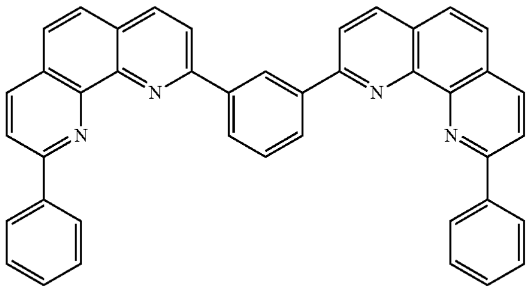

1. COMPARATIVE EXAMPLES (1) Comparative Examples 1 to 6 (Ref1 to Ref6)

The compound "Dopant1" in Formula 16 is used as the dopant, and the compound "Host1" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(2) Comparative Examples 7 to 12 (Ref7 to Ref12)

The compound "Dopant1" in Formula 16 is used as the dopant, and the compound "Host2" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(3) Comparative Examples 13 to 18 (Ref13 to Ref18)

The compound "Dopant1" in Formula 16 is used as the dopant, and the compound "Host3" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(4) Comparative Examples 19 to 24 (Ref19 to Ref24)

The compound "Dopant1" in Formula 16 is used as the dopant, and the compound "Host4" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(5) Comparative Examples 25 to 30 (Ref25 to Ref30)

The compound "Dopant2" in Formula 16 is used as the dopant, and the compound "Host1" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(6) Comparative Examples 31 to 36 (Ref31 to Ref36)

The compound "Dopant2" in Formula 16 is used as the dopant, and the compound "Host2" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(7) Comparative Examples 37 to 42 (Ref37 to Ref42)

The compound "Dopant2" in Formula 16 is used as the dopant, and the compound "Host3" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(8) Comparative Examples 43 to 48 (Ref43 to Ref48)

The compound "Dopant2" in Formula 16 is used as the dopant, and the compound "Host4" of Formula 17 are used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

2. EXAMPLES (1) Examples 1 to 24 (Ex1 to Ex24)

The compound "Dopant1" in Formula 16 is used as the dopant, and the compounds "Host1D", "Host1D-A", "Host1D-P1", "Host1D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(2) Examples 25 to 54 (Ex25 to Ex54)

The compound "Dopant1D" in Formula 16 is used as the dopant, and the compounds "Host1", "Host1D", "Host1D-A", "Host1D-P1", "Host1D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(3) Examples 55 to 84 (Ex55 to Ex84)

The compound "Dopant1D-A" in Formula 16 is used as the dopant, and the compounds "Host1", "Host1D", "Host1D-A", "Host1D-P1", "Host1D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(4) Examples 85 to 108 (Ex85 to Ex108)

The compound "Dopant1" in Formula 16 is used as the dopant, and the compounds "Host2D", "Host2D-A", "Host2D-P1", "Host2D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(5) Examples 109 to 138 (Ex109 to Ex138)

The compound "Dopant1D" in Formula 16 is used as the dopant, and the compounds "Host2", "Host2D", "Host2D-A", "Host2D-P1", "Host2D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(6) Examples 139 to 168 (Ex139 to Ex168)

The compound "Dopant1D-A" in Formula 16 is used as the dopant, and the compounds "Host2", "Host2D", "Host2D-A", "Host2D-P1", "Host2D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(7) Examples 169 to 192 (Ex169 to Ex192)

The compound "Dopant1" in Formula 16 is used as the dopant, and the compounds "Host3D", "Host3D-A", "Host3D-P1", "Host3D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(8) Examples 193 to 222 (Ex193 to Ex222)

The compound "Dopant1D" in Formula 16 is used as the dopant, and the compounds "Host3", "Host3D", "Host3D-A", "Host3D-P1", "Host3D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(9) Examples 223 to 252 (Ex223 to Ex252)

The compound "Dopant1D-A" in Formula 16 is used as the dopant, and the compounds "Host3", "Host3D", "Host3D-A", "Host3D-P1", "Host3D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(10) Examples 253 to 276 (Ex253 to Ex276)

The compound "Dopant1" in Formula 16 is used as the dopant, and the compounds "Host4D", "Host4D-A", "Host4D-P1", "Host4D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(11) Examples 277 to 306 (Ex277 to Ex306)

The compound "Dopant1D" in Formula 16 is used as the dopant, and the compounds "Host4", "Host4D", "Host4D-A", "Host4D-P1", "Host4D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(12) Examples 307 to 336 (Ex307 to Ex336)

The compound "Dopant1D-A" in Formula 16 is used as the dopant, and the compounds "Host4", "Host4D", "Host4D-A", "Host4D-P1", "Host4D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(13) Examples 337 to 360 (Ex337 to Ex360)

The compound "Dopant2" in Formula 16 is used as the dopant, and the compounds "Host1D", "Host1D-A", "Host1D-P1", "Host1D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(14) Examples 361 to 390 (Ex361 to Ex390)

The compound "Dopant2D" in Formula 16 is used as the dopant, and the compounds "Host1", "Host1D", "Host1D-A", "Host1D-P1", "Host1D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(15) Examples 391 to 420 (Ex391 to Ex420)

The compound "Dopant2D-A" in Formula 16 is used as the dopant, and the compounds "Host1", "Host1D", "Host1D-A", "Host1D-P1", "Host1D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(16) Examples 421 to 444 (Ex421 to Ex444)

The compound "Dopant2" in Formula 16 is used as the dopant, and the compounds "Host2D", "Host2D-A", "Host2D-P1", "Host2D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(17) Examples 445 to 474 (Ex445 to Ex474)

The compound "Dopant2D" in Formula 16 is used as the dopant, and the compounds "Host2", "Host2D", "Host2D-A", "Host2D-P1", "Host2D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(18) Examples 475 to 504 (Ex475 to Ex504)

The compound "Dopant2D-A" in Formula 16 is used as the dopant, and the compounds "Host2", "Host2D", "Host2D-A", "Host2D-P1", "Host2D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(19) Examples 505 to 528 (Ex505 to Ex528)

The compound "Dopant2" in Formula 16 is used as the dopant, and the compounds "Host3D", "Host3D-A", "Host3D-P1", "Host3D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(20) Examples 529 to 558 (Ex529 to Ex558)

The compound "Dopant2D" in Formula 16 is used as the dopant, and the compounds "Host3", "Host3D", "Host3D-A", "Host3D-P1", "Host3D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(21) Examples 559 to 588 (Ex559 to Ex588)

The compound "Dopant2D-A" in Formula 16 is used as the dopant, and the compounds "Host3", "Host3D", "Host3D-A", "Host3D-P1", "Host3D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(22) Examples 589 to 612 (Ex589 to Ex612)

The compound "Dopant2" in Formula 16 is used as the dopant, and the compounds "Host4D", "Host4D-A", "Host4D-P1", "Host4D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(23) Examples 613 to 642 (Ex613 to Ex642)

The compound "Dopant2D" in Formula 16 is used as the dopant, and the compounds "Host4", "Host4D", "Host4D-A", "Host4D-P1", "Host4D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

(24) Examples 643 to 672 (Ex643 to Ex672)

The compound "Dopant2D-A" in Formula 16 is used as the dopant, and the compounds "Host4", "Host4D", "Host4D-A", "Host4D-P1", "Host4D-P2" of Formula 17 are respectively used as the host to form the EML. The compounds "Ref_EBL" (Ref) of Formula 18 and "EBL" of Formula 19 are respectively used as the electron blocking material, and the compound "Ref_HBL" (Ref) of Formula 20, the compound "HBL1" of Formula 21 and the compound "HBL2" of Formula 22 are respectively used as the hole blocking material.

Formula 16

Dopant 1

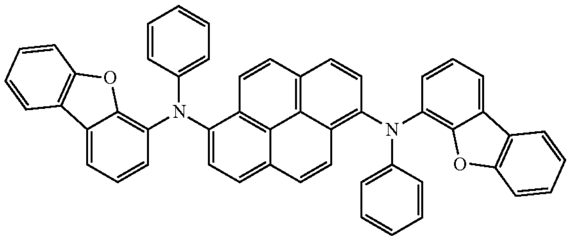

Dopant 1D

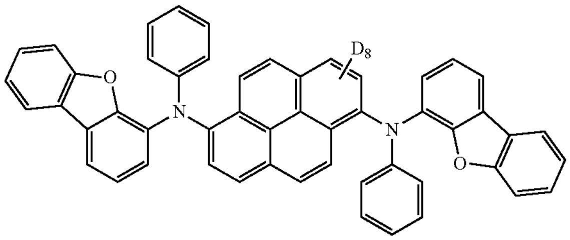

Dopant 1D-A

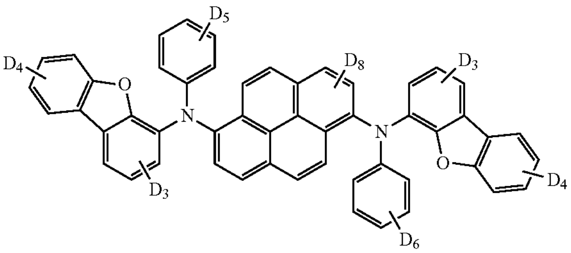

-continued

Dopant 2

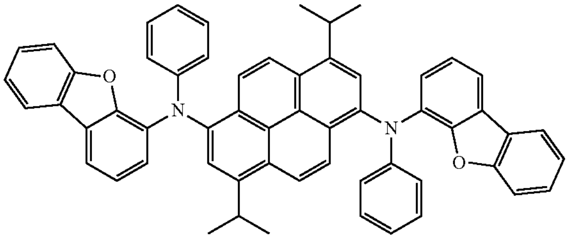

Dopant 2D

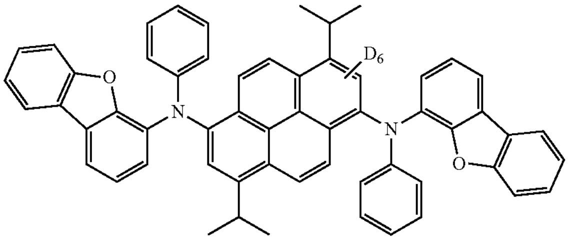

Dopant 2D-A

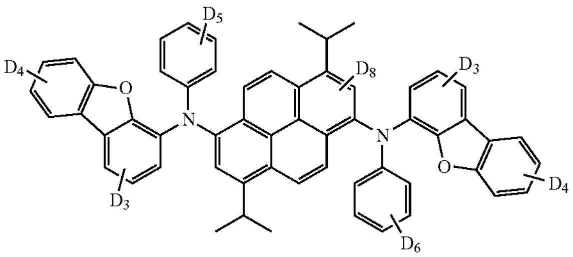

[Formula 17]

Host 1

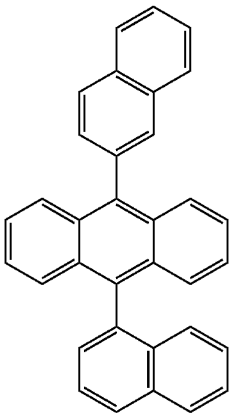

-continued
Host 1D
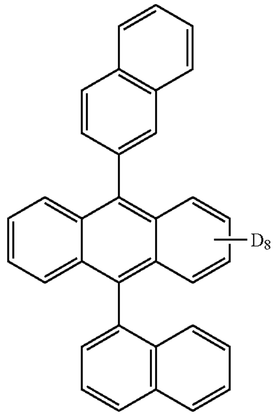
Host 1D-A
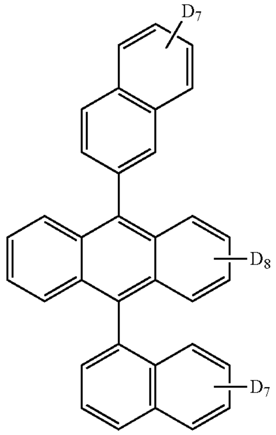
Host 1D-P1
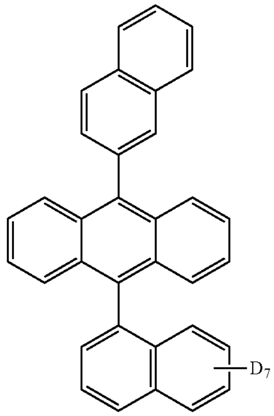
-continued
Host 1D-P2
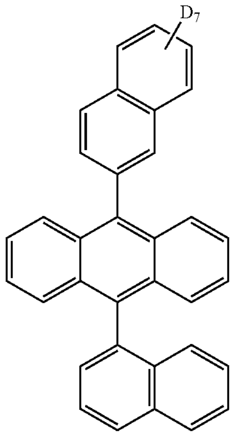
Host 2
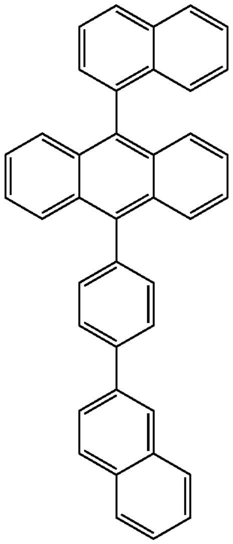
Host 2D
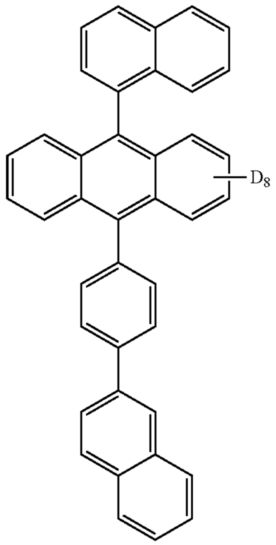

-continued
Host 2D-A
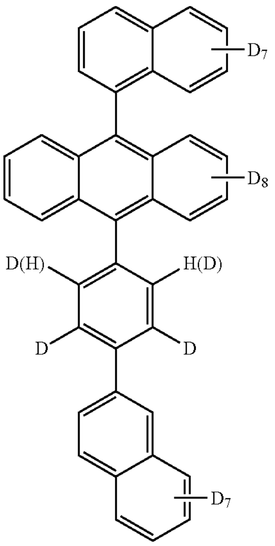
Host 2D-P1
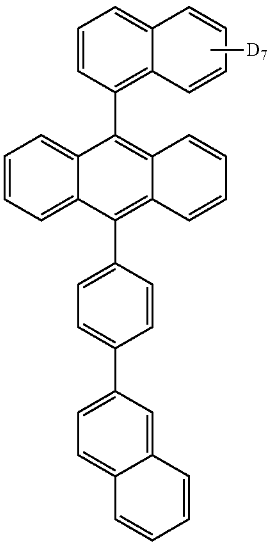
Host 2D-P2
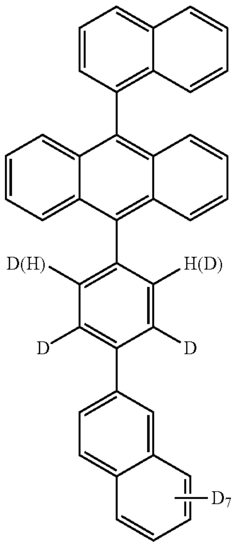
-continued
Host 3
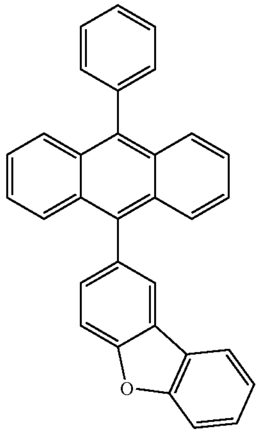
Host 3D
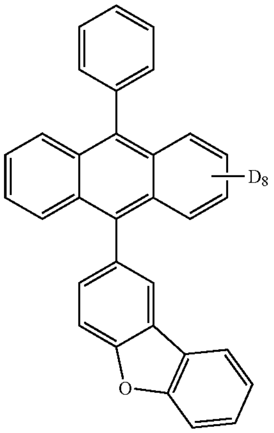
Host 3D-A
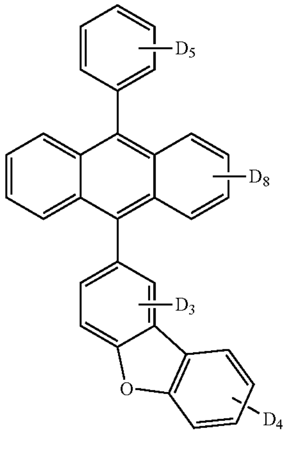

-continued
Host 3D-P1
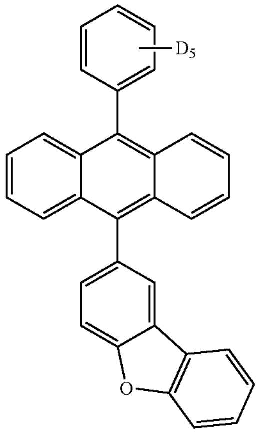
Host 3D-P2
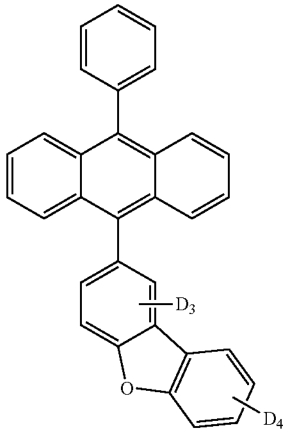
Host 4
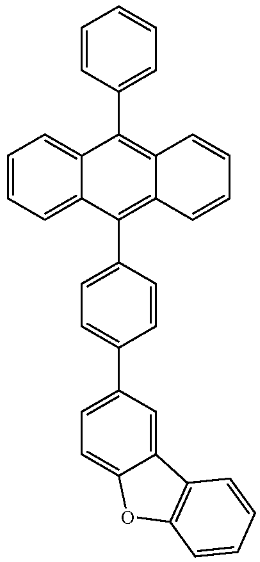
-continued
Host 4D
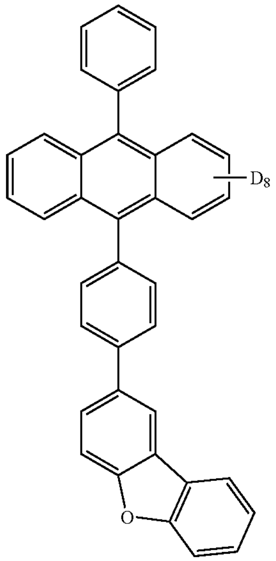
Host 4D-A
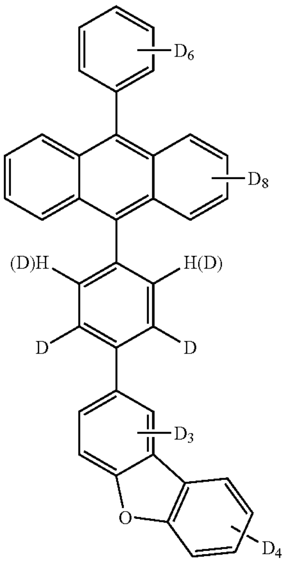

-continued
Host 4D-P1
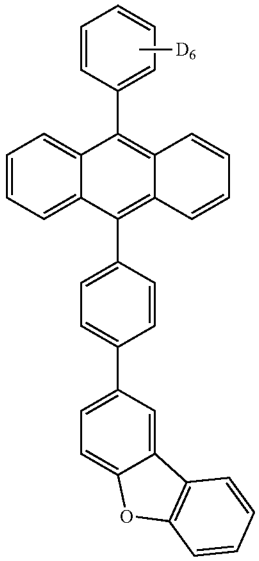
Host 4D-P2
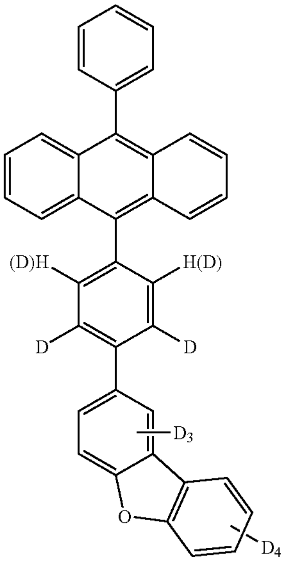
[Formula 18]
Ref_EBL
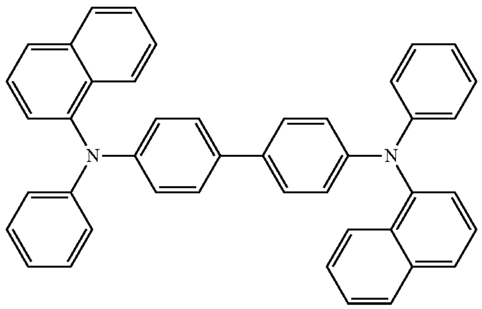
[Formula 19]
EBL
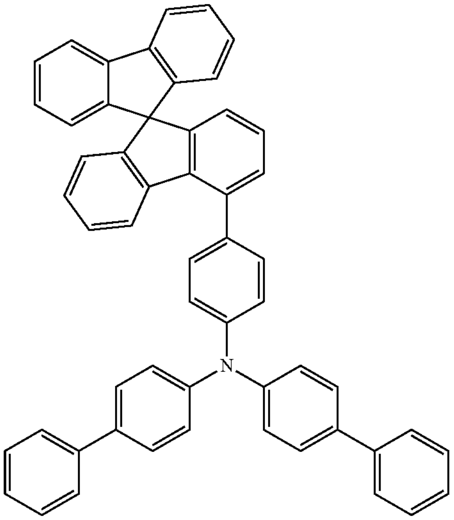
[Formula 20]
Ref_HBL
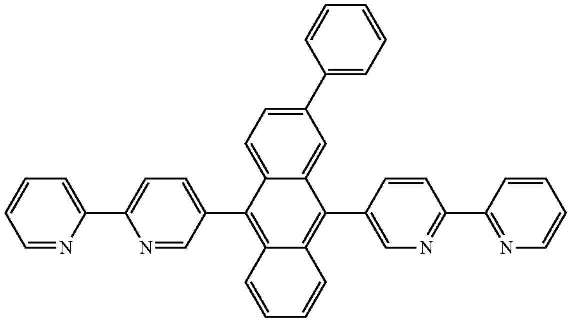
[Formula 21]
HBL1
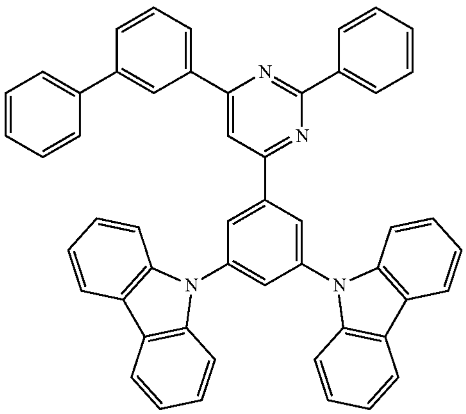

[Formula 22]

HBL2

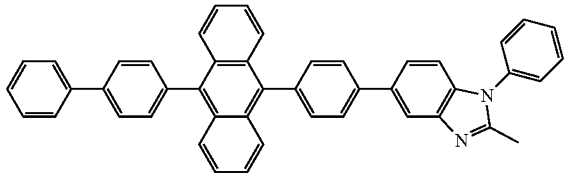

The properties, i.e., voltage (V), efficiency (cd/A), color coordinate (CIE), FWHM and lifespan (T95), of the OLEDs manufactured in Comparative Examples 1 to 48 and Examples 1 to 672 are measured and listed in Tables 1 to 40.

TABLE 1

| | EBL | EML | | HBL | V | cd/A | CIE (x, y) | | T95 [hr] |
|---|---|---|---|---|---|---|---|---|---|
| Ref 1 | Ref. | Dopant 1 | Host 1 | Ref. | 4.03 | 4.97 | 0.1412 | 0.1039 | 154 |
| Ref 2 | Ref. | Dopant 1 | Host 1 | HBL1 | 4.03 | 5.96 | 0.1412 | 0.1039 | 257 |
| Ref 3 | Ref. | Dopant 1 | Host 1 | HBL2 | 3.88 | 6.29 | 0.1382 | 0.1019 | 205 |
| Ref 4 | EBL | Dopant 1 | Host 1 | Ref. | 3.83 | 5.30 | 0.1382 | 0.1019 | 193 |
| Ref 5 | EBL | Dopant 1 | Host 1 | HBL1 | 3.83 | 6.62 | 0.1382 | 0.1019 | 321 |
| Ref 6 | EBL | Dopant 1 | Host 1 | HBL2 | 3.68 | 7.94 | 0.1382 | 0.1009 | 257 |
| Ex 1 | Ref. | Dopant 1 | Host 1D | Ref. | 4.04 | 4.95 | 0.1423 | 0.1039 | 264 |
| Ex 2 | Ref. | Dopant 1 | Host 1D | HBL1 | 4.04 | 5.94 | 0.1423 | 0.1039 | 439 |
| Ex 3 | Ref. | Dopant 1 | Host 1D | HBL2 | 3.89 | 6.27 | 0.1393 | 0.1019 | 351 |
| Ex 4 | EBL | Dopant 1 | Host 1D | Ref. | 3.84 | 5.28 | 0.1393 | 0.1019 | 329 |
| Ex 5 | EBL | Dopant 1 | Host 1D | HBL1 | 3.84 | 6.60 | 0.1393 | 0.1019 | 549 |
| Ex 6 | EBL | Dopant 1 | Host 1D | HBL2 | 3.69 | 7.92 | 0.1393 | 0.1009 | 439 |
| Ex 7 | Ref. | Dopant 1 | Host 1D-A | Ref. | 4.02 | 4.96 | 0.1414 | 0.1038 | 270 |
| Ex 8 | Ref. | Dopant 1 | Host 1D-A | HBL1 | 4.02 | 5.95 | 0.1414 | 0.1038 | 450 |
| Ex 9 | Ref. | Dopant 1 | Host 1D-A | HBL2 | 3.87 | 6.28 | 0.1384 | 0.1018 | 360 |
| Ex 10 | EBL | Dopant 1 | Host 1D-A | Ref. | 3.82 | 5.29 | 0.1384 | 0.1018 | 337 |
| Ex 11 | EBL | Dopant 1 | Host 1D-A | HBL1 | 3.82 | 6.61 | 0.1384 | 0.1018 | 562 |
| Ex 12 | EBL | Dopant 1 | Host 1D-A | HBL2 | 3.67 | 7.93 | 0.1384 | 0.1008 | 450 |

TABLE 2

| | EBL | EML | | HBL | V | cd/A | CIE (x, y) | | T95 [hr] |
|---|---|---|---|---|---|---|---|---|---|
| Ex 13 | Ref. | Dopant 1 | Host 1D-P1 | Ref. | 4.03 | 4.95 | 0.1411 | 0.1040 | 154 |
| Ex 14 | Ref. | Dopant 1 | Host 1D-P1 | HBL1 | 4.03 | 5.94 | 0.1411 | 0.1040 | 256 |
| Ex 15 | Ref. | Dopant 1 | Host 1D-P1 | HBL2 | 3.88 | 6.27 | 0.1381 | 0.1020 | 205 |
| Ex 16 | EBL | Dopant 1 | Host 1D-P1 | Ref. | 3.83 | 5.28 | 0.1381 | 0.1020 | 192 |
| Ex 17 | EBL | Dopant 1 | Host 1D-P1 | HBL1 | 3.83 | 6.60 | 0.1381 | 0.1020 | 320 |
| Ex 18 | EBL | Dopant 1 | Host 1D-P1 | HBL2 | 3.68 | 7.92 | 0.1381 | 0.1010 | 256 |
| Ex 19 | Ref. | Dopant 1 | Host 1D-P2 | Ref. | 4.04 | 4.97 | 0.1415 | 0.1039 | 154 |
| Ex 20 | Ref. | Dopant 1 | Host 1D-P2 | HBL1 | 4.04 | 5.96 | 0.1415 | 0.1039 | 257 |
| Ex 21 | Ref. | Dopant 1 | Host 1D-P2 | HBL2 | 3.89 | 6.29 | 0.1385 | 0.1019 | 205 |
| Ex 22 | EBL | Dopant 1 | Host 1D-P2 | Ref. | 3.84 | 5.30 | 0.1385 | 0.1019 | 193 |
| Ex 23 | EBL | Dopant 1 | Host 1D-P2 | HBL1 | 3.84 | 6.62 | 0.1385 | 0.1019 | 321 |
| Ex 24 | EBL | Dopant 1 | Host 1D-P2 | HBL2 | 3.69 | 7.94 | 0.1385 | 0.1009 | 257 |
| Ex 25 | Ref. | Dopant 1D | Host 1 | Ref. | 4.03 | 4.96 | 0.1420 | 0.1038 | 200 |
| Ex 26 | Ref. | Dopant 1D | Host 1 | HBL1 | 4.03 | 5.95 | 0.1420 | 0.1038 | 334 |
| Ex 27 | Ref. | Dopant 1D | Host 1 | HBL2 | 3.88 | 6.28 | 0.1390 | 0.1018 | 267 |
| Ex 28 | EBL | Dopant 1D | Host 1 | Ref. | 3.83 | 5.29 | 0.1390 | 0.1018 | 250 |
| Ex 29 | EBL | Dopant 1D | Host 1 | HBL1 | 3.83 | 6.61 | 0.1390 | 0.1018 | 417 |
| Ex 30 | EBL | Dopant 1D | Host 1 | HBL2 | 3.68 | 7.93 | 0.1390 | 0.1008 | 334 |

TABLE 3

| | EBL | EML | | HBL | V | cd/A | CIE (x, y) | | T95 [hr] |
|---|---|---|---|---|---|---|---|---|---|
| Ex 31 | Ref. | Dopant 1D | Host 1D | Ref. | 4.03 | 4.96 | 0.1422 | 0.1038 | 338 |
| Ex 32 | Ref. | Dopant 1D | Host 1D | HBL1 | 4.03 | 5.95 | 0.1422 | 0.1038 | 563 |
| Ex 33 | Ref. | Dopant 1D | Host 1D | HBL2 | 3.88 | 6.28 | 0.1392 | 0.1018 | 451 |
| Ex 34 | EBL | Dopant 1D | Host 1D | Ref. | 3.83 | 5.29 | 0.1392 | 0.1018 | 422 |
| Ex 35 | EBL | Dopant 1D | Host 1D | HBL1 | 3.83 | 6.61 | 0.1392 | 0.1018 | 704 |
| Ex 36 | EBL | Dopant 1D | Host 1D | HBL2 | 3.68 | 7.93 | 0.1392 | 0.1008 | 563 |
| Ex 37 | Ref. | Dopant 1D | Host 1D-A | Ref. | 4.04 | 4.95 | 0.1420 | 0.1039 | 350 |
| Ex 38 | Ref. | Dopant 1D | Host 1D-A | HBL1 | 4.04 | 5.94 | 0.1420 | 0.1039 | 584 |
| Ex 39 | Ref. | Dopant 1D | Host 1D-A | HBL2 | 3.89 | 6.27 | 0.1390 | 0.1019 | 467 |
| Ex 40 | EBL | Dopant 1D | Host 1D-A | Ref. | 3.84 | 5.28 | 0.1390 | 0.1019 | 438 |
| Ex 41 | EBL | Dopant 1D | Host 1D-A | HBL1 | 3.84 | 6.60 | 0.1390 | 0.1019 | 730 |
| Ex 42 | EBL | Dopant 1D | Host 1D-A | HBL2 | 3.69 | 7.92 | 0.1390 | 0.1009 | 584 |
| Ex 43 | Ref. | Dopant 1D | Host 1D-P1 | Ref. | 4.02 | 4.96 | 0.1421 | 0.1040 | 200 |
| Ex 44 | Ref. | Dopant 1D | Host 1D-P1 | HBL1 | 4.02 | 5.95 | 0.1421 | 0.1040 | 334 |
| Ex 45 | Ref. | Dopant 1D | Host 1D-P1 | HBL2 | 3.87 | 6.28 | 0.1391 | 0.1020 | 267 |
| Ex 46 | EBL | Dopant 1D | Host 1D-P1 | Ref. | 3.82 | 5.29 | 0.1391 | 0.1020 | 250 |
| Ex 47 | EBL | Dopant 1D | Host 1D-P1 | HBL1 | 3.82 | 6.61 | 0.1391 | 0.1020 | 417 |
| Ex 48 | EBL | Dopant 1D | Host 1D-P1 | HBL2 | 3.67 | 7.93 | 0.1391 | 0.1010 | 334 |

TABLE 4

| | EBL | EML | | HBL | V | cd/A | CIE (x, y) | | T95 [hr] |
|---|---|---|---|---|---|---|---|---|---|
| Ex 49 | Ref. | Dopant 1D | Host 1D-P2 | Ref. | 4.03 | 4.97 | 0.1418 | 0.1041 | 201 |
| Ex 50 | Ref. | Dopant 1D | Host 1D-P2 | HBL1 | 4.03 | 5.97 | 0.1418 | 0.1041 | 334 |
| Ex 51 | Ref. | Dopant 1D | Host 1D-P2 | HBL2 | 3.88 | 6.30 | 0.1388 | 0.1021 | 268 |
| Ex 52 | EBL | Dopant 1D | Host 1D-P2 | Ref. | 3.83 | 5.30 | 0.1388 | 0.1021 | 251 |
| Ex 53 | EBL | Dopant 1D | Host 1D-P2 | HBL1 | 3.83 | 6.63 | 0.1388 | 0.1021 | 418 |
| Ex 54 | EBL | Dopant 1D | Host 1D-P2 | HBL2 | 3.68 | 7.96 | 0.1388 | 0.1011 | 334 |
| Ex 55 | Ref. | Dopant 1D-A | Host 1 | Ref. | 4.02 | 4.97 | 0.1416 | 0.1038 | 208 |
| Ex 56 | Ref. | Dopant 1D-A | Host 1 | HBL1 | 4.02 | 5.96 | 0.1416 | 0.1038 | 346 |
| Ex 57 | Ref. | Dopant 1D-A | Host 1 | HBL2 | 3.87 | 6.29 | 0.1386 | 0.1018 | 277 |
| Ex 58 | EBL | Dopant 1D-A | Host 1 | Ref. | 3.82 | 5.30 | 0.1386 | 0.1018 | 260 |
| Ex 59 | EBL | Dopant 1D-A | Host 1 | HBL1 | 3.82 | 6.62 | 0.1386 | 0.1018 | 433 |
| Ex 60 | EBL | Dopant 1D-A | Host 1 | HBL2 | 3.67 | 7.94 | 0.1386 | 0.1008 | 346 |
| Ex 61 | Ref. | Dopant 1D-A | Host 1D | Ref. | 4.04 | 4.96 | 0.1421 | 0.1038 | 359 |
| Ex 62 | Ref. | Dopant 1D-A | Host 1D | HBL1 | 4.04 | 5.95 | 0.1421 | 0.1038 | 598 |
| Ex 63 | Ref. | Dopant 1D-A | Host 1D | HBL2 | 3.89 | 6.28 | 0.1391 | 0.1018 | 478 |
| Ex 64 | EBL | Dopant 1D-A | Host 1D | Ref. | 3.84 | 5.29 | 0.1391 | 0.1018 | 448 |
| Ex 65 | EBL | Dopant 1D-A | Host 1D | HBL1 | 3.84 | 6.61 | 0.1391 | 0.1018 | 747 |
| Ex 66 | EBL | Dopant 1D-A | Host 1D | HBL2 | 3.69 | 7.93 | 0.1391 | 0.1008 | 598 |

TABLE 5

| | EBL | EML | | HBL | V | cd/A | CIE (x, y) | | T95 [hr] |
|---|---|---|---|---|---|---|---|---|---|
| Ex 67 | Ref. | Dopant 1D-A | Host 1D-A | Ref. | 4.03 | 4.96 | 0.1415 | 0.1038 | 366 |
| Ex 68 | Ref. | Dopant 1D-A | Host 1D-A | HBL1 | 4.03 | 5.95 | 0.1415 | 0.1038 | 610 |
| Ex 69 | Ref. | Dopant 1D-A | Host 1D-A | HBL2 | 3.88 | 6.28 | 0.1385 | 0.1018 | 488 |
| Ex 70 | EBL | Dopant 1D-A | Host 1D-A | Ref. | 3.83 | 5.29 | 0.1385 | 0.1018 | 457 |
| Ex 71 | EBL | Dopant 1D-A | Host 1D-A | HBL1 | 3.83 | 6.61 | 0.1385 | 0.1018 | 762 |
| Ex 72 | EBL | Dopant 1D-A | Host 1D-A | HBL2 | 3.68 | 7.93 | 0.1385 | 0.1008 | 610 |
| Ex 73 | Ref. | Dopant 1D-A | Host 1D-P1 | Ref. | 4.03 | 4.95 | 0.1417 | 0.1039 | 206 |
| Ex 74 | Ref. | Dopant 1D-A | Host 1D-P1 | HBL1 | 4.03 | 5.94 | 0.1417 | 0.1039 | 344 |
| Ex 75 | Ref. | Dopant 1D-A | Host 1D-P1 | HBL2 | 3.88 | 6.27 | 0.1387 | 0.1019 | 275 |
| Ex 76 | EBL | Dopant 1D-A | Host 1D-P1 | Ref. | 3.83 | 5.28 | 0.1387 | 0.1019 | 258 |
| Ex 77 | EBL | Dopant 1D-A | Host 1D-P1 | HBL1 | 3.83 | 6.60 | 0.1387 | 0.1019 | 430 |
| Ex 78 | EBL | Dopant 1D-A | Host 1D-P1 | HBL2 | 3.68 | 7.92 | 0.1387 | 0.1009 | 344 |
| Ex 79 | Ref. | Dopant 1D-A | Host 1D-P2 | Ref. | 4.04 | 4.96 | 0.1416 | 0.1039 | 208 |
| Ex 80 | Ref. | Dopant 1D-A | Host 1D-P2 | HBL1 | 4.04 | 5.95 | 0.1416 | 0.1039 | 346 |
| Ex 81 | Ref. | Dopant 1D-A | Host 1D-P2 | HBL2 | 3.89 | 6.28 | 0.1386 | 0.1019 | 277 |
| Ex 82 | EBL | Dopant 1D-A | Host 1D-P2 | Ref. | 3.84 | 5.29 | 0.1386 | 0.1019 | 260 |
| Ex 83 | EBL | Dopant 1D-A | Host 1D-P2 | HBL1 | 3.84 | 6.61 | 0.1386 | 0.1019 | 433 |
| Ex 84 | EBL | Dopant 1D-A | Host 1D-P2 | HBL2 | 3.69 | 7.93 | 0.1386 | 0.1009 | 346 |

TABLE 6

| | EBL | EML | | HBL | V | cd/A | CIE (x, y) | | T95 [hr] |
|---|---|---|---|---|---|---|---|---|---|
| Ref 7 | Ref. | Dopant 1 | Host 2 | Ref. | 3.84 | 5.13 | 0.1413 | 0.1039 | 155 |
| Ref 8 | Ref. | Dopant 1 | Host 2 | HBL1 | 3.84 | 6.16 | 0.1413 | 0.1039 | 258 |
| Ref 9 | Ref. | Dopant 1 | Host 2 | HBL2 | 3.69 | 6.50 | 0.1383 | 0.1019 | 206 |
| Ref 10 | EBL | Dopant 1 | Host 2 | Ref. | 3.64 | 5.47 | 0.1383 | 0.1019 | 193 |
| Ref 11 | EBL | Dopant 1 | Host 2 | HBL1 | 3.64 | 6.84 | 0.1383 | 0.1019 | 322 |
| Ref 12 | EBL | Dopant 1 | Host 2 | HBL2 | 3.49 | 8.21 | 0.1383 | 0.1009 | 258 |
| Ex 85 | Ref. | Dopant 1 | Host 2D | Ref. | 3.83 | 5.13 | 0.1422 | 0.1040 | 266 |
| Ex 86 | Ref. | Dopant 1 | Host 2D | HBL1 | 3.83 | 6.16 | 0.1422 | 0.1040 | 443 |
| Ex 87 | Ref. | Dopant 1 | Host 2D | HBL2 | 3.68 | 6.50 | 0.1392 | 0.1020 | 355 |
| Ex 88 | EBL | Dopant 1 | Host 2D | Ref. | 3.63 | 5.47 | 0.1392 | 0.1020 | 332 |
| Ex 89 | EBL | Dopant 1 | Host 2D | HBL1 | 3.63 | 6.84 | 0.1392 | 0.1020 | 554 |
| Ex 90 | EBL | Dopant 1 | Host 2D | HBL2 | 3.48 | 8.21 | 0.1392 | 0.1010 | 443 |
| Ex 91 | Ref. | Dopant 1 | Host 2D-A | Ref. | 3.83 | 5.12 | 0.1420 | 0.1038 | 272 |
| Ex 92 | Ref. | Dopant 1 | Host 2D-A | HBL1 | 3.83 | 6.15 | 0.1420 | 0.1038 | 453 |
| Ex 93 | Ref. | Dopant 1 | Host 2D-A | HBL2 | 3.68 | 6.49 | 0.1390 | 0.1018 | 362 |
| Ex 94 | EBL | Dopant 1 | Host 2D-A | Ref. | 3.63 | 5.46 | 0.1390 | 0.1018 | 340 |
| Ex 95 | EBL | Dopant 1 | Host 2D-A | HBL1 | 3.63 | 6.83 | 0.1390 | 0.1018 | 566 |
| Ex 96 | EBL | Dopant 1 | Host 2D-A | HBL2 | 3.48 | 8.20 | 0.1390 | 0.1008 | 453 |

TABLE 7

| | EBL | EML | | HBL | V | cd/A | CIE (x, y) | | T95 [hr] |
|---|---|---|---|---|---|---|---|---|---|
| Ex 97 | Ref. | Dopant 1 | Host 2D-P1 | Ref. | 3.84 | 5.12 | 0.1421 | 0.1038 | 155 |
| Ex 98 | Ref. | Dopant 1 | Host 2D-P1 | HBL1 | 3.84 | 6.14 | 0.1421 | 0.1038 | 258 |
| Ex 99 | Ref. | Dopant 1 | Host 2D-P1 | HBL2 | 3.69 | 6.48 | 0.1391 | 0.1018 | 206 |
| Ex 100 | EBL | Dopant 1 | Host 2D-P1 | Ref. | 3.64 | 5.46 | 0.1391 | 0.1018 | 193 |
| Ex 101 | EBL | Dopant 1 | Host 2D-P1 | HBL1 | 3.64 | 6.82 | 0.1391 | 0.1018 | 322 |
| Ex 102 | EBL | Dopant 1 | Host 2D-P1 | HBL2 | 3.49 | 8.18 | 0.1391 | 0.1008 | 258 |
| Ex 103 | Ref. | Dopant 1 | Host 2D-P2 | Ref. | 3.82 | 5.15 | 0.1422 | 0.1039 | 155 |
| Ex 104 | Ref. | Dopant 1 | Host 2D-P2 | HBL1 | 3.82 | 6.17 | 0.1422 | 0.1039 | 258 |
| Ex 105 | Ref. | Dopant 1 | Host 2D-P2 | HBL2 | 3.67 | 6.52 | 0.1392 | 0.1019 | 207 |
| Ex 106 | EBL | Dopant 1 | Host 2D-P2 | Ref. | 3.62 | 5.49 | 0.1392 | 0.1019 | 194 |
| Ex 107 | EBL | Dopant 1 | Host 2D-P2 | HBL1 | 3.62 | 6.86 | 0.1392 | 0.1019 | 323 |
| Ex 108 | EBL | Dopant 1 | Host 2D-P2 | HBL2 | 3.47 | 8.23 | 0.1392 | 0.1009 | 258 |
| Ex 109 | Ref. | Dopant 1D | Host 2 | Ref. | 3.83 | 5.14 | 0.1422 | 0.1039 | 203 |
| Ex 110 | Ref. | Dopant 1D | Host 2 | HBL1 | 3.83 | 6.17 | 0.1422 | 0.1039 | 338 |
| Ex 111 | Ref. | Dopant 1D | Host 2 | HBL2 | 3.68 | 6.51 | 0.1392 | 0.1019 | 270 |
| Ex 112 | EBL | Dopant 1D | Host 2 | Ref. | 3.63 | 5.48 | 0.1392 | 0.1019 | 253 |
| Ex 113 | EBL | Dopant 1D | Host 2 | HBL1 | 3.63 | 6.85 | 0.1392 | 0.1019 | 422 |
| Ex 114 | EBL | Dopant 1D | Host 2 | HBL2 | 3.48 | 8.22 | 0.1392 | 0.1009 | 338 |

TABLE 8

| | EBL | EML | | HBL | V | cd/A | CIE (x, y) | | T95 [hr] |
|---|---|---|---|---|---|---|---|---|---|
| Ex 115 | Ref. | Dopant 1D | Host 2D | Ref. | 3.84 | 5.13 | 0.1424 | 0.1038 | 342 |
| Ex 116 | Ref. | Dopant 1D | Host 2D | HBL1 | 3.84 | 6.16 | 0.1424 | 0.1038 | 570 |
| Ex 117 | Ref. | Dopant 1D | Host 2D | HBL2 | 3.69 | 6.50 | 0.1394 | 0.1018 | 456 |
| Ex 118 | EBL | Dopant 1D | Host 2D | Ref. | 3.64 | 5.47 | 0.1394 | 0.1018 | 428 |
| Ex 119 | EBL | Dopant 1D | Host 2D | HBL1 | 3.64 | 6.84 | 0.1394 | 0.1018 | 713 |
| Ex 120 | EBL | Dopant 1D | Host 2D | HBL2 | 3.49 | 8.21 | 0.1394 | 0.1008 | 570 |
| Ex 121 | Ref. | Dopant 1D | Host 2D-A | Ref. | 3.85 | 5.13 | 0.1419 | 0.1040 | 352 |
| Ex 122 | Ref. | Dopant 1D | Host 2D-A | HBL1 | 3.85 | 6.16 | 0.1419 | 0.1040 | 587 |
| Ex 123 | Ref. | Dopant 1D | Host 2D-A | HBL2 | 3.70 | 6.50 | 0.1389 | 0.1020 | 470 |
| Ex 124 | EBL | Dopant 1D | Host 2D-A | Ref. | 3.65 | 5.47 | 0.1389 | 0.1020 | 440 |
| Ex 125 | EBL | Dopant 1D | Host 2D-A | HBL1 | 3.65 | 6.84 | 0.1389 | 0.1020 | 734 |
| Ex 126 | EBL | Dopant 1D | Host 2D-A | HBL2 | 3.50 | 8.21 | 0.1389 | 0.1010 | 587 |
| Ex 127 | Ref. | Dopant 1D | Host 2D-P1 | Ref. | 3.82 | 5.12 | 0.1422 | 0.1042 | 203 |
| Ex 128 | Ref. | Dopant 1D | Host 2D-P1 | HBL1 | 3.82 | 6.15 | 0.1422 | 0.1042 | 338 |
| Ex 129 | Ref. | Dopant 1D | Host 2D-P1 | HBL2 | 3.67 | 6.49 | 0.1392 | 0.1022 | 270 |
| Ex 130 | EBL | Dopant 1D | Host 2D-P1 | Ref. | 3.62 | 5.46 | 0.1392 | 0.1022 | 253 |
| Ex 131 | EBL | Dopant 1D | Host 2D-P1 | HBL1 | 3.62 | 6.83 | 0.1392 | 0.1022 | 422 |
| Ex 132 | EBL | Dopant 1D | Host 2D-P1 | HBL2 | 3.47 | 8.20 | 0.1392 | 0.1012 | 338 |

TABLE 9

| | EBL | EML | | HBL | V | cd/A | CIE (x, y) | | T95 [hr] |
|---|---|---|---|---|---|---|---|---|---|
| Ex 133 | Ref. | Dopant 1D | Host 2D-P2 | Ref. | 3.83 | 5.12 | 0.1423 | 0.1038 | 203 |
| Ex 134 | Ref. | Dopant 1D | Host 2D-P2 | HBL1 | 3.83 | 6.15 | 0.1423 | 0.1038 | 338 |
| Ex 135 | Ref. | Dopant 1D | Host 2D-P2 | HBL2 | 3.68 | 6.49 | 0.1393 | 0.1018 | 270 |
| Ex 136 | EBL | Dopant 1D | Host 2D-P2 | Ref. | 3.63 | 5.46 | 0.1393 | 0.1018 | 253 |
| Ex 137 | EBL | Dopant 1D | Host 2D-P2 | HBL1 | 3.63 | 6.83 | 0.1393 | 0.1018 | 422 |
| Ex 138 | EBL | Dopant 1D | Host 2D-P2 | HBL2 | 3.48 | 8.20 | 0.1393 | 0.1008 | 338 |
| Ex 139 | Ref. | Dopant 1D-A | Host 2 | Ref. | 3.83 | 5.14 | 0.1416 | 0.1041 | 210 |
| Ex 140 | Ref. | Dopant 1D-A | Host 2 | HBL1 | 3.83 | 6.17 | 0.1416 | 0.1041 | 350 |
| Ex 141 | Ref. | Dopant 1D-A | Host 2 | HBL2 | 3.68 | 6.51 | 0.1386 | 0.1021 | 280 |
| Ex 142 | EBL | Dopant 1D-A | Host 2 | Ref. | 3.63 | 5.48 | 0.1386 | 0.1021 | 263 |
| Ex 143 | EBL | Dopant 1D-A | Host 2 | HBL1 | 3.63 | 6.85 | 0.1386 | 0.1021 | 438 |
| Ex 144 | EBL | Dopant 1D-A | Host 2 | HBL2 | 3.48 | 8.22 | 0.1386 | 0.1011 | 350 |
| Ex 145 | Ref. | Dopant 1D-A | Host 2D | Ref. | 3.83 | 5.13 | 0.1424 | 0.1037 | 361 |
| Ex 146 | Ref. | Dopant 1D-A | Host 2D | HBL1 | 3.83 | 6.16 | 0.1424 | 0.1037 | 602 |
| Ex 147 | Ref. | Dopant 1D-A | Host 2D | HBL2 | 3.68 | 6.50 | 0.1394 | 0.1017 | 482 |
| Ex 148 | EBL | Dopant 1D-A | Host 2D | Ref. | 3.63 | 5.47 | 0.1394 | 0.1017 | 452 |
| Ex 149 | EBL | Dopant 1D-A | Host 2D | HBL1 | 3.63 | 6.84 | 0.1394 | 0.1017 | 753 |
| Ex 150 | EBL | Dopant 1D-A | Host 2D | HBL2 | 3.48 | 8.21 | 0.1394 | 0.1007 | 602 |

TABLE 10

| | EBL | EML | | HBL | V | cd/A | CIE (x, y) | | T95 [hr] |
|---|---|---|---|---|---|---|---|---|---|
| Ex 151 | Ref. | Dopant 1D-A | Host 2D-A | Ref. | 3.84 | 5.12 | 0.1417 | 0.1039 | 370 |
| Ex 152 | Ref. | Dopant 1D-A | Host 2D-A | HBL1 | 3.84 | 6.14 | 0.1417 | 0.1039 | 617 |
| Ex 153 | Ref. | Dopant 1D-A | Host 2D-A | HBL2 | 3.69 | 6.48 | 0.1387 | 0.1019 | 493 |
| Ex 154 | EBL | Dopant 1D-A | Host 2D-A | Ref. | 3.64 | 5.46 | 0.1387 | 0.1019 | 463 |
| Ex 155 | EBL | Dopant 1D-A | Host 2D-A | HBL1 | 3.64 | 6.82 | 0.1387 | 0.1019 | 771 |
| Ex 156 | EBL | Dopant 1D-A | Host 2D-A | HBL2 | 3.49 | 8.18 | 0.1387 | 0.1009 | 617 |
| Ex 157 | Ref. | Dopant 1D-A | Host 2D-P1 | Ref. | 3.83 | 5.12 | 0.1422 | 0.1038 | 211 |
| Ex 158 | Ref. | Dopant 1D-A | Host 2D-P1 | HBL1 | 3.83 | 6.15 | 0.1422 | 0.1038 | 352 |
| Ex 159 | Ref. | Dopant 1D-A | Host 2D-P1 | HBL2 | 3.68 | 6.49 | 0.1392 | 0.1018 | 282 |
| Ex 160 | EBL | Dopant 1D-A | Host 2D-P1 | Ref. | 3.63 | 5.46 | 0.1392 | 0.1018 | 264 |
| Ex 161 | EBL | Dopant 1D-A | Host 2D-P1 | HBL1 | 3.63 | 6.83 | 0.1392 | 0.1018 | 440 |
| Ex 162 | EBL | Dopant 1D-A | Host 2D-P1 | HBL2 | 3.48 | 8.20 | 0.1392 | 0.1008 | 352 |
| Ex 163 | Ref. | Dopant 1D-A | Host 2D-P2 | Ref. | 3.84 | 5.13 | 0.1422 | 0.1039 | 210 |
| Ex 164 | Ref. | Dopant 1D-A | Host 2D-P2 | HBL1 | 3.84 | 6.16 | 0.1422 | 0.1039 | 350 |
| Ex 165 | Ref. | Dopant 1D-A | Host 2D-P2 | HBL2 | 3.69 | 6.50 | 0.1392 | 0.1019 | 280 |
| Ex 166 | EBL | Dopant 1D-A | Host 2D-P2 | Ref. | 3.64 | 5.47 | 0.1392 | 0.1019 | 263 |
| Ex 167 | EBL | Dopant 1D-A | Host 2D-P2 | HBL1 | 3.64 | 6.84 | 0.1392 | 0.1019 | 438 |
| Ex 168 | EBL | Dopant 1D-A | Host 2D-P2 | HBL2 | 3.49 | 8.21 | 0.1392 | 0.1009 | 350 |

TABLE 11

| | EBL | EML | | HBL | V | cd/A | CIE (x, y) | | T95 [hr] |
|---|---|---|---|---|---|---|---|---|---|
| Ref 13. | Ref. | Dopant 1 | Host 3 | Ref. | 3.74 | 4.91 | 0.1423 | 0.1052 | 135 |
| Ref 14. | Ref. | Dopant 1 | Host 3 | HBL1 | 3.74 | 6.21 | 0.1423 | 0.1052 | 226 |
| Ref 15. | Ref. | Dopant 1 | Host 3 | HBL2 | 3.59 | 6.21 | 0.1393 | 0.1032 | 180 |
| Ref 16. | EBL | Dopant 1 | Host 3 | Ref. | 3.54 | 5.23 | 0.1393 | 0.1032 | 169 |
| Ref 17. | EBL | Dopant 1 | Host 3 | HBL1 | 3.54 | 6.54 | 0.1393 | 0.1032 | 282 |
| Ref 18. | EBL | Dopant 1 | Host 3 | HBL2 | 3.39 | 7.85 | 0.1393 | 0.1022 | 226 |
| Ex 169 | Ref. | Dopant 1 | Host 3D | Ref. | 3.72 | 4.91 | 0.1420 | 0.1055 | 231 |
| Ex 170 | Ref. | Dopant 1 | Host 3D | HBL1 | 3.72 | 6.22 | 0.1420 | 0.1055 | 386 |
| Ex 171 | Ref. | Dopant 1 | Host 3D | HBL2 | 3.57 | 6.22 | 0.1390 | 0.1035 | 308 |
| Ex 172 | EBL | Dopant 1 | Host 3D | Ref. | 3.52 | 5.24 | 0.1390 | 0.1035 | 289 |
| Ex 173 | EBL | Dopant 1 | Host 3D | HBL1 | 3.52 | 6.55 | 0.1390 | 0.1035 | 482 |
| Ex 174 | EBL | Dopant 1 | Host 3D | HBL2 | 3.37 | 7.86 | 0.1390 | 0.1025 | 386 |
| Ex 175 | Ref. | Dopant 1 | Host 3D-A | Ref. | 3.70 | 4.88 | 0.1419 | 0.1045 | 238 |
| Ex 176 | Ref. | Dopant 1 | Host 3D-A | HBL1 | 3.70 | 6.18 | 0.1419 | 0.1045 | 396 |
| Ex 177 | Ref. | Dopant 1 | Host 3D-A | HBL2 | 3.55 | 6.18 | 0.1389 | 0.1025 | 317 |
| Ex 178 | EBL | Dopant 1 | Host 3D-A | Ref. | 3.50 | 5.20 | 0.1389 | 0.1025 | 297 |
| Ex 179 | EBL | Dopant 1 | Host 3D-A | HBL1 | 3.50 | 6.50 | 0.1389 | 0.1025 | 495 |
| Ex 180 | EBL | Dopant 1 | Host 3D-A | HBL2 | 3.35 | 7.80 | 0.1389 | 0.1015 | 396 |

TABLE 12

| | EBL | EML | | HBL | V | cd/A | CIE (x, y) | | T95 [hr] |
|---|---|---|---|---|---|---|---|---|---|
| Ex 181 | Ref. | Dopant 1 | Host 3D-P1 | Ref. | 3.72 | 4.89 | 0.1420 | 0.1050 | 135 |
| Ex 182 | Ref. | Dopant 1 | Host 3D-P1 | HBL1 | 3.72 | 6.19 | 0.1420 | 0.1050 | 226 |
| Ex 183 | Ref. | Dopant 1 | Host 3D-P1 | HBL2 | 3.57 | 6.19 | 0.1390 | 0.1030 | 180 |
| Ex 184 | EBL | Dopant 1 | Host 3D-P1 | Ref. | 3.52 | 5.22 | 0.1390 | 0.1030 | 169 |
| Ex 185 | EBL | Dopant 1 | Host 3D-P1 | HBL1 | 3.52 | 6.52 | 0.1390 | 0.1030 | 282 |
| Ex 186 | EBL | Dopant 1 | Host 3D-P1 | HBL2 | 3.37 | 7.82 | 0.1390 | 0.1020 | 226 |
| Ex 187 | Ref. | Dopant 1 | Host 3D-P2 | Ref. | 3.74 | 4.89 | 0.1421 | 0.1051 | 135 |
| Ex 188 | Ref. | Dopant 1 | Host 3D-P2 | HBL1 | 3.74 | 6.19 | 0.1421 | 0.1051 | 225 |
| Ex 189 | Ref. | Dopant 1 | Host 3D-P2 | HBL2 | 3.59 | 6.19 | 0.1391 | 0.1031 | 180 |
| Ex 190 | EBL | Dopant 1 | Host 3D-P2 | Ref. | 3.54 | 5.22 | 0.1391 | 0.1031 | 169 |
| Ex 191 | EBL | Dopant 1 | Host 3D-P2 | HBL1 | 3.54 | 6.52 | 0.1391 | 0.1031 | 281 |
| Ex 192 | EBL | Dopant 1 | Host 3D-P2 | HBL2 | 3.39 | 7.82 | 0.1391 | 0.1021 | 225 |
| Ex 193 | Ref. | Dopant 1D | Host 3 | Ref. | 3.74 | 4.90 | 0.1422 | 0.1053 | 180 |
| Ex 194 | Ref. | Dopant 1D | Host 3 | HBL1 | 3.74 | 6.20 | 0.1422 | 0.1053 | 300 |
| Ex 195 | Ref. | Dopant 1D | Host 3 | HBL2 | 3.59 | 6.20 | 0.1392 | 0.1033 | 240 |
| Ex 196 | EBL | Dopant 1D | Host 3 | Ref. | 3.54 | 5.22 | 0.1392 | 0.1033 | 225 |
| Ex 197 | EBL | Dopant 1D | Host 3 | HBL1 | 3.54 | 6.53 | 0.1392 | 0.1033 | 375 |
| Ex 198 | EBL | Dopant 1D | Host 3 | HBL2 | 3.39 | 7.84 | 0.1392 | 0.1023 | 300 |

TABLE 13

| | EBL | EML | | HBL | V | cd/A | CIE (x, y) | | T95 [hr] |
|---|---|---|---|---|---|---|---|---|---|
| Ex 199 | Ref. | Dopant 1D | Host 3D | Ref. | 3.73 | 4.90 | 0.1421 | 0.1053 | 303 |
| Ex 200 | Ref. | Dopant 1D | Host 3D | HBL1 | 3.73 | 6.20 | 0.1421 | 0.1053 | 505 |
| Ex 201 | Ref. | Dopant 1D | Host 3D | HBL2 | 3.58 | 6.20 | 0.1391 | 0.1033 | 404 |
| Ex 202 | EBL | Dopant 1D | Host 3D | Ref. | 3.53 | 5.22 | 0.1391 | 0.1033 | 379 |
| Ex 203 | EBL | Dopant 1D | Host 3D | HBL1 | 3.53 | 6.53 | 0.1391 | 0.1033 | 631 |
| Ex 204 | EBL | Dopant 1D | Host 3D | HBL2 | 3.38 | 7.84 | 0.1391 | 0.1023 | 505 |
| Ex 205 | Ref. | Dopant 1D | Host 3D-A | Ref. | 3.75 | 4.91 | 0.1423 | 0.1048 | 315 |
| Ex 206 | Ref. | Dopant 1D | Host 3D-A | HBL1 | 3.75 | 6.22 | 0.1423 | 0.1048 | 525 |
| Ex 207 | Ref. | Dopant 1D | Host 3D-A | HBL2 | 3.60 | 6.22 | 0.1393 | 0.1028 | 420 |
| Ex 208 | EBL | Dopant 1D | Host 3D-A | Ref. | 3.55 | 5.24 | 0.1393 | 0.1028 | 394 |
| Ex 209 | EBL | Dopant 1D | Host 3D-A | HBL1 | 3.55 | 6.55 | 0.1393 | 0.1028 | 656 |
| Ex 210 | EBL | Dopant 1D | Host 3D-A | HBL2 | 3.40 | 7.86 | 0.1393 | 0.1018 | 525 |
| Ex 211 | Ref. | Dopant 1D | Host 3D-P1 | Ref. | 3.70 | 4.88 | 0.1420 | 0.1048 | 180 |
| Ex 212 | Ref. | Dopant 1D | Host 3D-P1 | HBL1 | 3.70 | 6.18 | 0.1420 | 0.1048 | 299 |
| Ex 213 | Ref. | Dopant 1D | Host 3D-P1 | HBL2 | 3.55 | 6.18 | 0.1390 | 0.1028 | 239 |
| Ex 214 | EBL | Dopant 1D | Host 3D-P1 | Ref. | 3.50 | 5.21 | 0.1390 | 0.1028 | 224 |
| Ex 215 | EBL | Dopant 1D | Host 3D-P1 | HBL1 | 3.50 | 6.51 | 0.1390 | 0.1028 | 374 |
| Ex216 | EBL | Dopant 1D | Host 3D-P1 | HBL2 | 3.35 | 7.81 | 0.1390 | 0.1018 | 299 |

TABLE 14

| | EBL | EML | | HBL | V | cd/A | CIE (x, y) | | T95 [hr] |
|---|---|---|---|---|---|---|---|---|---|
| Ex 217 | Ref. | Dopant 1D | Host 3D-P2 | Ref. | 3.76 | 4.88 | 0.1421 | 0.1052 | 180 |
| Ex 218 | Ref. | Dopant 1D | Host 3D-P2 | HBL1 | 3.76 | 6.18 | 0.1421 | 0.1052 | 300 |
| Ex 219 | Ref. | Dopant 1D | Host 3D-P2 | HBL2 | 3.61 | 6.18 | 0.1391 | 0.1032 | 240 |
| Ex 220 | EBL | Dopant 1D | Host 3D-P2 | Ref. | 3.56 | 5.20 | 0.1391 | 0.1032 | 225 |
| Ex 221 | EBL | Dopant 1D | Host 3D-P2 | HBL1 | 3.56 | 6.50 | 0.1391 | 0.1032 | 375 |
| Ex 222 | EBL | Dopant 1D | Host 3D-P2 | HBL2 | 3.41 | 7.80 | 0.1391 | 0.1022 | 300 |
| Ex 223 | Ref. | Dopant 1D-A | Host 3 | Ref. | 3.72 | 4.92 | 0.1418 | 0.1051 | 183 |
| Ex 224 | Ref. | Dopant 1D-A | Host 3 | HBL1 | 3.72 | 6.23 | 0.1418 | 0.1051 | 305 |
| Ex 225 | Ref. | Dopant 1D-A | Host 3 | HBL2 | 3.57 | 6.23 | 0.1388 | 0.1031 | 244 |
| Ex 226 | EBL | Dopant 1D-A | Host 3 | Ref. | 3.52 | 5.25 | 0.1388 | 0.1031 | 229 |
| Ex 227 | EBL | Dopant 1D-A | Host 3 | HBL1 | 3.52 | 6.56 | 0.1388 | 0.1031 | 381 |
| Ex 228 | EBL | Dopant 1D-A | Host 3 | HBL2 | 3.37 | 7.87 | 0.1388 | 0.1021 | 305 |
| Ex 229 | Ref. | Dopant 1D-A | Host 3D | Ref. | 3.72 | 4.91 | 0.1422 | 0.1052 | 327 |
| Ex 230 | Ref. | Dopant 1D-A | Host 3D | HBL1 | 3.72 | 6.21 | 0.1422 | 0.1052 | 545 |
| Ex 231 | Ref. | Dopant 1D-A | Host 3D | HBL2 | 3.57 | 6.21 | 0.1392 | 0.1032 | 436 |
| Ex 232 | EBL | Dopant 1D-A | Host 3D | Ref. | 3.52 | 5.23 | 0.1392 | 0.1032 | 409 |
| Ex 233 | EBL | Dopant 1D-A | Host 3D | HBL1 | 3.52 | 6.54 | 0.1392 | 0.1032 | 681 |
| Ex 234 | EBL | Dopant 1D-A | Host 3D | HBL2 | 3.37 | 7.85 | 0.1392 | 0.1022 | 545 |

TABLE 15

| | EBL | EML | | HBL | V | cd/A | CIE (x, y) | | T95 [hr] |
|---|---|---|---|---|---|---|---|---|---|
| Ex 235 | Ref. | Dopant 1D-A | Host 3D-A | Ref. | 3.73 | 4.91 | 0.1420 | 0.1052 | 329 |
| Ex 236 | Ref. | Dopant 1D-A | Host 3D-A | HBL1 | 3.73 | 6.21 | 0.1420 | 0.1052 | 549 |
| Ex 237 | Ref. | Dopant 1D-A | Host 3D-A | HBL2 | 3.58 | 6.21 | 0.1390 | 0.1032 | 439 |
| Ex 238 | EBL | Dopant 1D-A | Host 3D-A | Ref. | 3.53 | 5.23 | 0.1390 | 0.1032 | 412 |
| Ex 239 | EBL | Dopant 1D-A | Host 3D-A | HBL1 | 3.53 | 6.54 | 0.1390 | 0.1032 | 686 |
| Ex 240 | EBL | Dopant 1D-A | Host 3D-A | HBL2 | 3.38 | 7.85 | 0.1390 | 0.1022 | 549 |
| Ex 241 | Ref. | Dopant 1D-A | Host 3D-P1 | Ref. | 3.72 | 4.90 | 0.1422 | 0.1050 | 183 |
| Ex 242 | Ref. | Dopant 1D-A | Host 3D-P1 | HBL1 | 3.72 | 6.20 | 0.1422 | 0.1050 | 305 |
| Ex 243 | Ref. | Dopant 1D-A | Host 3D-P1 | HBL2 | 3.57 | 6.20 | 0.1392 | 0.1030 | 244 |
| Ex 244 | EBL | Dopant 1D-A | Host 3D-P1 | Ref. | 3.52 | 5.22 | 0.1392 | 0.1030 | 229 |
| Ex 245 | EBL | Dopant 1D-A | Host 3D-P1 | HBL1 | 3.52 | 6.53 | 0.1392 | 0.1030 | 381 |
| Ex 246 | EBL | Dopant 1D-A | Host 3D-P1 | HBL2 | 3.37 | 7.84 | 0.1392 | 0.1020 | 305 |
| Ex 247 | Ref. | Dopant 1D-A | Host 3D-P2 | Ref. | 3.74 | 4.88 | 0.1421 | 0.1051 | 183 |
| Ex 248 | Ref. | Dopant 1D-A | Host 3D-P2 | HBL1 | 3.74 | 6.18 | 0.1421 | 0.1051 | 305 |
| Ex 249 | Ref. | Dopant 1D-A | Host 3D-P2 | HBL2 | 3.59 | 6.18 | 0.1391 | 0.1031 | 244 |
| Ex 250 | EBL | Dopant 1D-A | Host 3D-P2 | Ref. | 3.54 | 5.21 | 0.1391 | 0.1031 | 229 |
| Ex 251 | EBL | Dopant 1D-A | Host 3D-P2 | HBL1 | 3.54 | 6.51 | 0.1391 | 0.1031 | 381 |
| Ex 252 | EBL | Dopant 1D-A | Host 3D-P2 | HBL2 | 3.39 | 7.81 | 0.1391 | 0.1021 | 305 |

TABLE 16

| | EBL | EML | | HBL | V | cd/A | CIE (x, y) | | T95 [hr] |
|---|---|---|---|---|---|---|---|---|---|
| Ref 19 | Ref. | Dopant 1 | Host 4 | Ref. | 3.79 | 4.95 | 0.1423 | 0.1049 | 139 |
| Ref 20 | Ref. | Dopant 1 | Host 4 | HBL1 | 3.79 | 5.94 | 0.1423 | 0.1049 | 232 |
| Ref 21 | Ref. | Dopant 1 | Host 4 | HBL2 | 3.64 | 6.27 | 0.1393 | 0.1029 | 186 |
| Ref 22 | EBL | Dopant 1 | Host 4 | Ref. | 3.59 | 5.28 | 0.1393 | 0.1029 | 174 |
| Ref 23 | EBL | Dopant 1 | Host 4 | HBL1 | 3.59 | 6.60 | 0.1393 | 0.1029 | 290 |
| Ref 24 | EBL | Dopant 1 | Host 4 | HBL2 | 3.44 | 7.92 | 0.1393 | 0.1019 | 232 |
| Ex 253 | Ref. | Dopant 1 | Host 4D | Ref. | 3.80 | 4.97 | 0.1423 | 0.1050 | 241 |
| Ex 254 | Ref. | Dopant 1 | Host 4D | HBL1 | 3.80 | 5.96 | 0.1423 | 0.1050 | 402 |
| Ex 255 | Ref. | Dopant 1 | Host 4D | HBL2 | 3.65 | 6.29 | 0.1393 | 0.1030 | 321 |
| Ex 256 | EBL | Dopant 1 | Host 4D | Ref. | 3.60 | 5.30 | 0.1393 | 0.1030 | 301 |
| Ex 257 | EBL | Dopant 1 | Host 4D | HBL1 | 3.60 | 6.62 | 0.1393 | 0.1030 | 502 |
| Ex 258 | EBL | Dopant 1 | Host 4D | HBL2 | 3.45 | 7.94 | 0.1393 | 0.1020 | 402 |
| Ex 259 | Ref. | Dopant 1 | Host 4D-A | Ref. | 3.78 | 4.93 | 0.1410 | 0.1044 | 248 |
| Ex 260 | Ref. | Dopant 1 | Host 4D-A | HBL1 | 3.78 | 5.91 | 0.1410 | 0.1044 | 413 |
| Ex 261 | Ref. | Dopant 1 | Host 4D-A | HBL2 | 3.63 | 6.24 | 0.1380 | 0.1024 | 330 |
| Ex 262 | EBL | Dopant 1 | Host 4D-A | Ref. | 3.58 | 5.26 | 0.1380 | 0.1024 | 310 |
| Ex 263 | EBL | Dopant 1 | Host 4D-A | HBL1 | 3.58 | 6.57 | 0.1380 | 0.1024 | 516 |
| Ex 264 | EBL | Dopant 1 | Host 4D-A | HBL2 | 3.43 | 7.88 | 0.1380 | 0.1014 | 413 |

TABLE 17

| | EBL | EML | | HBL | V | cd/A | CIE (x, y) | | T95 [hr] |
|---|---|---|---|---|---|---|---|---|---|
| Ex 265 | Ref. | Dopant 1 | Host 4D-P1 | Ref. | 3.82 | 4.99 | 0.1421 | 0.1049 | 140 |
| Ex 266 | Ref. | Dopant 1 | Host 4D-P1 | HBL1 | 3.82 | 5.99 | 0.1421 | 0.1049 | 233 |
| Ex 267 | Ref. | Dopant 1 | Host 4D-P1 | HBL2 | 3.67 | 6.32 | 0.1391 | 0.1029 | 186 |
| Ex 268 | EBL | Dopant 1 | Host 4D-P1 | Ref. | 3.62 | 5.32 | 0.1391 | 0.1029 | 175 |
| Ex 269 | EBL | Dopant 1 | Host 4D-P1 | HBL1 | 3.62 | 6.65 | 0.1391 | 0.1029 | 291 |
| Ex 270 | EBL | Dopant 1 | Host 4D-P1 | HBL2 | 3.47 | 7.98 | 0.1391 | 0.1019 | 233 |
| Ex 271 | Ref. | Dopant 1 | Host 4D-P2 | Ref. | 3.80 | 4.95 | 0.1428 | 0.1055 | 140 |
| Ex 272 | Ref. | Dopant 1 | Host 4D-P2 | HBL1 | 3.80 | 5.94 | 0.1428 | 0.1055 | 233 |
| Ex 273 | Ref. | Dopant 1 | Host 4D-P2 | HBL2 | 3.65 | 6.27 | 0.1398 | 0.1035 | 186 |
| Ex 274 | EBL | Dopant 1 | Host 4D-P2 | Ref. | 3.60 | 5.28 | 0.1398 | 0.1035 | 175 |
| Ex 275 | EBL | Dopant 1 | Host 4D-P2 | HBL1 | 3.60 | 6.60 | 0.1398 | 0.1035 | 291 |
| Ex 276 | EBL | Dopant 1 | Host 4D-P2 | HBL2 | 3.45 | 7.92 | 0.1398 | 0.1025 | 233 |
| Ex 277 | Ref. | Dopant 1D | Host 4 | Ref. | 3.79 | 4.95 | 0.1421 | 0.1050 | 184 |
| Ex 278 | Ref. | Dopant 1D | Host 4 | HBL1 | 3.79 | 5.94 | 0.1421 | 0.1050 | 306 |
| Ex 279 | Ref. | Dopant 1D | Host 4 | HBL2 | 3.64 | 6.27 | 0.1391 | 0.1030 | 245 |
| Ex 280 | EBL | Dopant 1D | Host 4 | Ref. | 3.59 | 5.28 | 0.1391 | 0.1030 | 230 |
| Ex 281 | EBL | Dopant 1D | Host 4 | HBL1 | 3.59 | 6.60 | 0.1391 | 0.1030 | 383 |
| Ex 282 | EBL | Dopant 1D | Host 4 | HBL2 | 3.44 | 7.92 | 0.1391 | 0.1020 | 306 |

TABLE 18

| | EBL | EML | | HBL | V | cd/A | CIE (x, y) | | T95 [hr] |
|---|---|---|---|---|---|---|---|---|---|
| Ex 283 | Ref. | Dopant 1D | Host 4D | Ref. | 3.80 | 4.96 | 0.1420 | 0.1050 | 314 |
| Ex 284 | Ref. | Dopant 1D | Host 4D | HBL1 | 3.80 | 5.95 | 0.1420 | 0.1050 | 523 |
| Ex 285 | Ref. | Dopant 1D | Host 4D | HBL2 | 3.65 | 6.28 | 0.1390 | 0.1030 | 419 |
| Ex 286 | EBL | Dopant 1D | Host 4D | Ref. | 3.60 | 5.29 | 0.1390 | 0.1030 | 392 |
| Ex 287 | EBL | Dopant 1D | Host 4D | HBL1 | 3.60 | 6.61 | 0.1390 | 0.1030 | 654 |
| Ex 288 | EBL | Dopant 1D | Host 4D | HBL2 | 3.45 | 7.93 | 0.1390 | 0.1020 | 523 |
| Ex 289 | Ref. | Dopant 1D | Host 4D-A | Ref. | 3.79 | 4.96 | 0.1425 | 0.1055 | 325 |
| Ex 290 | Ref. | Dopant 1D | Host 4D-A | HBL1 | 3.79 | 5.95 | 0.1425 | 0.1055 | 542 |
| Ex 291 | Ref. | Dopant 1D | Host 4D-A | HBL2 | 3.64 | 6.28 | 0.1395 | 0.1035 | 434 |
| Ex 292 | EBL | Dopant 1D | Host 4D-A | Ref. | 3.59 | 5.29 | 0.1395 | 0.1035 | 407 |
| Ex 293 | EBL | Dopant 1D | Host 4D-A | HBL1 | 3.59 | 6.61 | 0.1395 | 0.1035 | 678 |
| Ex 294 | EBL | Dopant 1D | Host 4D-A | HBL2 | 3.44 | 7.93 | 0.1395 | 0.1025 | 542 |
| Ex 295 | Ref. | Dopant 1D | Host 4D-P1 | Ref. | 3.79 | 4.91 | 0.1422 | 0.1052 | 184 |
| Ex 296 | Ref. | Dopant 1D | Host 4D-P1 | HBL1 | 3.79 | 5.89 | 0.1422 | 0.1052 | 306 |
| Ex 297 | Ref. | Dopant 1D | Host 4D-P1 | HBL2 | 3.64 | 6.21 | 0.1392 | 0.1032 | 245 |
| Ex 298 | EBL | Dopant 1D | Host 4D-P1 | Ref. | 3.59 | 5.23 | 0.1392 | 0.1032 | 230 |
| Ex 299 | EBL | Dopant 1D | Host 4D-P1 | HBL1 | 3.59 | 6.54 | 0.1392 | 0.1032 | 383 |
| Ex 300 | EBL | Dopant 1D | Host 4D-P1 | HBL2 | 3.44 | 7.85 | 0.1392 | 0.1022 | 306 |

TABLE 19

| | EBL | EML | | HBL | V | cd/A | CIE (x, y) | | T95 [hr] |
|---|---|---|---|---|---|---|---|---|---|
| Ex 301 | Ref. | Dopant 1D | Host 4D-P2 | Ref. | 3.77 | 4.94 | 0.1412 | 0.1050 | 183 |
| Ex 302 | Ref. | Dopant 1D | Host 4D-P2 | HBL1 | 3.77 | 5.92 | 0.1412 | 0.1050 | 305 |
| Ex 303 | Ref. | Dopant 1D | Host 4D-P2 | HBL2 | 3.62 | 6.25 | 0.1382 | 0.1030 | 244 |
| Ex 304 | EBL | Dopant 1D | Host 4D-P2 | Ref. | 3.57 | 5.26 | 0.1382 | 0.1030 | 229 |
| Ex 305 | EBL | Dopant 1D | Host 4D-P2 | HBL1 | 3.57 | 6.58 | 0.1382 | 0.1030 | 381 |
| Ex 306 | EBL | Dopant 1D | Host 4D-P2 | HBL2 | 3.42 | 7.90 | 0.1382 | 0.1020 | 305 |
| Ex 307 | Ref. | Dopant 1D-A | Host 4 | Ref. | 3.79 | 4.95 | 0.1420 | 0.1052 | 188 |
| Ex 308 | Ref. | Dopant 1D-A | Host 4 | HBL1 | 3.79 | 5.94 | 0.1420 | 0.1052 | 314 |
| Ex 309 | Ref. | Dopant 1D-A | Host 4 | HBL2 | 3.64 | 6.27 | 0.1390 | 0.1032 | 251 |
| Ex 310 | EBL | Dopant 1D-A | Host 4 | Ref. | 3.59 | 5.28 | 0.1390 | 0.1032 | 235 |
| Ex 311 | EBL | Dopant 1D-A | Host 4 | HBL1 | 3.59 | 6.60 | 0.1390 | 0.1032 | 392 |
| Ex 312 | EBL | Dopant 1D-A | Host 4 | HBL2 | 3.44 | 7.92 | 0.1390 | 0.1022 | 314 |
| Ex 313 | Ref. | Dopant 1D-A | Host 4D | Ref. | 3.80 | 4.95 | 0.1420 | 0.1051 | 331 |
| Ex 314 | Ref. | Dopant 1D-A | Host 4D | HBL1 | 3.80 | 5.94 | 0.1420 | 0.1051 | 552 |
| Ex 315 | Ref. | Dopant 1D-A | Host 4D | HBL2 | 3.65 | 6.27 | 0.1390 | 0.1031 | 442 |
| Ex 316 | EBL | Dopant 1D-A | Host 4D | Ref. | 3.60 | 5.28 | 0.1390 | 0.1031 | 414 |
| Ex 317 | EBL | Dopant 1D-A | Host 4D | HBL1 | 3.60 | 6.60 | 0.1390 | 0.1031 | 690 |
| Ex 318 | EBL | Dopant 1D-A | Host 4D | HBL2 | 3.45 | 7.92 | 0.1390 | 0.1021 | 552 |

TABLE 20

| | EBL | EML | | HBL | V | cd/A | CIE (x, y) | | T95 [hr] |
|---|---|---|---|---|---|---|---|---|---|
| Ex 319 | Ref. | Dopant 1D-A | Host 4D-A | Ref. | 3.84 | 5.00 | 0.1418 | 0.1053 | 339 |
| Ex 320 | Ref. | Dopant 1D-A | Host 4D-A | HBL1 | 3.84 | 6.00 | 0.1418 | 0.1053 | 565 |
| Ex 321 | Ref. | Dopant 1D-A | Host 4D-A | HBL2 | 3.69 | 6.34 | 0.1388 | 0.1033 | 452 |
| Ex 322 | EBL | Dopant 1D-A | Host 4D-A | Ref. | 3.64 | 5.34 | 0.1388 | 0.1033 | 424 |
| Ex 323 | EBL | Dopant 1D-A | Host 4D-A | HBL1 | 3.64 | 6.67 | 0.1388 | 0.1033 | 706 |
| Ex 324 | EBL | Dopant 1D-A | Host 4D-A | HBL2 | 3.49 | 8.00 | 0.1388 | 0.1023 | 565 |
| Ex 325 | Ref. | Dopant 1D-A | Host 4D-P1 | Ref. | 3.83 | 4.95 | 0.1420 | 0.1050 | 188 |
| Ex 326 | Ref. | Dopant 1D-A | Host 4D-P1 | HBL1 | 3.83 | 5.94 | 0.1420 | 0.1050 | 314 |
| Ex 327 | Ref. | Dopant 1D-A | Host 4D-P1 | HBL2 | 3.68 | 6.27 | 0.1390 | 0.1030 | 251 |
| Ex 328 | EBL | Dopant 1D-A | Host 4D-P1 | Ref. | 3.63 | 5.28 | 0.1390 | 0.1030 | 235 |
| Ex 329 | EBL | Dopant 1D-A | Host 4D-P1 | HBL1 | 3.63 | 6.60 | 0.1390 | 0.1030 | 392 |
| Ex 330 | EBL | Dopant 1D-A | Host 4D-P1 | HBL2 | 3.48 | 7.92 | 0.1390 | 0.1020 | 314 |
| Ex 331 | Ref. | Dopant 1D-A | Host 4D-P2 | Ref. | 6.82 | 4.94 | 0.1421 | 0.1047 | 188 |
| Ex 332 | Ref. | Dopant 1D-A | Host 4D-P2 | HBL1 | 6.82 | 5.92 | 0.1421 | 0.1047 | 314 |
| Ex 333 | Ref. | Dopant 1D-A | Host 4D-P2 | HBL2 | 6.67 | 6.25 | 0.1391 | 0.1027 | 251 |
| Ex 334 | EBL | Dopant 1D-A | Host 4D-P2 | Ref. | 6.62 | 5.26 | 0.1391 | 0.1027 | 235 |
| Ex 335 | EBL | Dopant 1D-A | Host 4D-P2 | HBL1 | 6.62 | 6.58 | 0.1391 | 0.1027 | 392 |
| Ex 336 | EBL | Dopant 1D-A | Host 4D-P2 | HBL2 | 6.47 | 7.90 | 0.1391 | 0.1017 | 314 |

TABLE 21

| | EBL | EML | | HBL | V | cd/A | CIE (x, y) | | T95 [hr] |
|---|---|---|---|---|---|---|---|---|---|
| Ref 25 | Ref. | Dopant 2 | Host 1 | Ref. | 3.95 | 5.05 | 0.1410 | 0.1030 | 185 |
| Ref 26 | Ref. | Dopant 2 | Host 1 | HBL1 | 3.95 | 6.06 | 0.1410 | 0.1030 | 308 |
| Ref 27 | Ref. | Dopant 2 | Host 1 | HBL2 | 3.80 | 6.39 | 0.1380 | 0.1010 | 246 |
| Ref 28 | EBL | Dopant 2 | Host 1 | Ref. | 3.75 | 5.38 | 0.1380 | 0.1010 | 231 |
| Ref 29 | EBL | Dopant 2 | Host 1 | HBL1 | 3.75 | 6.73 | 0.1380 | 0.1010 | 385 |
| Ref 30 | EBL | Dopant 2 | Host 1 | HBL2 | 3.60 | 8.08 | 0.1380 | 0.1000 | 308 |
| Ex 337 | Ref. | Dopant 2 | Host 1D | Ref. | 3.95 | 5.05 | 0.1411 | 0.1030 | 316 |
| Ex 338 | Ref. | Dopant 2 | Host 1D | HBL1 | 3.95 | 6.06 | 0.1411 | 0.1030 | 526 |
| Ex 339 | Ref. | Dopant 2 | Host 1D | HBL2 | 3.80 | 6.39 | 0.1381 | 0.1010 | 421 |
| Ex 340 | EBL | Dopant 2 | Host 1D | Ref. | 3.75 | 5.38 | 0.1381 | 0.1010 | 395 |
| Ex 341 | EBL | Dopant 2 | Host 1D | HBL1 | 3.75 | 6.73 | 0.1381 | 0.1010 | 658 |
| Ex 342 | EBL | Dopant 2 | Host 1D | HBL2 | 3.60 | 8.08 | 0.1381 | 0.1000 | 526 |
| Ex 343 | Ref. | Dopant 2 | Host 1D-A | Ref. | 3.90 | 5.03 | 0.1412 | 0.1035 | 322 |
| Ex 344 | Ref. | Dopant 2 | Host 1D-A | HBL1 | 3.90 | 6.04 | 0.1412 | 0.1035 | 536 |
| Ex 345 | Ref. | Dopant 2 | Host 1D-A | HBL2 | 3.75 | 6.37 | 0.1382 | 0.1015 | 429 |
| Ex 346 | EBL | Dopant 2 | Host 1D-A | Ref. | 3.70 | 5.37 | 0.1382 | 0.1015 | 402 |
| Ex 347 | EBL | Dopant 2 | Host 1D-A | HBL1 | 3.70 | 6.71 | 0.1382 | 0.1015 | 670 |
| Ex 348 | EBL | Dopant 2 | Host 1D-A | HBL2 | 3.55 | 8.05 | 0.1382 | 0.1005 | 536 |

TABLE 22

| | EBL | EML | | HBL | V | cd/A | CIE (x, y) | | T95 [hr] |
|---|---|---|---|---|---|---|---|---|---|
| Ex 349 | Ref. | Dopant 2 | Host 1D-P1 | Ref. | 3.95 | 5.04 | 0.1412 | 0.1029 | 185 |
| Ex 350 | Ref. | Dopant 2 | Host 1D-P1 | HBL1 | 3.95 | 6.05 | 0.1412 | 0.1029 | 308 |
| Ex 351 | Ref. | Dopant 2 | Host 1D-P1 | HBL2 | 3.80 | 6.38 | 0.1382 | 0.1009 | 246 |
| Ex 352 | EBL | Dopant 2 | Host 1D-P1 | Ref. | 3.75 | 5.38 | 0.1382 | 0.1009 | 231 |
| Ex 353 | EBL | Dopant 2 | Host 1D-P1 | HBL1 | 3.75 | 6.72 | 0.1382 | 0.1009 | 385 |
| Ex 354 | EBL | Dopant 2 | Host 1D-P1 | HBL2 | 3.60 | 8.06 | 0.1382 | 0.0999 | 308 |
| Ex 355 | Ref. | Dopant 2 | Host 1D-P2 | Ref. | 3.92 | 5.03 | 0.1411 | 0.1032 | 185 |
| Ex 356 | Ref. | Dopant 2 | Host 1D-P2 | HBL1 | 3.92 | 6.03 | 0.1411 | 0.1032 | 308 |
| Ex 357 | Ref. | Dopant 2 | Host 1D-P2 | HBL2 | 3.77 | 6.37 | 0.1381 | 0.1012 | 246 |
| Ex 358 | EBL | Dopant 2 | Host 1D-P2 | Ref. | 3.72 | 5.36 | 0.1381 | 0.1012 | 231 |
| Ex 359 | EBL | Dopant 2 | Host 1D-P2 | HBL1 | 3.72 | 6.70 | 0.1381 | 0.1012 | 385 |
| Ex 360 | EBL | Dopant 2 | Host 1D-P2 | HBL2 | 3.57 | 8.04 | 0.1381 | 0.1002 | 308 |
| Ex 361 | Ref. | Dopant 2D | Host 1 | Ref. | 3.96 | 5.04 | 0.1412 | 0.1028 | 240 |
| Ex 362 | Ref. | Dopant 2D | Host 1 | HBL1 | 3.96 | 6.06 | 0.1412 | 0.1028 | 400 |
| Ex 363 | Ref. | Dopant 2D | Host 1 | HBL2 | 3.81 | 6.38 | 0.1382 | 0.1008 | 320 |
| Ex 364 | EBL | Dopant 2D | Host 1 | Ref. | 3.76 | 5.38 | 0.1382 | 0.1008 | 300 |
| Ex 365 | EBL | Dopant 2D | Host 1 | HBL1 | 3.76 | 6.72 | 0.1382 | 0.1008 | 500 |
| Ex 366 | EBL | Dopant 2D | Host 1 | HBL2 | 3.61 | 8.06 | 0.1382 | 0.0998 | 400 |

TABLE 23

| | EBL | EML | | HBL | V | cd/A | CIE (x, y) | | T95 [hr] |
|---|---|---|---|---|---|---|---|---|---|
| Ex 367 | Ref. | Dopant 2D | Host 1D | Ref. | 3.96 | 5.03 | 0.1412 | 0.1032 | 403 |
| Ex 368 | Ref. | Dopant 2D | Host 1D | HBL1 | 3.96 | 6.04 | 0.1412 | 0.1032 | 671 |
| Ex 369 | Ref. | Dopant 2D | Host 1D | HBL2 | 3.81 | 6.37 | 0.1382 | 0.1012 | 537 |
| Ex 370 | EBL | Dopant 2D | Host 1D | Ref. | 3.76 | 5.37 | 0.1382 | 0.1012 | 503 |
| Ex 371 | EBL | Dopant 2D | Host 1D | HBL1 | 3.76 | 6.71 | 0.1382 | 0.1012 | 839 |
| Ex 372 | EBL | Dopant 2D | Host 1D | HBL2 | 3.61 | 8.05 | 0.1382 | 0.1002 | 671 |
| Ex 373 | Ref. | Dopant 2D | Host 1D-A | Ref. | 3.91 | 5.10 | 0.1408 | 0.1033 | 421 |
| Ex 374 | Ref. | Dopant 2D | Host 1D-A | HBL1 | 3.91 | 6.12 | 0.1408 | 0.1033 | 702 |
| Ex 375 | Ref. | Dopant 2D | Host 1D-A | HBL2 | 3.76 | 6.46 | 0.1378 | 0.1013 | 561 |
| Ex 376 | EBL | Dopant 2D | Host 1D-A | Ref. | 3.71 | 5.44 | 0.1378 | 0.1013 | 526 |
| Ex 377 | EBL | Dopant 2D | Host 1D-A | HBL1 | 3.71 | 6.80 | 0.1378 | 0.1013 | 877 |
| Ex 378 | EBL | Dopant 2D | Host 1D-A | HBL2 | 3.56 | 8.16 | 0.1378 | 0.1003 | 702 |
| Ex 379 | Ref. | Dopant 2D | Host 1D-P1 | Ref. | 3.94 | 5.04 | 0.1412 | 0.1027 | 240 |
| Ex 380 | Ref. | Dopant 2D | Host 1D-P1 | HBL1 | 3.94 | 6.05 | 0.1412 | 0.1027 | 400 |
| Ex 381 | Ref. | Dopant 2D | Host 1D-P1 | HBL2 | 3.79 | 6.38 | 0.1382 | 0.1007 | 320 |
| Ex 382 | EBL | Dopant 2D | Host 1D-P1 | Ref. | 3.74 | 5.38 | 0.1382 | 0.1007 | 300 |
| Ex 383 | EBL | Dopant 2D | Host 1D-P1 | HBL1 | 3.74 | 6.72 | 0.1382 | 0.1007 | 500 |
| Ex 384 | EBL | Dopant 2D | Host 1D-P1 | HBL2 | 3.59 | 8.06 | 0.1382 | 0.0997 | 400 |

TABLE 24

| | EBL | EML | | HBL | V | cd/A | CIE (x, y) | | T95 [hr] |
|---|---|---|---|---|---|---|---|---|---|
| Ex 385 | Ref. | Dopant 2D | Host 1D-P2 | Ref. | 3.95 | 5.01 | 0.1411 | 0.1034 | 240 |
| Ex 386 | Ref. | Dopant 2D | Host 1D-P2 | HBL1 | 3.95 | 6.01 | 0.1411 | 0.1034 | 401 |
| Ex 387 | Ref. | Dopant 2D | Host 1D-P2 | HBL2 | 3.80 | 6.35 | 0.1381 | 0.1014 | 321 |
| Ex 388 | EBL | Dopant 2D | Host 1D-P2 | Ref. | 3.75 | 5.34 | 0.1381 | 0.1014 | 301 |
| Ex 389 | EBL | Dopant 2D | Host 1D-P2 | HBL1 | 3.75 | 6.68 | 0.1381 | 0.1014 | 501 |
| Ex 390 | EBL | Dopant 2D | Host 1D-P2 | HBL2 | 3.60 | 8.02 | 0.1381 | 0.1004 | 401 |
| Ex 391 | Ref. | Dopant 2D-A | Host 1 | Ref. | 3.98 | 5.03 | 0.1408 | 0.1033 | 252 |
| Ex 392 | Ref. | Dopant 2D-A | Host 1 | HBL1 | 3.98 | 6.03 | 0.1408 | 0.1033 | 419 |
| Ex 393 | Ref. | Dopant 2D-A | Host | HBL2 | 3.83 | 6.37 | 0.1378 | 0.1013 | 335 |
| Ex 394 | EBL | Dopant 2D-A | Host 1 | Ref. | 3.78 | 5.36 | 0.1378 | 0.1013 | 314 |
| Ex 395 | EBL | Dopant 2D-A | Host 1 | HBL1 | 3.78 | 6.70 | 0.1378 | 0.1013 | 524 |
| Ex 396 | EBL | Dopant 2D-A | Host 1 | HBL2 | 3.63 | 8.04 | 0.1378 | 0.1003 | 419 |
| Ex 397 | Ref. | Dopant 2D-A | Host 1D | Ref. | 3.97 | 5.03 | 0.1412 | 0.1033 | 422 |
| Ex 398 | Ref. | Dopant 2D-A | Host 1D | HBL1 | 3.97 | 6.03 | 0.1412 | 0.1033 | 704 |
| Ex 399 | Ref. | Dopant 2D-A | Host 1D | HBL2 | 3.82 | 6.37 | 0.1382 | 0.1013 | 563 |
| Ex 400 | EBL | Dopant 2D-A | Host 1D | Ref. | 3.77 | 5.36 | 0.1382 | 0.1013 | 528 |
| Ex 401 | EBL | Dopant 2D-A | Host 1D | HBL1 | 3.77 | 6.70 | 0.1382 | 0.1013 | 880 |
| Ex 402 | EBL | Dopant 2D-A | Host 1D | HBL2 | 3.62 | 8.04 | 0.1382 | 0.1003 | 704 |

TABLE 25

| | EBL | EML | | HBL | V | cd/A | CIE (x, y) | | T95 [hr] |
|---|---|---|---|---|---|---|---|---|---|
| Ex 403 | Ref. | Dopant 2D-A | Host 1D-A | Ref. | 3.91 | 5.04 | 0.1413 | 0.1030 | 732 |
| Ex 404 | Ref. | Dopant 2D-A | Host 1D-A | HBL1 | 3.91 | 6.05 | 0.1413 | 0.1030 | 721 |
| Ex 405 | Ref. | Dopant 2D-A | Host 1D-A | HBL2 | 3.76 | 6.38 | 0.1383 | 0.1010 | 577 |
| Ex 406 | EBL | Dopant 2D-A | Host 1D-A | Ref. | 3.71 | 5.38 | 0.1383 | 0.1010 | 541 |
| Ex 407 | EBL | Dopant 2D-A | Host 1D-A | HBL1 | 3.71 | 6.72 | 0.1383 | 0.1010 | 901 |
| Ex 408 | EBL | Dopant 2D-A | Host 1D-A | HBL2 | 3.56 | 8.06 | 0.1383 | 0.1000 | 721 |
| Ex 409 | Ref. | Dopant 2D-A | Host 1D-P1 | Ref. | 3.92 | 5.03 | 0.1412 | 0.1031 | 252 |
| Ex 410 | Ref. | Dopant 2D-A | Host 1D-P1 | HBL1 | 3.92 | 6.04 | 0.1412 | 0.1031 | 420 |
| Ex 411 | Ref. | Dopant 2D-A | Host 1D-P1 | HBL2 | 3.77 | 6.37 | 0.1382 | 0.1011 | 336 |
| Ex 412 | EBL | Dopant 2D-A | Host 1D-P1 | Ref. | 3.72 | 5.37 | 0.1382 | 0.1011 | 315 |
| Ex 413 | EBL | Dopant 2D-A | Host 1D-P1 | HBL1 | 3.72 | 6.71 | 0.1382 | 0.1011 | 525 |
| Ex 414 | EBL | Dopant 2D-A | Host 1D-P1 | HBL2 | 3.57 | 8.05 | 0.1382 | 0.1001 | 420 |
| Ex 415 | Ref. | Dopant 2D-A | Host 1D-P2 | Ref. | 3.95 | 5.00 | 0.1410 | 0.1032 | 252 |
| Ex 416 | Ref. | Dopant 2D-A | Host 1D-P2 | HBL1 | 3.95 | 5.99 | 0.1410 | 0.1032 | 420 |
| Ex 417 | Ref. | Dopant 2D-A | Host 1D-P2 | HBL2 | 3.80 | 6.33 | 0.1380 | 0.1012 | 336 |
| Ex 418 | EBL | Dopant 2D-A | Host 1D-P2 | Ref. | 3.75 | 5.33 | 0.1380 | 0.1012 | 315 |
| Ex 419 | EBL | Dopant 2D-A | Host 1D-P2 | HBL1 | 3.75 | 6.66 | 0.1380 | 0.1012 | 525 |
| Ex 420 | EBL | Dopant 2D-A | Host 1D-P2 | HBL2 | 3.60 | 7.99 | 0.1380 | 0.1002 | 420 |

TABLE 26

| | EBL | EML | | HBL | V | cd/A | CIE (x, y) | | T95 [hr] |
|---|---|---|---|---|---|---|---|---|---|
| Ref 31 | Ref. | Dopant 2 | Host 2 | Ref. | 3.80 | 5.18 | 0.1411 | 0.1041 | 185 |
| Ref 32 | Ref. | Dopant 2 | Host 2 | HBL1 | 3.80 | 6.22 | 0.1411 | 0.1041 | 308 |
| Ref 33 | Ref. | Dopant 2 | Host 2 | HBL2 | 3.65 | 6.56 | 0.1381 | 0.1021 | 246 |
| Ref 34 | EBL | Dopant 2 | Host 2 | Ref. | 3.60 | 5.53 | 0.1381 | 0.1021 | 231 |
| Ref 35 | EBL | Dopant 2 | Host 2 | HBL1 | 3.60 | 6.91 | 0.1381 | 0.1021 | 385 |
| Ref 36 | EBL | Dopant 2 | Host 2 | HBL2 | 3.45 | 8.29 | 0.1381 | 0.1011 | 308 |
| Ex 421 | Ref. | Dopant 2 | Host 2D | Ref. | 3.80 | 5.19 | 0.1413 | 0.1043 | 317 |
| Ex 422 | Ref. | Dopant 2 | Host 2D | HBL1 | 3.80 | 6.23 | 0.1413 | 0.1043 | 528 |
| Ex 423 | Ref. | Dopant 2 | Host 2D | HBL2 | 3.65 | 6.57 | 0.1383 | 0.1023 | 422 |
| Ex 424 | EBL | Dopant 2 | Host 2D | Ref. | 3.60 | 5.54 | 0.1383 | 0.1023 | 396 |
| Ex 425 | EBL | Dopant 2 | Host 2D | HBL1 | 3.60 | 6.92 | 0.1383 | 0.1023 | 660 |
| Ex 426 | EBL | Dopant 2 | Host 2D | HBL2 | 3.45 | 8.30 | 0.1383 | 0.1013 | 528 |
| Ex 427 | Ref. | Dopant 2 | Host 2D-A | Ref. | 3.75 | 5.14 | 0.1411 | 0.1042 | 324 |
| Ex 428 | Ref. | Dopant 2 | Host 2D-A | HBL1 | 3.75 | 6.17 | 0.1411 | 0.1042 | 539 |
| Ex 429 | Ref. | Dopant 2 | Host 2D-A | HBL2 | 3.60 | 6.51 | 0.1381 | 0.1022 | 431 |
| Ex 430 | EBL | Dopant 2 | Host 2D-A | Ref. | 3.55 | 5.48 | 0.1381 | 0.1022 | 404 |
| Ex 431 | EBL | Dopant 2 | Host 2D-A | HBL1 | 3.55 | 6.85 | 0.1381 | 0.1022 | 674 |
| Ex 432 | EBL | Dopant 2 | Host 2D-A | HBL2 | 3.40 | 8.22 | 0.1381 | 0.1012 | 539 |

TABLE 27

| | EBL | EML | | HBL | V | cd/A | CIE (x, y) | | T95 [hr] |
|---|---|---|---|---|---|---|---|---|---|
| Ex 433 | Ref. | Dopant 2 | Host 2D-P1 | Ref. | 3.78 | 5.18 | 0.1412 | 0.1039 | 184 |
| Ex 434 | Ref. | Dopant 2 | Host 2D-P1 | HBL1 | 3.78 | 6.21 | 0.1412 | 0.1039 | 307 |
| Ex 435 | Ref. | Dopant 2 | Host 2D-P1 | HBL2 | 3.63 | 6.56 | 0.1382 | 0.1019 | 246 |
| Ex 436 | EBL | Dopant 2 | Host 2D-P1 | Ref. | 3.58 | 5.52 | 0.1382 | 0.1019 | 230 |
| Ex 437 | EBL | Dopant 2 | Host 2D-P1 | HBL1 | 3.58 | 6.90 | 0.1382 | 0.1019 | 384 |
| Ex 438 | EBL | Dopant 2 | Host 2D-P1 | HBL2 | 3.43 | 8.28 | 0.1382 | 0.1009 | 307 |
| Ex 439 | Ref. | Dopant 2 | Host 2D-P2 | Ref. | 3.78 | 5.16 | 0.1412 | 0.1042 | 185 |
| Ex 440 | Ref. | Dopant 2 | Host 2D-P2 | HBL1 | 3.78 | 6.19 | 0.1412 | 0.1042 | 309 |
| Ex 441 | Ref. | Dopant 2 | Host 2D-P2 | HBL2 | 3.63 | 6.54 | 0.1382 | 0.1022 | 247 |
| Ex 442 | EBL | Dopant 2 | Host 2D-P2 | Ref. | 3.58 | 5.50 | 0.1382 | 0.1022 | 232 |
| Ex 443 | EBL | Dopant 2 | Host 2D-P2 | HBL1 | 3.58 | 6.88 | 0.1382 | 0.1022 | 386 |
| Ex 444 | EBL | Dopant 2 | Host 2D-P2 | HBL2 | 3.43 | 8.26 | 0.1382 | 0.1012 | 309 |
| Ex 445 | Ref. | Dopant 2D | Host 2 | Ref. | 3.79 | 5.18 | 0.1410 | 0.1044 | 241 |
| Ex 446 | Ref. | Dopant 2D | Host 2 | HBL1 | 3.79 | 6.22 | 0.1410 | 0.1044 | 402 |
| Ex 447 | Ref. | Dopant 2D | Host 2 | HBL2 | 3.64 | 6.56 | 0.1380 | 0.1024 | 321 |
| Ex 448 | EBL | Dopant 2D | Host 2 | Ref. | 3.59 | 5.53 | 0.1380 | 0.1024 | 301 |
| Ex 449 | EBL | Dopant 2D | Host 2 | HBL1 | 3.59 | 6.91 | 0.1380 | 0.1024 | 502 |
| Ex 450 | EBL | Dopant 2D | Host 2 | HBL2 | 3.44 | 8.29 | 0.1380 | 0.1014 | 402 |

TABLE 28

| | EBL | EML | | HBL | V | cd/A | CIE (x, y) | | T95 [hr] |
|---|---|---|---|---|---|---|---|---|---|
| Ex 451 | Ref. | Dopant 2D | Host 2D | Ref. | 3.80 | 5.18 | 0.1411 | 0.1043 | 406 |
| Ex 452 | Ref. | Dopant 2D | Host 2D | HBL1 | 3.80 | 6.21 | 0.1411 | 0.1043 | 676 |
| Ex 453 | Ref. | Dopant 2D | Host 2D | HBL2 | 3.65 | 6.56 | 0.1381 | 0.1023 | 541 |
| Ex 454 | EBL | Dopant 2D | Host 2D | Ref. | 3.60 | 5.52 | 0.1381 | 0.1023 | 507 |
| Ex 455 | EBL | Dopant 2D | Host 2D | HBL1 | 3.60 | 6.90 | 0.1381 | 0.1023 | 845 |
| Ex 456 | EBL | Dopant 2D | Host 2D | HBL2 | 3.45 | 8.28 | 0.1381 | 0.1013 | 676 |
| Ex 457 | Ref. | Dopant 2D | Host 2D-A | Ref. | 3.78 | 5.19 | 0.1407 | 0.1042 | 422 |
| Ex 458 | Ref. | Dopant 2D | Host 2D-A | HBL1 | 3.78 | 6.23 | 0.1407 | 0.1042 | 703 |
| Ex 459 | Ref. | Dopant 2D | Host 2D-A | HBL2 | 3.63 | 6.57 | 0.1377 | 0.1022 | 563 |
| Ex 460 | EBL | Dopant 2D | Host 2D-A | Ref. | 3.58 | 5.54 | 0.1377 | 0.1022 | 527 |
| Ex 461 | EBL | Dopant 2D | Host 2D-A | HBL1 | 3.58 | 6.92 | 0.1377 | 0.1022 | 879 |
| Ex 462 | EBL | Dopant 2D | Host 2D-A | HBL2 | 3.43 | 8.30 | 0.1377 | 0.1012 | 703 |
| Ex 463 | Ref. | Dopant 2D | Host 2D-P1 | Ref. | 3.82 | 5.13 | 0.1412 | 0.1039 | 241 |
| Ex 464 | Ref. | Dopant 2D | Host 2D-P1 | HBL1 | 3.82 | 6.16 | 0.1412 | 0.1039 | 402 |
| Ex 465 | Ref. | Dopant 2D | Host 2D-P1 | HBL2 | 3.67 | 6.50 | 0.1382 | 0.1019 | 321 |
| Ex 466 | EBL | Dopant 2D | Host 2D-P1 | Ref. | 3.62 | 5.47 | 0.1382 | 0.1019 | 301 |
| Ex 467 | EBL | Dopant 2D | Host 2D-P1 | HBL1 | 3.62 | 6.84 | 0.1382 | 0.1019 | 502 |
| Ex 468 | EBL | Dopant 2D | Host 2D-P1 | HBL2 | 3.47 | 8.21 | 0.1382 | 0.1009 | 402 |

TABLE 29

| | EBL | EML | | HBL | V | cd/A | CIE (x, y) | | T95 [hr] |
|---|---|---|---|---|---|---|---|---|---|
| Ex 469 | Ref. | Dopant 2D | Host 2D-P2 | Ref. | 3.76 | 5.15 | 0.1413 | 0.1040 | 240 |
| Ex 470 | Ref. | Dopant 2D | Host 2D-P2 | HBL1 | 3.76 | 6.18 | 0.1413 | 0.1040 | 401 |
| Ex 471 | Ref. | Dopant 2D | Host 2D-P2 | HBL2 | 3.61 | 6.53 | 0.1383 | 0.1020 | 321 |
| Ex 472 | EBL | Dopant 2D | Host 2D-P2 | Ref. | 3.56 | 5.50 | 0.1383 | 0.1020 | 301 |
| Ex 473 | EBL | Dopant 2D | Host 2D-P2 | HBL1 | 3.56 | 6.87 | 0.1383 | 0.1020 | 501 |
| Ex 474 | EBL | Dopant 2D | Host 2D-P2 | HBL2 | 3.41 | 8.24 | 0.1383 | 0.1010 | 401 |
| Ex 475 | Ref. | Dopant 2D-A | Host 2 | Ref. | 3.75 | 5.18 | 0.1410 | 0.1040 | 250 |
| Ex 476 | Ref. | Dopant 2D-A | Host 2 | HBL1 | 3.75 | 6.21 | 0.1410 | 0.1040 | 416 |
| Ex 477 | Ref. | Dopant 2D-A | Host 2 | HBL2 | 3.60 | 6.56 | 0.1380 | 0.1020 | 333 |
| Ex 478 | EBL | Dopant 2D-A | Host 2 | Ref. | 3.55 | 5.52 | 0.1380 | 0.1020 | 312 |
| Ex 479 | EBL | Dopant 2D-A | Host 2 | HBL1 | 3.55 | 6.90 | 0.1380 | 0.1020 | 520 |
| Ex 480 | EBL | Dopant 2D-A | Host 2 | HBL2 | 3.40 | 8.28 | 0.1380 | 0.1010 | 416 |
| Ex 481 | Ref. | Dopant 2D-A | Host 2D | Ref. | 3.81 | 5.18 | 0.1411 | 0.1043 | 432 |
| Ex 482 | Ref. | Dopant 2D-A | Host 2D | HBL1 | 3.81 | 6.22 | 0.1411 | 0.1043 | 719 |
| Ex 483 | Ref. | Dopant 2D-A | Host 2D | HBL2 | 3.66 | 6.56 | 0.1381 | 0.1023 | 575 |
| Ex 484 | EBL | Dopant 2D-A | Host 2D | Ref. | 3.61 | 5.53 | 0.1381 | 0.1023 | 539 |
| Ex 485 | EBL | Dopant 2D-A | Host 2D | HBL1 | 3.61 | 6.91 | 0.1381 | 0.1023 | 899 |
| Ex 486 | EBL | Dopant 2D-A | Host 2D | HBL2 | 3.46 | 8.29 | 0.1381 | 0.1013 | 719 |

TABLE 30

| | EBL | EML | | HBL | V | cd/A | CIE (x, y) | | T95 [hr] |
|---|---|---|---|---|---|---|---|---|---|
| Ex 487 | Ref. | Dopant 2D-A | Host 2D-A | Ref. | 3.82 | 5.16 | 0.1412 | 0.1041 | 442 |
| Ex 488 | Ref. | Dopant 2D-A | Host 2D-A | HBL1 | 3.82 | 6.19 | 0.1412 | 0.1041 | 736 |
| Ex 489 | Ref. | Dopant 2D-A | Host 2D-A | HBL2 | 3.67 | 6.54 | 0.1382 | 0.1021 | 589 |
| Ex 490 | EBL | Dopant 2D-A | Host 2D-A | Ref. | 3.62 | 5.50 | 0.1382 | 0.1021 | 552 |
| Ex 491 | EBL | Dopant 2D-A | Host 2D-A | HBL1 | 3.62 | 6.88 | 0.1382 | 0.1021 | 920 |
| Ex 492 | EBL | Dopant 2D-A | Host 2DA | HBL2 | 3.47 | 8.26 | 0.1382 | 0.1011 | 736 |
| Ex 493 | Ref. | Dopant 2D-A | Host 2D-P1 | Ref. | 3.75 | 5.13 | 0.1413 | 0.1042 | 250 |
| Ex 494 | Ref. | Dopant 2D-A | Host 2D-P1 | HBL1 | 3.75 | 6.16 | 0.1413 | 0.1042 | 416 |
| Ex 495 | Ref. | Dopant 2D-A | Host 2D-P1 | HBL2 | 3.60 | 6.50 | 0.1383 | 0.1022 | 333 |
| Ex 496 | EBL | Dopant 2D-A | Host 2D-P1 | Ref. | 3.55 | 5.47 | 0.1383 | 0.1022 | 312 |
| Ex 497 | EBL | Dopant 2D-A | Host 2D-P1 | HBL1 | 3.55 | 6.84 | 0.1383 | 0.1022 | 520 |
| Ex 498 | EBL | Dopant 2D-A | Host 2D-P1 | HBL2 | 3.40 | 8.21 | 0.1383 | 0.1012 | 416 |
| Ex 499 | Ref. | Dopant 2D-A | Host 2D-P2 | Ref. | 3.77 | 5.14 | 0.1411 | 0.1039 | 251 |
| Ex 500 | Ref. | Dopant 2D-A | Host 2D-P2 | HBL1 | 3.77 | 6.17 | 0.1411 | 0.1039 | 418 |
| Ex 501 | Ref. | Dopant 2D-A | Host 2D-P2 | HBL2 | 3.62 | 6.51 | 0.1381 | 0.1019 | 334 |
| Ex 502 | EBL | Dopant 2D-A | Host 2D-P2 | Ref. | 3.57 | 5.48 | 0.1381 | 0.1019 | 313 |
| Ex 503 | EBL | Dopant 2D-A | Host 2D-P2 | HBL1 | 3.57 | 6.85 | 0.1381 | 0.1019 | 522 |
| Ex 504 | EBL | Dopant 2D-A | Host 2D-P2 | HBL2 | 3.42 | 8.22 | 0.1381 | 0.1009 | 418 |

TABLE 31

| | EBL | EML | | HBL | V | cd/A | CIE (x, y) | | T95 [hr] |
|---|---|---|---|---|---|---|---|---|---|
| Ref 37 | Ref. | Dopant 2 | Host 3 | Ref. | 3.72 | 5.01 | 0.1416 | 0.1053 | 162 |
| Ref 38 | Ref. | Dopant 2 | Host 3 | HBL1 | 3.72 | 6.01 | 0.1416 | 0.1053 | 270 |
| Ref 39 | Ref. | Dopant 2 | Host 3 | HBL2 | 3.57 | 6.35 | 0.1386 | 0.1033 | 216 |
| Ref 40 | EBL | Dopant 2 | Host 3 | Ref. | 3.52 | 5.34 | 0.1386 | 0.1033 | 203 |
| Ref 41 | EBL | Dopant 2 | Host 3 | HBL1 | 3.52 | 6.68 | 0.1386 | 0.1033 | 338 |
| Ref 42 | EBL | Dopant 2 | Host 3 | HBL2 | 3.37 | 8.02 | 0.1386 | 0.1023 | 270 |
| Ex 505 | Ref. | Dopant 2 | Host 3D | Ref. | 3.73 | 5.00 | 0.1411 | 0.1052 | 281 |
| Ex 506 | Ref. | Dopant 2 | Host 3D | HBL1 | 3.73 | 5.99 | 0.1411 | 0.1052 | 468 |
| Ex 507 | Ref. | Dopant 2 | Host 3D | HBL2 | 3.58 | 6.33 | 0.1381 | 0.1032 | 374 |
| Ex 508 | EBL | Dopant 2 | Host 3D | Ref. | 3.53 | 5.33 | 0.1381 | 0.1032 | 351 |
| Ex 509 | EBL | Dopant 2 | Host 3D | HBL1 | 3.53 | 6.66 | 0.1381 | 0.1032 | 585 |
| Ex 510 | EBL | Dopant 2 | Host 3D | HBL2 | 3.38 | 7.99 | 0.1381 | 0.1022 | 468 |
| Ex 511 | Ref. | Dopant 2 | Host 3D-A | Ref. | 3.71 | 4.99 | 0.1411 | 0.1053 | 288 |
| Ex 512 | Ref. | Dopant 2 | Host 3D-A | HBL1 | 3.71 | 5.99 | 0.1411 | 0.1053 | 479 |
| Ex 513 | Ref. | Dopant 2 | Host 3D-A | HBL2 | 3.56 | 6.32 | 0.1381 | 0.1033 | 383 |
| Ex 514 | EBL | Dopant 2 | Host 3D-A | Ref. | 3.51 | 5.32 | 0.1381 | 0.1033 | 359 |
| Ex 515 | EBL | Dopant 2 | Host 3D-A | HBL1 | 3.51 | 6.65 | 0.1381 | 0.1033 | 599 |
| Ex 516 | EBL | Dopant 2 | Host 3D-A | HBL2 | 3.36 | 7.98 | 0.1381 | 0.1023 | 479 |

TABLE 32

| | EBL | EML | | HBL | V | cd/A | CIE (x, y) | | T95 [hr] |
|---|---|---|---|---|---|---|---|---|---|
| Ex 517 | Ref. | Dopant 2 | Host 3D-P1 | Ref. | 3.71 | 4.96 | 0.1412 | 0.1051 | 162 |
| Ex 518 | Ref. | Dopant 2 | Host 3D-P1 | HBL1 | 3.71 | 5.95 | 0.1412 | 0.1051 | 270 |
| Ex 519 | Ref. | Dopant 2 | Host 3D-P1 | HBL2 | 3.56 | 6.28 | 0.1382 | 0.1031 | 216 |
| Ex 520 | EBL | Dopant 2 | Host 3D-P1 | Ref. | 3.51 | 5.29 | 0.1382 | 0.1031 | 203 |
| Ex 521 | EBL | Dopant 2 | Host 3D-P1 | HBL1 | 3.51 | 6.61 | 0.1382 | 0.1031 | 338 |
| Ex 522 | EBL | Dopant 2 | Host 3D-P1 | HBL2 | 3.36 | 7.93 | 0.1382 | 0.1021 | 270 |
| Ex 523 | Ref. | Dopant 2 | Host 3D-P2 | Ref. | 3.72 | 5.01 | 0.1414 | 0.1053 | 162 |
| Ex 524 | Ref. | Dopant 2 | Host 3D-P2 | HBL1 | 3.72 | 6.01 | 0.1414 | 0.1053 | 270 |
| Ex 525 | Ref. | Dopant 2 | Host 3D-P2 | HBL2 | 3.57 | 6.35 | 0.1384 | 0.1033 | 216 |
| Ex 526 | EBL | Dopant 2 | Host 3D-P2 | Ref. | 3.52 | 5.34 | 0.1384 | 0.1033 | 203 |
| Ex 527 | EBL | Dopant 2 | Host 3D-P2 | HBL1 | 3.52 | 6.68 | 0.1384 | 0.1033 | 338 |
| Ex 528 | EBL | Dopant 2 | Host 3D-P2 | HBL2 | 3.37 | 8.02 | 0.1384 | 0.1023 | 270 |
| Ex 529 | Ref. | Dopant 2D | Host 3 | Ref. | 3.72 | 5.00 | 0.1412 | 0.1052 | 198 |
| Ex 530 | Ref. | Dopant 2D | Host 3 | HBL1 | 3.72 | 6.00 | 0.1412 | 0.1052 | 330 |
| Ex 531 | Ref. | Dopant 2D | Host 3 | HBL2 | 3.57 | 6.34 | 0.1382 | 0.1032 | 264 |
| Ex 532 | EBL | Dopant 2D | Host 3 | Ref. | 3.52 | 5.34 | 0.1382 | 0.1032 | 247 |
| Ex 533 | EBL | Dopant 2D | Host 3 | HBL1 | 3.52 | 6.67 | 0.1382 | 0.1032 | 412 |
| Ex 534 | EBL | Dopant 2D | Host 3 | HBL2 | 3.37 | 8.00 | 0.1382 | 0.1022 | 330 |

TABLE 33

| | EBL | EML | | HBL | V | cd/A | CIE (x, y) | | T95 [hr] |
|---|---|---|---|---|---|---|---|---|---|
| Ex 535 | Ref. | Dopant 2D | Host 3D | Ref. | 3.71 | 5.02 | 0.1415 | 0.1052 | 354 |
| Ex 536 | Ref. | Dopant 2D | Host 3D | HBL1 | 3.71 | 6.02 | 0.1415 | 0.1052 | 590 |
| Ex 537 | Ref. | Dopant 2D | Host 3D | HBL2 | 3.56 | 6.36 | 0.1385 | 0.1032 | 472 |
| Ex 538 | EBL | Dopant 2D | Host 3D | Ref. | 3.51 | 5.35 | 0.1385 | 0.1032 | 442 |
| Ex 539 | EBL | Dopant 2D | Host 3D | HBL1 | 3.51 | 6.69 | 0.1385 | 0.1032 | 737 |
| Ex 540 | EBL | Dopant 2D | Host 3D | HBL2 | 3.36 | 8.03 | 0.1385 | 0.1022 | 590 |
| Ex 541 | Ref. | Dopant 2D | Host 3D-A | Ref. | 3.70 | 5.00 | 0.1412 | 0.1049 | 359 |
| Ex 542 | Ref. | Dopant 2D | Host 3D-A | HBL1 | 3.70 | 5.99 | 0.1412 | 0.1049 | 598 |
| Ex 543 | Ref. | Dopant 2D | Host 3D-A | HBL2 | 3.55 | 6.33 | 0.1382 | 0.1029 | 479 |
| Ex 544 | EBL | Dopant 2D | Host 3D-A | Ref. | 3.50 | 5.33 | 0.1382 | 0.1029 | 449 |
| Ex 545 | EBL | Dopant 2D | Host 3D-A | HBL1 | 3.50 | 6.66 | 0.1382 | 0.1029 | 748 |
| Ex 546 | EBL | Dopant 2D | Host 3D-A | HBL2 | 3.35 | 7.99 | 0.1382 | 0.1019 | 598 |
| Ex 547 | Ref. | Dopant 2D | Host 3D-P1 | Ref. | 3.75 | 5.01 | 0.1418 | 0.1053 | 197 |
| Ex 548 | Ref. | Dopant 2D | Host 3D-P1 | HBL1 | 3.75 | 6.01 | 0.1418 | 0.1053 | 328 |
| Ex 549 | Ref. | Dopant 2D | Host 3D-P1 | HBL2 | 3.60 | 6.35 | 0.1388 | 0.1033 | 262 |
| Ex 550 | EBL | Dopant 2D | Host 3D-P1 | Ref. | 3.55 | 5.34 | 0.1388 | 0.1033 | 246 |
| Ex 551 | EBL | Dopant 2D | Host 3D-P1 | HBL1 | 3.55 | 6.68 | 0.1388 | 0.1033 | 410 |
| Ex 552 | EBL | Dopant 2D | Host 3D-P1 | HBL2 | 3.40 | 8.02 | 0.1388 | 0.1023 | 328 |

TABLE 34

| | EBL | EML | | HBL | V | cd/A | CIE (x, y) | | T95 [hr] |
|---|---|---|---|---|---|---|---|---|---|
| Ex 553 | Ref. | Dopant 2D | Host 3D-P2 | Ref. | 3.71 | 4.99 | 0.1415 | 0.1051 | 199 |
| Ex 554 | Ref. | Dopant 2D | Host 3D-P2 | HBL1 | 3.71 | 5.99 | 0.1415 | 0.1051 | 331 |
| Ex 555 | Ref. | Dopant 2D | Host 3D-P2 | HBL2 | 3.56 | 6.32 | 0.1385 | 0.1031 | 265 |
| Ex 556 | EBL | Dopant 2D | Host 3D-P2 | Ref. | 3.51 | 5.32 | 0.1385 | 0.1031 | 248 |
| Ex 557 | EBL | Dopant 2D | Host 3D-P2 | HBL1 | 3.51 | 6.65 | 0.1385 | 0.1031 | 414 |
| Ex 558 | EBL | Dopant 2D | Host 3D-P2 | HBL2 | 3.36 | 7.98 | 0.1385 | 0.1021 | 331 |
| Ex 559 | Ref. | Dopant 2D-A | Host 3 | Ref. | 3.72 | 5.02 | 0.1411 | 0.1051 | 219 |
| Ex 560 | Ref. | Dopant 2D-A | Host 3 | HBL1 | 3.72 | 6.02 | 0.1411 | 0.1051 | 365 |
| Ex 561 | Ref. | Dopant 2D-A | Host 3 | HBL2 | 3.57 | 6.36 | 0.1381 | 0.1031 | 292 |
| Ex 562 | EBL | Dopant 2D-A | Host 3 | Ref. | 3.52 | 5.35 | 0.1381 | 0.1031 | 274 |
| Ex 563 | EBL | Dopant 2D-A | Host 3 | HBL1 | 3.52 | 6.69 | 0.1381 | 0.1031 | 456 |
| Ex 564 | EBL | Dopant 2D-A | Host 3 | HBL2 | 3.37 | 8.03 | 0.1381 | 0.1021 | 365 |
| Ex 565 | Ref. | Dopant 2D-A | Host 3D | Ref. | 3.71 | 5.02 | 0.1414 | 0.1051 | 372 |
| Ex 566 | Ref. | Dopant 2D-A | Host 3D | HBL1 | 3.71 | 6.02 | 0.1414 | 0.1051 | 619 |
| Ex 567 | Ref. | Dopant 2D-A | Host 3D | HBL2 | 3.56 | 6.36 | 0.1384 | 0.1031 | 495 |
| Ex 568 | EBL | Dopant 2D-A | Host 3D | Ref. | 3.51 | 5.35 | 0.1384 | 0.1031 | 464 |
| Ex 569 | EBL | Dopant 2D-A | Host 3D | HBL1 | 3.51 | 6.69 | 0.1384 | 0.1031 | 774 |
| Ex 570 | EBL | Dopant 2D-A | Host 3D | HBL2 | 3.36 | 8.03 | 0.1384 | 0.1021 | 619 |

TABLE 35

| | EBL | EML | | HBL | V | cd/A | CIE (x, y) | | T95 [hr] |
|---|---|---|---|---|---|---|---|---|---|
| Ex 571 | Ref. | Dopant 2D-A | Host 3D-A | Ref. | 3.73 | 5.01 | 0.1411 | 0.1052 | 390 |
| Ex 572 | Ref. | Dopant 2D-A | Host 3D-A | HBL1 | 3.73 | 6.01 | 0.1411 | 0.1052 | 650 |
| Ex 573 | Ref. | Dopant 2D-A | Host 3D-A | HBL2 | 3.58 | 6.35 | 0.1381 | 0.1032 | 520 |
| Ex 574 | EBL | Dopant 2D-A | Host 3D-A | Ref. | 3.53 | 5.34 | 0.1381 | 0.1032 | 487 |
| Ex 575 | EBL | Dopant 2D-A | Host 3D-A | HBL1 | 3.53 | 6.68 | 0.1381 | 0.1032 | 812 |
| Ex 576 | EBL | Dopant 2D-A | Host 3D-A | HBL2 | 3.38 | 8.02 | 0.1381 | 0.1022 | 650 |
| Ex 577 | Ref. | Dopant 2D-A | Host 3D-P1 | Ref. | 3.71 | 4.97 | 0.1414 | 0.1053 | 218 |
| Ex 578 | Ref. | Dopant 2D-A | Host 3D-P1 | HBL1 | 3.71 | 5.96 | 0.1414 | 0.1053 | 364 |
| Ex 579 | Ref. | Dopant 2D-A | Host 3D-P1 | HBL2 | 3.56 | 6.29 | 0.1384 | 0.1033 | 291 |
| Ex 580 | EBL | Dopant 2D-A | Host 3D-P1 | Ref. | 3.51 | 5.30 | 0.1384 | 0.1033 | 273 |
| Ex 581 | EBL | Dopant 2D-A | Host 3D-P1 | HBL1 | 3.51 | 6.62 | 0.1384 | 0.1033 | 455 |
| Ex 582 | EBL | Dopant 2D-A | Host 3D-P1 | HBL2 | 3.36 | 7.94 | 0.1384 | 0.1023 | 364 |
| Ex 583 | Ref. | Dopant 2D-A | Host 3D-P2 | Ref. | 3.70 | 5.00 | 0.1414 | 0.1053 | 219 |
| Ex 584 | Ref. | Dopant 2D-A | Host 3D-P2 | HBL1 | 3.70 | 6.00 | 0.1414 | 0.1053 | 365 |
| Ex 585 | Ref. | Dopant 2D-A | Host 3D-P2 | HBL2 | 3.55 | 6.34 | 0.1384 | 0.1033 | 292 |
| Ex 586 | EBL | Dopant 2D-A | Host 3D-P2 | Ref. | 3.50 | 5.34 | 0.1384 | 0.1033 | 274 |
| Ex 587 | EBL | Dopant 2D-A | Host 3D-P2 | HBL1 | 3.50 | 6.67 | 0.1384 | 0.1033 | 456 |
| Ex 588 | EBL | Dopant 2D-A | Host 3D-P2 | HBL2 | 3.35 | 8.00 | 0.1384 | 0.1023 | 365 |

TABLE 36

| | EBL | EML | | HBL | V | cd/A | CIE (x, y) | | T95 [hr] |
|---|---|---|---|---|---|---|---|---|---|
| Ref 43 | Ref. | Dopant 2 | Host 4 | Ref. | 3.74 | 5.03 | 0.1412 | 0.1051 | 168 |
| Ref 44 | Ref. | Dopant 2 | Host 4 | HBL1 | 3.74 | 6.03 | 0.1412 | 0.1051 | 281 |
| Ref 45 | Ref. | Dopant 2 | Host 4 | HBL2 | 3.59 | 6.37 | 0.1382 | 0.1031 | 225 |
| Ref 46 | EBL | Dopant 2 | Host 4 | Ref. | 3.54 | 5.36 | 0.1382 | 0.1031 | 211 |
| Ref 47 | EBL | Dopant 2 | Host 4 | HBL1 | 3.54 | 6.70 | 0.1382 | 0.1031 | 351 |
| Ref 48 | EBL | Dopant 2 | Host 4 | HBL2 | 3.39 | 8.04 | 0.1382 | 0.1021 | 281 |
| Ex 589 | Ref. | Dopant 2 | Host 4D | Ref. | 3.74 | 5.05 | 0.1411 | 0.1051 | 288 |
| Ex 590 | Ref. | Dopant 2 | Host 4D | HBL1 | 3.74 | 6.06 | 0.1411 | 0.1051 | 480 |
| Ex 591 | Ref. | Dopant 2 | Host 4D | HBL2 | 3.59 | 6.39 | 0.1381 | 0.1031 | 384 |
| Ex 592 | EBL | Dopant 2 | Host 4D | Ref. | 3.54 | 5.38 | 0.1381 | 0.1031 | 360 |
| Ex 593 | EBL | Dopant 2 | Host 4D | HBL1 | 3.54 | 6.73 | 0.1381 | 0.1031 | 600 |
| Ex 594 | EBL | Dopant 2 | Host 4D | HBL2 | 3.39 | 8.08 | 0.1381 | 0.1021 | 480 |
| Ex 595 | Ref. | Dopant 2 | Host 4D-A | Ref. | 3.75 | 5.02 | 0.1410 | 0.1053 | 293 |
| Ex 596 | Ref. | Dopant 2 | Host 4D-A | HBL1 | 3.75 | 6.02 | 0.1410 | 0.1053 | 488 |
| Ex 597 | Ref. | Dopant 2 | Host 4D-A | HBL2 | 3.60 | 6.36 | 0.1380 | 0.1033 | 390 |
| Ex 598 | EBL | Dopant 2 | Host 4D-A | Ref. | 3.55 | 5.35 | 0.1380 | 0.1033 | 366 |
| Ex 599 | EBL | Dopant 2 | Host 4D-A | HBL1 | 3.55 | 6.69 | 0.1380 | 0.1033 | 610 |
| Ex 600 | EBL | Dopant 2 | Host 4D-A | HBL2 | 3.40 | 8.03 | 0.1380 | 0.1023 | 488 |

TABLE 37

| | EBL | EML | | HBL | V | cd/A | CIE (x, y) | | T95 [hr] |
|---|---|---|---|---|---|---|---|---|---|
| Ex 601 | Ref. | Dopant 2 | Host 4D-P1 | Ref | 3.71 | 5.01 | 0.1411 | 0.1052 | 168 |
| Ex 602 | Ref. | Dopant 2 | Host 4D-P1 | HBL1 | 3.71 | 6.01 | 0.1411 | 0.1052 | 281 |
| Ex 603 | Ref. | Dopant 2 | Host 4D-P1 | HBL2 | 3.56 | 6.35 | 0.1381 | 0.1032 | 225 |
| Ex 604 | EBL | Dopant 2 | Host 4D-P1 | Ref. | 3.51 | 5.34 | 0.1381 | 0.1032 | 211 |
| Ex 605 | EBL | Dopant 2 | Host 4D-P1 | HBL1 | 3.51 | 6.68 | 0.1381 | 0.1032 | 351 |
| Ex 606 | EBL | Dopant 2 | Host 4D-P1 | HBL2 | 3.36 | 8.02 | 0.1381 | 0.1022 | 281 |
| Ex 607 | Ref. | Dopant 2 | Host 4D-P2 | Ref. | 3.70 | 5.01 | 0.1415 | 0.1051 | 168 |
| Ex 608 | Ref. | Dopant 2 | Host 4D-P2 | HBL1 | 3.70 | 6.01 | 0.1415 | 0.1051 | 281 |
| Ex 609 | Ref. | Dopant 2 | Host 4D-P2 | HBL2 | 3.55 | 6.35 | 0.1385 | 0.1031 | 225 |
| Ex 610 | EBL | Dopant 2 | Host 4D-P2 | Ref. | 3.50 | 5.34 | 0.1385 | 0.1031 | 211 |
| Ex 611 | EBL | Dopant 2 | Host 4D-P2 | HBL1 | 3.50 | 6.68 | 0.1385 | 0.1031 | 351 |
| Ex 612 | EBL | Dopant 2 | Host 4D-P2 | HBL2 | 3.35 | 8.02 | 0.1385 | 0.1021 | 281 |
| Ex 613 | Ref. | Dopant 2D | Host 4 | Ref. | 3.73 | 5.04 | 0.1417 | 0.1050 | 207 |
| Ex 614 | Ref. | Dopant 2D | Host 4 | HBL1 | 3.73 | 6.05 | 0.1417 | 0.1050 | 345 |
| Ex 615 | Ref. | Dopant 2D | Host 4 | HBL2 | 3.58 | 6.38 | 0.1387 | 0.1030 | 276 |
| Ex 616 | EBL | Dopant 2D | Host 4 | Ref. | 3.53 | 5.38 | 0.1387 | 0.1030 | 259 |
| Ex 617 | EBL | Dopant 2D | Host 4 | HBL1 | 3.53 | 6.72 | 0.1387 | 0.1030 | 431 |
| Ex 618 | EBL | Dopant 2D | Host 4 | HBL2 | 3.38 | 8.06 | 0.1387 | 0.1020 | 345 |

TABLE 38

| | EBL | EML | | HBL | V | cd/A | CIE (x, y) | | T95 [hr] |
|---|---|---|---|---|---|---|---|---|---|
| Ex 619 | Ref. | Dopant 2D | Host 4D | Ref. | 3.73 | 5.03 | 0.1413 | 0.1052 | 367 |
| Ex 620 | Ref. | Dopant 2D | Host 4D | HBL1 | 3.73 | 6.03 | 0.1413 | 0.1052 | 611 |
| Ex 621 | Ref. | Dopant 2D | Host 4D | HBL2 | 3.58 | 6.37 | 0.1383 | 0.1032 | 489 |
| Ex 622 | EBL | Dopant 2D | Host 4D | Ref. | 3.53 | 5.36 | 0.1383 | 0.1032 | 458 |
| Ex 623 | EBL | Dopant 2D | Host 4D | HBL1 | 3.53 | 6.70 | 0.1383 | 0.1032 | 764 |
| Ex 624 | EBL | Dopant 2D | Host 4D | HBL2 | 3.38 | 8.04 | 0.1383 | 0.1022 | 611 |
| Ex 625 | Ref. | Dopant 2D | Host 4D-A | Ref. | 3.73 | 5.04 | 0.1412 | 0.1052 | 379 |
| Ex 626 | Ref. | Dopant 2D | Host 4D-A | HBL1 | 3.73 | 6.05 | 0.1412 | 0.1052 | 632 |
| Ex 627 | Ref. | Dopant 2D | Host 4D-A | HBL2 | 3.58 | 6.38 | 0.1382 | 0.1032 | 506 |
| Ex 628 | EBL | Dopant 2D | Host 4D-A | Ref. | 3.53 | 5.38 | 0.1382 | 0.1032 | 474 |
| Ex 629 | EBL | Dopant 2D | Host 4D-A | HBL1 | 3.53 | 6.72 | 0.1382 | 0.1032 | 790 |
| Ex 630 | EBL | Dopant 2D | Host 4D-A | HBL2 | 3.38 | 8.06 | 0.1382 | 0.1022 | 632 |
| Ex 631 | Ref. | Dopant 2D | Host 4D-P1 | Ref. | 3.72 | 5.03 | 0.1408 | 0.1053 | 208 |
| Ex 632 | Ref. | Dopant 2D | Host 4D-P1 | HBL1 | 3.72 | 6.04 | 0.1408 | 0.1053 | 346 |
| Ex 633 | Ref. | Dopant 2D | Host 4D-P1 | HBL2 | 3.57 | 6.37 | 0.1378 | 0.1033 | 277 |
| Ex 634 | EBL | Dopant 2D | Host 4D-P1 | Ref. | 3.52 | 5.37 | 0.1378 | 0.1033 | 260 |
| Ex 635 | EBL | Dopant 2D | Host 4D-P1 | HBL1 | 3.52 | 6.71 | 0.1378 | 0.1033 | 433 |
| Ex 636 | EBL | Dopant 2D | Host 4D-P1 | HBL2 | 3.37 | 8.05 | 0.1378 | 0.1023 | 346 |

TABLE 39

| | EBL | EML | | HBL | V | cd/A | CIE (x, y) | | T95 [hr] |
|---|---|---|---|---|---|---|---|---|---|
| Ex 637 | Ref. | Dopant 2D | Host 4D-P2 | Ref. | 3.71 | 5.03 | 0.1412 | 0.1050 | 209 |
| Ex 638 | Ref. | Dopant 2D | Host 4D-P2 | HBL1 | 3.71 | 6.03 | 0.1412 | 0.1050 | 348 |
| Ex 639 | Ref. | Dopant 2D | Host 4D-P2 | HBL2 | 3.56 | 6.37 | 0.1382 | 0.1030 | 278 |
| Ex 640 | EBL | Dopant 2D | Host 4D-P2 | Ref. | 3.51 | 5.36 | 0.1382 | 0.1030 | 261 |
| Ex 641 | EBL | Dopant 2D | Host 4D-P2 | HBL1 | 3.51 | 6.70 | 0.1382 | 0.1030 | 435 |
| Ex 642 | EBL | Dopant 2D | Host 4D-P2 | HBL2 | 3.36 | 8.04 | 0.1382 | 0.1020 | 348 |
| Ex 643 | Ref. | Dopant 2D-A | Host 4 | Ref. | 3.74 | 5.01 | 0.1413 | 0.1052 | 227 |
| Ex 644 | Ref. | Dopant 2D-A | Host 4 | HBL1 | 3.74 | 6.01 | 0.1413 | 0.1052 | 378 |
| Ex 645 | Ref. | Dopant 2D-A | Host 4 | HBL2 | 3.59 | 6.35 | 0.1383 | 0.1032 | 303 |
| Ex 646 | EBL | Dopant 2D-A | Host 4 | Ref. | 3.54 | 5.34 | 0.1383 | 0.1032 | 284 |
| Ex 647 | EBL | Dopant 2D-A | Host 4 | HBL1 | 3.54 | 6.68 | 0.1383 | 0.1032 | 473 |
| Ex 648 | EBL | Dopant 2D-A | Host 4 | HBL2 | 3.39 | 8.02 | 0.1383 | 0.1022 | 378 |
| Ex 649 | Ref. | Dopant 2D-A | Host 4D | Ref. | 3.73 | 5.03 | 0.1413 | 0.1052 | 384 |
| Ex 650 | Ref. | Dopant 2D-A | Host 4D | HBL1 | 3.73 | 6.04 | 0.1413 | 0.1052 | 640 |
| Ex 651 | Ref. | Dopant 2D-A | Host 4D | HBL2 | 3.58 | 6.37 | 0.1383 | 0.1032 | 512 |
| Ex 652 | EBL | Dopant 2D-A | Host 4D | Ref. | 3.53 | 5.37 | 0.1383 | 0.1032 | 480 |
| Ex 653 | EBL | Dopant 2D-A | Host 4D | HBL1 | 3.53 | 6.71 | 0.1383 | 0.1032 | 800 |
| Ex 654 | EBL | Dopant 2D-A | Host 4D | HBL2 | 3.38 | 8.05 | 0.1383 | 0.1022 | 640 |

TABLE 40

| | EBL | EML | | HBL | V | cd/A | CIE (x, y) | | T95 [hr] |
|---|---|---|---|---|---|---|---|---|---|
| Ex 655 | Ref. | Dopant 2D-A | Host 4D-A | Ref. | 3.71 | 5.03 | 0.1411 | 0.1050 | 397 |
| Ex 656 | Ref. | Dopant 2D-A | Host 4D-A | HBL1 | 3.71 | 6.03 | 0.1411 | 0.1050 | 662 |
| Ex 657 | Ref. | Dopant 2D-A | Host 4D-A | HBL2 | 3.56 | 6.37 | 0.1381 | 0.1030 | 530 |
| Ex 658 | EBL | Dopant 2D-A | Host 4D-A | Ref. | 3.51 | 5.36 | 0.1381 | 0.1030 | 497 |
| Ex 659 | EBL | Dopant 2D-A | Host 4D-A | HBL1 | 3.51 | 6.70 | 0.1381 | 0.1030 | 828 |
| Ex 660 | EBL | Dopant 2D-A | Host 4D-A | HBL2 | 3.36 | 8.04 | 0.1381 | 0.1020 | 662 |
| Ex 661 | Ref. | Dopant 2D-A | Host 4D-P1 | Ref. | 3.70 | 5.01 | 0.1410 | 0.1053 | 227 |
| Ex 662 | Ref. | Dopant 2D-A | Host 4D-P1 | HBL1 | 3.70 | 6.01 | 0.1410 | 0.1053 | 378 |
| Ex 663 | Ref. | Dopant 2D-A | Host 4D-P1 | HBL2 | 3.55 | 6.35 | 0.1380 | 0.1033 | 303 |
| Ex 664 | EBL | Dopant 2D-A | Host 4D-P1 | Ref. | 3.50 | 5.34 | 0.1380 | 0.1033 | 284 |
| Ex 665 | EBL | Dopant 2D-A | Host 4D-P1 | HBL1 | 3.50 | 6.68 | 0.1380 | 0.1033 | 473 |
| Ex 666 | EBL | Dopant 2D-A | Host 4D-P1 | HBL2 | 3.35 | 8.02 | 0.1380 | 0.1023 | 378 |
| Ex 667 | Ref. | Dopant 2D-A | Host 4D-P2 | Ref. | 3.74 | 5.02 | 0.1412 | 0.1051 | 227 |
| Ex 668 | Ref. | Dopant 2D-A | Host 4D-P2 | HBL1 | 3.74 | 6.02 | 0.1412 | 0.1051 | 378 |
| Ex 669 | Ref. | Dopant 2D-A | Host 4D-P2 | HBL2 | 3.59 | 6.36 | 0.1382 | 0.1031 | 303 |
| Ex 670 | EBL | Dopant 2D-A | Host 4D-P2 | Ref. | 3.54 | 5.35 | 0.1382 | 0.1031 | 284 |
| Ex 671 | EBL | Dopant 2D-A | Host 4D-P2 | HBL1 | 3.54 | 6.69 | 0.1382 | 0.1031 | 473 |
| Ex 672 | EBL | Dopant 2D-A | Host 4D-P2 | HBL2 | 3.39 | 8.03 | 0.1382 | 0.1021 | 378 |

As shown in Tables 1 to 40, in comparison to the OLED in Comparative Examples 1 to 48, which uses the non-deuterated anthracene derivative as the host and the non-deuterated pyrene derivative as the dopant, the lifespan of the OLED in Examples 1 to 672, which uses an anthracene derivative as the host and a pyrene derivative as the dopant and at least one of anthracene derivative and the pyrene derivative is deuterated, is increased.

Particularly, when at least one of an anthracene core of the anthracene derivative as the host and a pyrene core of the pyrene derivative as the dopant is deuterated or at least one of the anthracene derivative and the pyrene derivative is wholly deuterated, the lifespan of the OLED is significantly increased.

On the other hand, in comparison to the OLED, which uses the wholly-deuterated anthracene derivative as the host, the lifespan of the OLED, which uses the core-deuterated anthracene derivative as the host, is slightly short. However, the OLED using the core-deuterated anthracene derivative provides sufficient lifespan increase with low ratio of deuterium, which is expensive. Namely, the OLED has enhanced emitting efficiency and lifespan with minimizing production cost increase.

In addition, in comparison to the OLED, which uses the wholly-deuterated pyrene derivative as the host, the lifespan of the OLED, which uses the core-deuterated pyrene derivative as the host, is slightly short. However, the OLED using the core-deuterated pyrene derivative provides sufficient lifespan increase with low ratio of deuterium, which is expensive.

Moreover, the EBL includes the electron blocking material of Formula 8 such that the emitting efficiency and the lifespan of the OLED is further improved.

Further, the HBL includes the hole blocking material of Formula 10 or 12 such that the emitting efficiency and the lifespan of the OLED is further improved.

FIG. 4 is a schematic cross-sectional view illustrating an OLED having a tandem structure of two emitting units according to the first embodiment of the present disclosure.

As shown in FIG. 4, the OLED D includes the first and second electrodes 160 and 164 facing each other and the organic emitting layer 162 between the first and second electrodes 160 and 164. The organic emitting layer 162 includes a first emitting part 310 including a first EML 320, a second emitting part 330 including a second EML 340 and a charge generation layer (CGL) 350 between the first and second emitting parts 310 and 330. Namely, the OLED D in FIG. 4 and the OLED D in FIG. 3 have a difference in the organic emitting layer 162.

The first electrode 160 may be formed of a conductive material having a relatively high work function to serve as an anode for injecting a hole into the organic emitting layer 162. The second electrode 164 may be formed of a conductive material having a relatively low work function to serve as a cathode for injecting an electron into the organic emitting layer 162. The first electrode 160 may be formed of ITO or IZO, and the second electrode 164 may be formed of Al, Mg, Ag, AlMg or MgAg.

The CGL 350 is positioned between the first and second emitting parts 310 and 330, and the first emitting part 310, the CGL 350 and the second emitting part 330 are sequentially stacked on the first electrode 160. Namely, the first emitting part 310 is positioned between the first electrode 160 and the CGL 350, and the second emitting part 330 is positioned between the second electrode 164 and the CGL 350.

The first emitting part 310 includes a first EML 320. In addition, the first emitting part 310 may further include a first EBL 316 between the first electrode 160 and the first EML 320 and a first HBL 318 between the first EML 320 and the CGL 350.

In addition, the first emitting part 310 may further include a first HTL 314 between the first electrode 160 and the first EBL 316 and an HIL 312 between the first electrode 160 and the first HTL 314.

The first EML 320 includes a host 322, which is an anthracene derivative, and a dopant 324, which is a pyrene derivative, and at least one of the hydrogen atoms in the anthracene derivative and the pyrene derivative, is substituted by a deuterium atom (D). The first EML 320 provides a blue emission.

For example, the hydrogen atoms in at least one of the anthracene derivative and the pyrene derivative may be wholly deuterated. When the anthracene derivative as the host 322 is wholly deuterated (e.g., "wholly-deuterated anthracene derivative"), the hydrogen atoms in the pyrene derivative as the dopant 324 may be non-deuterated (e.g., "non-deuterated pyrene derivative"), a part of the hydrogen atoms in the pyrene derivative as the dopant 324 may be deuterated (e.g., "partially-deuterated pyrene derivative"), or all of the hydrogen atoms in the pyrene derivative as the dopant 324 may be deuterated (e.g., "wholly-deuterated pyrene derivative"). Alternatively, when the pyrene derivative as the dopant 324 is wholly deuterated (e.g., "wholly-deuterated pyrene derivative"), the hydrogen atoms in the anthracene derivative as the host 322 may be non-deuterated (e.g., "non-deuterated anthracene derivative"), a part of the hydrogen atoms in the anthracene derivative as the host 322 may be deuterated (e.g., "partially-deuterated anthracene derivative"), or all of the hydrogen atoms in the anthracene derivative as the host 322 may be deuterated (e.g., "wholly-deuterated anthracene derivative").

At least one of an anthracene core of the host 322 and a pyrene core of the dopant 324 may be deuterated.

For example, when the anthracene core of the host 322 is deuterated (e.g., "core-deuterated anthracene derivative"), the dopant 324 may be non-deuterated (e.g., "non-deuterated pyrene derivative") or all of the pyrene core and a substituent of the dopant 324 may be deuterated (e.g., "wholly-deuterated pyrene derivative"). Alternatively, the pyrene core of the dopant 324 except the substituent may be deuterated (e.g., "core-deuterated pyrene derivative"), or the substituent of the dopant 324 except the pyrene core may be deuterated (e.g., "substituent-deuterated pyrene derivative").

On the other hand, in the first EML 320, when the pyrene core of the dopant 324 is deuterated (e.g., "core-deuterated pyrene derivative"), the host 322 may be non-deuterated (e.g., "non-deuterated anthracene derivative") or all of the anthracene core and a substituent of the host 322 may be deuterated (e.g., "wholly-deuterated anthracene derivative"). Alternatively, the anthracene core of the host 322 except the substituent may be deuterated (e.g., "core-deuterated anthracene derivative"), or the substituent of the host 322 except the anthracene core may be deuterated (e.g., "substituent-deuterated anthracene derivative").

In the first EML 320, the host 322 may have a weight % of about 70 to 99.9, and the dopant 324 may have a weight % of about 0.1 to 30. To provide sufficient emitting efficiency and lifespan, a weight % of the dopant 324 may be about 0.1 to 10, preferably about 1 to 5.

The first EBL 316 may include the electron blocking material of Formula 8. In addition, the first HBL 318 may include at least one of the hole blocking material of Formula 10 and the hole blocking material of Formula 12.

The second emitting part 330 includes the second EML 340. In addition, the second emitting part 330 may further include a second EBL 334 between the CGL 350 and the second EML 340 and a second HBL 336 between the second EML 340 and the second electrode 164.

In addition, the second emitting part 330 may further include a second HTL 332 between the CGL 350 and the second EBL 334 and an EIL 338 between the second HBL 336 and the second electrode 164.

The second EML 340 includes a host 342, which is an anthracene derivative, a dopant 344, which is a pyrene derivative, and at least one of the hydrogen atoms in the anthracene derivative and the pyrene derivative, is substituted by a deuterium atom (D). The second EML 340 provides a blue emission.

For example, the anthracene derivative as the host 342 may be wholly deuterated (e.g., "wholly-deuterated anthracene derivative"), or the anthracene core of the anthracene derivative may be deuterated (e.g., "core-deuterated anthracene derivative"). In this instance, the hydrogen atoms in the pyrene derivative as the dopant 344 may be non-deuterated (e.g., "non-deuterated pyrene derivative"), or all of the pyrene core and a substituent of the dopant 344 may be deuterated (e.g., "wholly-deuterated pyrene derivative"). Alternatively, the pyrene core of the dopant 344 except the substituent may be deuterated (e.g., "core-deuterated pyrene derivative"), or the substituent of the dopant 344 except the pyrene core may be deuterated (e.g., "substituent-deuterated pyrene derivative").

The pyrene derivative as the dopant 344 may be wholly deuterated (e.g., "wholly-deuterated pyrene derivative"), or the pyrene core of the pyrene derivative may be deuterated (e.g., "core-deuterated pyrene derivative"). In this instance, the hydrogen atoms in the anthracene derivative as the host 342 may be non-deuterated (e.g., "non-deuterated anthracene derivative"), or all of the anthracene core and a substituent of the host 342 may be deuterated (e.g., "wholly-deuterated anthracene derivative"). Alternatively, the anthracene core of the host 342 except the substituent may be deuterated (e.g., "core-deuterated anthracene derivative"), or the substituent of the host 342 except the anthracene core may be deuterated (e.g., "substituent-deuterated anthracene derivative").

In the second EML 340, the host 342 may have a weight % of about 70 to 99.9, and the dopant 344 may have a weight % of about 0.1 to 30. To provide sufficient emitting efficiency and lifespan, a weight % of the dopant 344 may be about 0.1 to 10, preferably about 1 to 5.

The host 342 of the second EML 340 may be same as or different from the host 322 of the first EML 320, and the dopant 344 of the second EML 340 may be same as or different from the dopant 324 of the first EML 320.

The second EBL 334 may include the electron blocking material of Formula 8. In addition, the second HBL 336 may include at least one of the hole blocking material of Formula 10 and the hole blocking material of Formula 12.

The CGL 350 is positioned between the first and second emitting parts 310 and 330. Namely, the first and second emitting parts 310 and 330 are connected through the CGL 350. The CGL 350 may be a P-N junction CGL of an N-type CGL 352 and a P-type CGL 354.

The N-type CGL 352 is positioned between the first HBL 318 and the second HTL 332, and the P-type CGL 354 is positioned between the N-type CGL 352 and the second HTL 332.

In the OLED D, since each of the first and second EMLs 320 and 340 includes the host 322 and 342, each of which is an anthracene derivative, and the dopant 324 and 344, each of which is a pyrene derivative, and at least one of the hydrogens in the anthracene derivative and of the pyrene derivative is substituted by D (e.g., deuterated). As a result, the OLED D and the organic light emitting display device 100 have advantages in the emitting efficiency and the lifespan.

For example, when at least one of an anthracene core of the anthracene derivative and a pyrene core of the pyrene derivative is deuterated, the OLED and the organic light emitting display device 100 have sufficient emitting efficiency and lifespan with minimizing production cost increase.

In addition, at least one of the first and second EBLs 316 and 334 includes an amine derivative of Formula 9, and at least one of the first and second HBLs 318 and 336 includes at least one of a hole blocking material of Formula 11 and a hole blocking material of Formula 13. As a result, the lifespan of the OLED D and the organic light emitting display device 100 is further improved.

In addition, since the first and second emitting parts 310 and 330 for emitting blue light are stacked, the organic light emitting display device 100 provides an image having high color temperature.

FIG. 5 is a schematic cross-sectional view illustrating an organic light emitting display device according to a second embodiment of the present disclosure, and FIG. 6 is a schematic cross-sectional view illustrating an OLED for the organic light emitting display device according to the second embodiment of the present disclosure.

As shown in FIG. 5, the organic light emitting display device 400 includes a first substrate 410, where a red pixel RP, a green pixel GP and a blue pixel BP are defined, a second substrate 470 facing the first substrate 410, an OLED D, which is positioned between the first and second substrates 410 and 470 and providing white emission, and a color filter layer 480 between the OLED D and the second substrate 470.

Each of the first and second substrates 410 and 470 may be a glass substrate or a plastic substrate. For example, each of the first and second substrates 410 and 470 may be a polyimide substrate.

A buffer layer 420 is formed on the substrate, and the TFT Tr corresponding to each of the red, green and blue pixels RP, GP and BP is formed on the buffer layer 420. The buffer layer 420 may be omitted.

A semiconductor layer 422 is formed on the buffer layer 420. The semiconductor layer 122 may include an oxide semiconductor material or polycrystalline silicon.

A gate insulating layer 424 is formed on the semiconductor layer 422. The gate insulating layer 424 may be formed of an inorganic insulating material such as silicon oxide or silicon nitride.

A gate electrode 430, which is formed of a conductive material, e.g., metal, is formed on the gate insulating layer 424 to correspond to a center of the semiconductor layer 422.

An interlayer insulating layer 432, which is formed of an insulating material, is formed on the gate electrode 430. The interlayer insulating layer 432 may be formed of an inorganic insulating material, e.g., silicon oxide or silicon nitride, or an organic insulating material, e.g., benzocyclobutene or photo-acryl.

The interlayer insulating layer 432 includes first and second contact holes 434 and 436 exposing both sides of the semiconductor layer 422. The first and second contact holes 434 and 436 are positioned at both sides of the gate electrode 430 to be spaced apart from the gate electrode 430.

A source electrode 440 and a drain electrode 442, which are formed of a conductive material, e.g., metal, are formed on the interlayer insulating layer 432.

The source electrode 440 and the drain electrode 442 are spaced apart from each other with respect to the gate electrode 430 and respectively contact both sides of the semiconductor layer 422 through the first and second contact holes 434 and 436.

The semiconductor layer 422, the gate electrode 430, the source electrode 440 and the drain electrode 442 constitute the TFT Tr. The TFT Tr serves as a driving element. Namely, the TFT Tr may correspond to the driving TFT Td (of FIG. 1).

Although not shown, the gate line and the data line cross each other to define the pixel, and the switching TFT is formed to be connected to the gate and data lines. The switching TFT is connected to the TFT Tr as the driving element.

In addition, the power line, which may be formed to be parallel to and spaced apart from one of the gate and data lines, and the storage capacitor for maintaining the voltage of the gate electrode of the TFT Tr in one frame may be further formed.

A passivation layer 450, which includes a drain contact hole 452 exposing the drain electrode 442 of the TFT Tr, is formed to cover the TFT Tr.

A first electrode 460, which is connected to the drain electrode 442 of the TFT Tr through the drain contact hole 452, is separately formed in each pixel. The first electrode 160 may be an anode and may be formed of a conductive material having a relatively high work function. For example, the first electrode 460 may be formed of a transparent conductive material such as indium-tin-oxide (ITO) or indium-zinc-oxide (IZO).

A reflection electrode or a reflection layer may be formed under the first electrode 460. For example, the reflection electrode or the reflection layer may be formed of aluminum-palladium-copper (APC) alloy.

A bank layer 466 is formed on the passivation layer 450 to cover an edge of the first electrode 460. Namely, the bank layer 466 is positioned at a boundary of the pixel and exposes a center of the first electrode 460 in the red, green and blue pixels RP, GP and BP. The bank layer 466 may be omitted.

An organic emitting layer 462 is formed on the first electrode 460.

Referring to FIG. 6, the organic emitting layer 462 includes a first emitting part 530 including a first EML 520, a second emitting part 550 including a second EML 540, a third emitting part 570 including a third EML 560, a first CGL 580 between the first and second emitting parts 530 and 550 and a second CGL 590 between the second and third emitting parts 550 and 570.

The first electrode 460 may be formed of a conductive material having a relatively high work function to serve as an anode for injecting a hole into the organic emitting layer 462. The second electrode 464 may be formed of a conductive material having a relatively low work function to serve as a cathode for injecting an electron into the organic emitting layer 462. The first electrode 460 may be formed of ITO or IZO, and the second electrode 464 may be formed of Al, Mg, Ag, AlMg or MgAg.

The first CGL 580 is positioned between the first and second emitting parts 530 and 550, and the second CGL 590 is positioned between the second and third emitting parts 550 and 570. Namely, the first emitting part 530, the first CGL 580, the second emitting part 550, the second CGL 590 and the third emitting part 570 are sequentially stacked on the first electrode 460. In other words, the first emitting part 530 is positioned between the first electrode 460 and the first CGL 570, the second emitting part 550 is positioned between the first and second CGLs 580 and 590, and the third emitting part 570 is positioned between the second electrode 460 and the second CGL 590.

The first emitting part 530 may include an HIL 532, a first HTL 534, a first EBL 536, the first EML 520 and a first HBL 538 sequentially stacked on the first electrode 460. Namely, the HIL 532, the first HTL 534 and the first EBL 536 are positioned between the first electrode 460 and the first EML 520, and the first HBL 538 is positioned between the first EML 520 and the first CGL 580.

The first EML 520 includes a host 522, which is an anthracene derivative, and a dopant 524, which is a pyrene derivative, and at least one of the hydrogen atoms in the anthracene derivative and the pyrene derivative, is substituted by a deuterium atom (D). The first EML 520 provides a blue emission.

For example, the hydrogen atoms in at least one of the anthracene derivative and the pyrene derivative may be wholly deuterated. When the anthracene derivative as the host 522 is wholly deuterated (e.g., "wholly-deuterated anthracene derivative"), the hydrogen atoms in the pyrene derivative as the dopant 524 may be non-deuterated (e.g., "non-deuterated pyrene derivative"), a part of the hydrogen atoms in the pyrene derivative as the dopant 524 may be deuterated (e.g., "partially-deuterated pyrene derivative"), or all of the hydrogen atoms in the pyrene derivative as the dopant 524 may be deuterated (e.g., "wholly-deuterated pyrene derivative"). Alternatively, when the pyrene derivative as the dopant 524 is wholly deuterated (e.g., "wholly-deuterated pyrene derivative"), the hydrogen atoms in the anthracene derivative as the host 522 may be non-deuterated (e.g., "non-deuterated anthracene derivative"), a part of the hydrogen atoms in the anthracene derivative as the host 522 may be deuterated (e.g., "partially-deuterated anthracene derivative"), or all of the hydrogen atoms in the anthracene derivative as the host 522 may be deuterated (e.g., "wholly-deuterated anthracene derivative").

At least one of an anthracene core of the host 522 and a pyrene core of the dopant 524 may be deuterated.

For example, when the anthracene core of the host 522 is deuterated (e.g., "core-deuterated anthracene derivative"), the dopant 524 may be non-deuterated (e.g., "non-deuterated pyrene derivative") or all of the pyrene core and a substituent of the dopant 524 may be deuterated (e.g., "wholly-deuterated pyrene derivative"). Alternatively, the pyrene core of the dopant 524 except the substituent may be deuterated (e.g., "core-deuterated pyrene derivative"), or the substituent of the dopant 524 except the pyrene core may be deuterated (e.g., "substituent-deuterated pyrene derivative").

On the other hand, in the first EML 520, when the pyrene core of the dopant 524 is deuterated (e.g., "core-deuterated pyrene derivative"), the host 522 may be non-deuterated (e.g., "non-deuterated anthracene derivative") or all of the anthracene core and a substituent of the host 522 may be deuterated (e.g., "wholly-deuterated anthracene derivative"). Alternatively, the anthracene core of the host 522 except the substituent may be deuterated (e.g., "core-deuterated anthracene derivative"), or the substituent of the host 522 except the anthracene core may be deuterated (e.g., "substituent-deuterated anthracene derivative").

In the first EML 520, the host 522 may have a weight % of about 70 to 99.9, and the dopant 524 may have a weight % of about 0.1 to 30. To provide sufficient emitting efficiency and lifespan, a weight % of the dopant 524 may be about 0.1 to 10, preferably about 1 to 5.

The first EBL 536 may include the electron blocking material of Formula 8. In addition, the first HBL 538 may include at least one of the hole blocking material of Formula 10 and the hole blocking material of Formula 12.

The second EML 550 may include a second HTL 552, the second EML 540 and an electron transporting layer (ETL) 554. The second HTL 552 is positioned between the first CGL 580 and the second EML 540, and the ETL 554 is positioned between the second EML 540 and the second CGL 590.

The second EML 540 may be a yellow-green EML. For example, the second EML 540 may include a host and a yellow-green dopant. Alternatively, the second EML 540 may include a host, a red dopant and a green dopant. In this instance, the second EML 540 may include a lower layer including the host and the red dopant (or the green dopant) and an upper layer including the host and the green dopant (or the red dopant).

The third emitting part 570 may include a third HTL 572, a second EBL 574, the third EML 560, a second HBL 576 and an EIL 578.

The third EML 560 includes a host 562, which is an anthracene derivative, a dopant 564, which is a pyrene derivative, and at least one of the hydrogen atoms in the anthracene derivative and the pyrene derivative, is substituted by a deuterium atom (D). The third EML 560 provides a blue emission.

For example, in the third EML 560, the anthracene derivative as the host 562 may be wholly deuterated (e.g., "wholly-deuterated anthracene derivative"), or the anthracene core of the anthracene derivative may be deuterated (e.g., "core-deuterated anthracene derivative"). In this instance, the hydrogen atoms in the pyrene derivative as the dopant 564 may be non-deuterated (e.g., "non-deuterated pyrene derivative"), or all of the pyrene core and a substituent of the dopant 564 may be deuterated (e.g., "wholly-deuterated pyrene derivative"). Alternatively, the pyrene core of the dopant 564 except the substituent may be deuterated (e.g., "core-deuterated pyrene derivative"), or the substituent of the dopant 564 except the pyrene core may be deuterated (e.g., "substituent-deuterated pyrene derivative").

The pyrene derivative as the dopant 564 may be wholly deuterated (e.g., "wholly-deuterated pyrene derivative"), or the pyrene core of the pyrene derivative may be deuterated (e.g., "core-deuterated pyrene derivative"). In this instance, the hydrogen atoms in the anthracene derivative as the host 562 may be non-deuterated (e.g., "non-deuterated anthracene derivative"), or all of the anthracene core and a substituent of the host 562 may be deuterated (e.g., "wholly-deuterated anthracene derivative"). Alternatively, the anthracene core of the host 562 except the substituent may be deuterated (e.g., "core-deuterated anthracene derivative"), or the substituent of the host 562 except the anthracene core may be deuterated (e.g., "substituent-deuterated anthracene derivative").

In the third EML 560, the host 562 may have a weight % of about 70 to 99.9, and the dopant 564 may have a weight % of about 0.1 to 30. To provide sufficient emitting efficiency and lifespan, a weight % of the dopant 564 may be about 0.1 to 10, preferably about 1 to 5.

The host 562 of the third EML 560 may be same as or different from the host 522 of the first EML 520, and the dopant 564 of the third EML 560 may be same as or different from the dopant 524 of the first EML 520.

The second EBL 574 may include the electron blocking material of Formula 8. In addition, the second HBL 576 may include at least one of the hole blocking material of Formula 10 and the hole blocking material of Formula 12. The electron blocking material in the second EBL 574 and the electron blocking material in the first EBL 536 may be same or different, and the hole blocking material in the second HBL 576 and the hole blocking material in the first HBL 538 may be same or different.

The first CGL 580 is positioned between the first emitting part 530 and the second emitting part 550, and the second CGL 590 is positioned between the second emitting part 550 and the third emitting part 570. Namely, the first and second emitting stacks 530 and 550 are connected through the first CGL 580, and the second and third emitting stacks 550 and 570 are connected through the second CGL 590. The first CGL 580 may be a P-N junction CGL of a first N-type CGL 582 and a first P-type CGL 584, and the second CGL 590 may be a P-N junction CGL of a second N-type CGL 592 and a second P-type CGL 594.

In the first CGL 580, the first N-type CGL 582 is positioned between the first HBL 538 and the second HTL 552, and the first P-type CGL 584 is positioned between the first N-type CGL 582 and the second HTL 552.

In the second CGL 590, the second N-type CGL 592 is positioned between the ETL 554 and the third HTL 572, and the second P-type CGL 594 is positioned between the second N-type CGL 592 and the third HTL 572.

In the OLED D, each of the first and third EMLs 520 and 560 includes the host 522 and 562, each of which is an anthracene derivative, the blue dopant 524 and 564, each of which is a pyrene derivative.

Accordingly, the OLED D including the first and third emitting parts 530 and 570 with the second emitting part 550, which emits yellow-green light or red/green light, can emit white light.

In FIG. 6, the OLED D has a triple-stack structure of the first, second and third emitting parts 530, 550 and 570. Alternatively, the OLED D may have a double-stack structure without the first emitting part 530 or the third emitting part 570.

Referring to FIG. 5 again, a second electrode 464 is formed over the substrate 410 where the organic emitting layer 462 is formed.

In the organic light emitting display device 400, since the light emitted from the organic emitting layer 462 is incident to the color filter layer 480 through the second electrode 464, the second electrode 464 has a thin profile for transmitting the light.

The first electrode 460, the organic emitting layer 462 and the second electrode 464 constitute the OLED D.

The color filter layer 480 is positioned over the OLED D and includes a red color filter 482, a green color filter 484 and a blue color filter 486 respectively corresponding to the red, green and blue pixels RP, GP and BP.

Although not shown, the color filter layer 480 may be attached to the OLED D by using an adhesive layer. Alternatively, the color filter layer 480 may be formed directly on the OLED D.

An encapsulation film (not shown) may be formed to prevent penetration of moisture into the OLED D. For example, the encapsulation film may include a first inorganic insulating layer, an organic insulating layer and a second inorganic insulating layer sequentially stacked, but it is not limited thereto. The encapsulation film may be omitted.

A polarization plate (not shown) for reducing an ambient light reflection may be disposed over the top-emission type OLED D. For example, the polarization plate may be a circular polarization plate.

In FIG. 5, the light from the OLED D passes through the second electrode 464, and the color filter layer 480 is disposed on or over the OLED D. Alternatively, when the light from the OLED D passes through the first electrode 460, the color filter layer 480 may be disposed between the OLED D and the first substrate 410.

A color conversion layer (not shown) may be formed between the OLED D and the color filter layer 480. The color conversion layer may include a red color conversion layer, a green color conversion layer and a blue color conversion layer respectively corresponding to the red, green and blue pixels RP, GP and BP. The white light from the OLED D is converted into the red light, the green light and the blue light by the red, green and blue color conversion layer, respectively.

As described above, the white light from the organic light emitting diode D passes through the red color filter 482, the green color filter 484 and the blue color filter 486 in the red pixel RP, the green pixel GP and the blue pixel BP such that the red light, the green light and the blue light are provided from the red pixel RP, the green pixel GP and the blue pixel BP, respectively.

In FIGS. 5 and 6, the OLED D emitting the white light is used for a display device. Alternatively, the OLED D may be formed on an entire surface of a substrate without at least one of the driving element and the color filter layer to be used for a lightening device. The display device and the lightening device each including the OLED D of the present disclosure may be referred to as an organic light emitting device.

FIG. 7 is a schematic cross-sectional view illustrating an organic light emitting display device according to a third embodiment of the present disclosure.

As shown in FIG. 7, the organic light emitting display device 600 includes a first substrate 610, where a red pixel RP, a green pixel GP and a blue pixel BP are defined, a second substrate 670 facing the first substrate 610, an OLED D, which is positioned between the first and second substrates 610 and 670 and providing white emission, and a color conversion layer 680 between the OLED D and the second substrate 670.

Although not shown, a color filter may be formed between the second substrate 670 and each color conversion layer 680.

A TFT Tr, which corresponding to each of the red, green and blue pixels RP, GP and BP, is formed on the first substrate 610, and a passivation layer 650, which has a drain contact hole 652 exposing an electrode, e.g., a drain electrode, of the TFT Tr is formed to cover the TFT Tr.

The OLED D including a first electrode 660, an organic emitting layer 662 and a second electrode 664 is formed on the passivation layer 650. In this instance, the first electrode 660 may be connected to the drain electrode of the TFT Tr through the drain contact hole 652.

A bank layer 666 covering an edge of the first electrode 660 is formed at a boundary of the red, green and blue pixel regions RP, GP and BP.

The OLED D emits a blue light and may have a structure shown in FIG. 3 or FIG. 4. Namely, the OLED D is formed in each of the red, green and blue pixels RP, GP and BP and provides the blue light.

The color conversion layer 680 includes a first color conversion layer 682 corresponding to the red pixel RP and a second color conversion layer 684 corresponding to the green pixel GP. For example, the color conversion layer 680 may include an inorganic color conversion material such as a quantum dot.

The blue light from the OLED D is converted into the red light by the first color conversion layer 682 in the red pixel RP, and the blue light from the OLED D is converted into the green light by the second color conversion layer 684 in the green pixel GP.

Accordingly, the organic light emitting display device 600 can display a full-color image.

On the other hand, when the light from the OLED D passes through the first substrate 610, the color conversion layer 680 is disposed between the OLED D and the first substrate 610.

While the present disclosure has been described with reference to exemplary embodiments and examples, these embodiments and examples are not intended to limit the scope of the present disclosure. Rather, it will be apparent to those skilled in the art that various modifications and variations can be made in the present disclosure without departing from the spirit or scope of the invention. Thus, it is intended that the present disclosure cover the modifications and variations of the present disclosure provided they come within the scope of the appended claims and their equivalents.

The various embodiments described above can be combined to provide further embodiments. All of patents, patent application publications, patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light emitting diode (OLED), comprising:

a first electrode;

a second electrode facing the first electrode;

a first emitting material layer including a first host being an anthracene derivative and a first dopant being a pyrene derivative and positioned between the first and second electrodes;

a first electron blocking layer including an electron blocking material of a spirofluorene-substituted amine derivative and positioned between the first electrode and the first emitting material layer;

a second emitting material layer including a second host being an anthracene derivative and a second dopant being a pyrene derivative and positioned between the first emitting material layer and the second electrode; and a first charge generation layer between the first and second emitting material layers, wherein at least one of hydrogen atoms in the anthracene derivative and the pyrene derivative is deuterated, and at least one of hydrogen atoms in the second host and the second dopant is deuterated, and wherein the electron blocking material is a compound being one of the followings of Formula 6:

[Formula 6]

H1

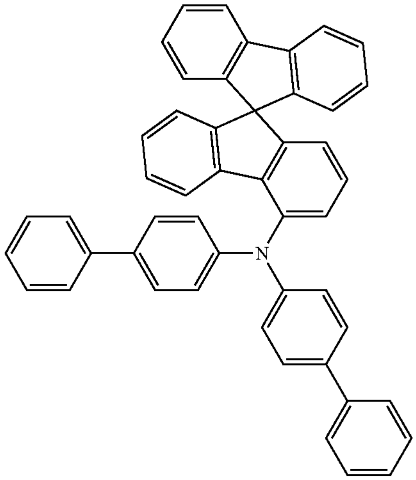

-continued
H2
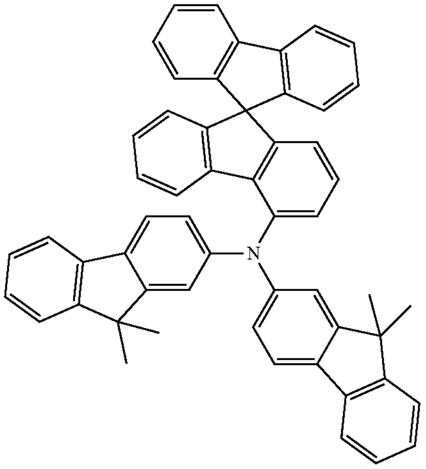
H3
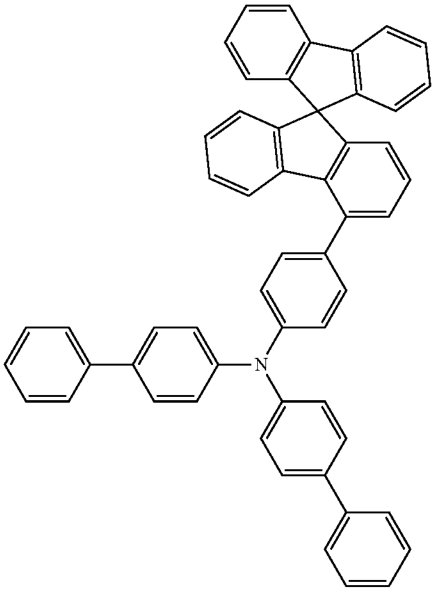
H4
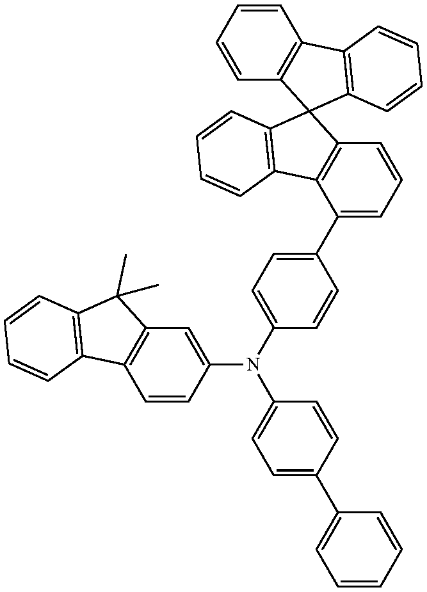
-continued
H5
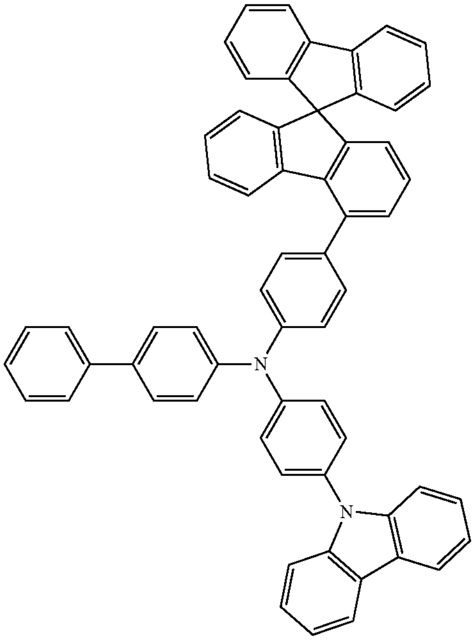
H6
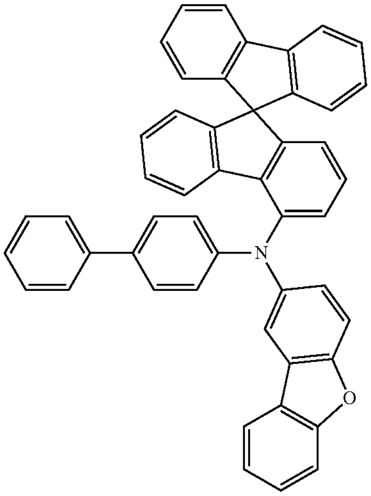
H7
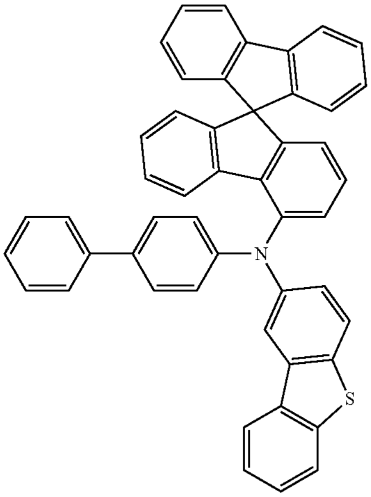

-continued

H8

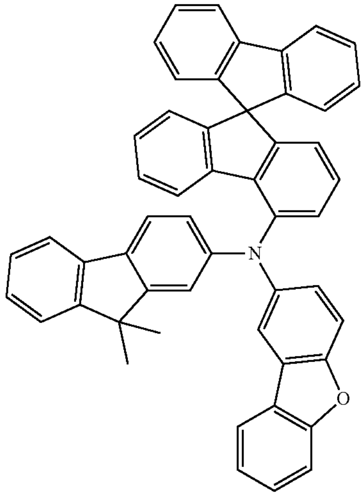

H9

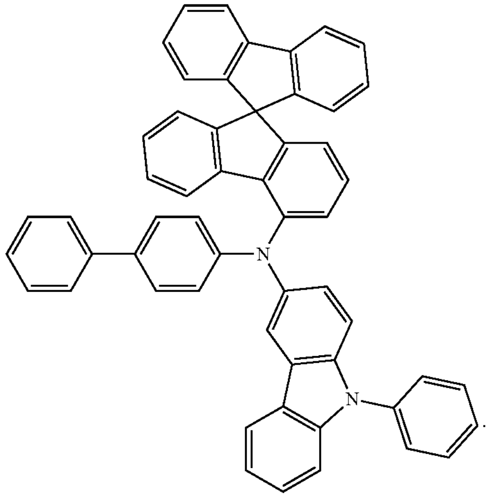

2. The OLED of claim 1, wherein all of the hydrogen atoms in at least one of the anthracene derivative and the pyrene derivative are deuterated.

3. The OLED of claim 1, wherein at least one of an anthracene core of the anthracene derivative and a pyrene core of the pyrene derivative is deuterated.

4. The OLED of claim 3, wherein the anthracene derivative is represented by Formula 1:

Formula 1

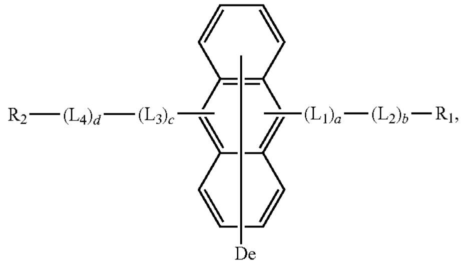

wherein each of $R_1$ and $R_2$ is independently $C_6$~$C_{30}$ aryl group or $C_5$~$C_{30}$ heteroaryl group, and each of $L_1$, $L_2$, $L_3$ and $L_4$ is independently $C_6$~$C_{30}$ arylene group, and wherein each of a, b, c and d is 0 or 1, and e is an integer of 1 to 8.

5. The OLED of claim 3, wherein the pyrene derivative is represented by Formula 3:

Formula 3

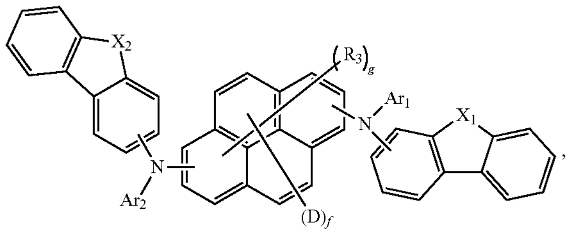

wherein each of $X_1$ and $X_2$ is independently O or S, each of $Ar_1$ and $Ar_2$ is independently $C_6$~$C_{30}$ aryl group or $C_5$~$C_{30}$ heteroaryl group, wherein $R_3$ is $C_1$~$C_{10}$ alkyl group or $C_1$~$C_{10}$ cycloalkyl group, and f is an integer of 1 to 8, and wherein g is an integer of 0 to 2, and a summation of f and g is 8 or less.

6. The OLED of claim 1, further comprising: a first hole blocking layer including at least one of a first hole blocking material being an azine derivative and a second hole blocking material being a benzimidazole derivative and positioned between the second electrode and the first emitting material layer.

7. The OLED of claim 6, wherein the first hole blocking material is represented by Formula 7:

Formula 7

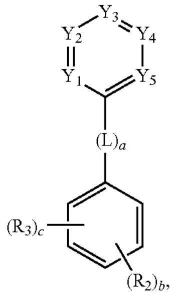

wherein each of $Y_1$ to $Y_5$ are independently $CR_1$ or N, and one to three of $Y_1$ to $Y_5$ is N, wherein $R_1$ is independently hydrogen or $C_6$~$C_{30}$ aryl group, wherein L is $C_6$~$C_{30}$ arylene group, and $R_2$ is $C_6$~$C_{30}$ aryl group or $C_5$~$C_{30}$ hetero aryl group, wherein $R_3$ is hydrogen, or adjacent two of $R_3$ form a fused ring, and wherein "a" is 0 or 1, "b" is 1 or 2, and "c" is an integer of 0 to 4.

8. The OLED of claim 6, wherein the second hole blocking material is represented by Formula 9:

Formula 9

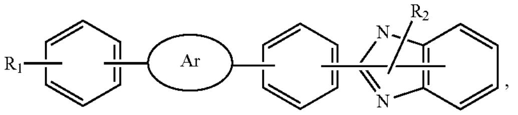

wherein Ar is $C_{10}$~$C_{30}$ arylene group, $R_1$ is $C_6$~$C_{30}$ aryl group or $C_5$~$C_{30}$ hetero aryl group, and wherein $R_2$ is $C_1$~$C_{10}$ alkyl group or $C_6$~$C_{30}$ aryl group.

9. The OLED of claim 1, further comprising:

a third emitting material layer emitting a yellow-green light and positioned between the first charge generation layer and the second emitting material layer; and a second charge generation layer between the second and third emitting material layers.

10. The OLED of claim 1, further comprising:

a third emitting material layer emitting a red light and a green light and positioned between the first charge generation layer and the second emitting material layer; and a second charge generation layer between the second and third emitting material layers.

11. An organic light emitting device, comprising:

a substrate;

an organic light emitting diode positioned on the substrate and including a first electrode; a second electrode facing the first electrode; a first emitting material layer including a first host being an anthracene derivative and a first dopant being a pyrene derivative and positioned between the first and second electrodes; and a first electron blocking layer including an electron blocking material of a spirofluorene-substituted amine derivative and positioned between the first electrode and the first emitting material layer; a second emitting material layer including a second host being an anthracene derivative and a second dopant being a pyrene derivative and positioned between the first emitting material layer and the second electrode; and a first charge generation layer between the first and second emitting material layers, wherein at least one of hydrogen atoms in the anthracene derivative and the pyrene derivative is deuterated, and at least one of hydrogen atoms in the second host and the second dopant is deuterated, and wherein the electron blocking material is a compound being one of the followings of Formula 6:

[Formula 6]

H1

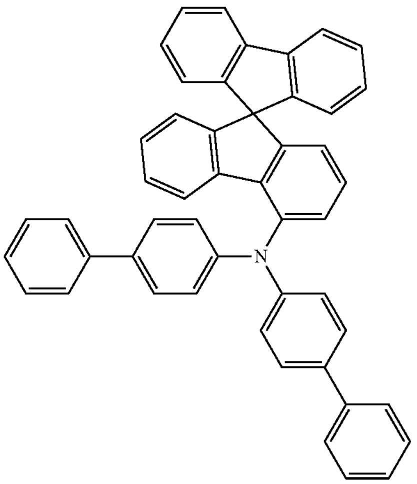

H2

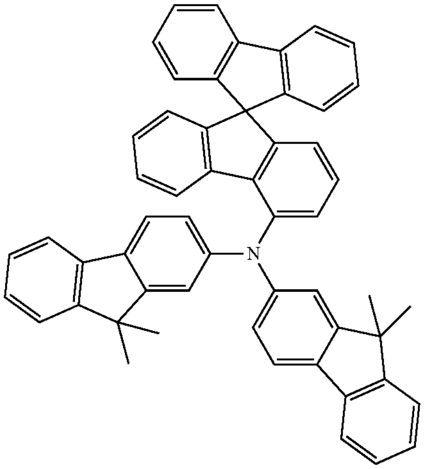

H3

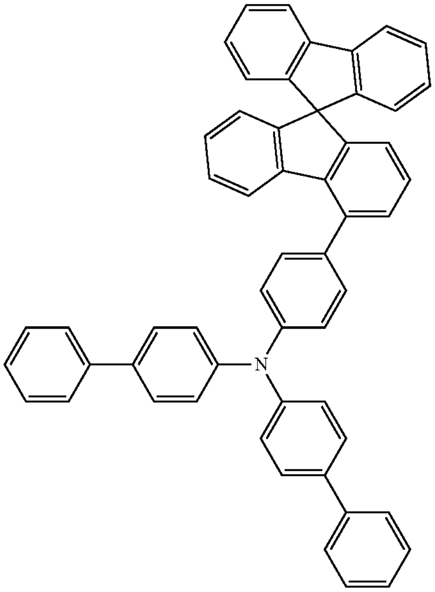

-continued
H4
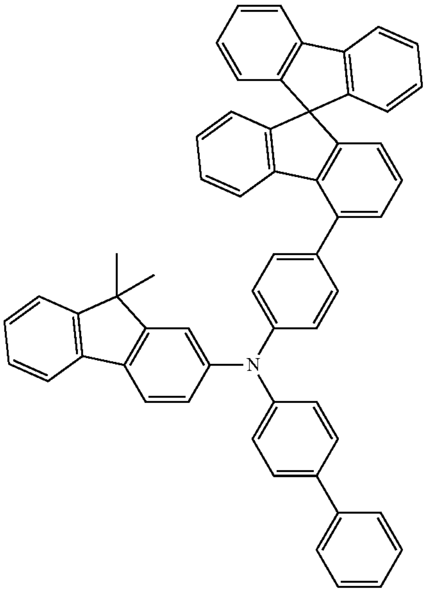
H5
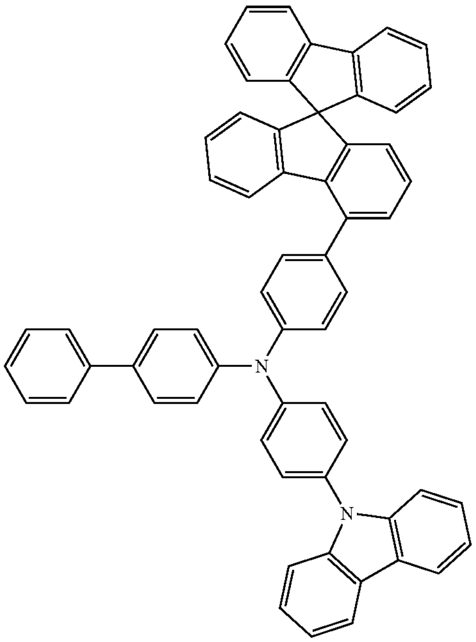
-continued
H6
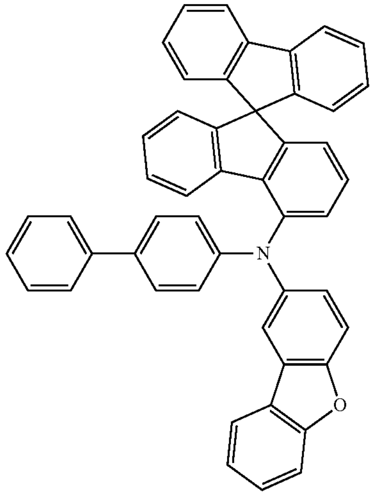
H7
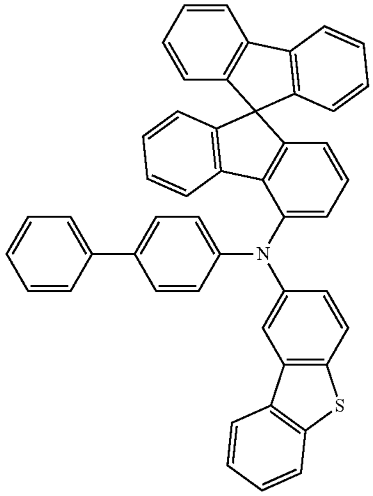
H8
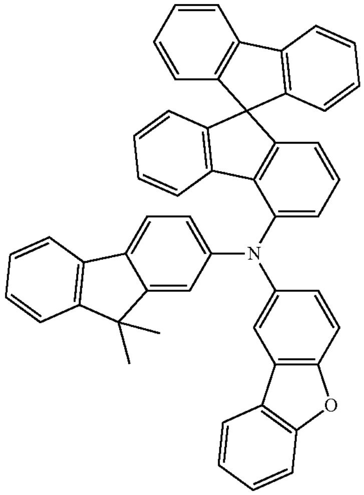

-continued

H9

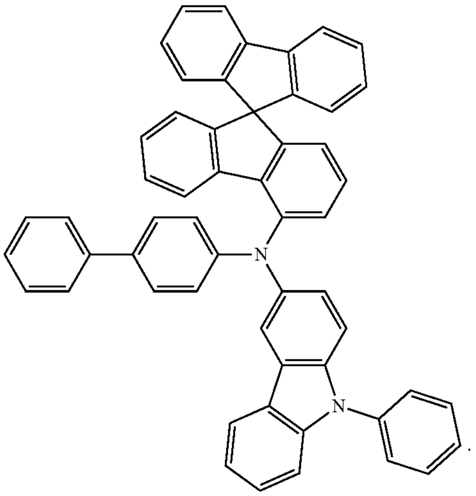

12. The organic light emitting device of claim 11, wherein all of the hydrogen atoms in at least one of the anthracene derivative and the pyrene derivative are deuterated.

13. The organic light emitting device of claim 11, wherein at least one of an anthracene core of the anthracene derivative and a pyrene core of the pyrene derivative is deuterated.

14. The organic light emitting device of claim 13, wherein the anthracene derivative is represented by Formula 1:

Formula 1

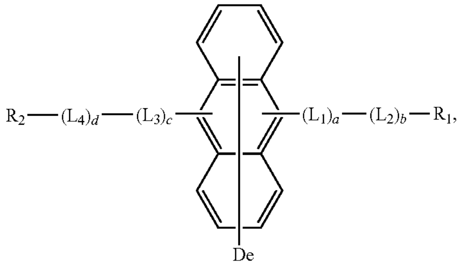

wherein each of $R_1$ and $R_2$ is independently $C_6$~$C_{30}$ aryl group or $C_5$~$C_{30}$ heteroaryl group, and each of $L_1$, $L_2$, $L_3$ and $L_4$ is independently $C_6$~$C_{30}$ arylene group, and wherein each of a, b, c and d is 0 or 1, and e is an integer of 1 to 8.

15. The organic light emitting device of claim 13, wherein the pyrene derivative is represented by Formula 3:

Formula 3

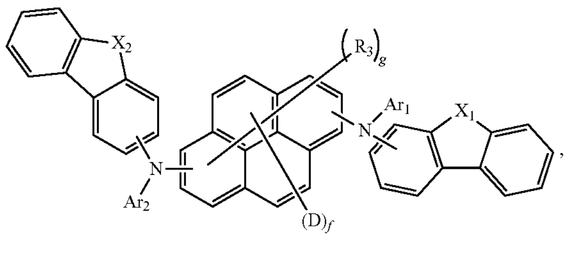

wherein each of $X_1$ and $X_2$ is independently O or S, each of $Ar_1$ and $Ar_2$ is independently $C_6$~$C_{30}$ aryl group or $C_5$~$C_{30}$ heteroaryl group, wherein $R_3$ is $C_1$~$C_{10}$ alkyl group or $C_1$~$C_{10}$ cycloalkyl group, and f is an integer of 1 to 8, and wherein g is an integer of 0 to 2, and a summation of f and g is 8 or less.

16. The organic light emitting device of claim 11, further comprising: a first hole blocking layer including at least one of a first hole blocking material being an azine derivative and a second hole blocking material being a benzimidazole derivative and positioned between the second electrode and the first emitting material layer.

17. The organic light emitting device of claim 16, wherein the first hole blocking material is represented by Formula 7:

Formula 7

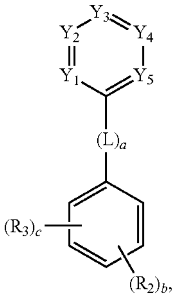

wherein each of $Y_1$ to $Y_5$ are independently $CR_1$ or N, and one to three of $Y_1$ to $Y_5$ is N, wherein $R_1$ is independently hydrogen or $C_6$~$C_{30}$ aryl group, wherein L is $C_6$~$C_{30}$ arylene group, and $R_2$ is $C_6$~$C_{30}$ aryl group or $C_5$~$C_{30}$ hetero aryl group, wherein $R_3$ is hydrogen, or adjacent two of $R_3$ form a fused ring, and wherein "a" is 0 or 1, "b" is 1 or 2, and "c" is an integer of 0 to 4.

18. The organic light emitting device of claim 16, wherein the second hole blocking material is represented by Formula 9:

Formula 9

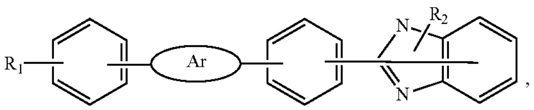

wherein Ar is $C_{10}$~$C_{30}$ arylene group, $R_1$ is $C_6$~$C_{30}$ aryl group or $C_5$~$C_{30}$ hetero aryl group, and wherein $R_2$ is $C_1$~$C_{10}$ alkyl group or $C_6$~$C_{30}$ aryl group.

19. The organic light emitting device of claim 11, wherein a red pixel, a green pixel and a blue pixel are defined on the substrate, and the organic light emitting diode corresponds to each of the red, green and blue pixels, and wherein the organic light emitting device further includes:

a color conversion layer disposed between the substrate and the organic light emitting diode or on the organic light emitting diode and corresponding to the red and green pixels.

20. The organic light emitting device of claim 11, wherein the organic light emitting diode further includes:

a third emitting material layer emitting a yellow-green light and positioned between the first charge generation layer and the second emitting material layer; and a second charge generation layer between the second and third emitting material layers.

21. The organic light emitting device of claim 11, wherein the organic light emitting diode further includes:

a third emitting material layer emitting a red light and a green light and positioned between the first charge generation layer and the second emitting material layer; and a second charge generation layer between the second and third emitting material layers.

22. The organic light emitting device of claim 20, wherein a red pixel, a green pixel and a blue pixel are defined on the substrate, and the organic light emitting diode corresponds to each of the red, green and blue pixels, and wherein the organic light emitting device further includes:

a color filter layer disposed between the substrate and the organic light emitting diode or on the organic light emitting diode and corresponding to the red, green and blue pixels.

23. The OLED of claim 4, wherein the anthracene derivative is a compound being one of the followings of Formula 2:

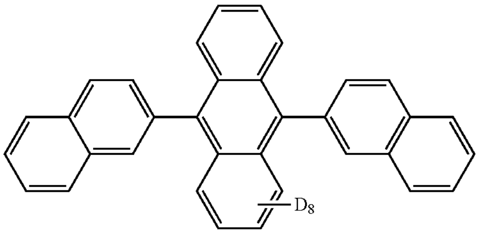

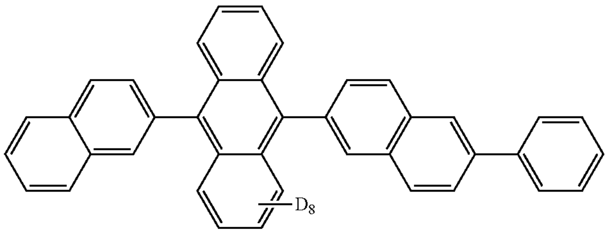

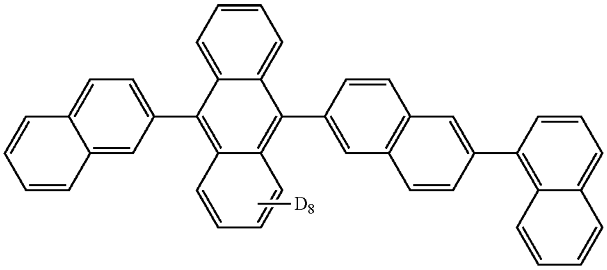

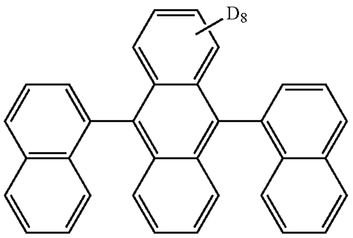

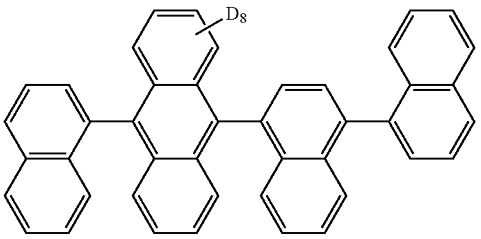

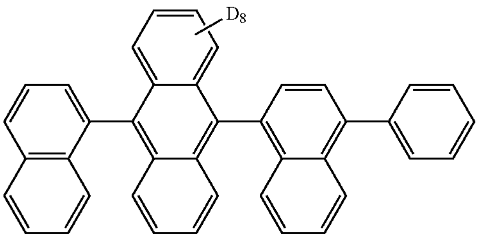

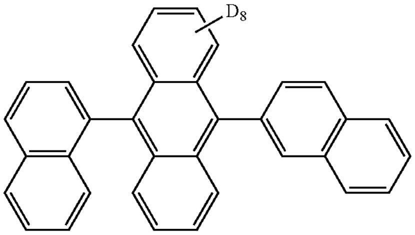

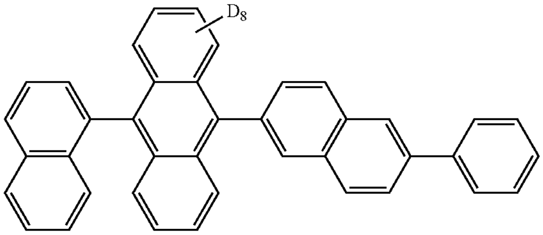

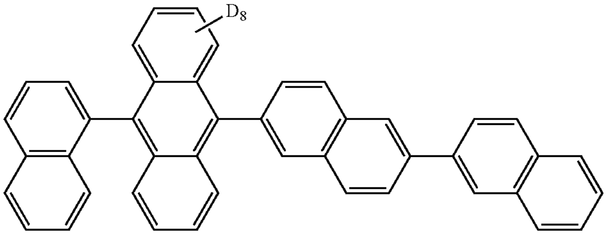

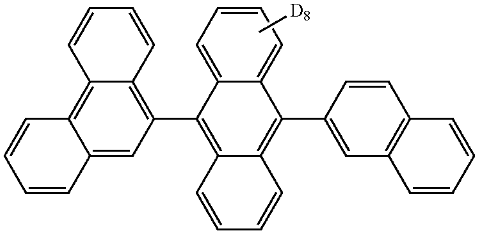

-continued
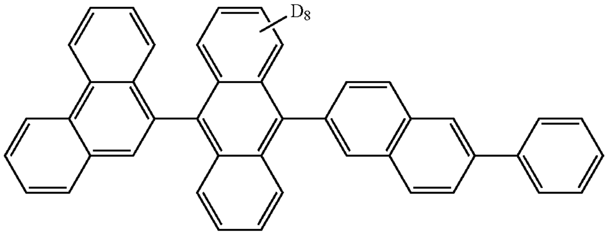
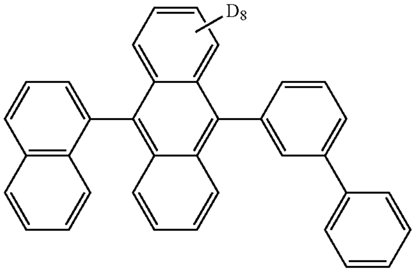
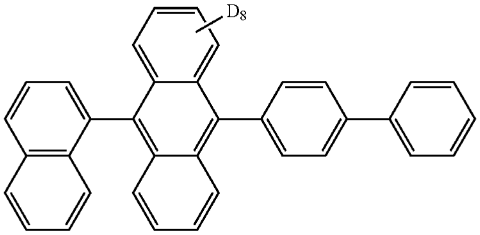
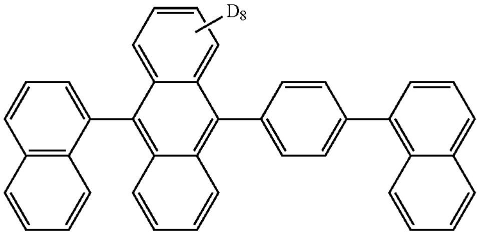
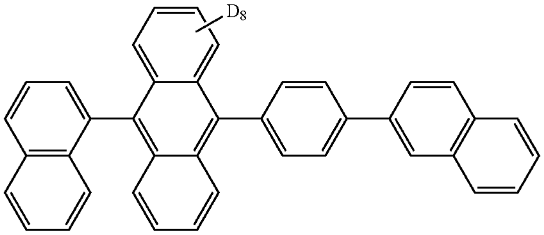
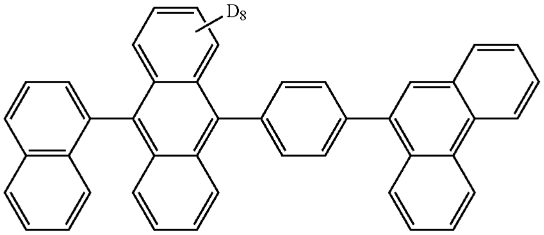
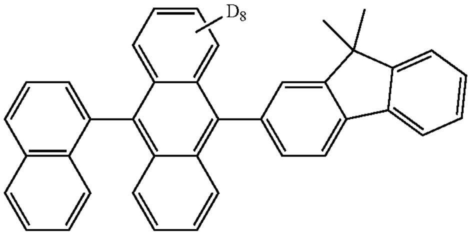
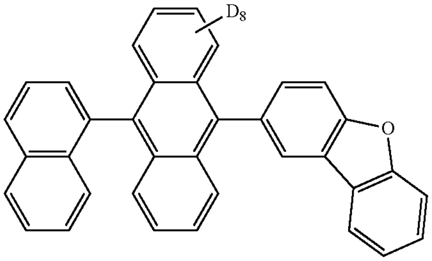
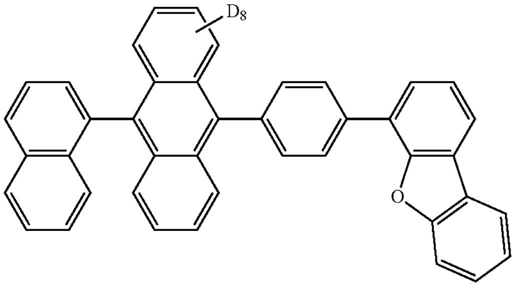
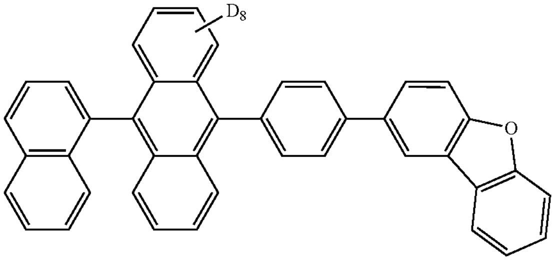
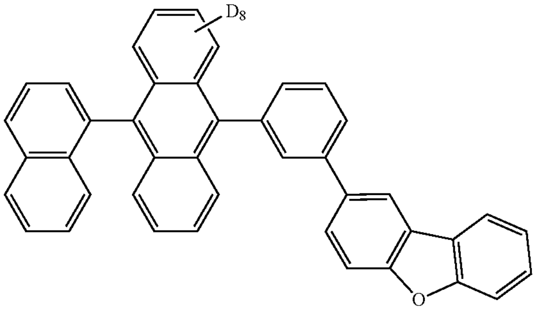
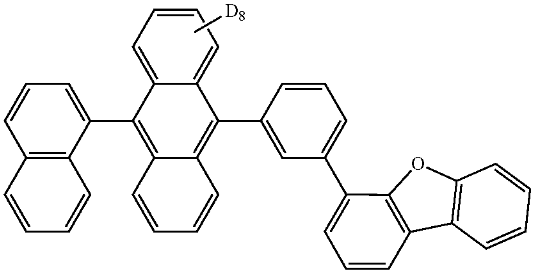

-continued
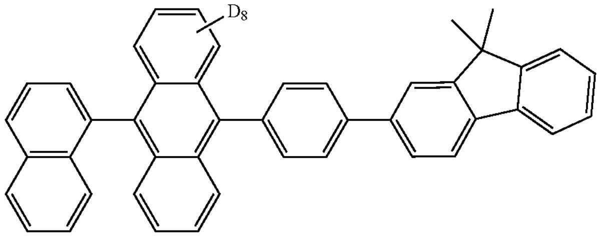
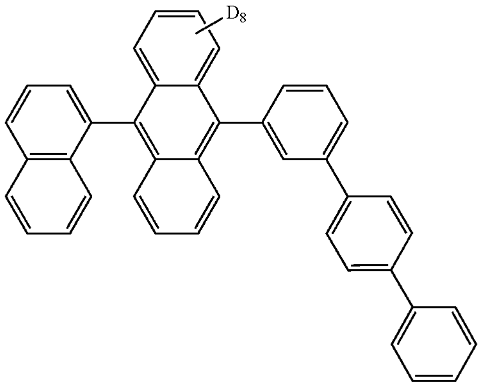
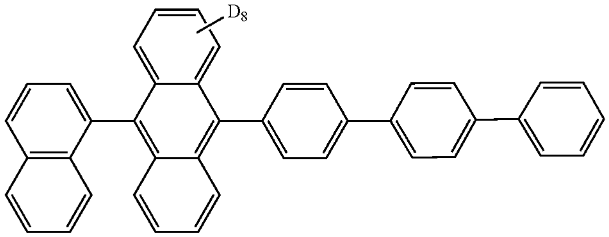
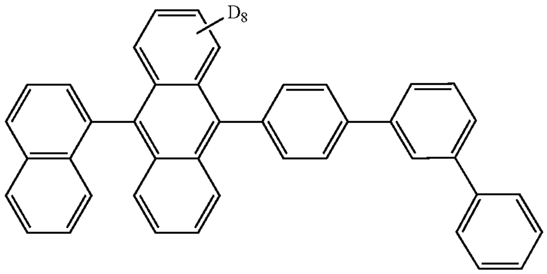
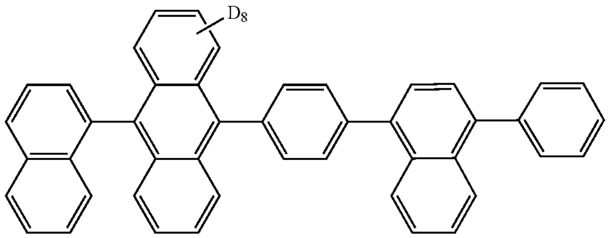
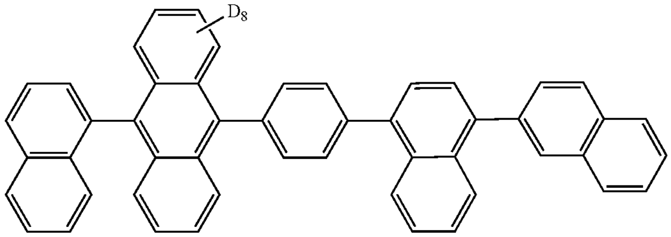
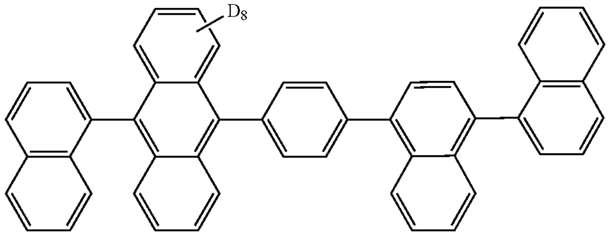

-continued
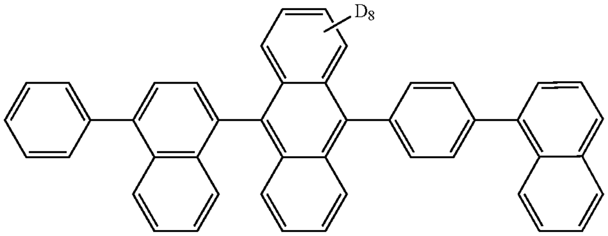
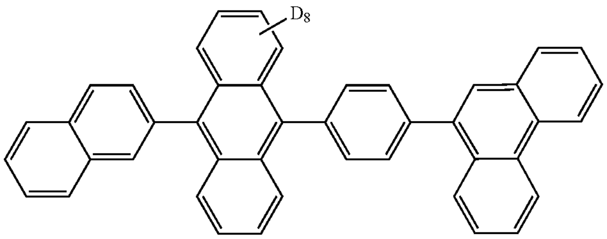
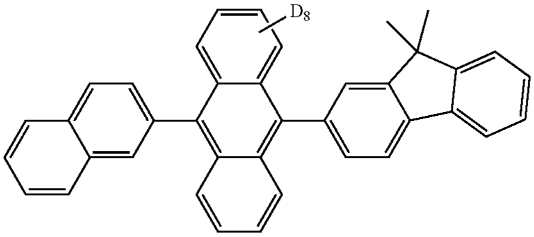
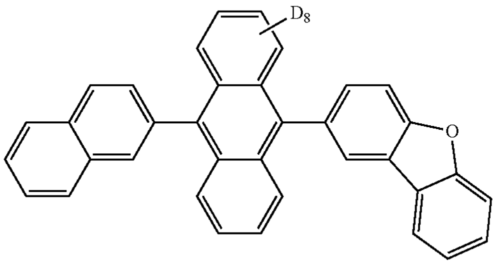
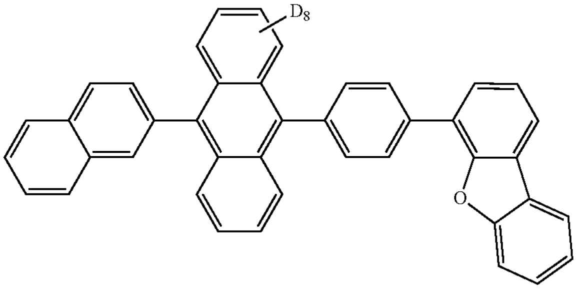
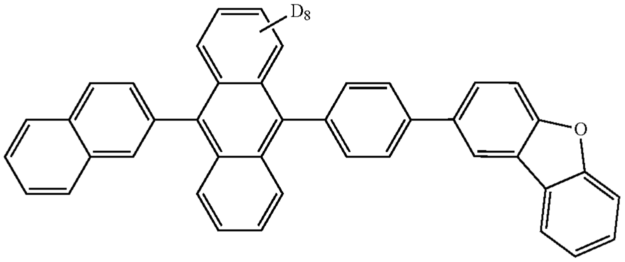
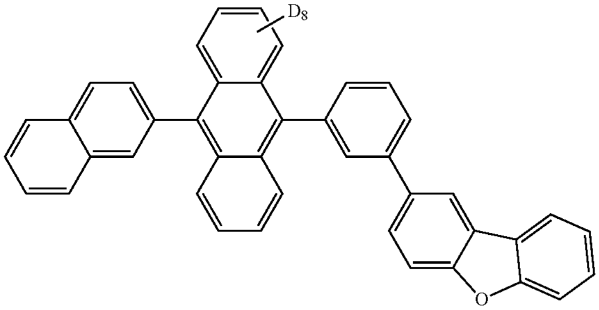
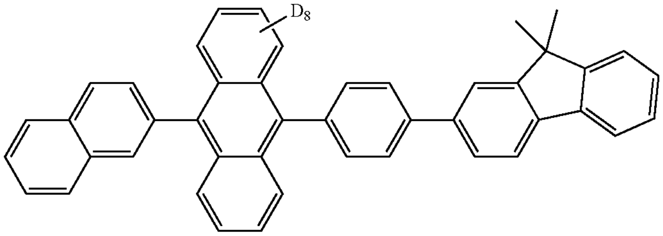

-continued
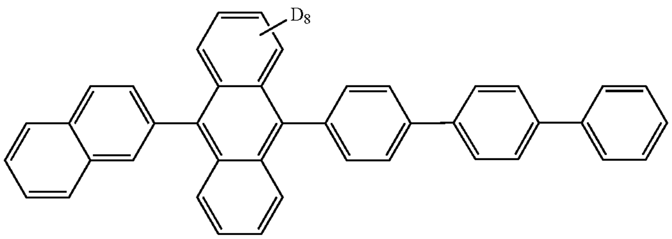
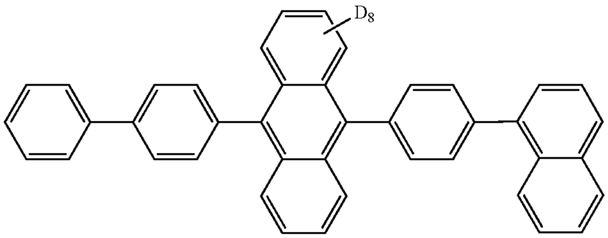
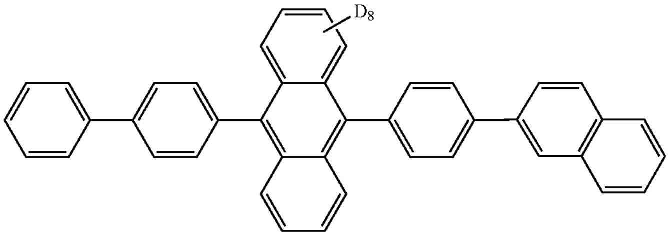
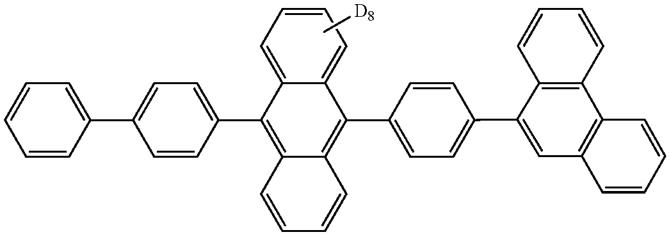
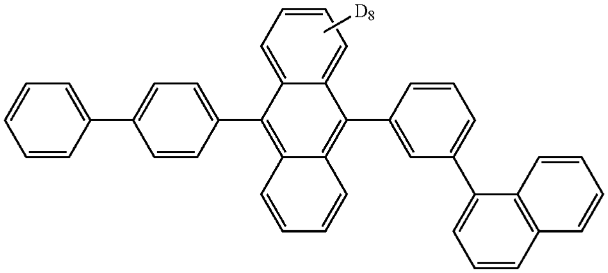
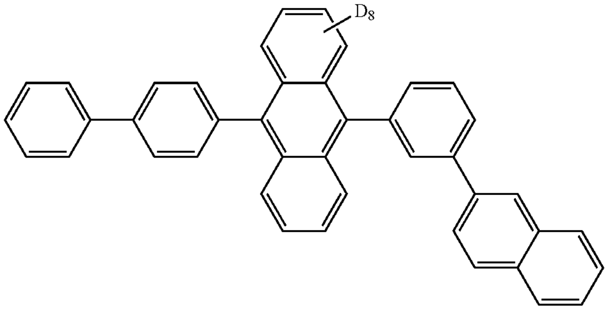

-continued
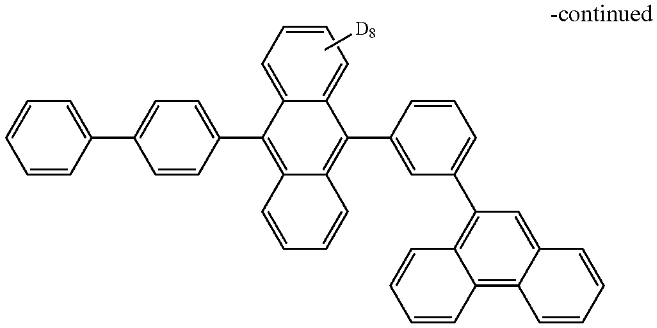
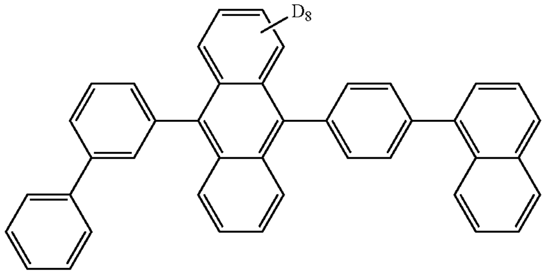
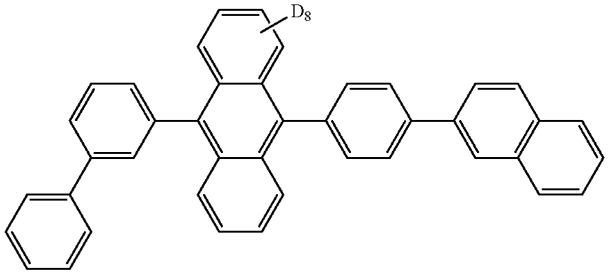
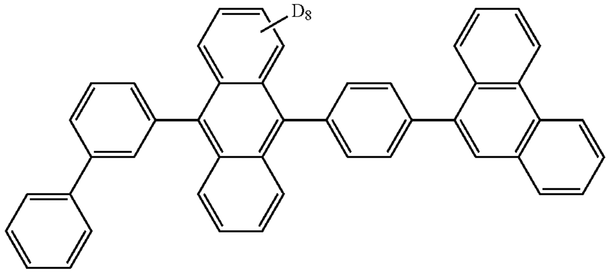
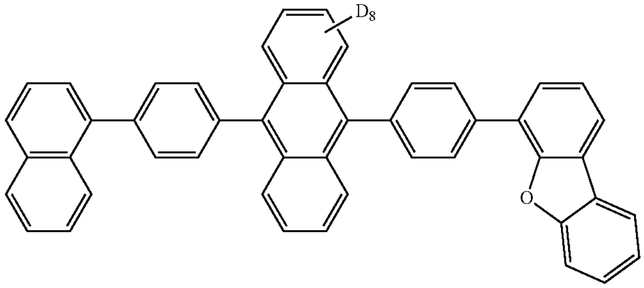
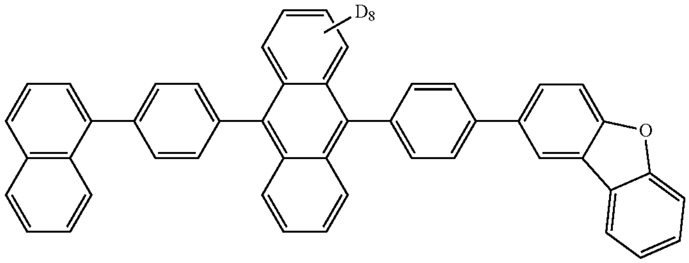
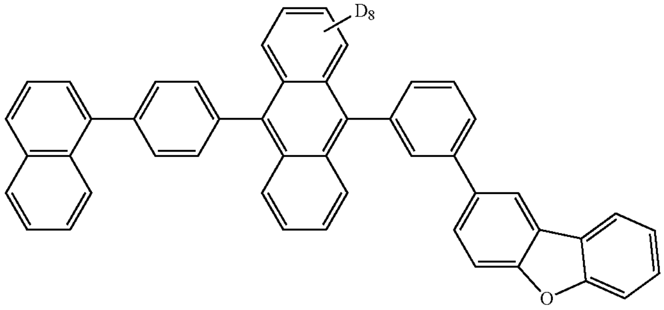

-continued
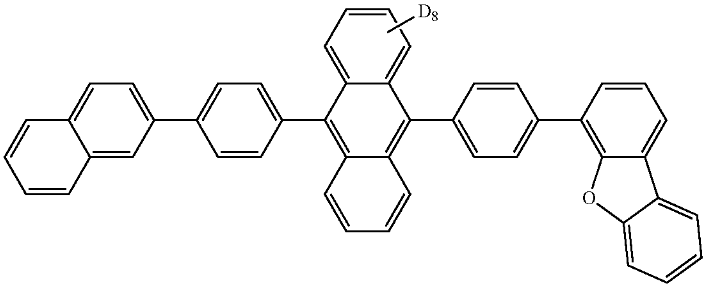
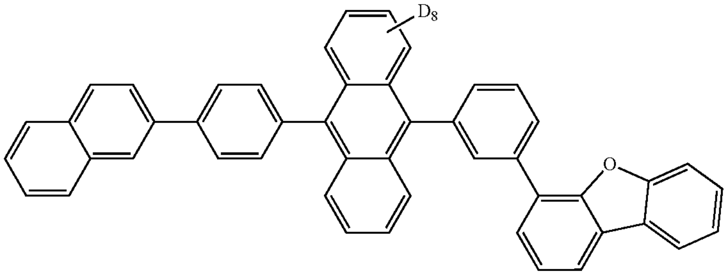
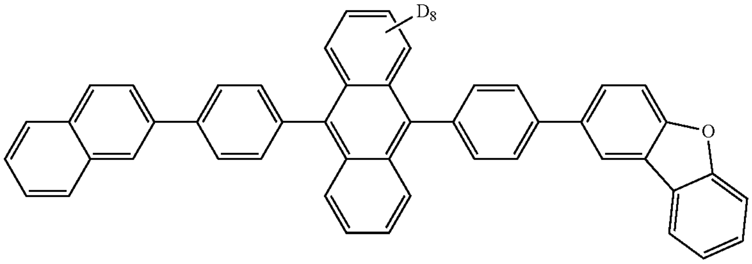
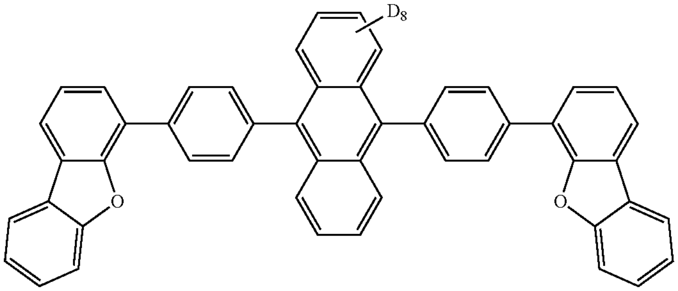
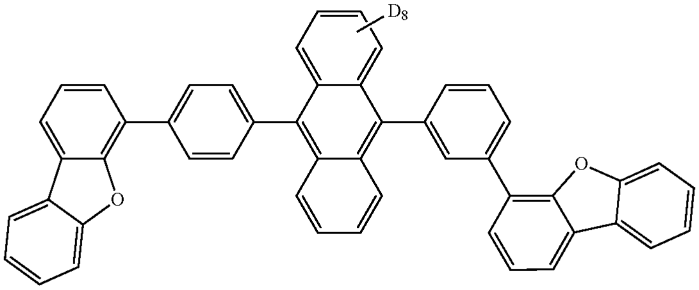
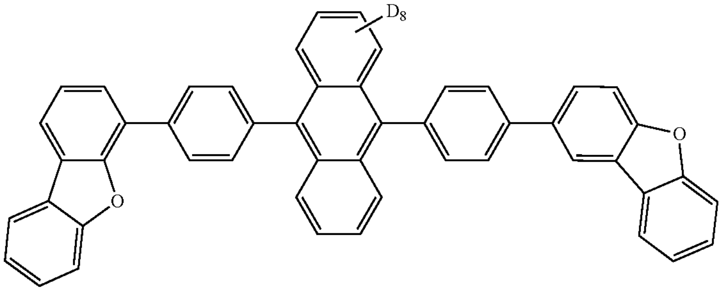

-continued
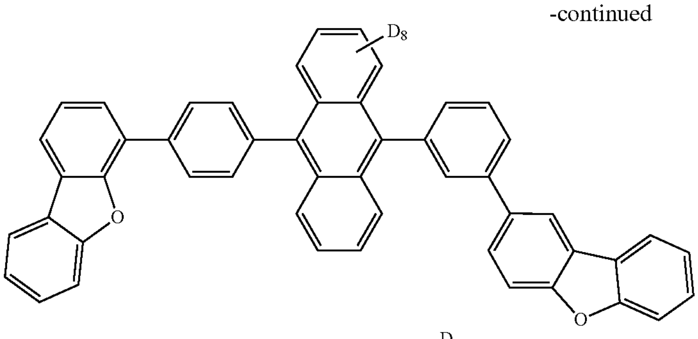
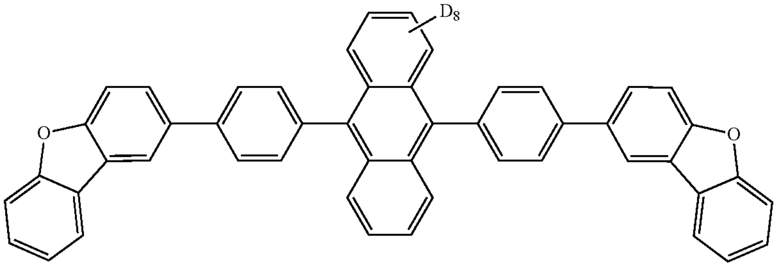
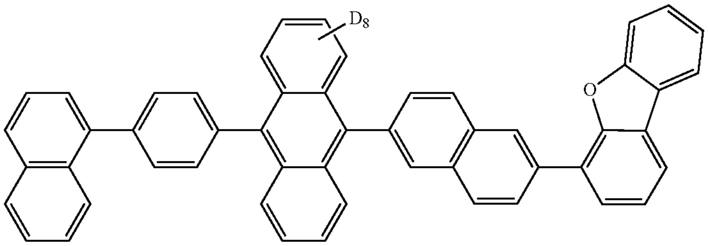
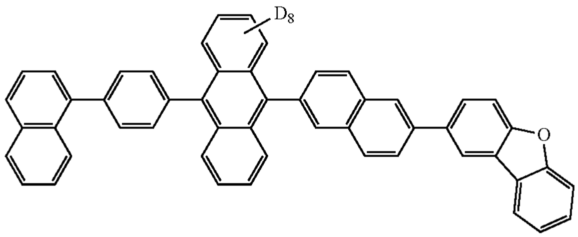
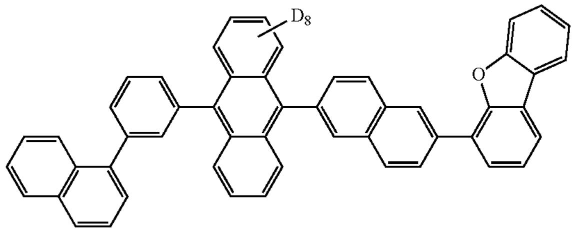
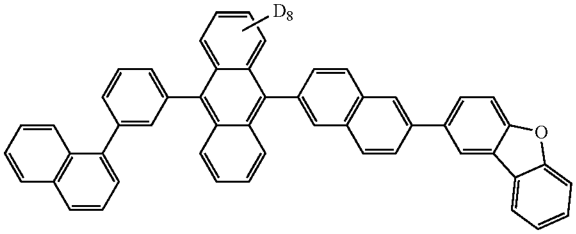
-continued
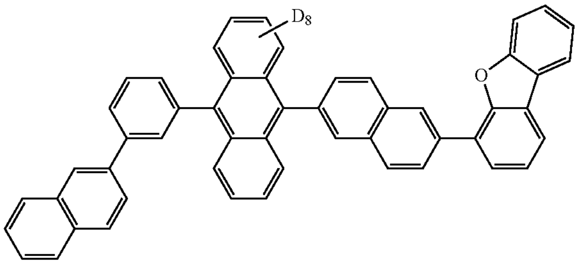
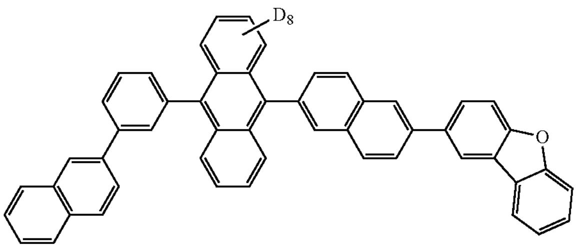
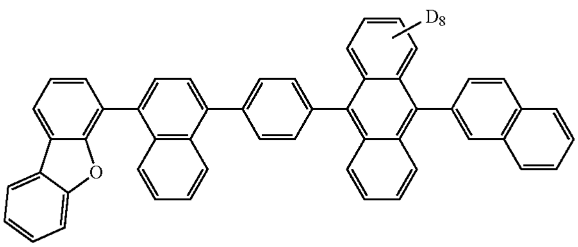

-continued
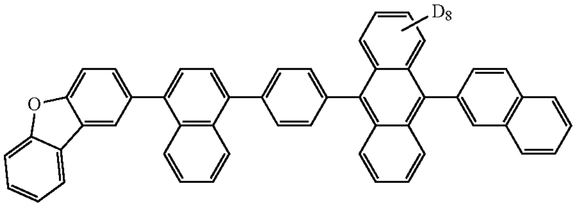
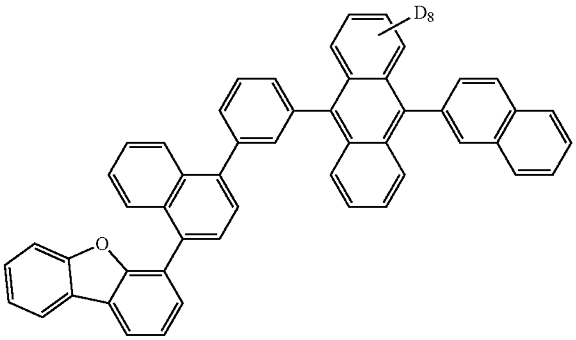
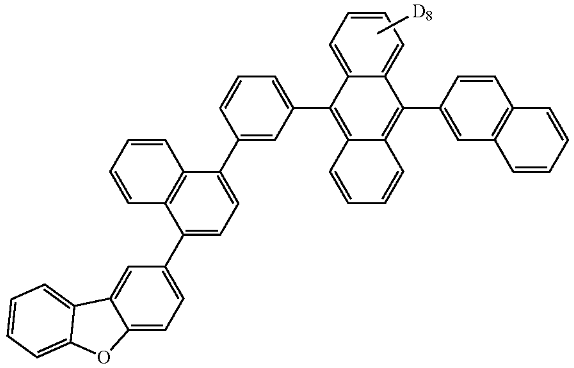
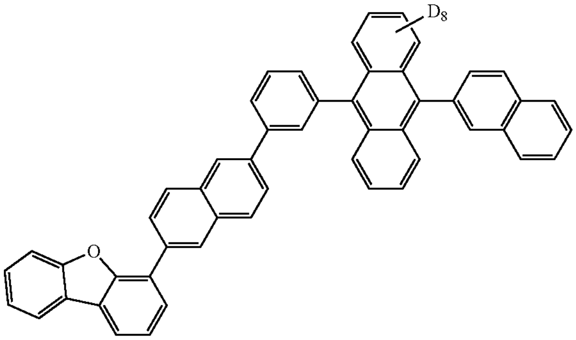
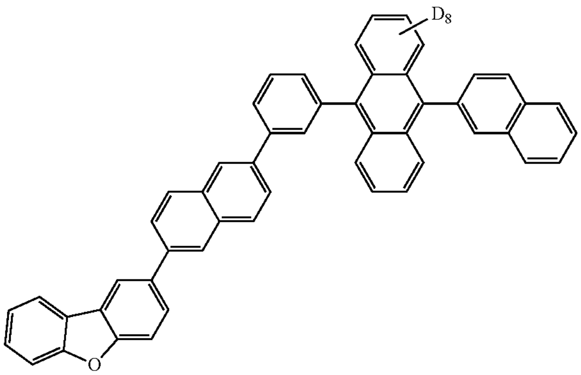
-continued
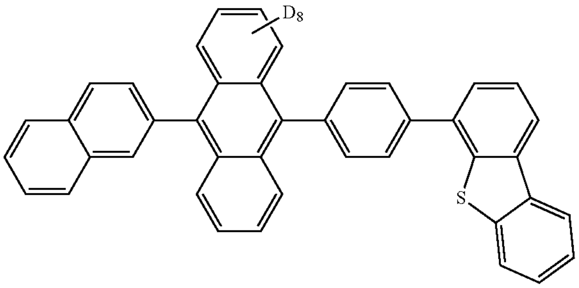
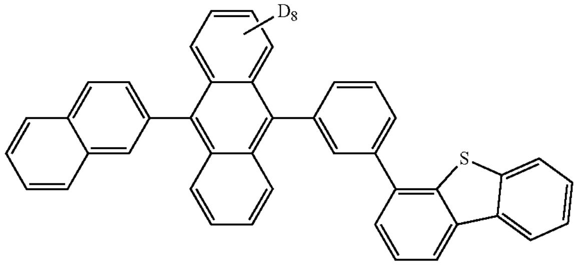
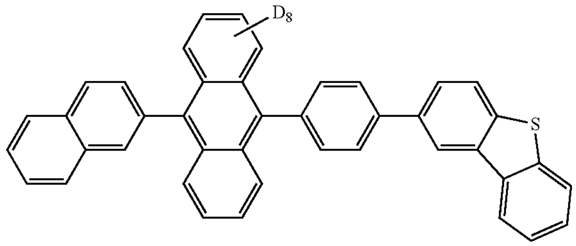
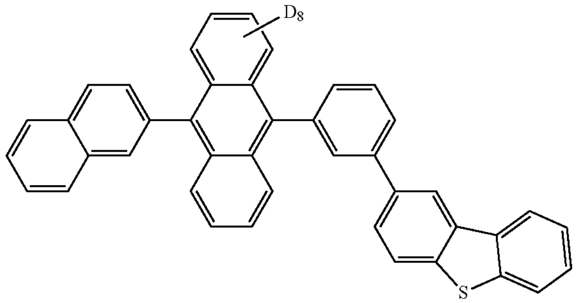
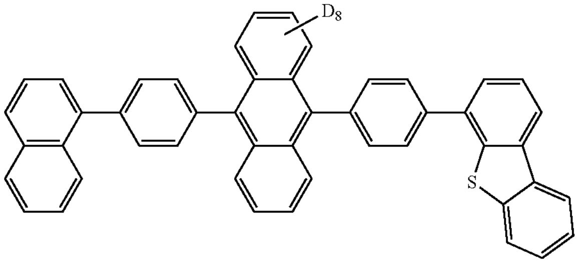
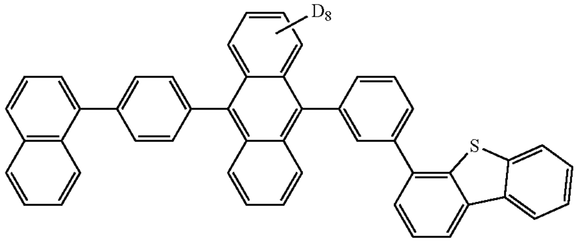

-continued
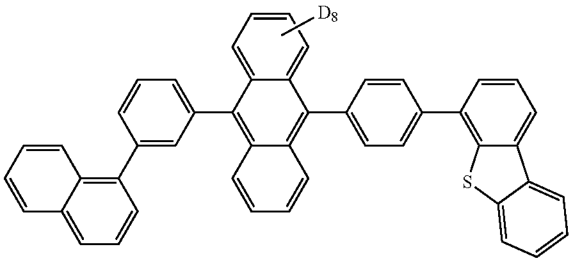
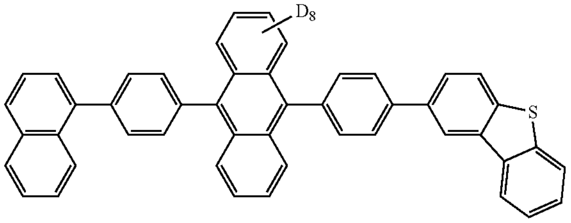
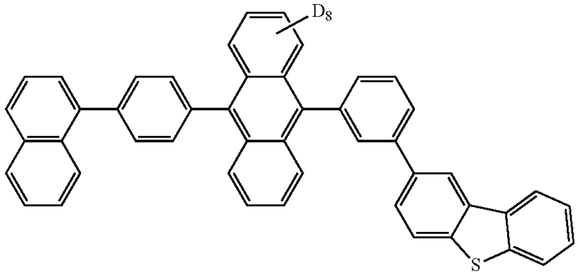
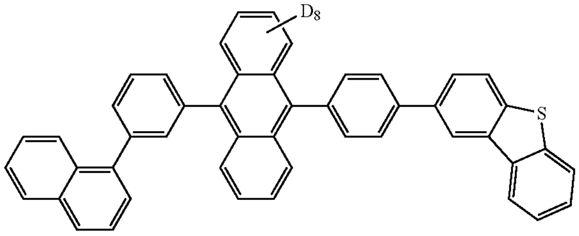
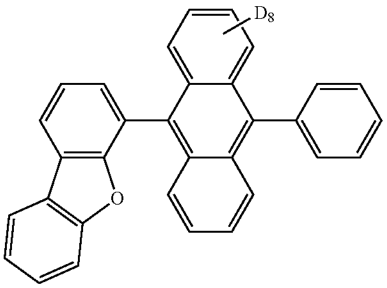
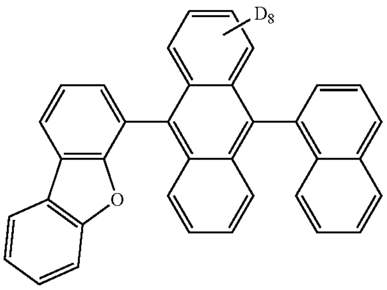
-continued
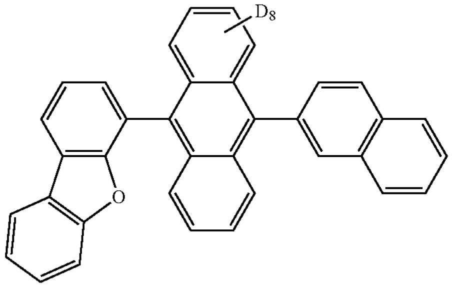
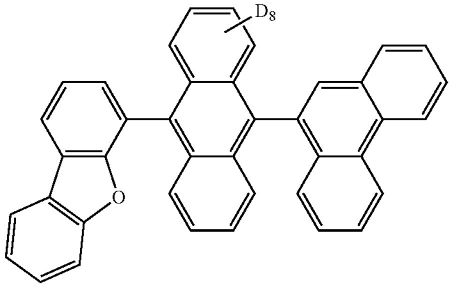
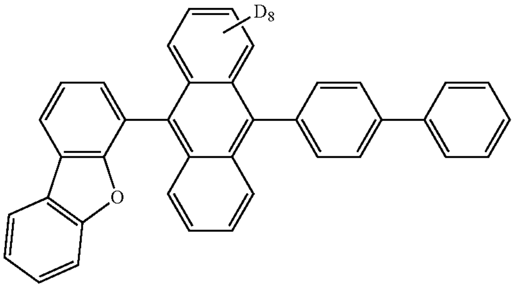
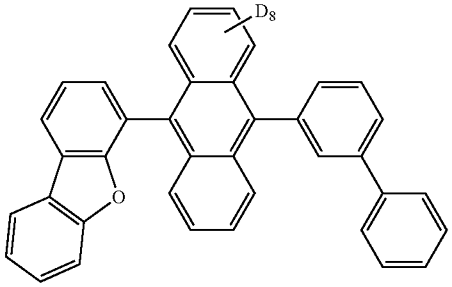
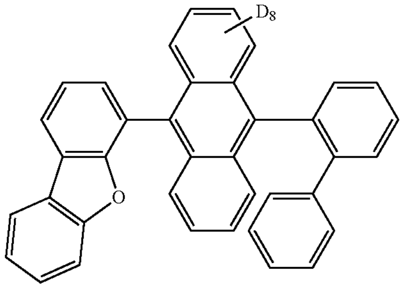
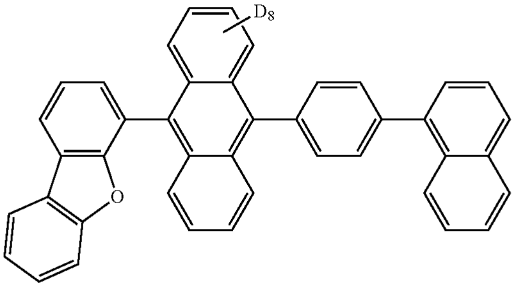

-continued
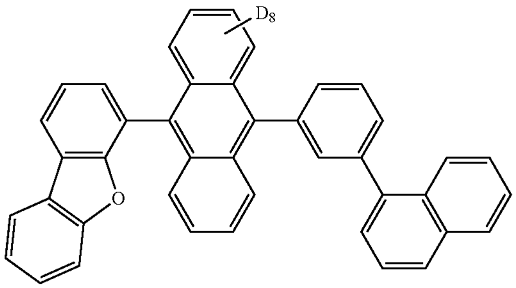
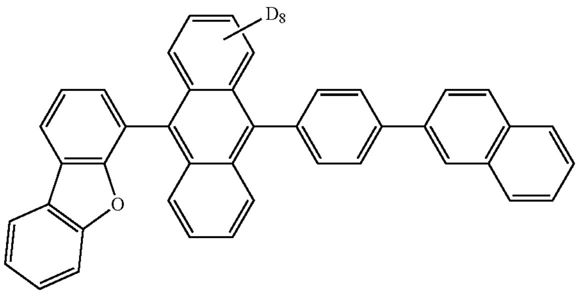
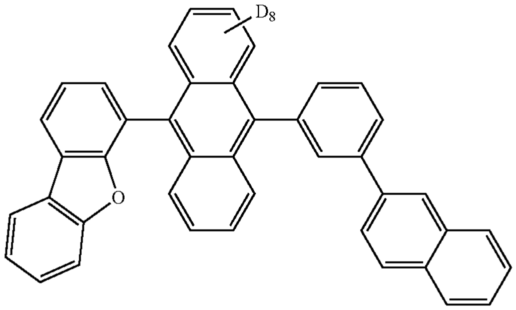
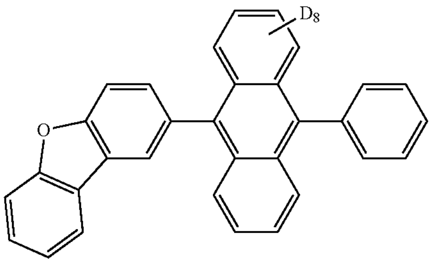
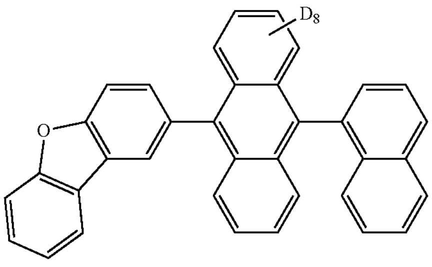
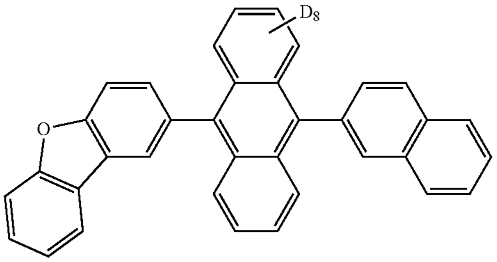
-continued
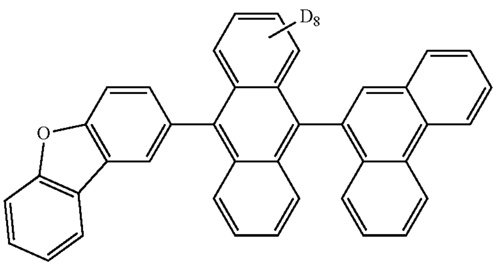
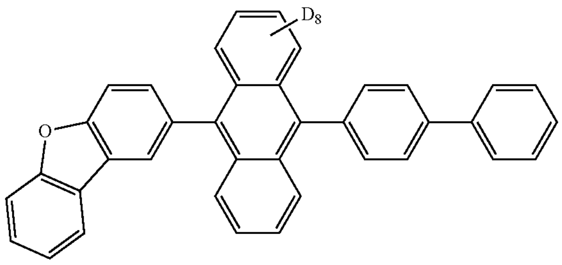
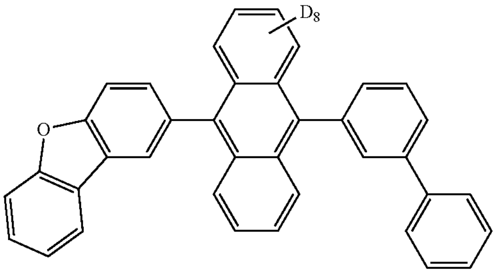
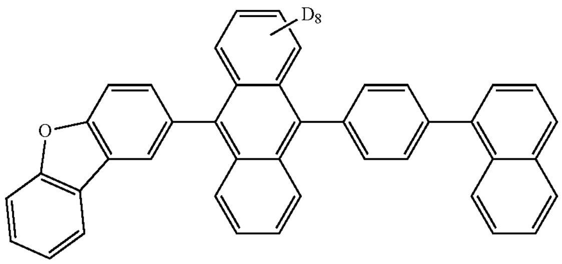
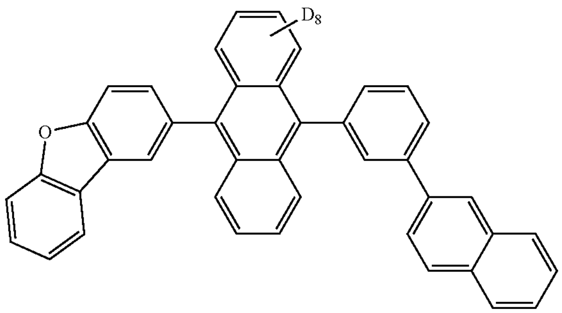
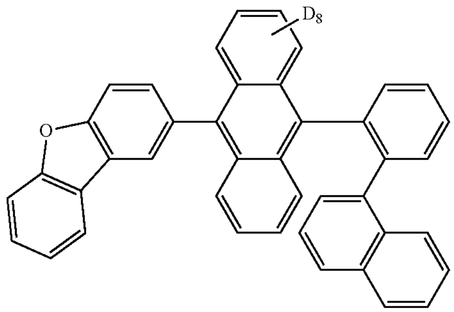

-continued
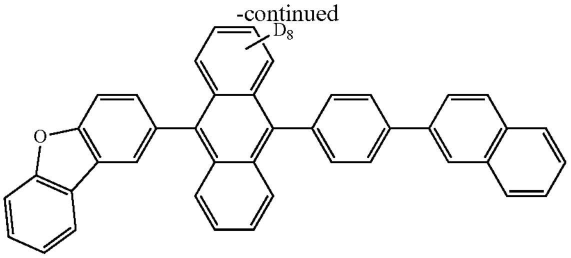
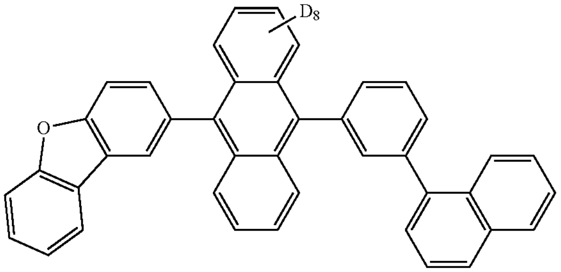
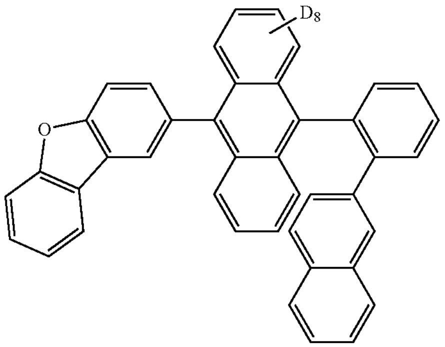
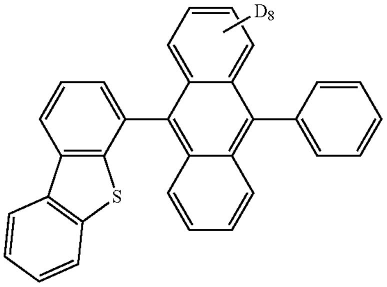
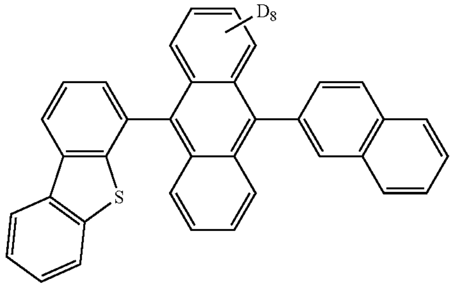
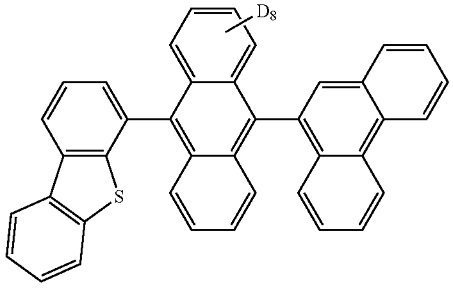
-continued
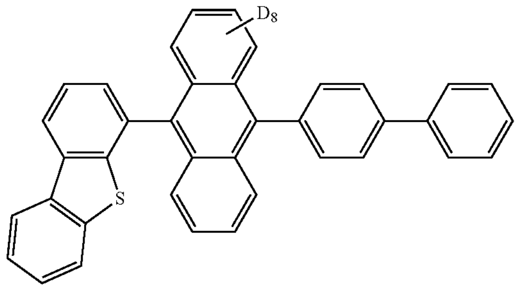
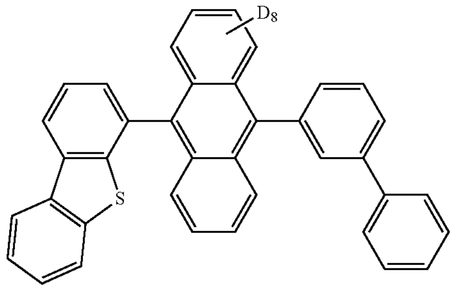
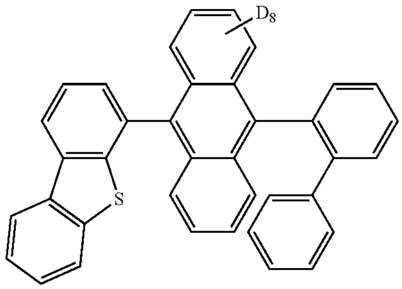
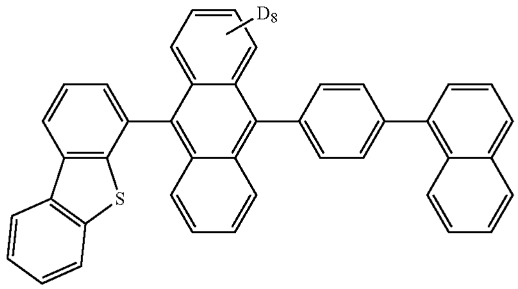
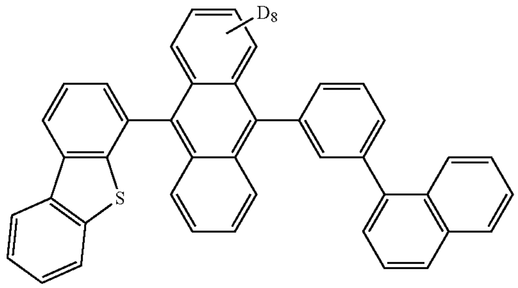

-continued
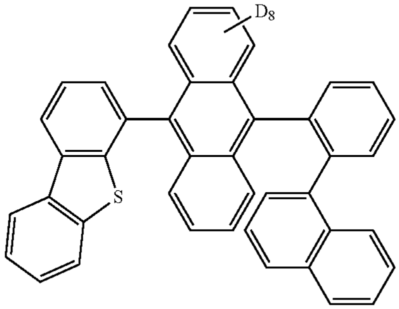
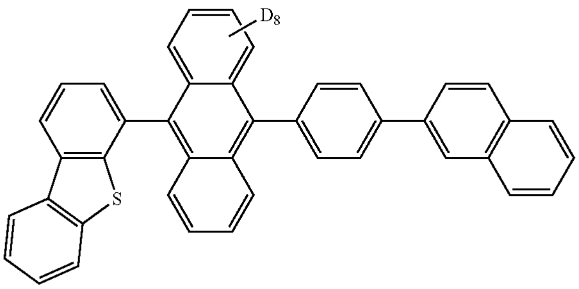
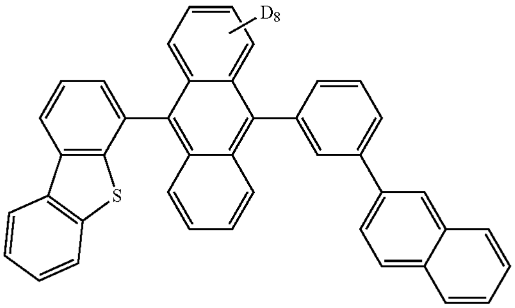
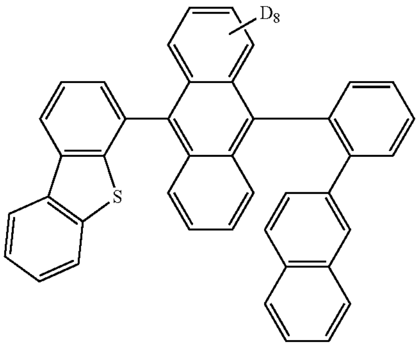
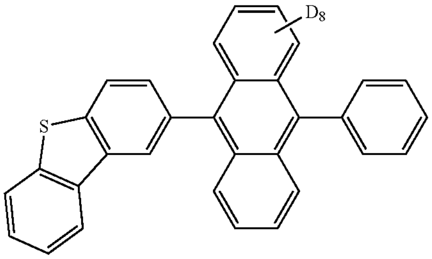
-continued
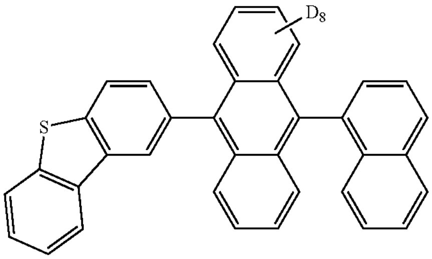
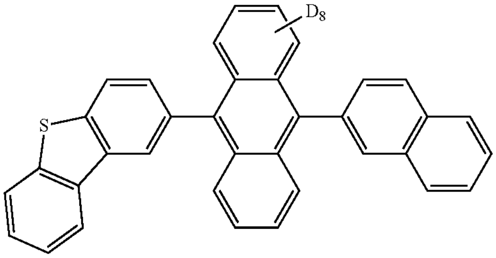
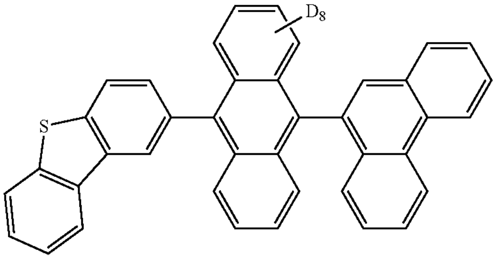
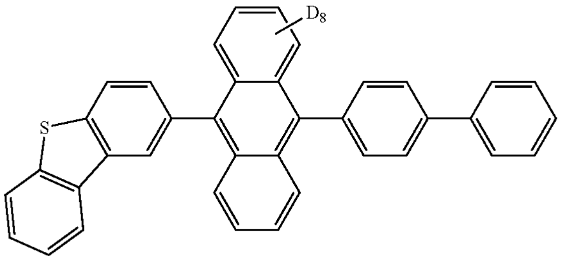
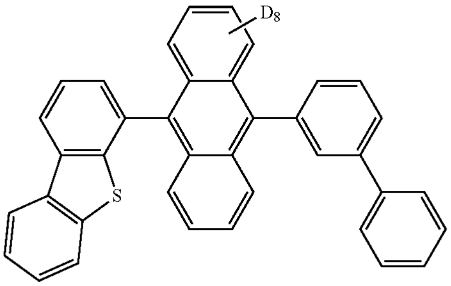
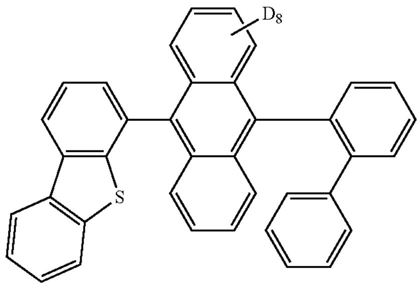

-continued
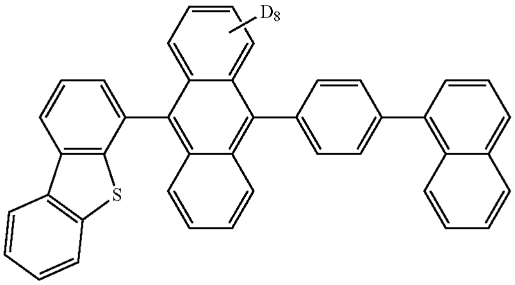
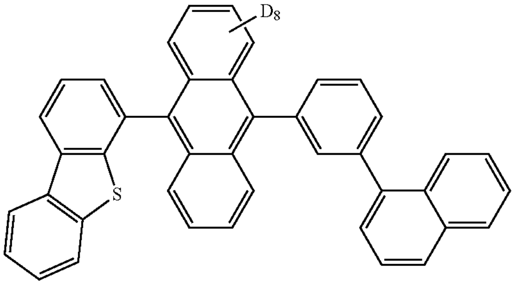
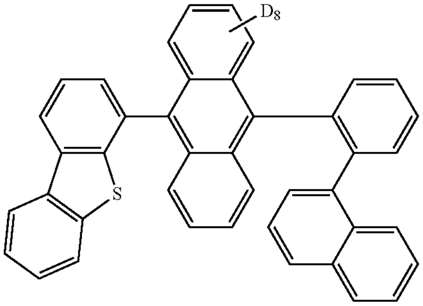
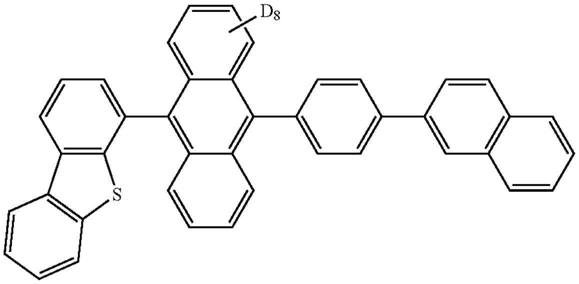
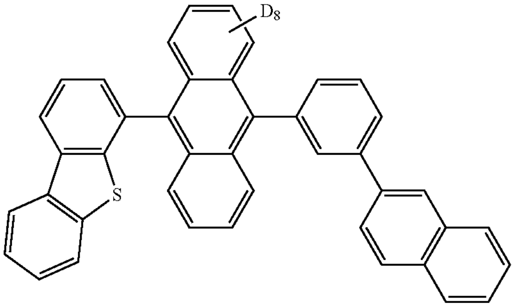
-continued
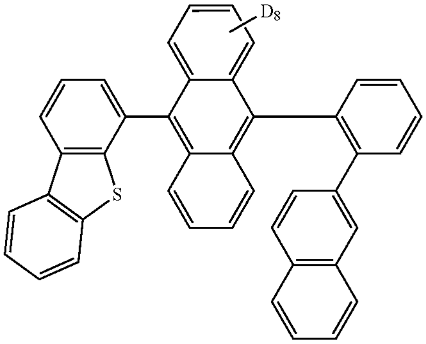
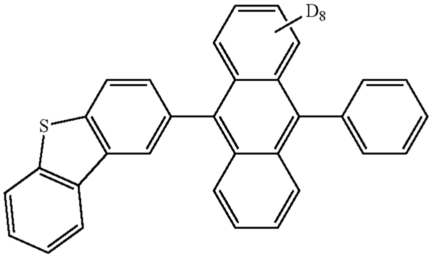
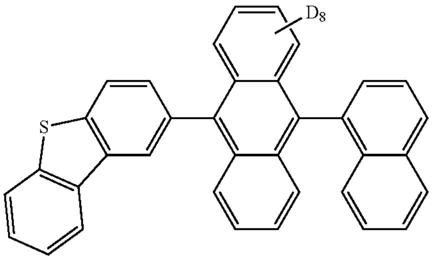
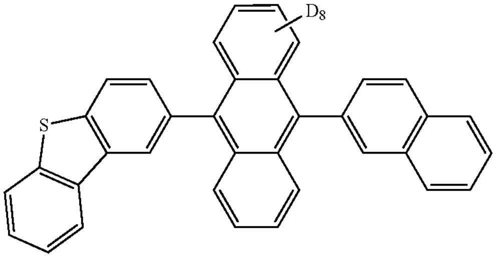
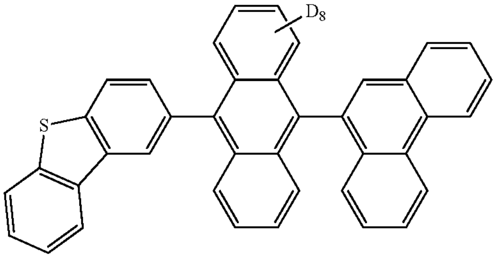
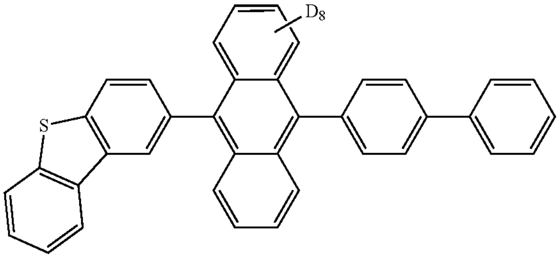

-continued
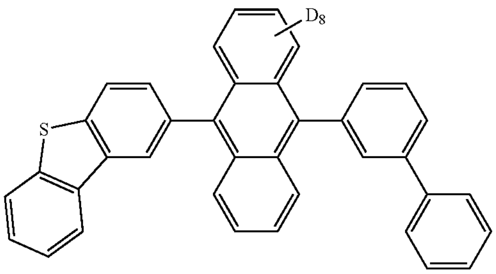
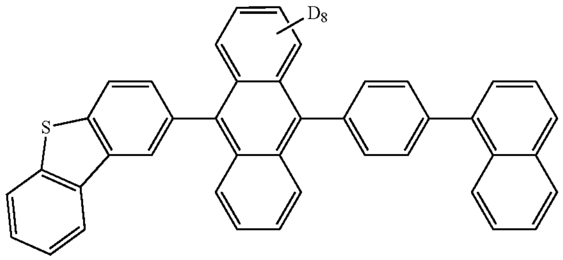
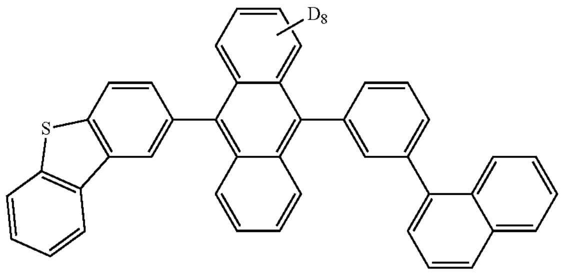
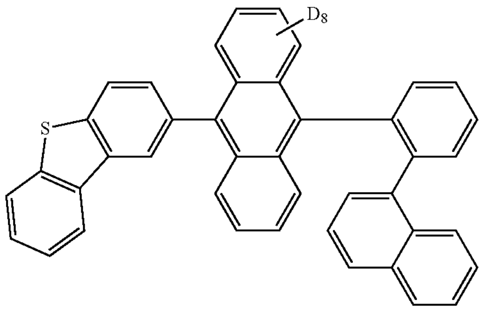
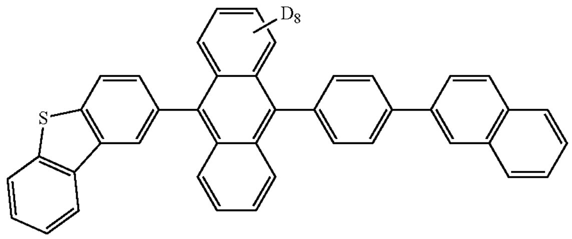
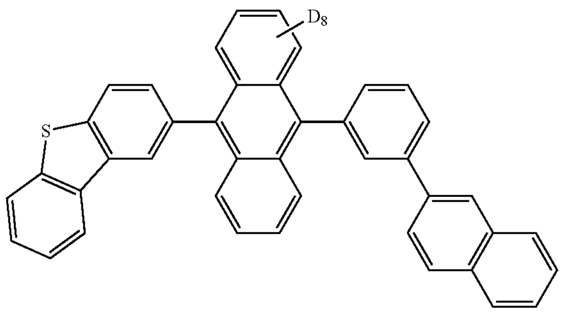
-continued
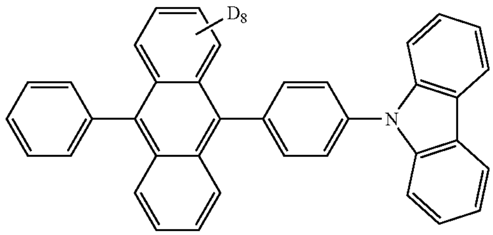
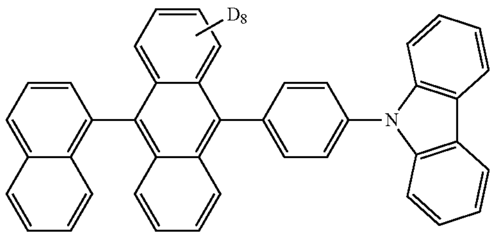
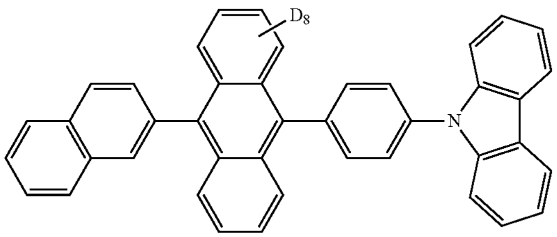
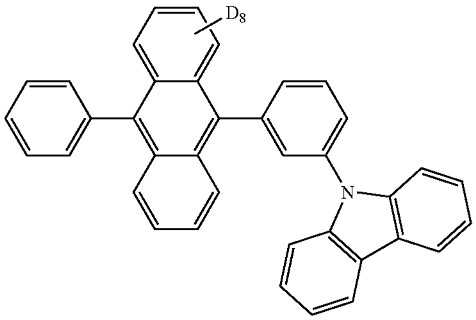
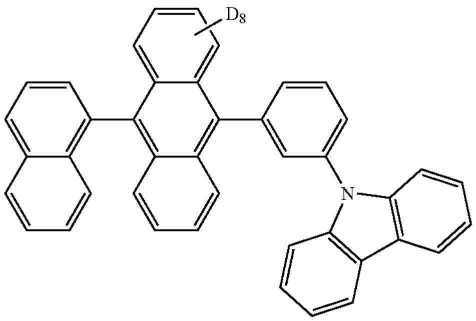
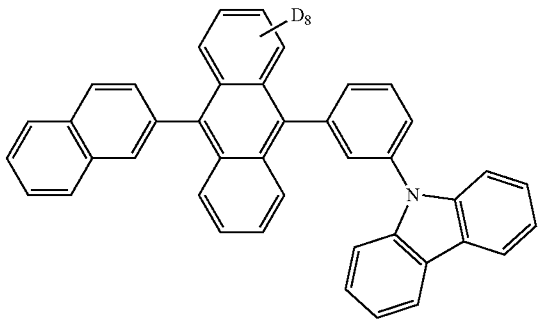

-continued
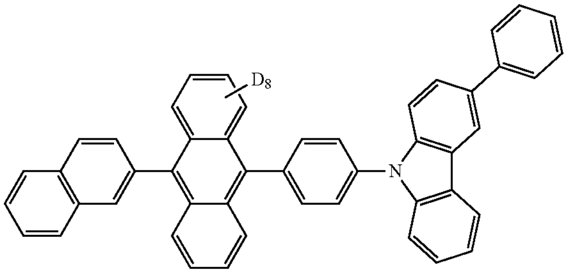
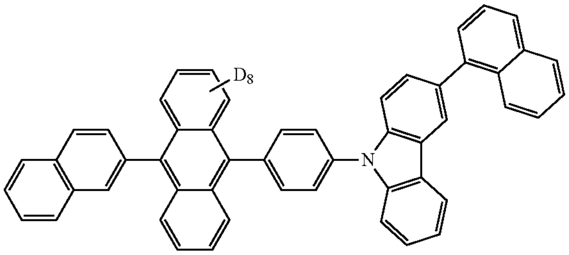
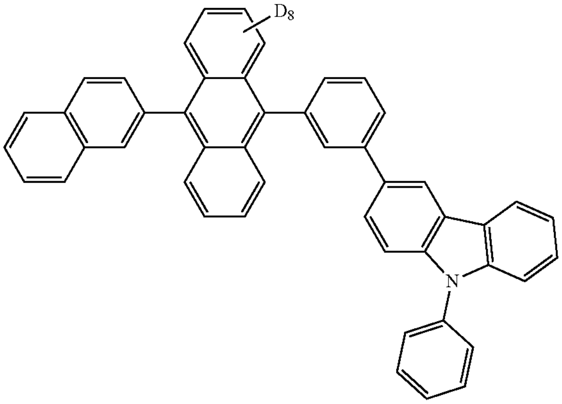
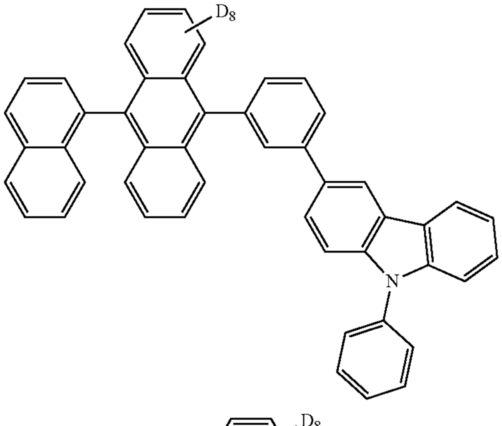
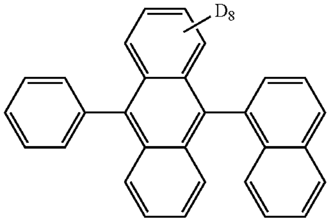
-continued
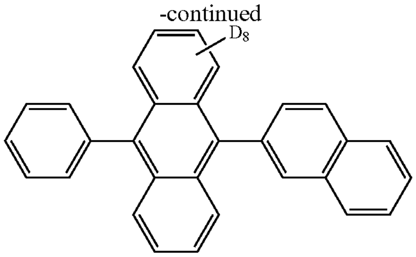
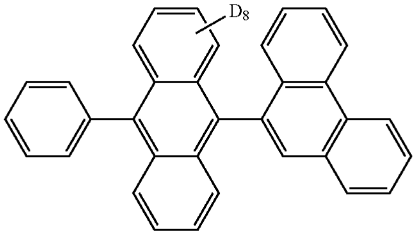
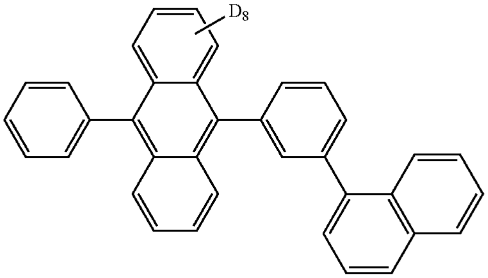
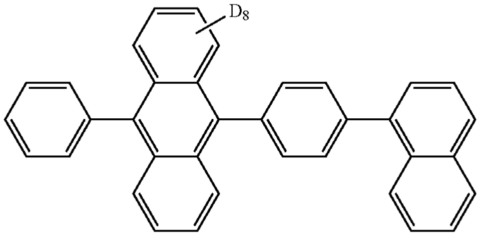
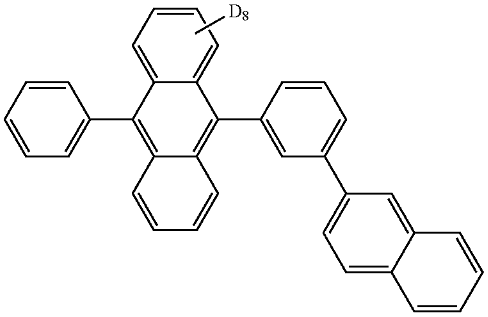
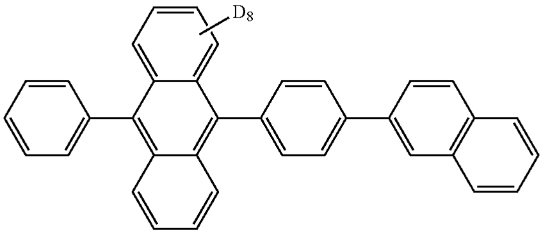
.
24. The OLED of claim 5, wherein the pyrene derivative is a compound being one of the followings of Formula 4:

Formula 4
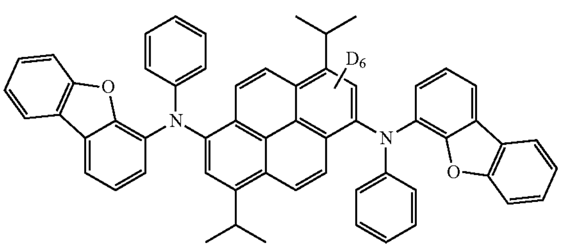
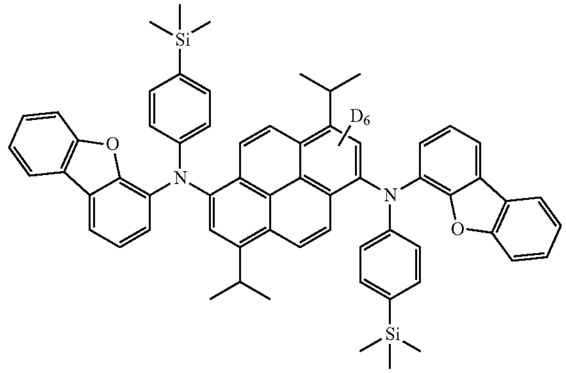
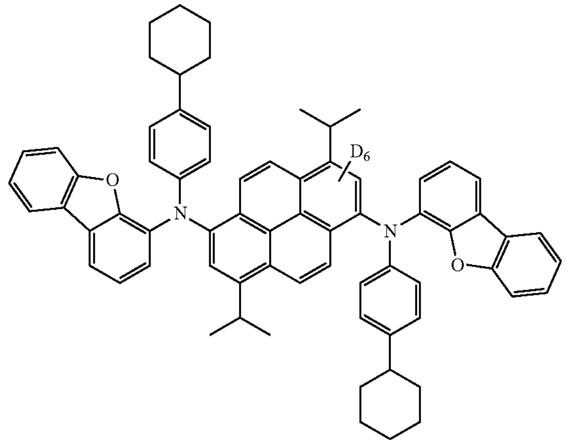
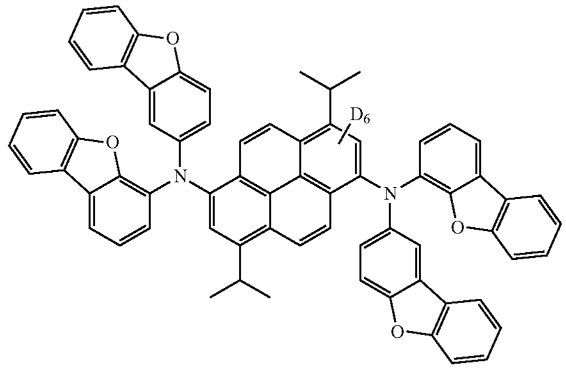
-continued
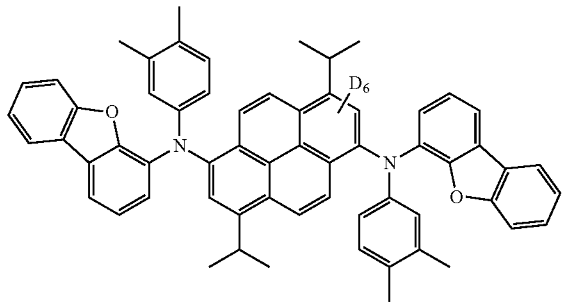
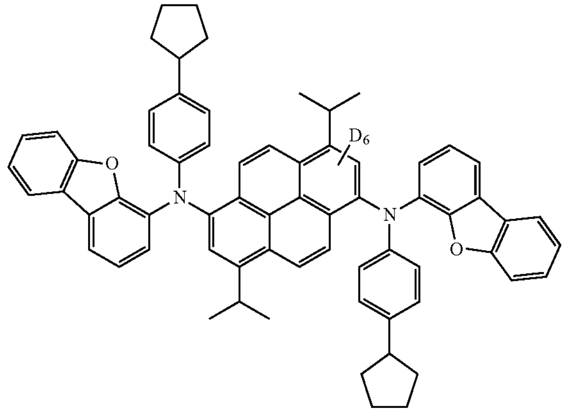
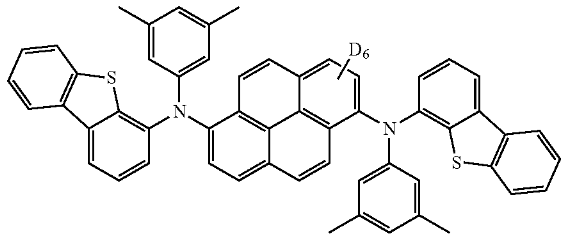
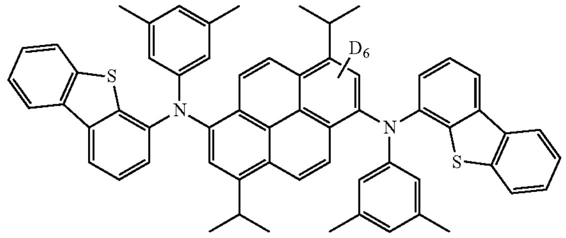
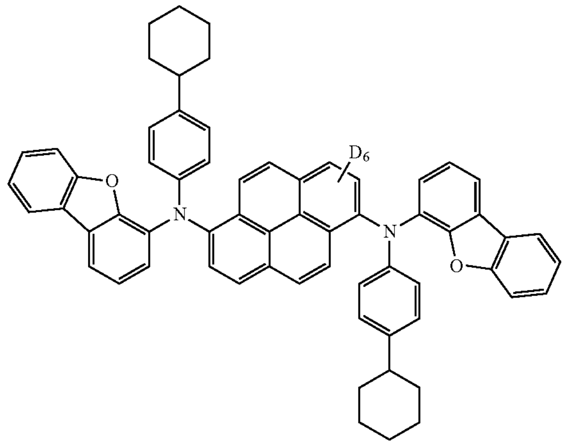

-continued
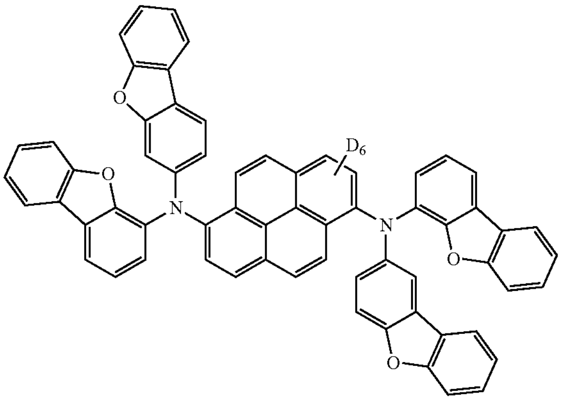
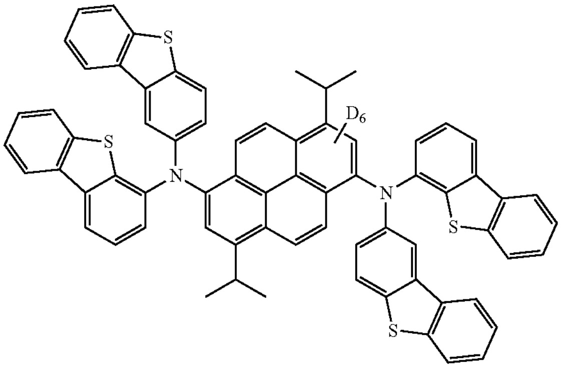
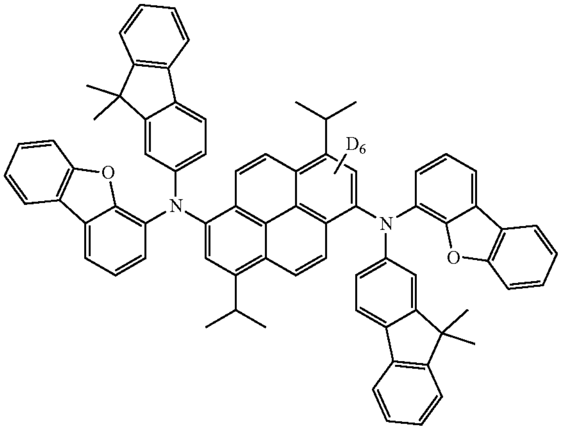
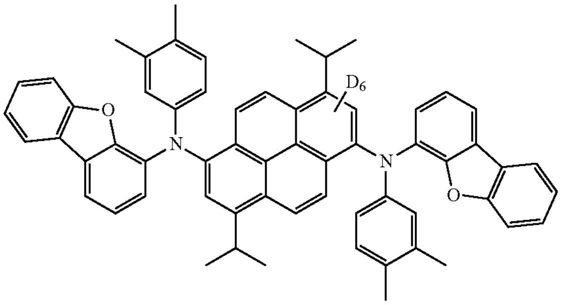
-continued
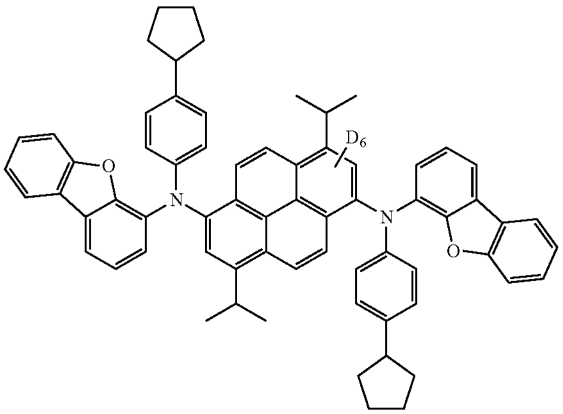
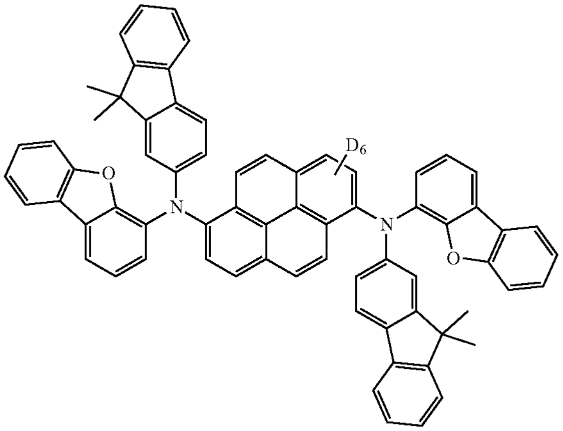
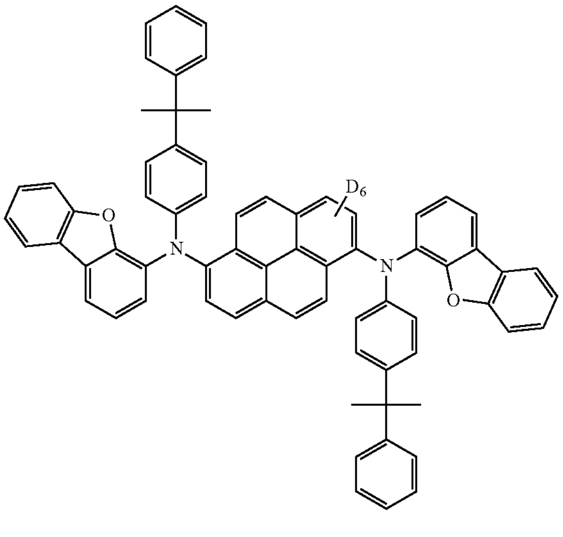

-continued
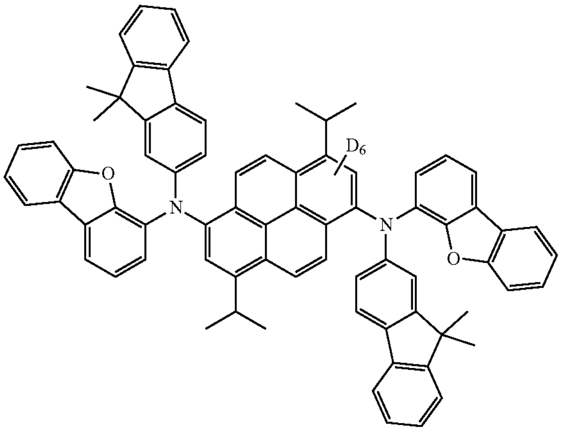
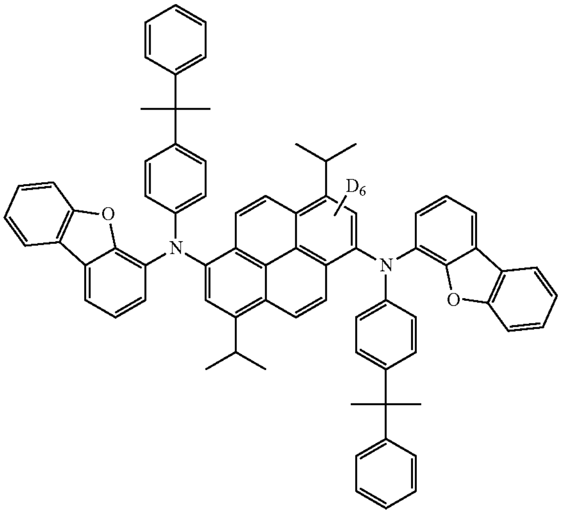
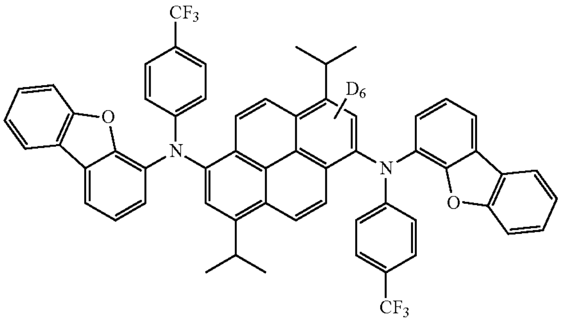
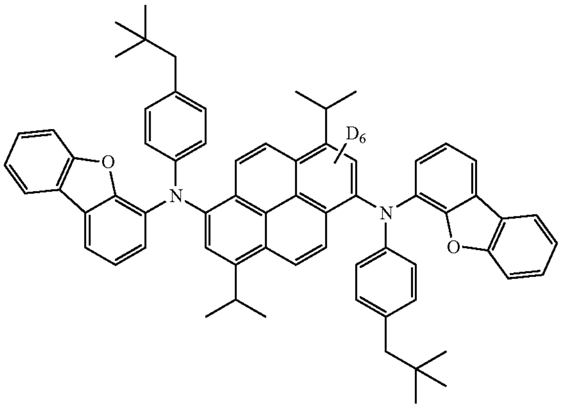
-continued
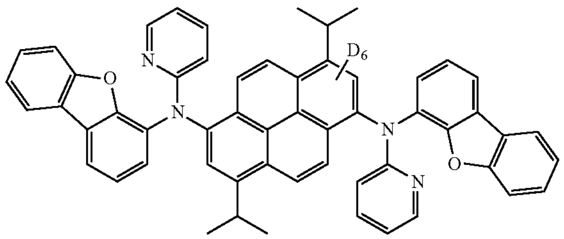
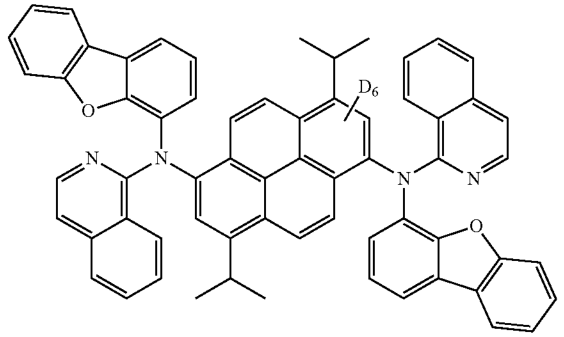
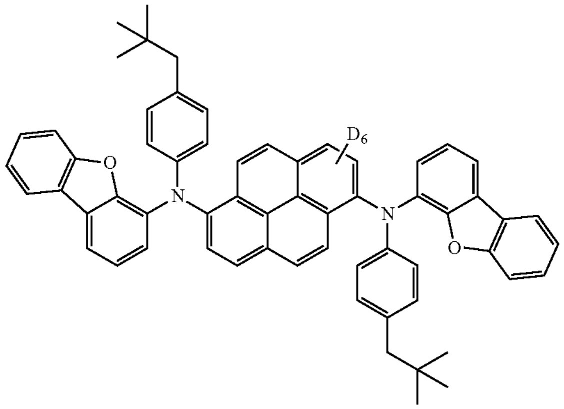
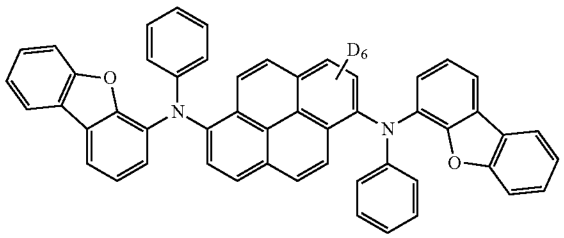
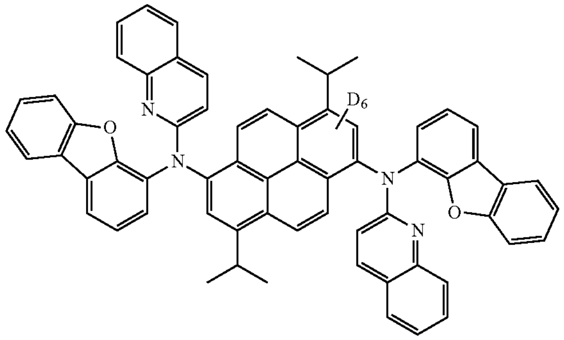

-continued
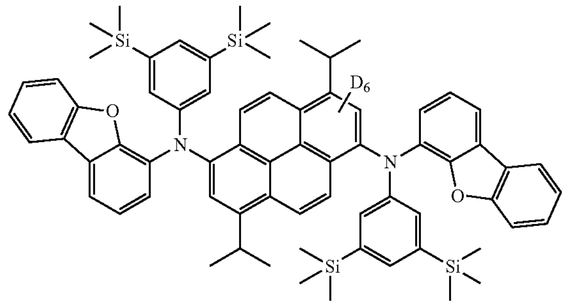
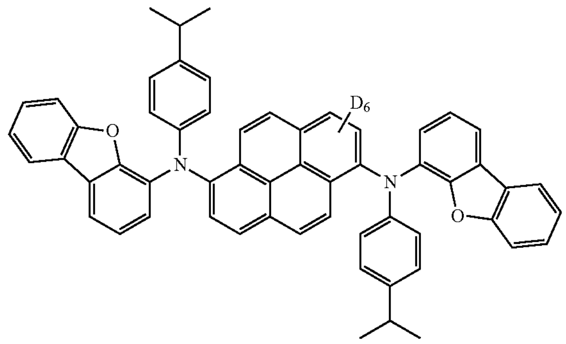
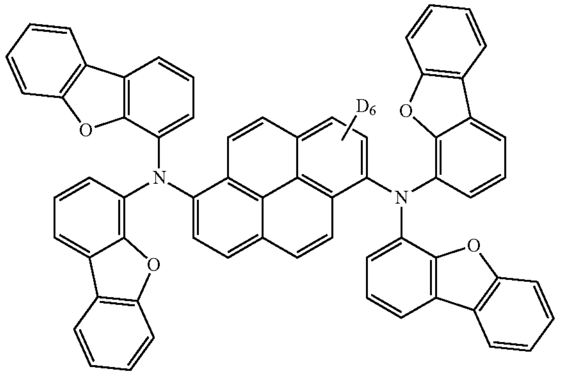
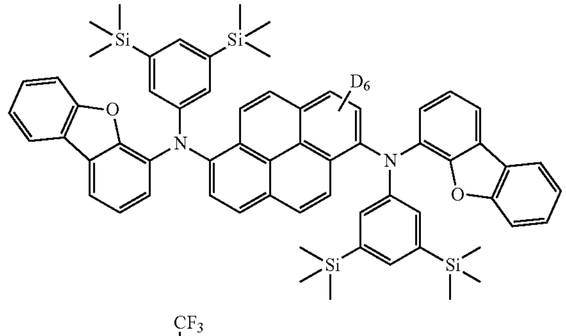
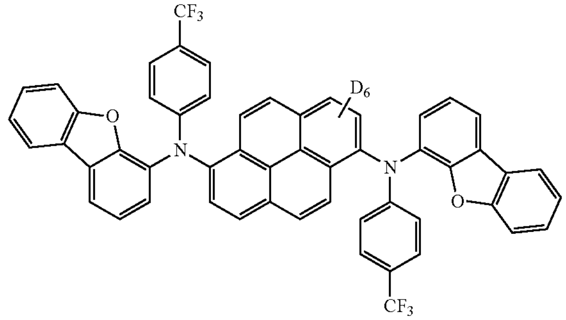
-continued
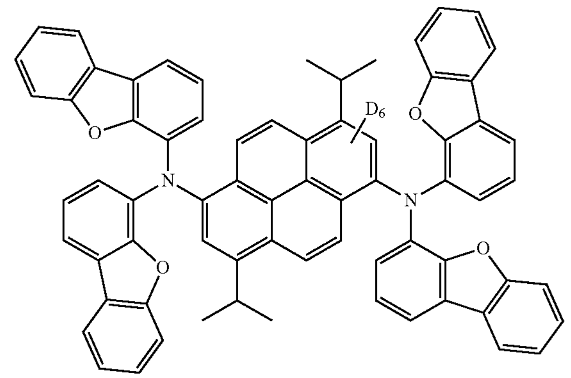
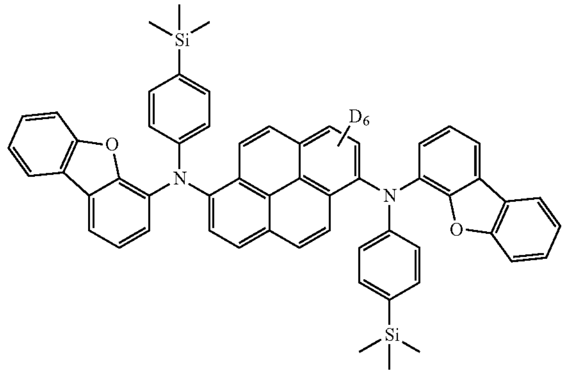
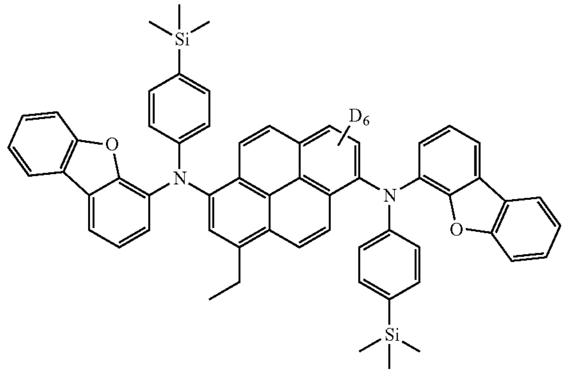
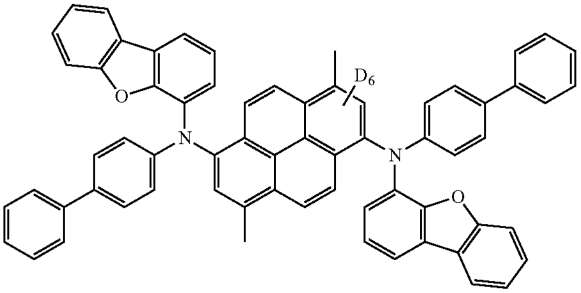

-continued
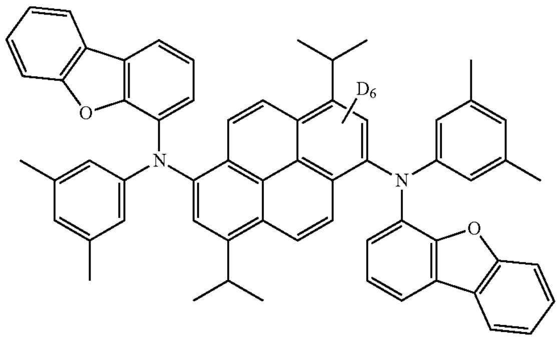
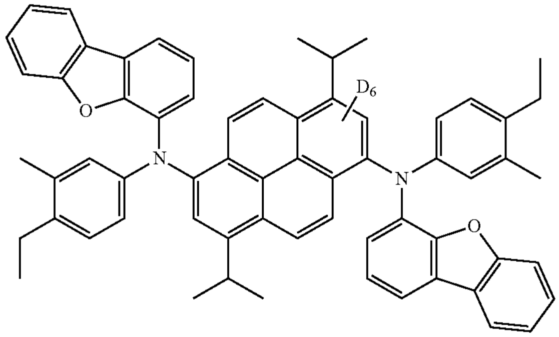
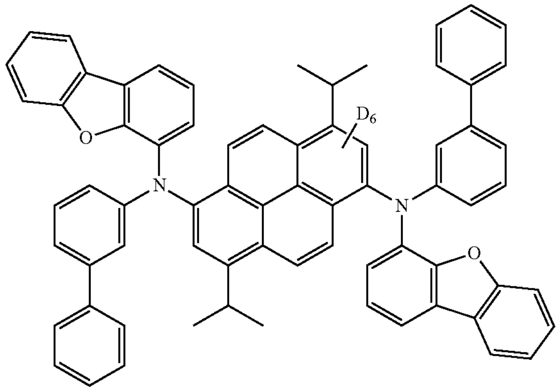
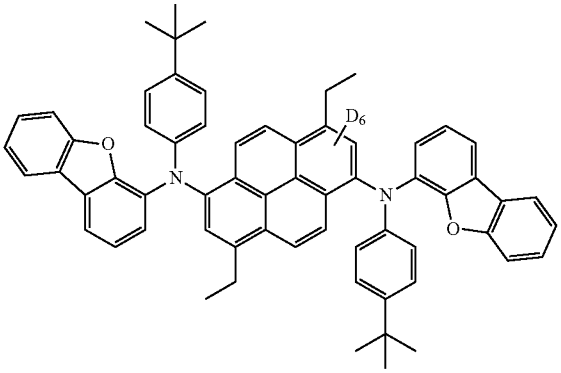
-continued
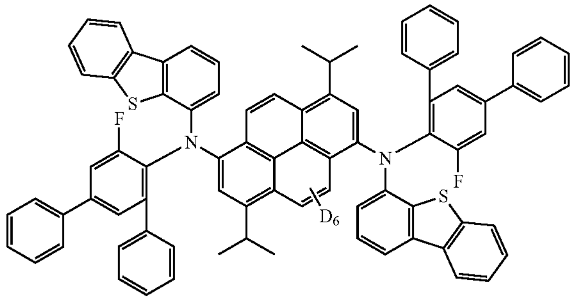
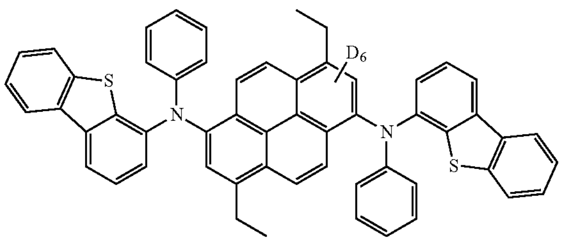
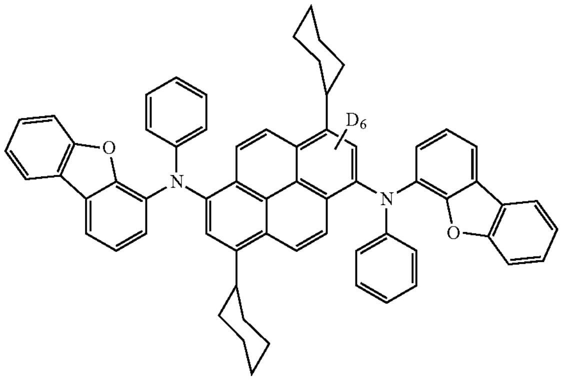
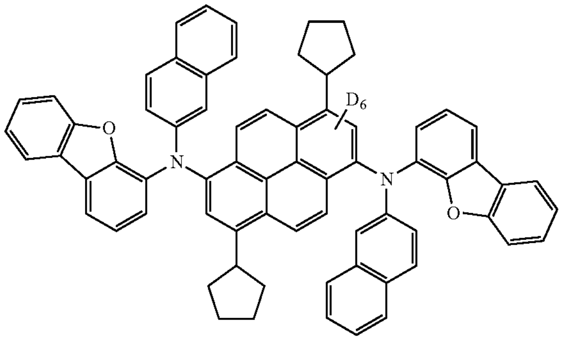

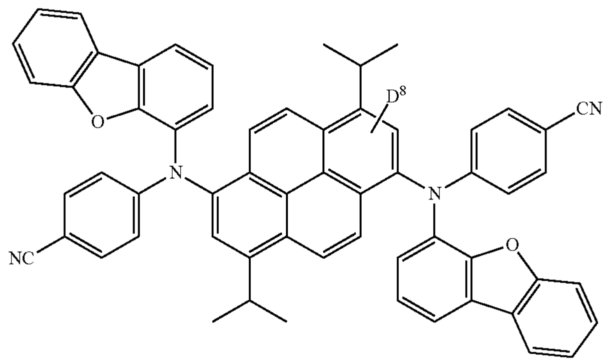
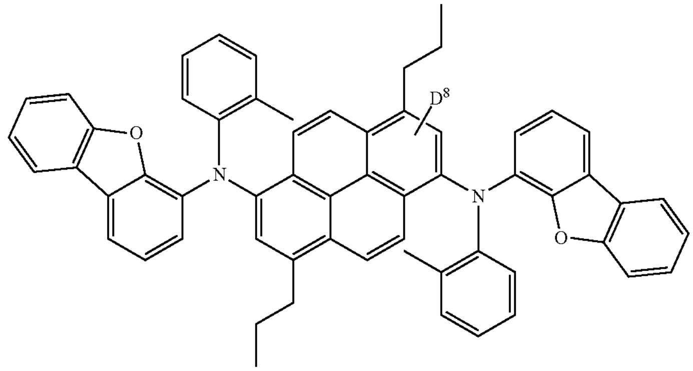
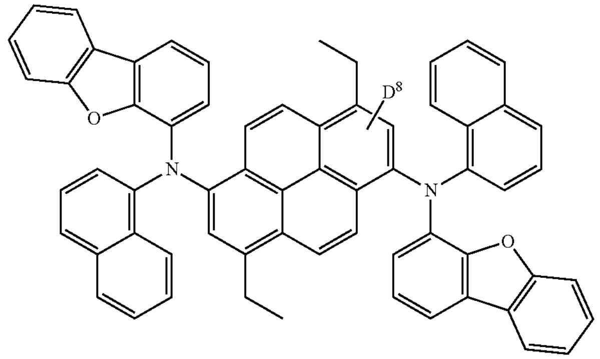
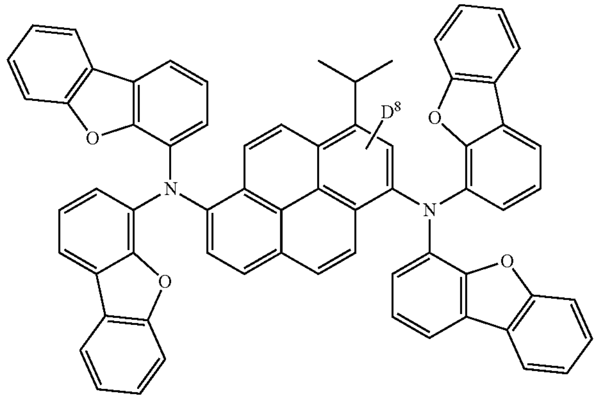
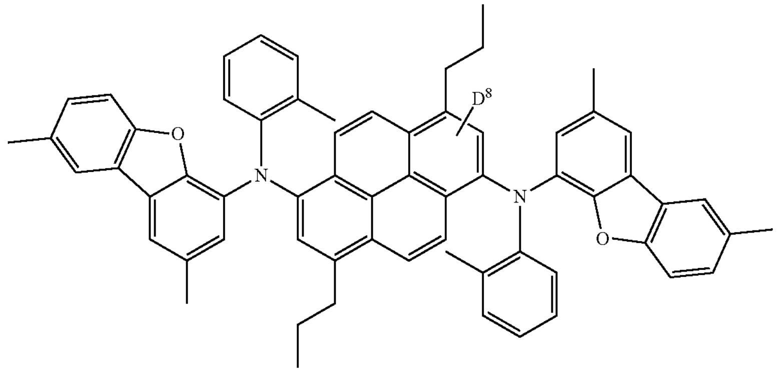

-continued
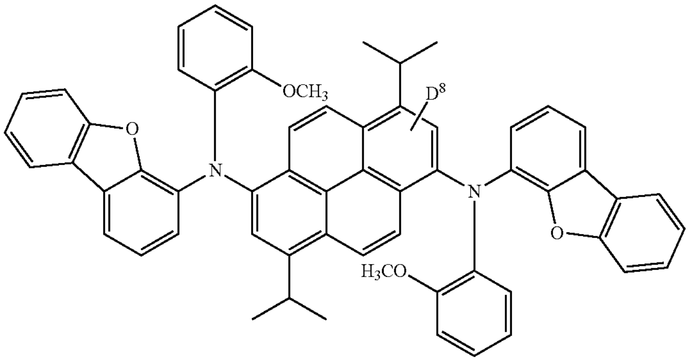
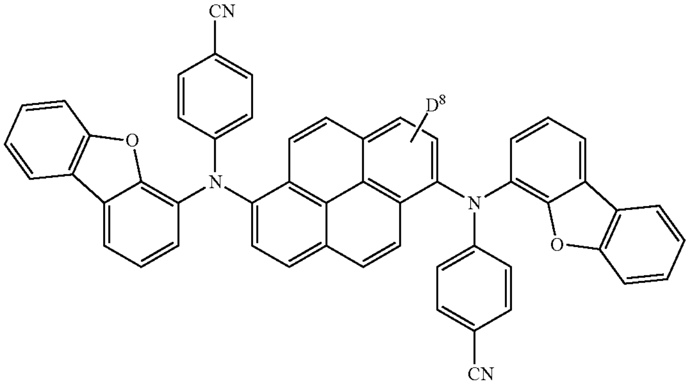
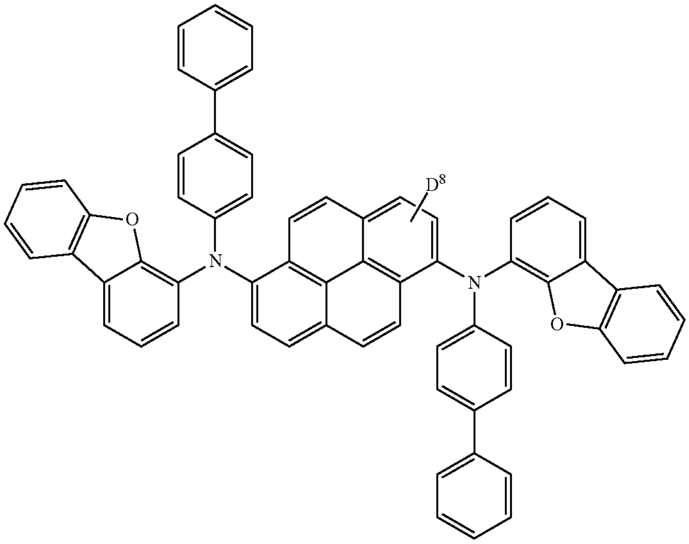
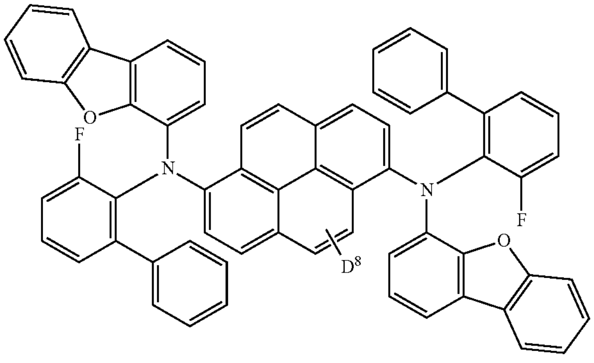

-continued
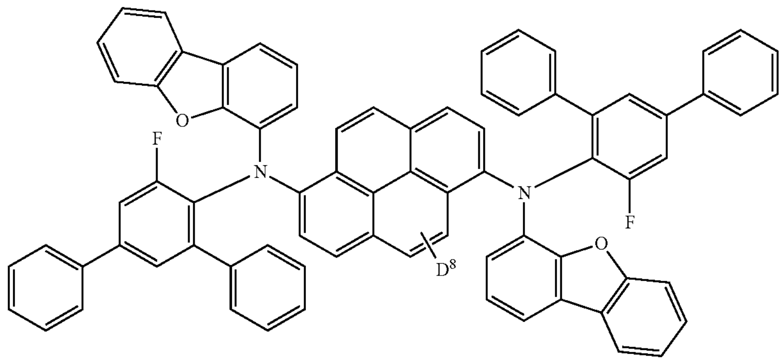
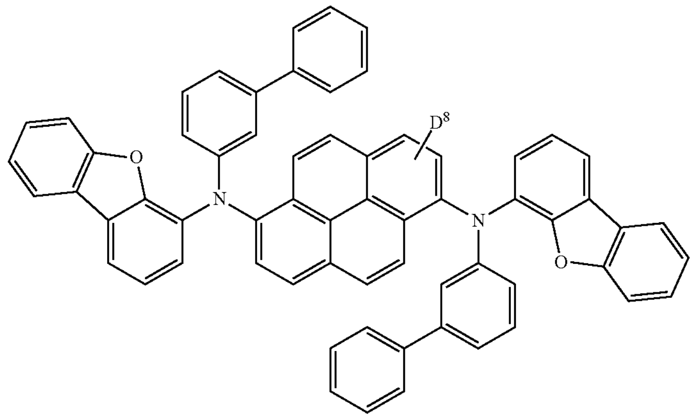
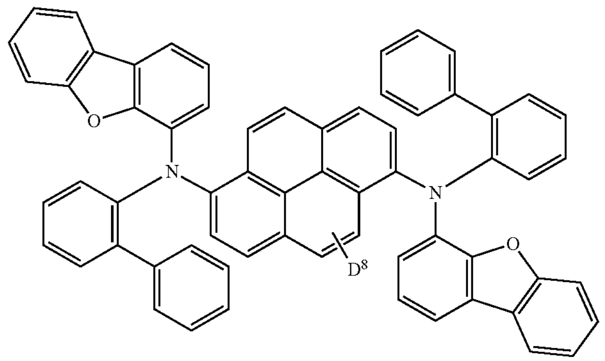
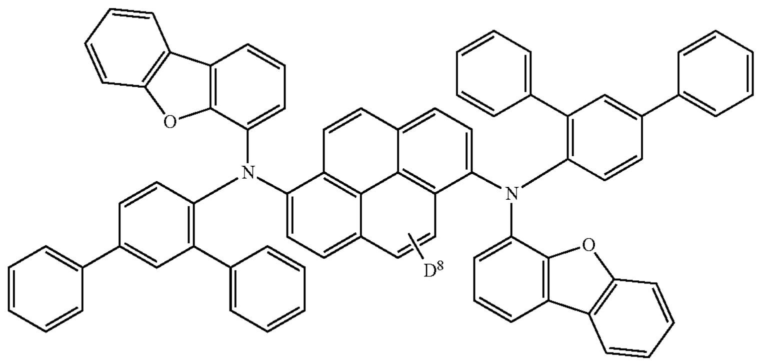

-continued
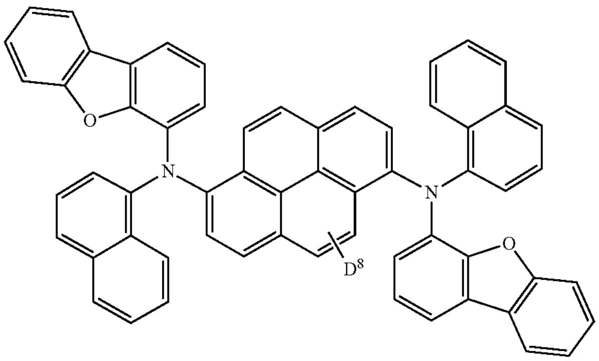
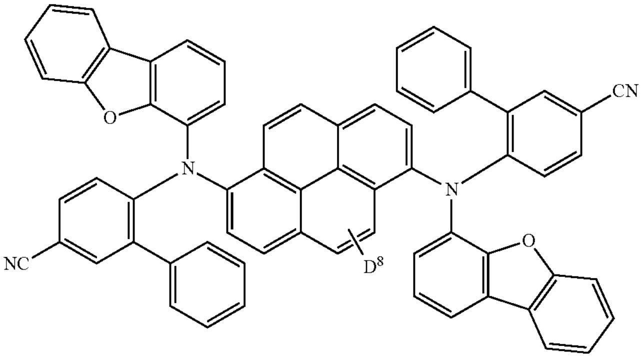
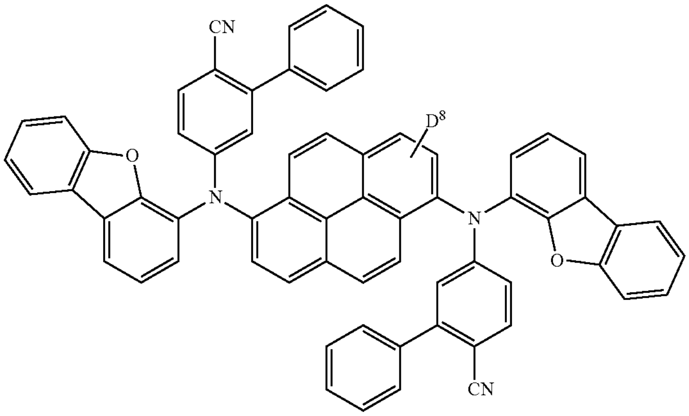
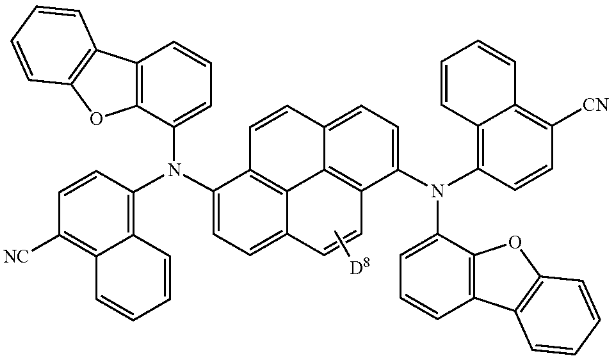

-continued
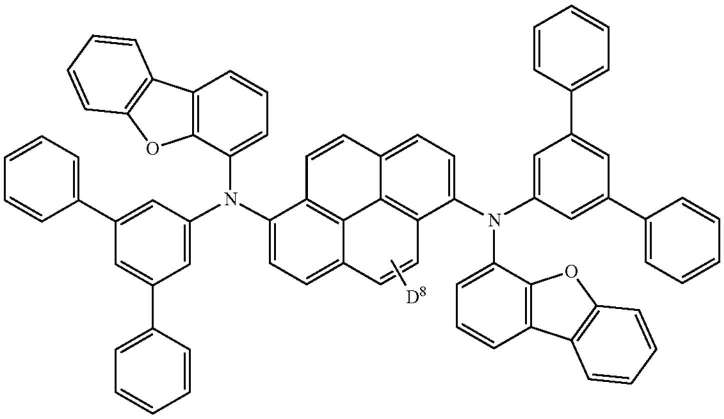
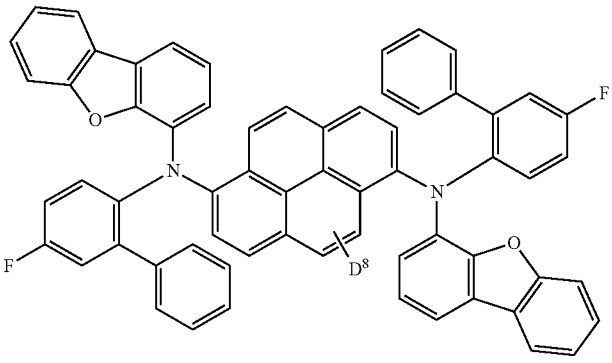
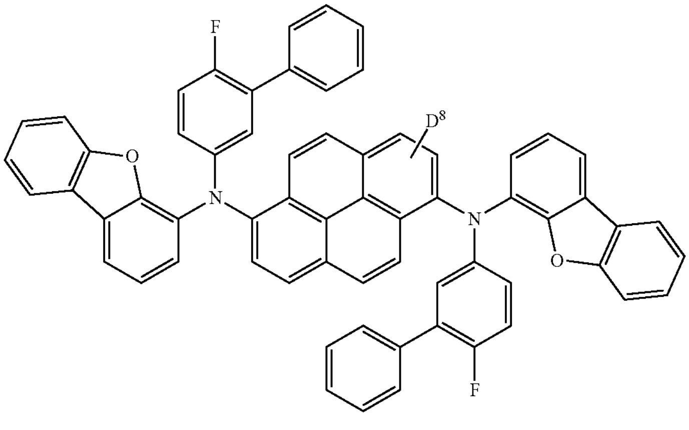
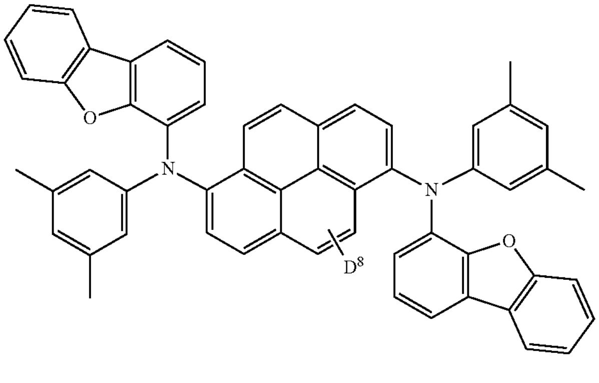
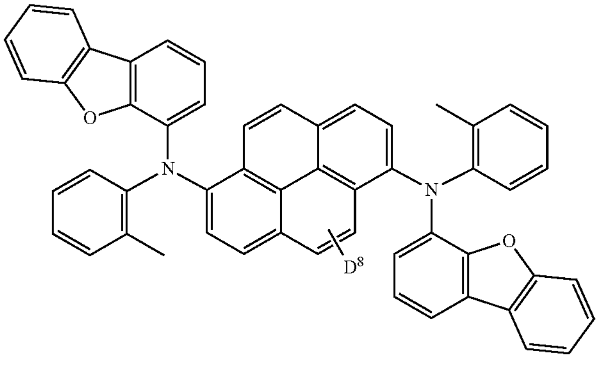

-continued
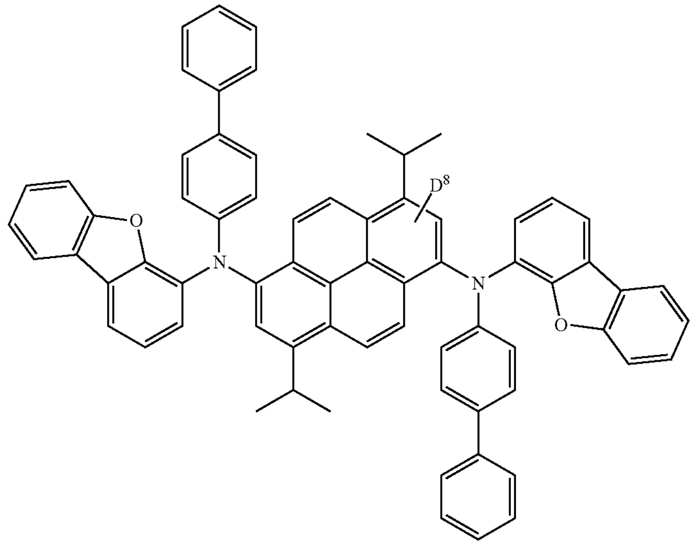
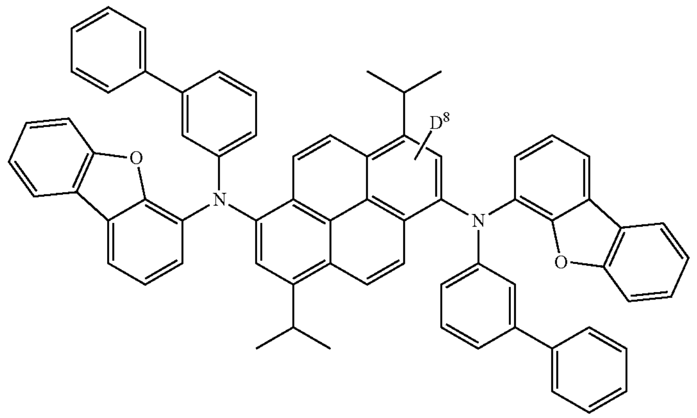
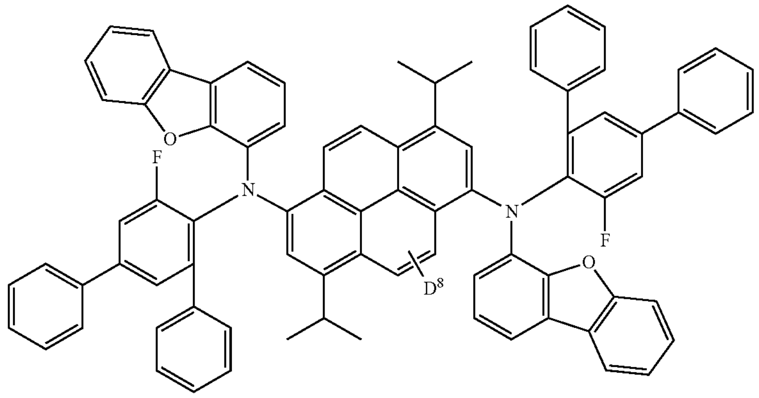

-continued
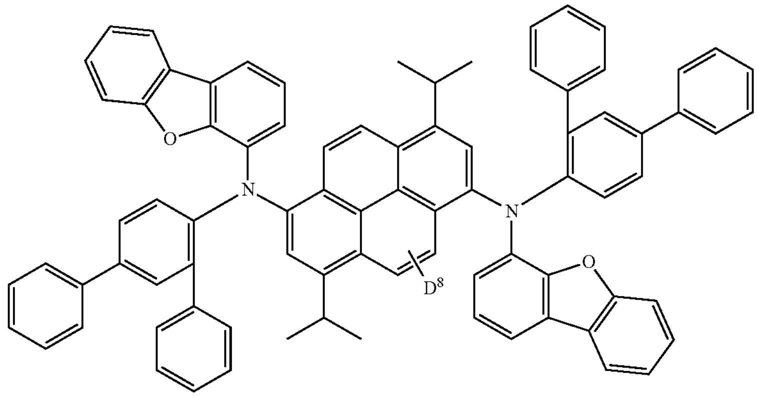
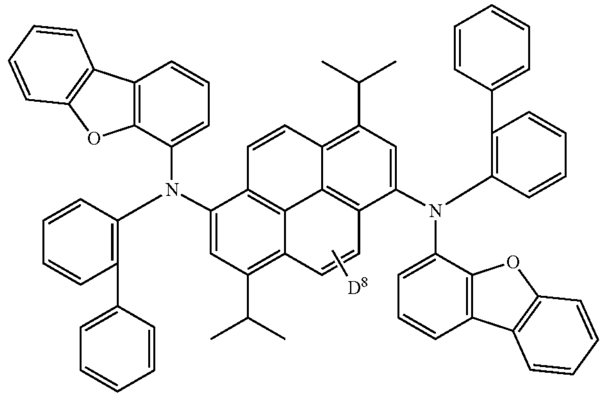
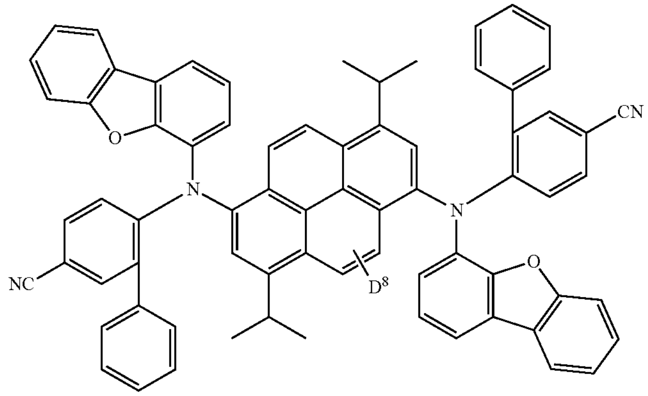
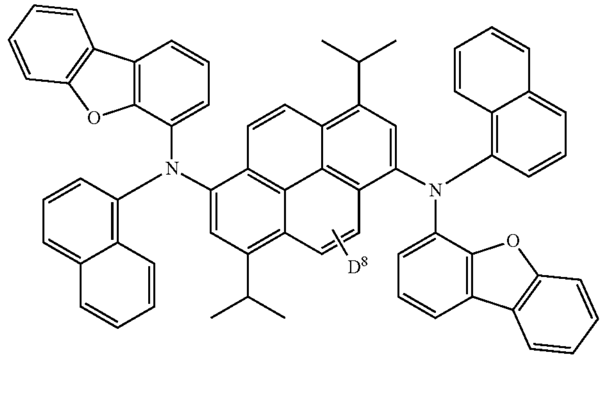

-continued
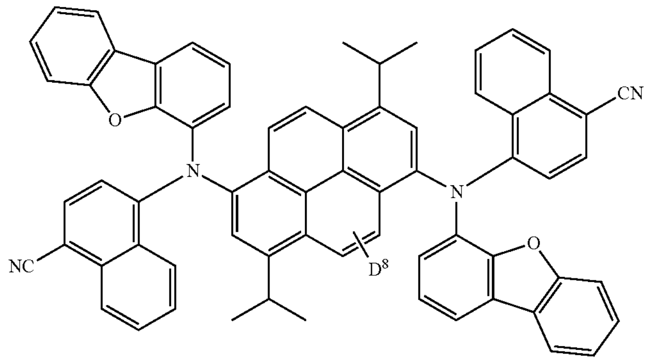
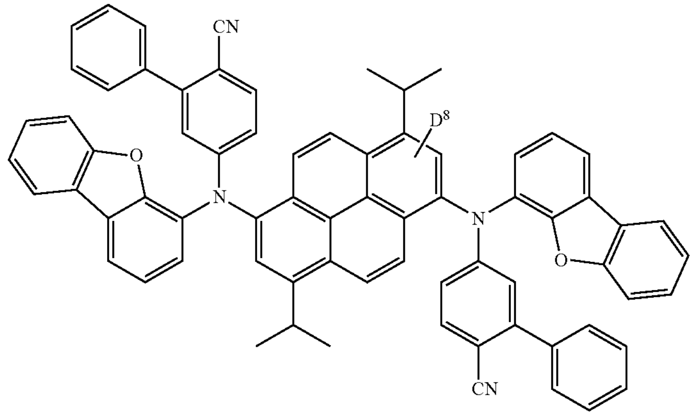
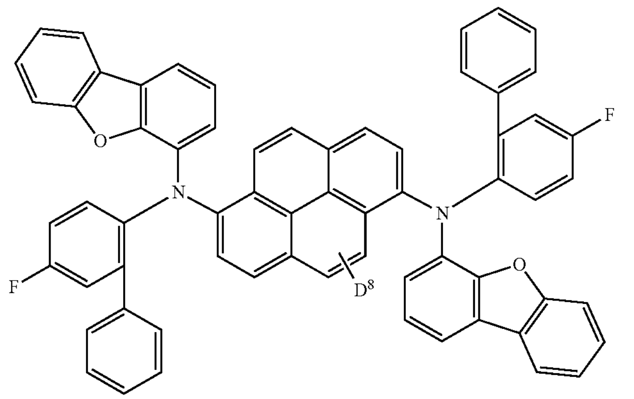
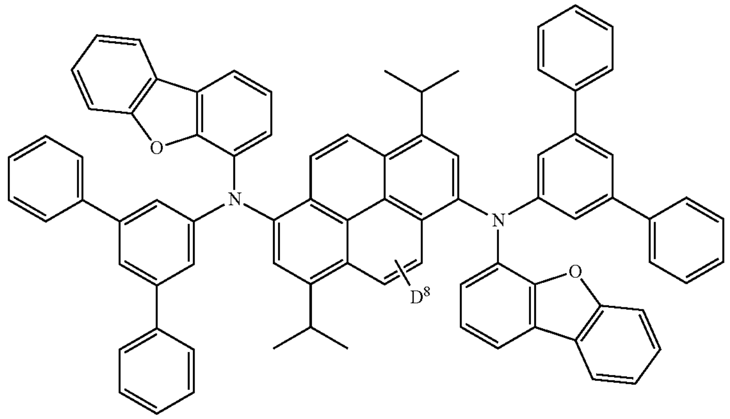

-continued
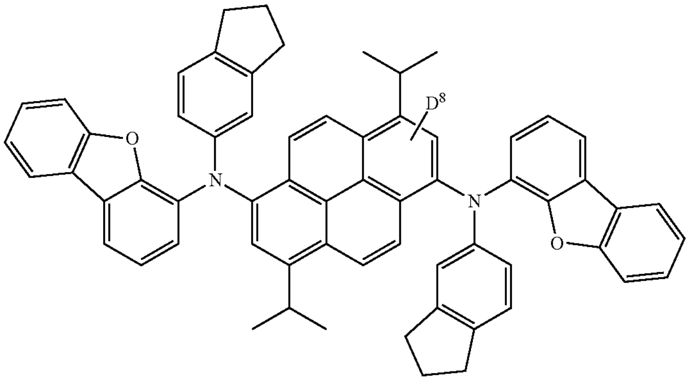
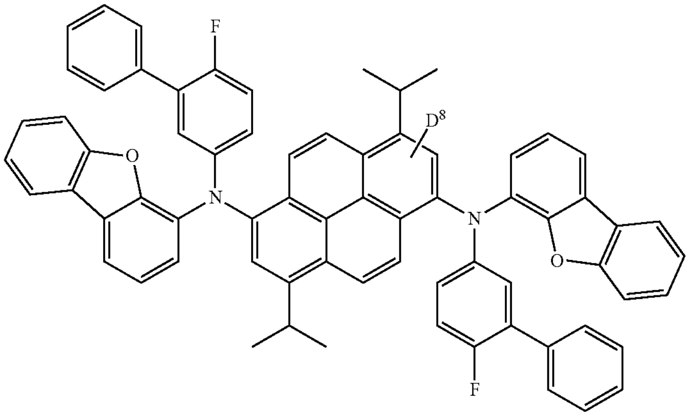
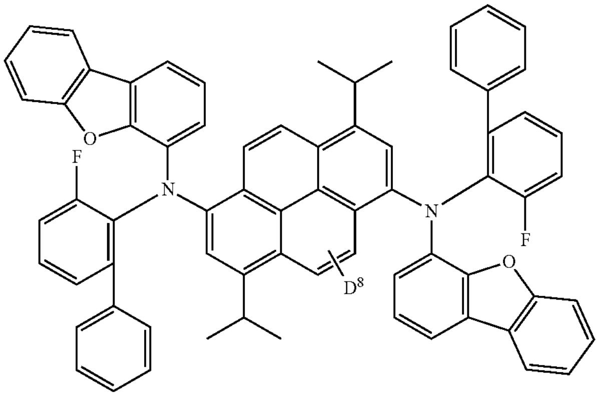
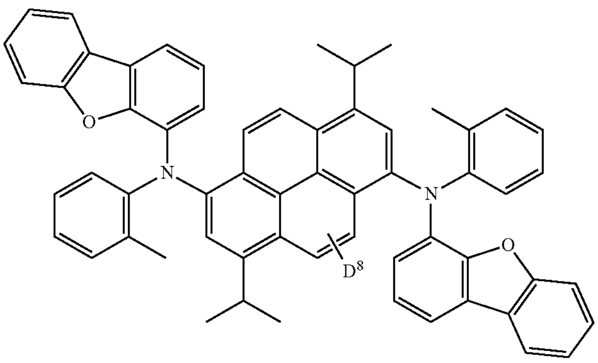
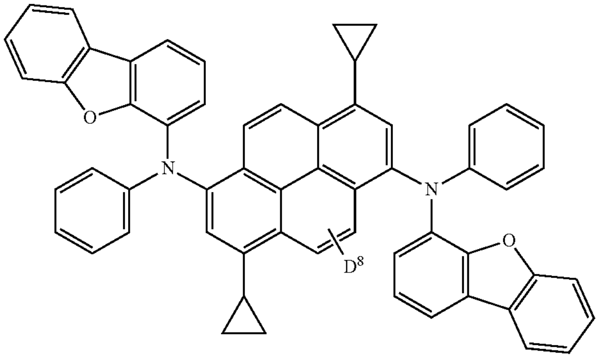

-continued
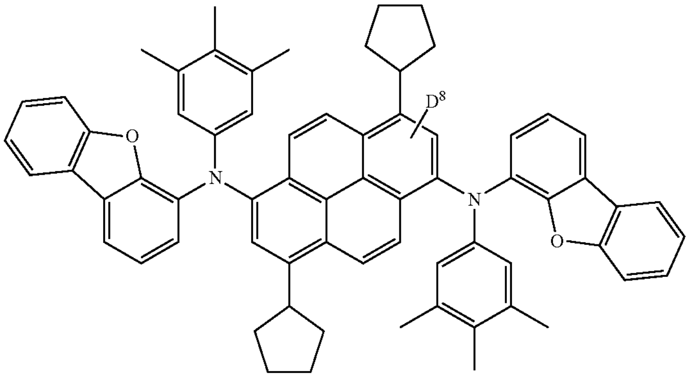
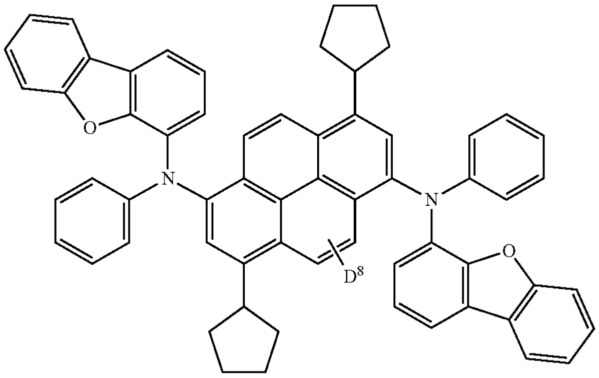
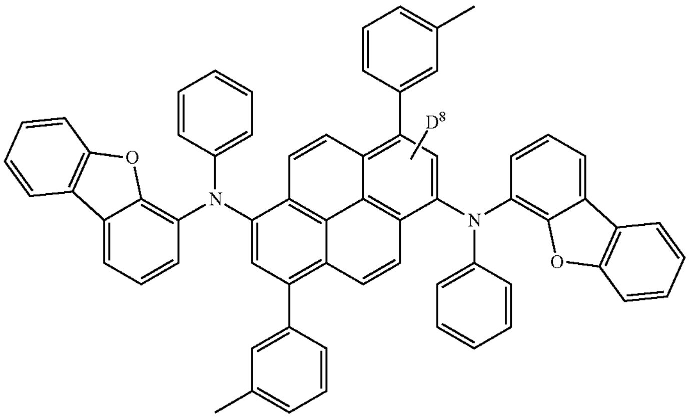
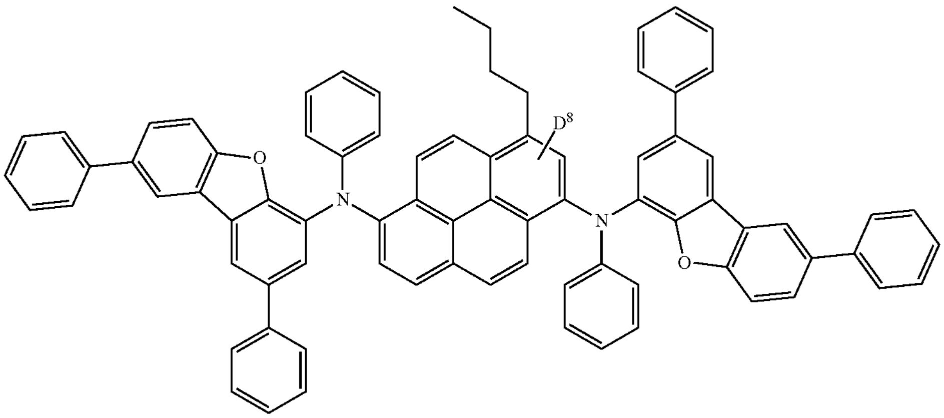

-continued
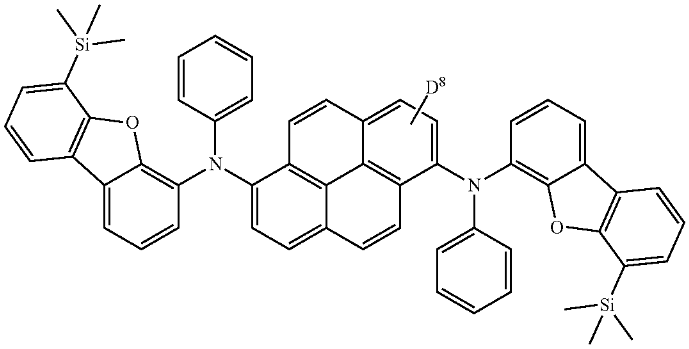
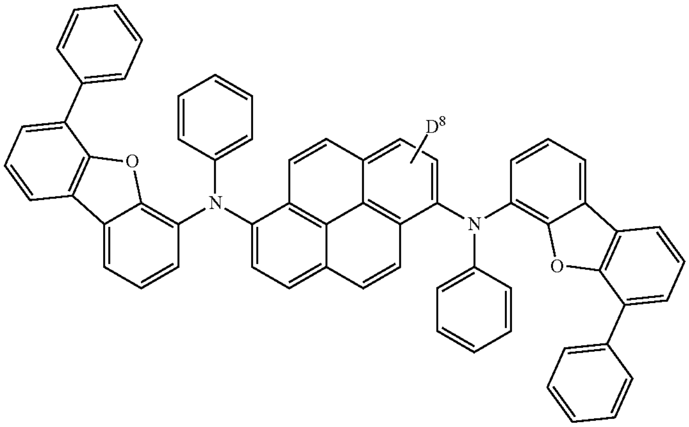
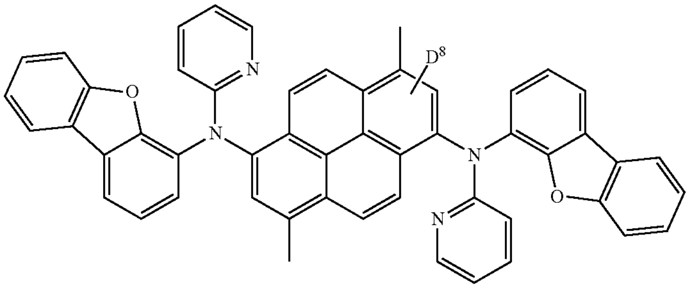
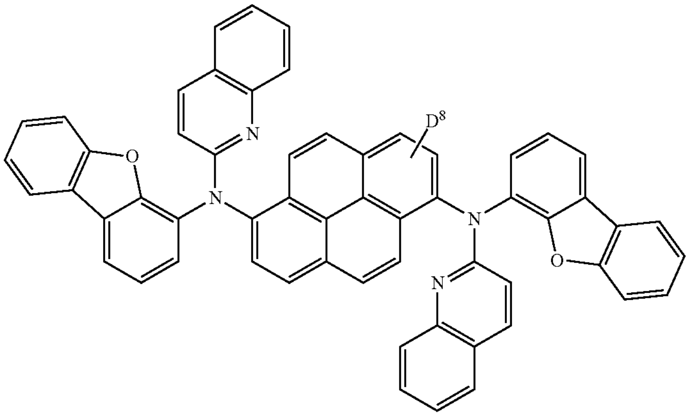

-continued
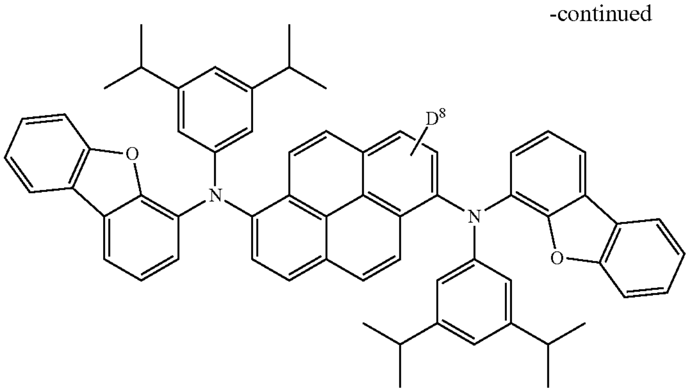
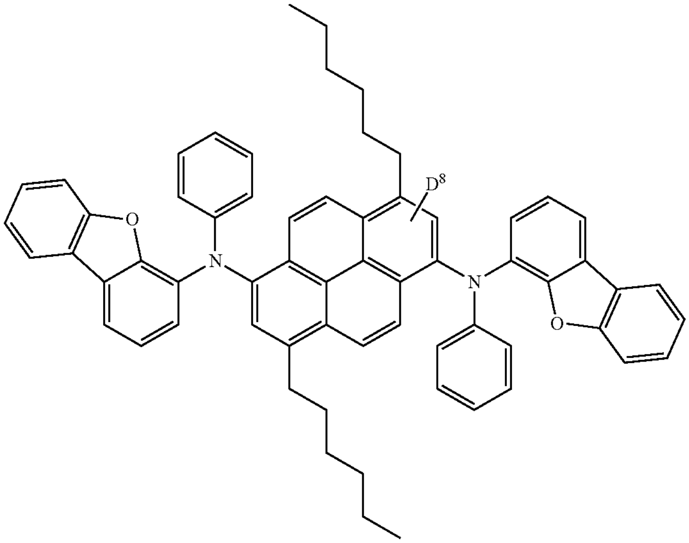
-continued
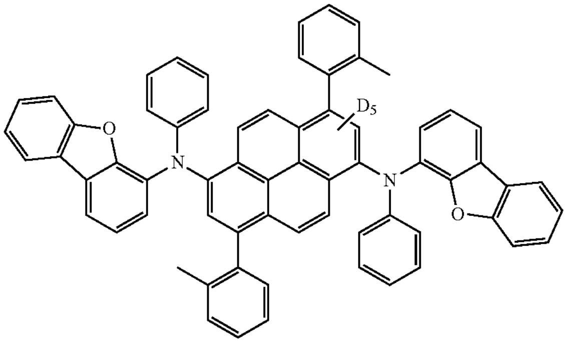
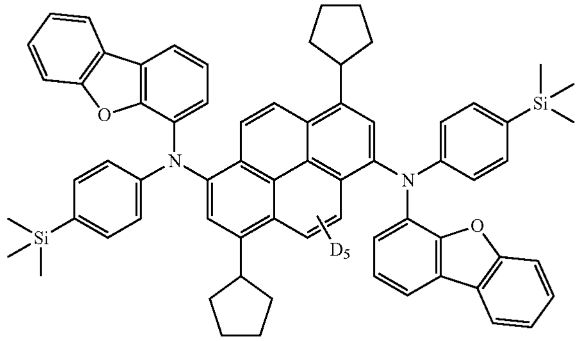
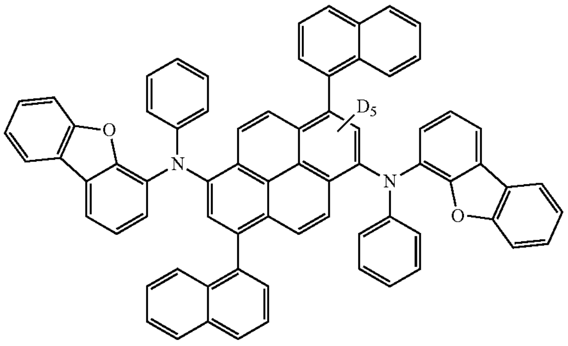
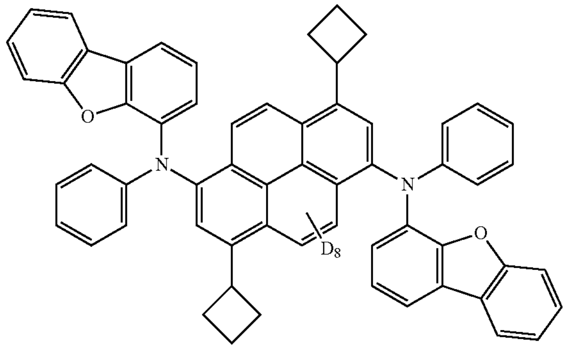

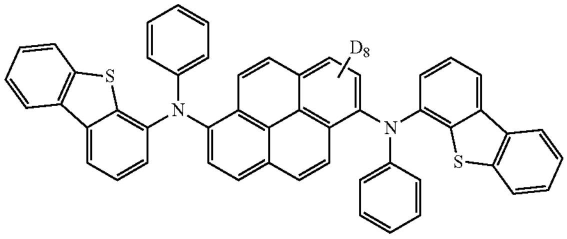
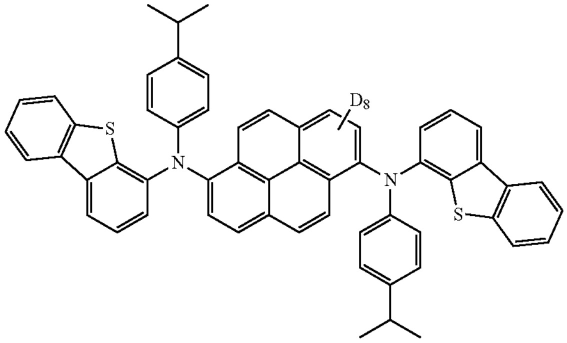
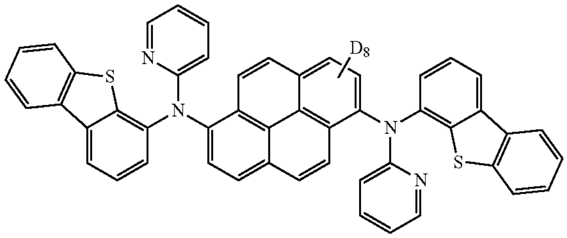
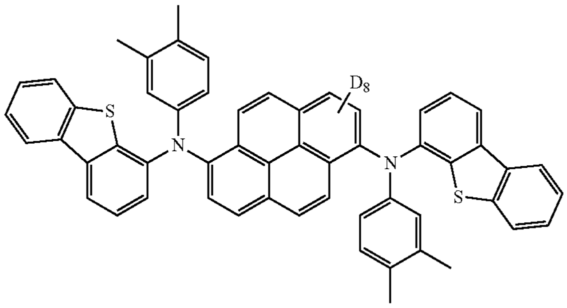
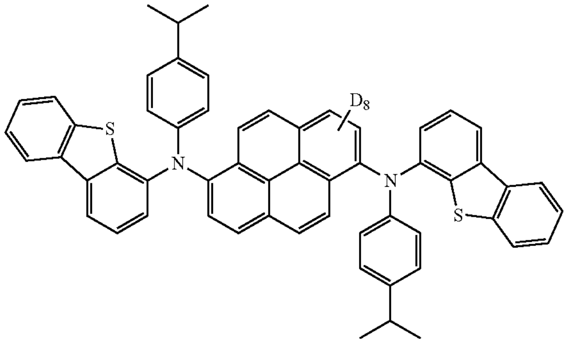
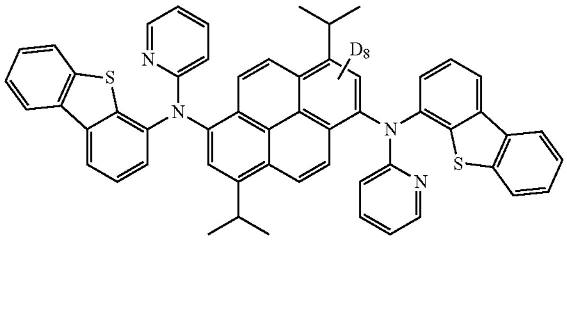
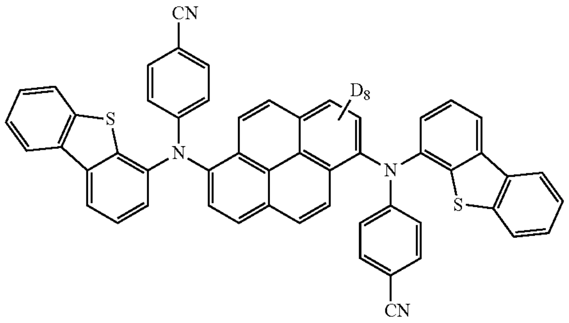
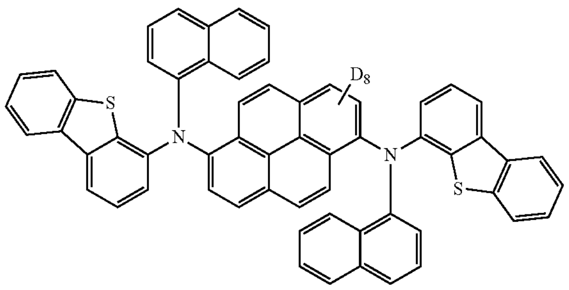
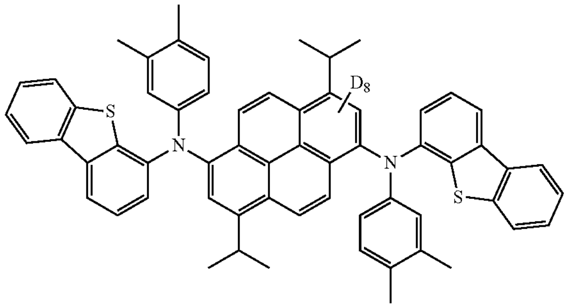
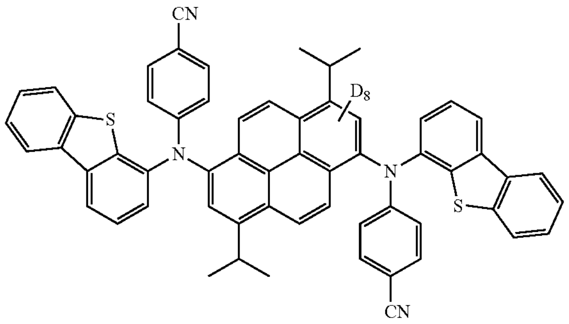
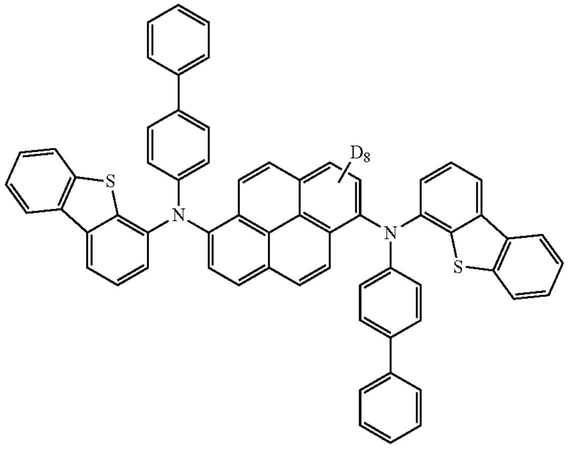

-continued
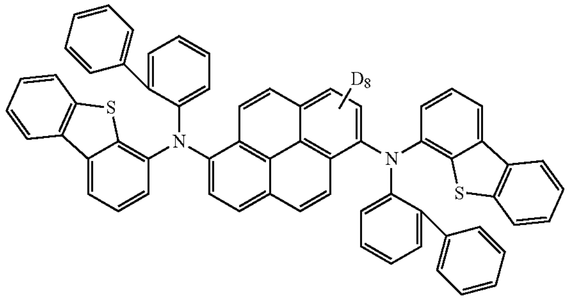
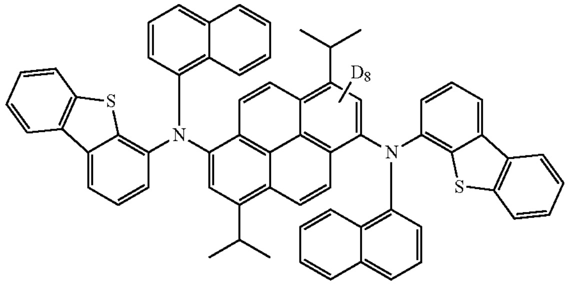
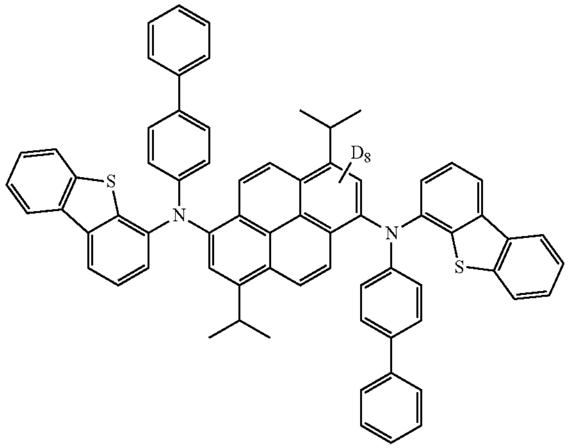
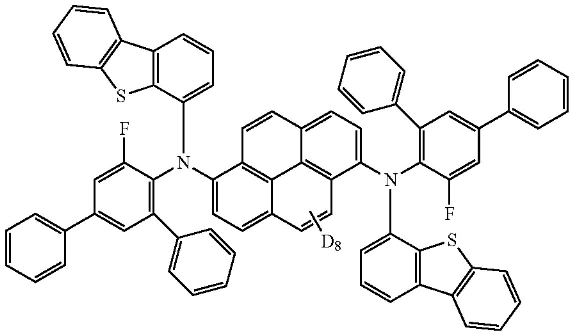
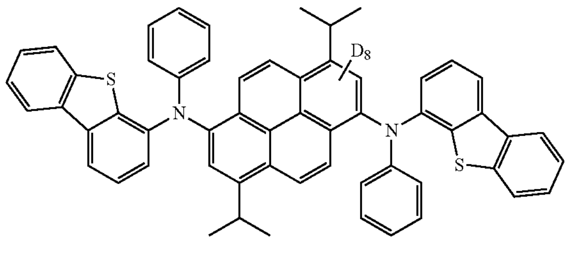
-continued
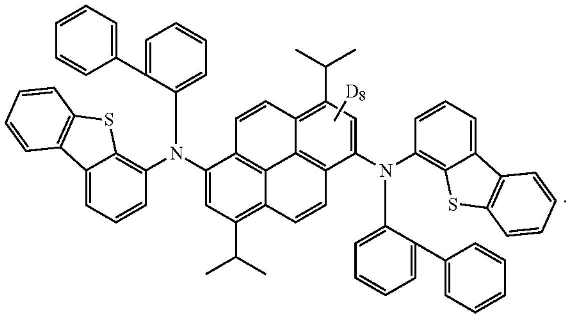
25. The OLED of claim 7, wherein the first hole blocking material is a compound being one of the followings of Formula 8:
Formula 8
E1
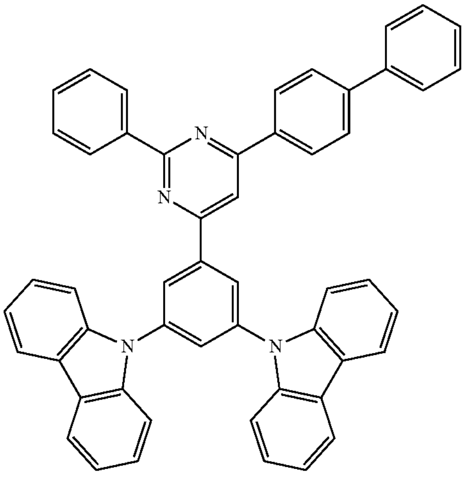
E2
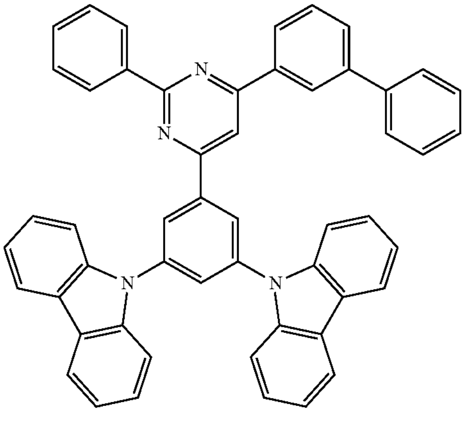

-continued
E3
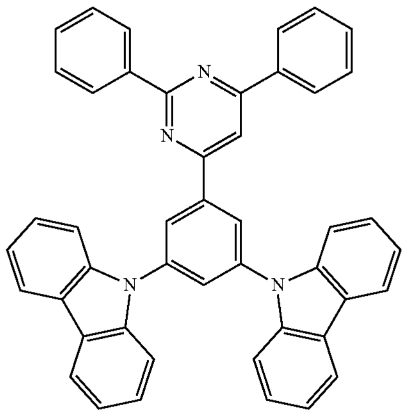
E4
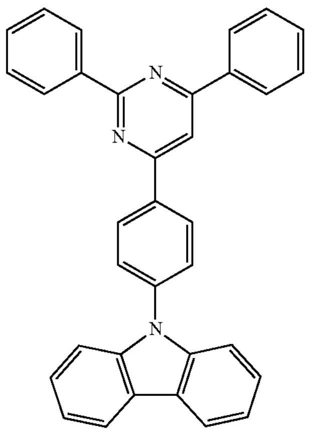
E5
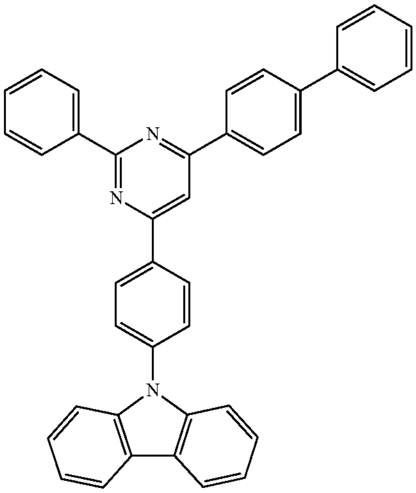
-continued
E6
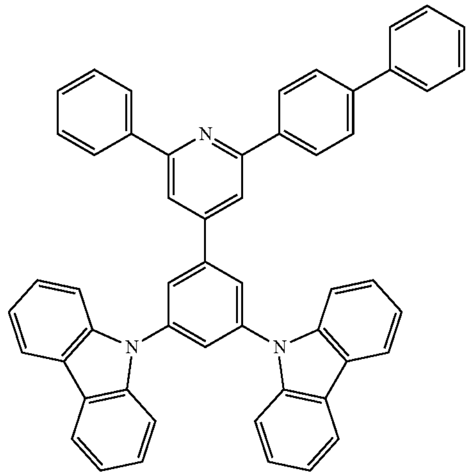
E7
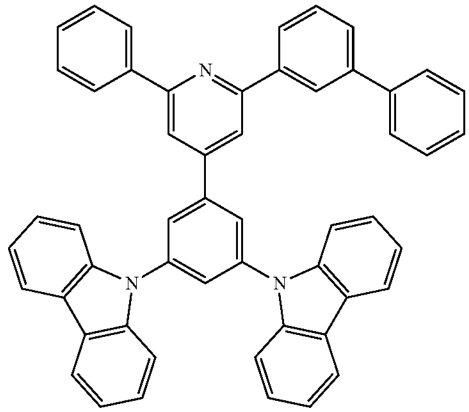
E8
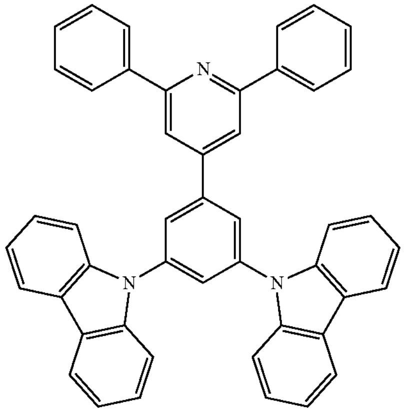

-continued
E9
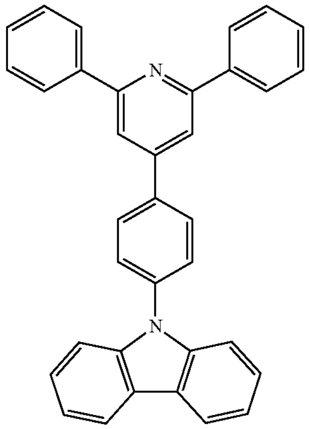
E10
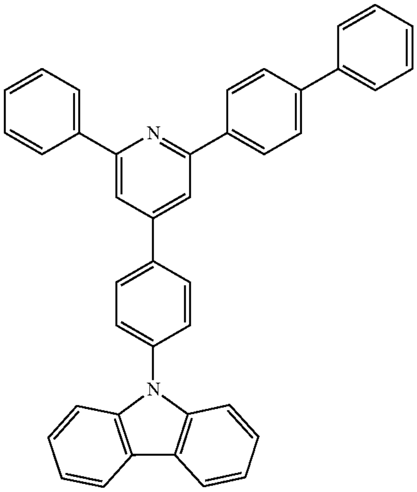
E11
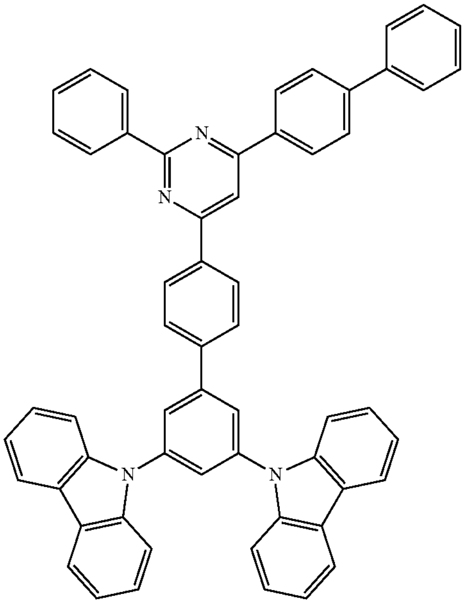
-continued
E12
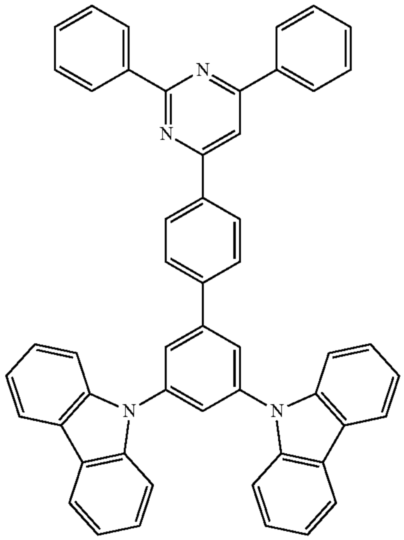
E13
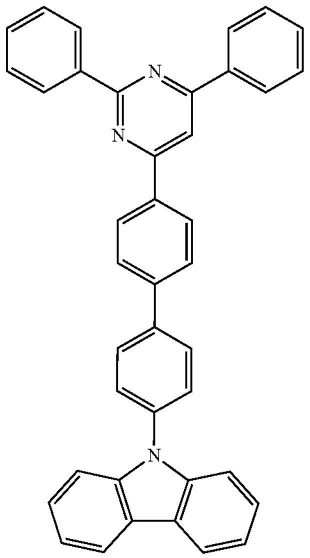

-continued
E14
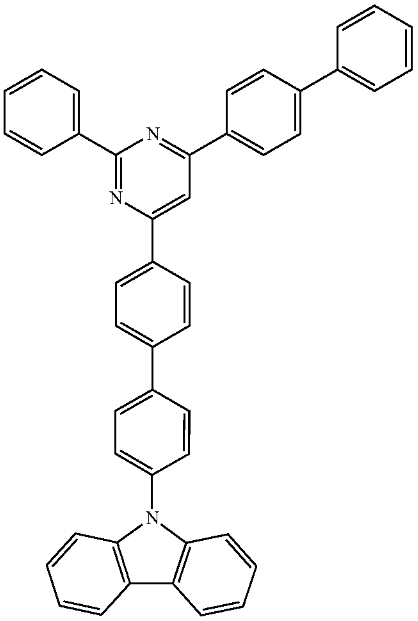
E15
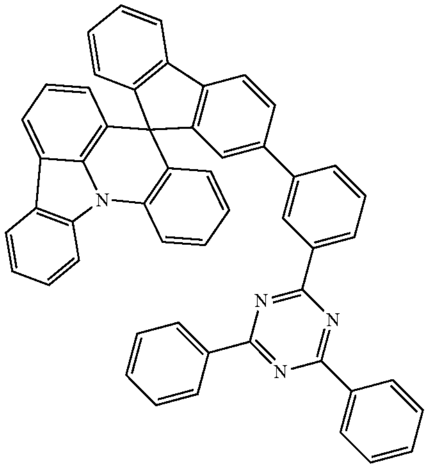
E16
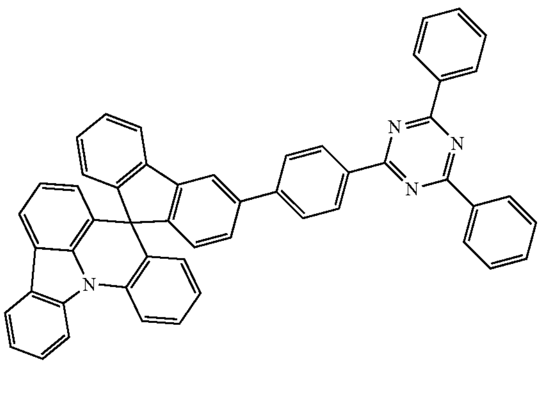
-continued
E17
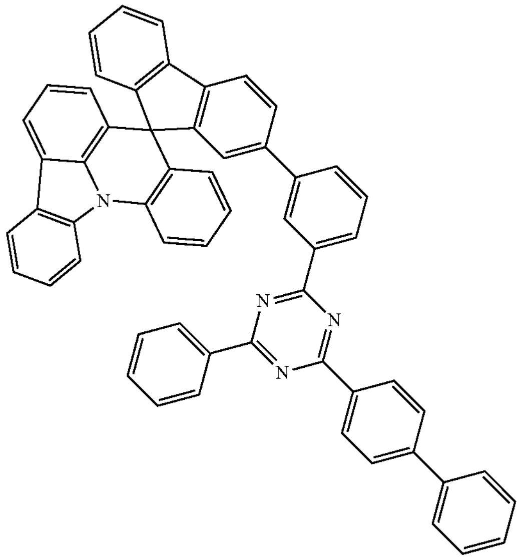
E18
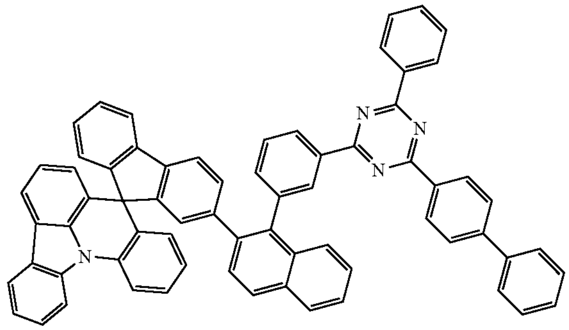
E19
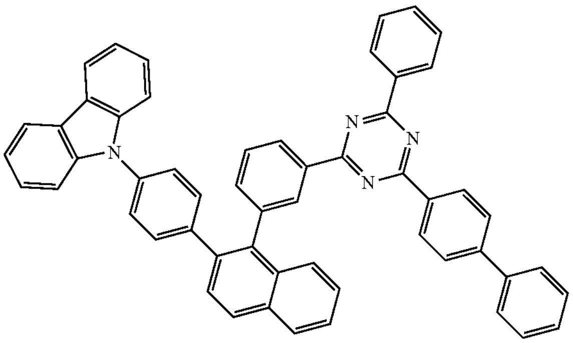

-continued
E20
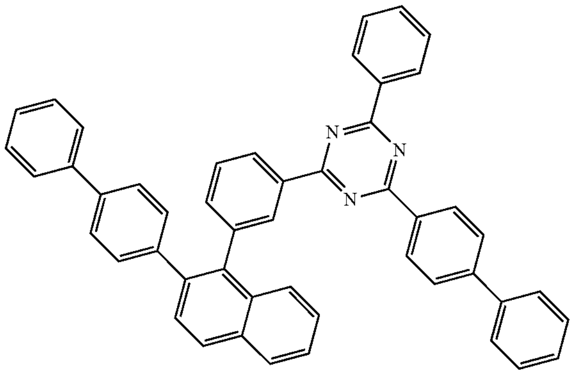
E21
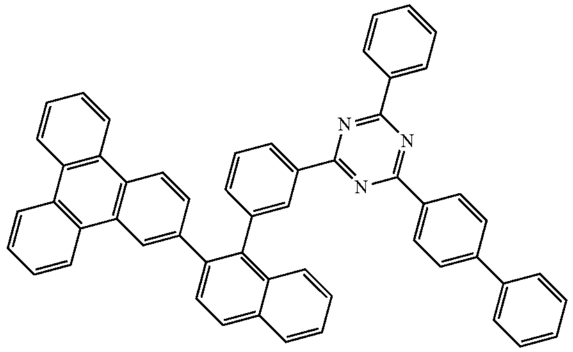
E22
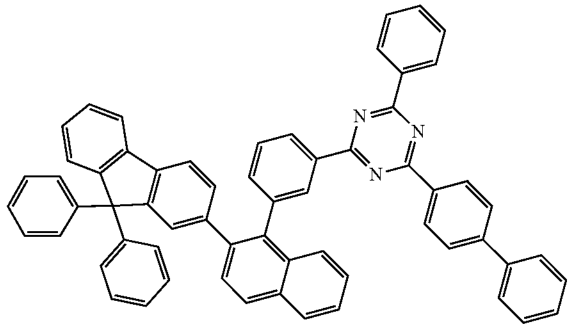
E23
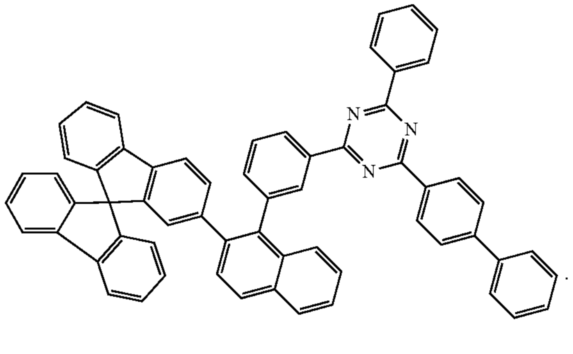
26. The OLED of claim 8, wherein the second hole blocking material is a compound being one of the followings of Formula 10:
Formula 10
F1
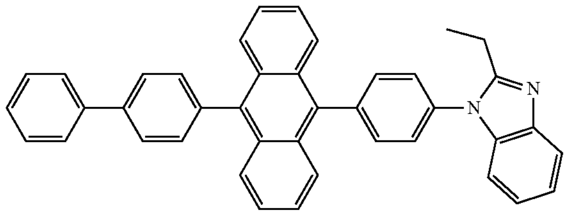
F2
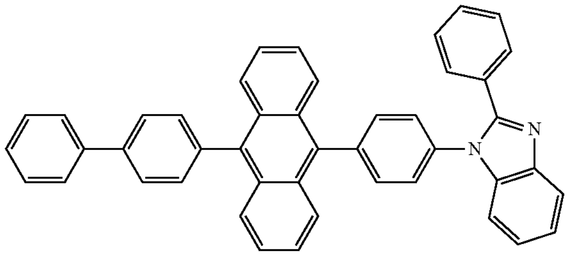
F3
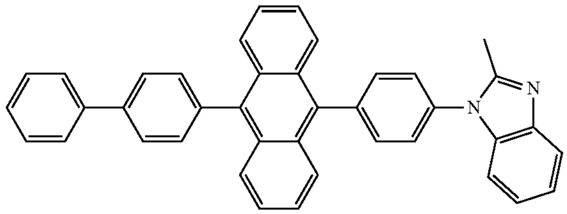
F4
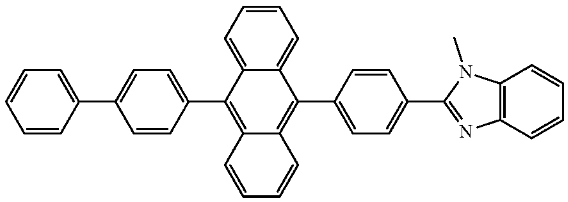
F5
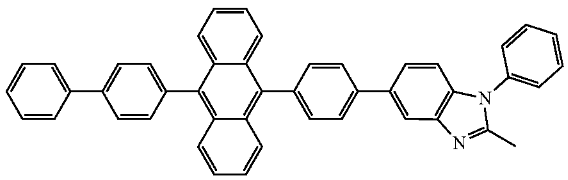
F6
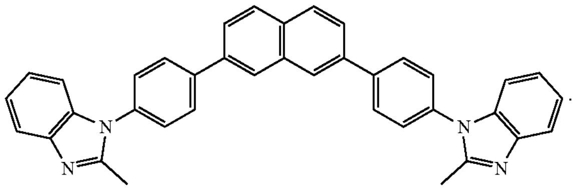
27. The organic light emitting device of claim 14, wherein the anthracene derivative is a compound being one of the followings of Formula 2:

Formula 2
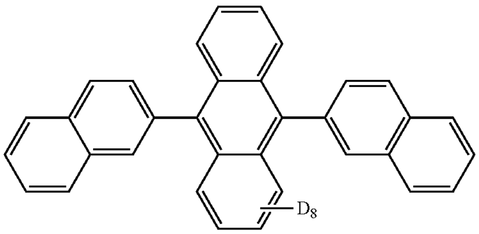
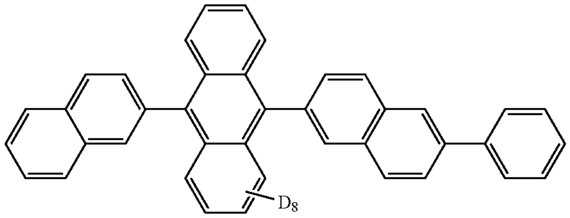
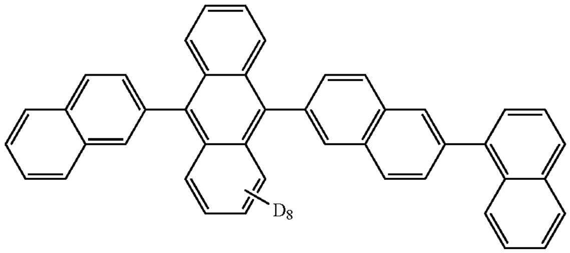
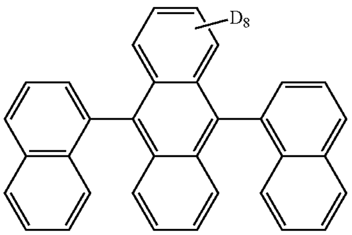
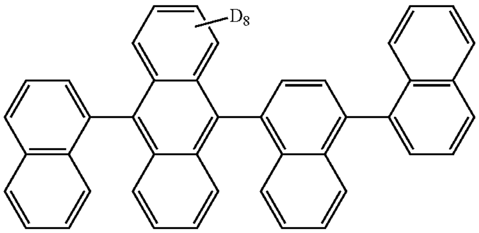
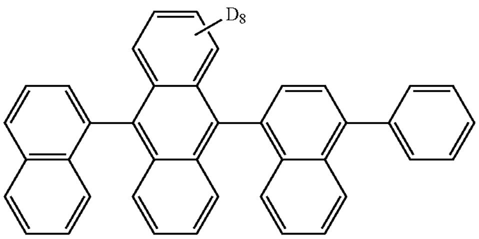
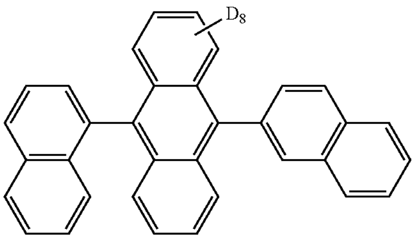
-continued
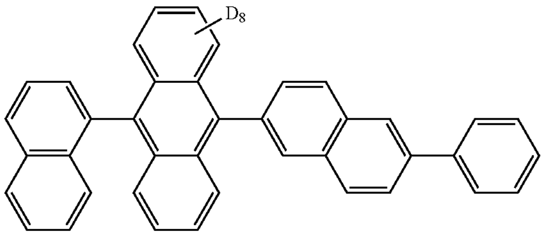
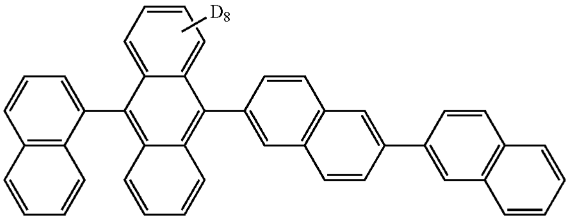
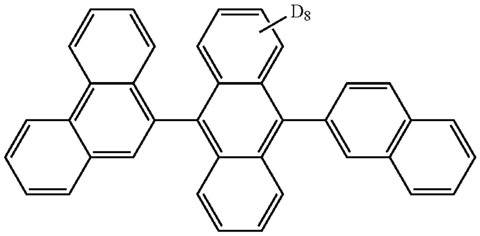
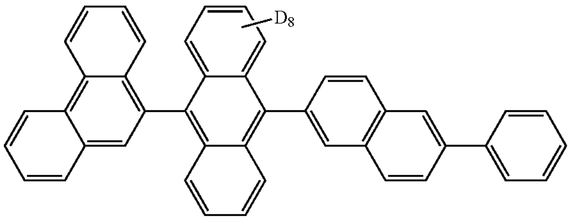
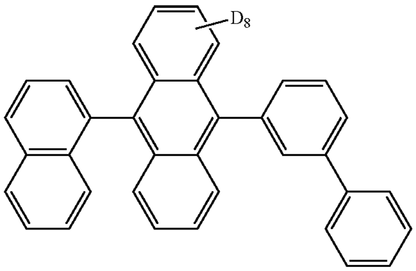
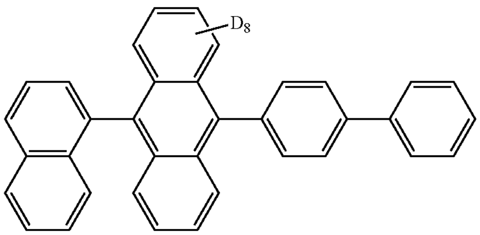
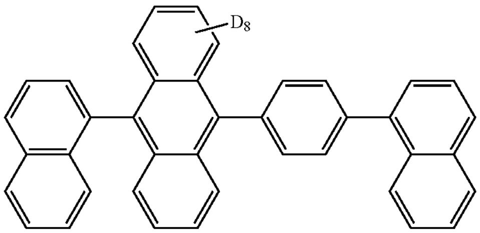

-continued
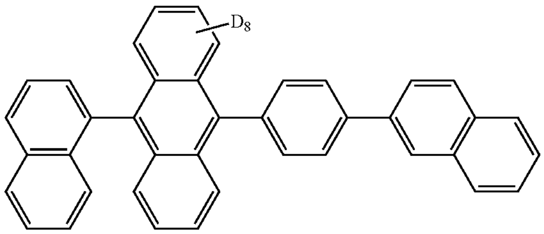
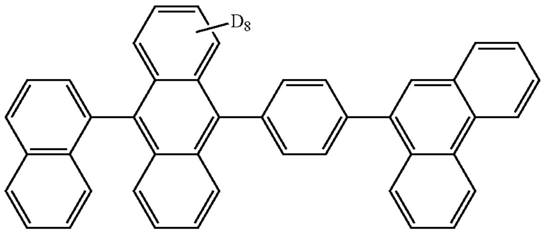
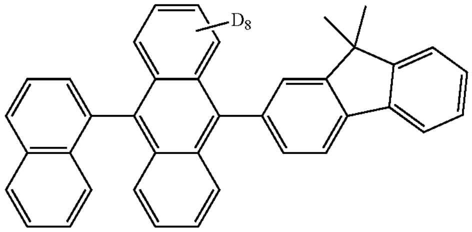
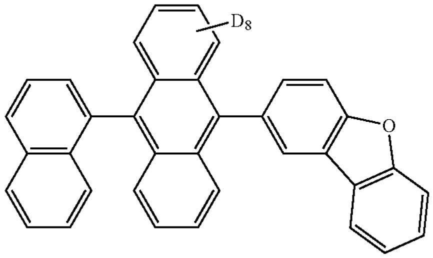
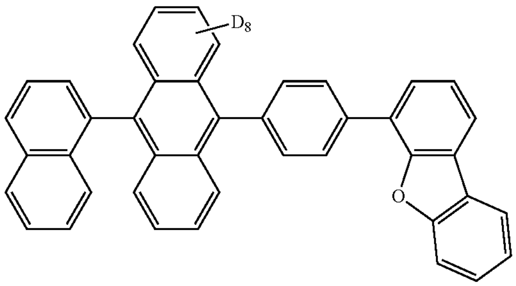
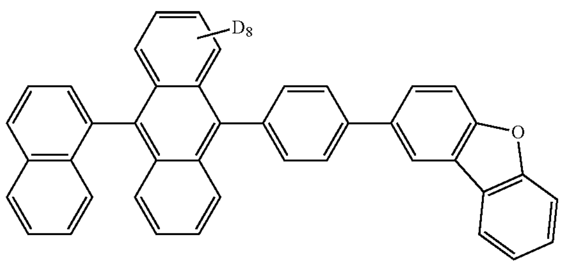
-continued
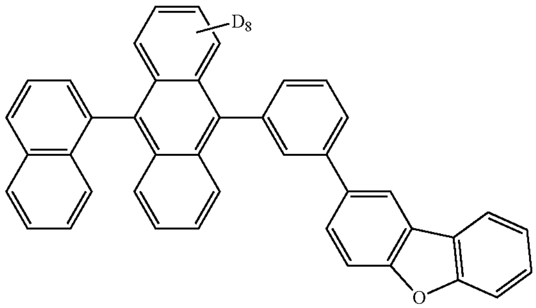
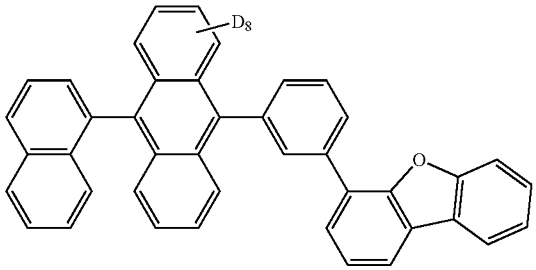
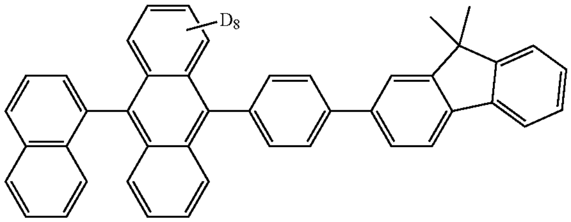
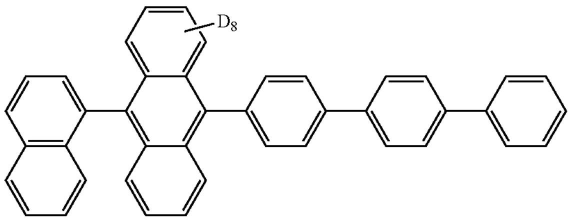
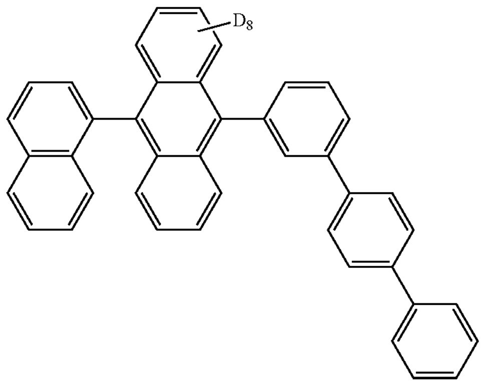
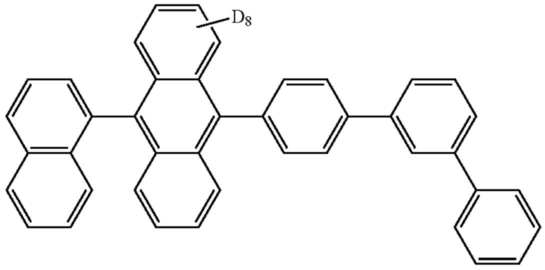

-continued
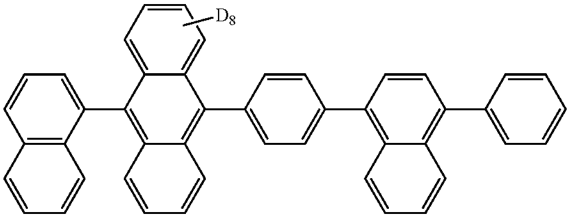
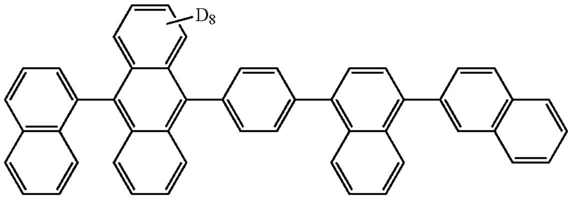
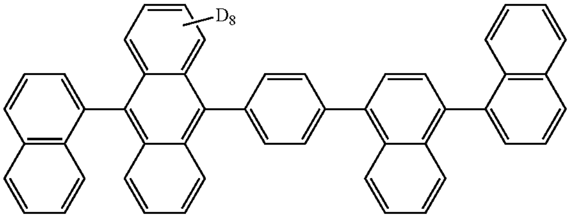
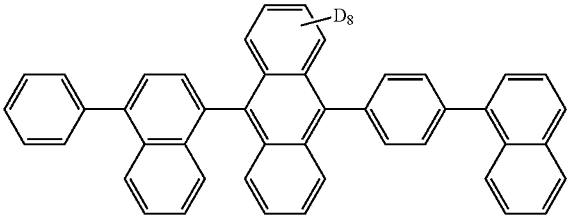
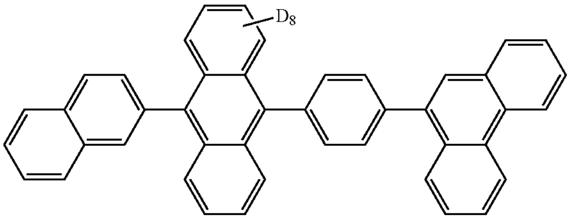
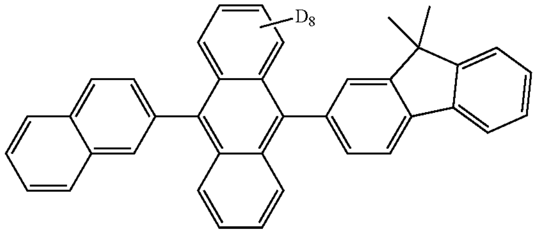
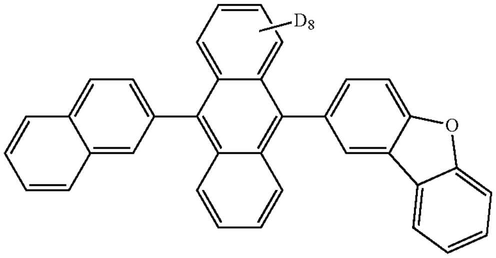
-continued
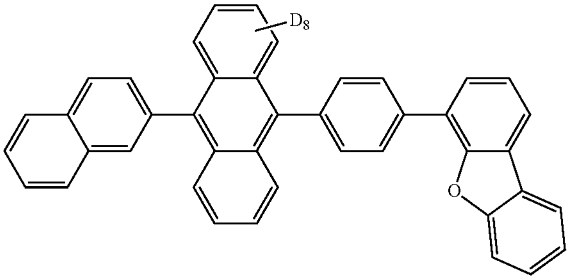
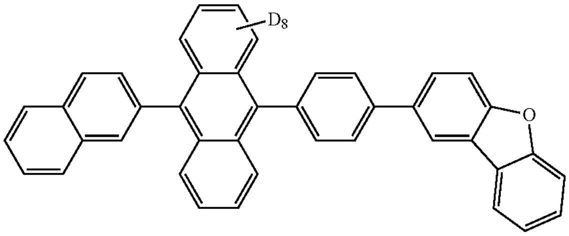
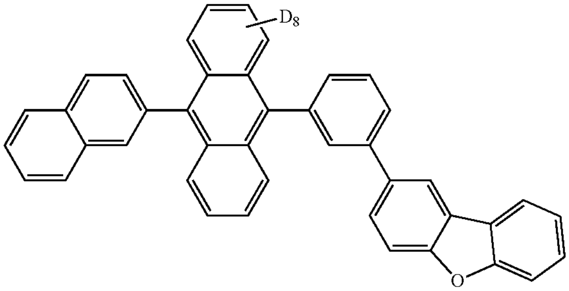
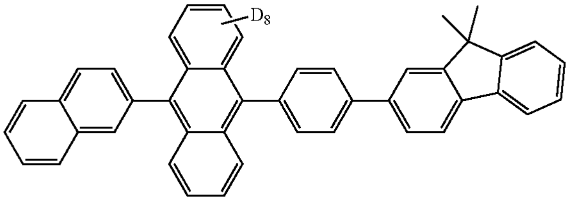
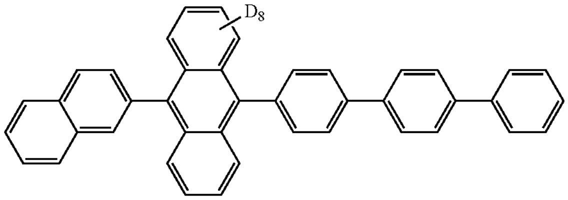
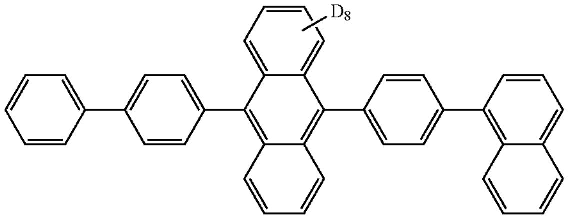
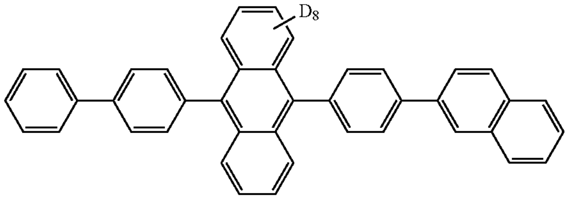

-continued
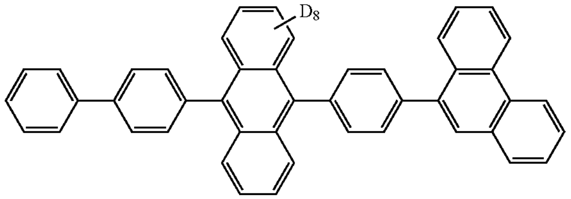
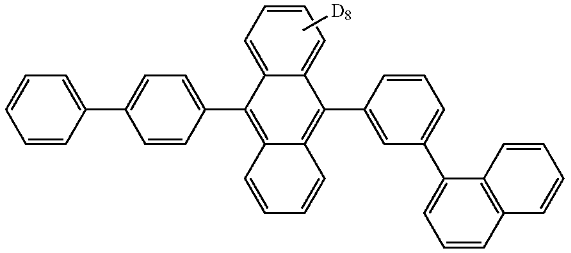
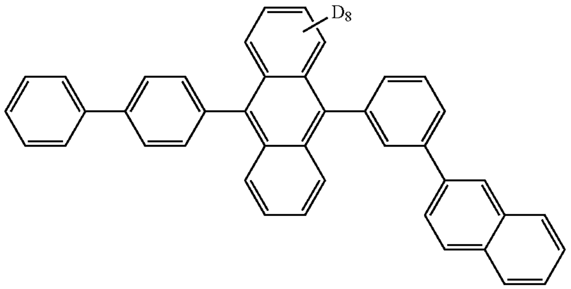
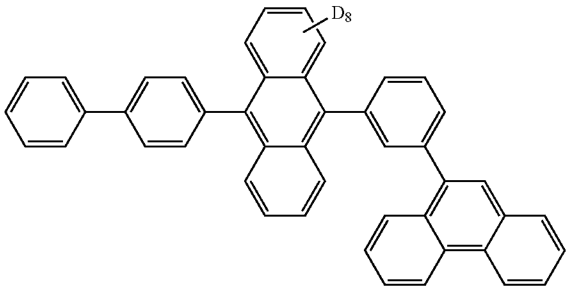
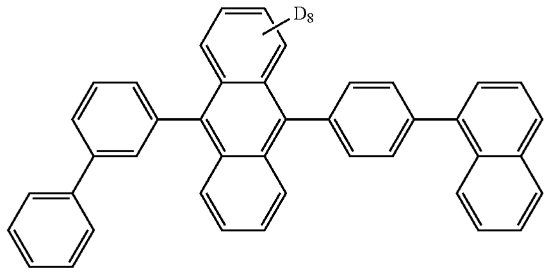
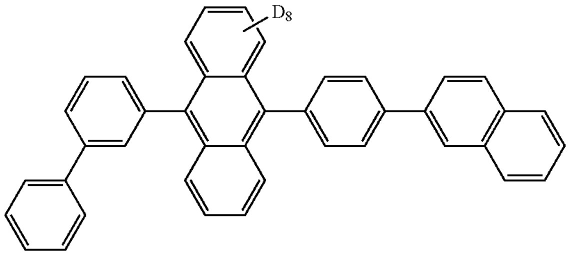
-continued
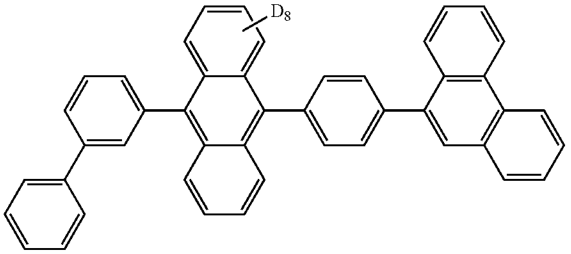
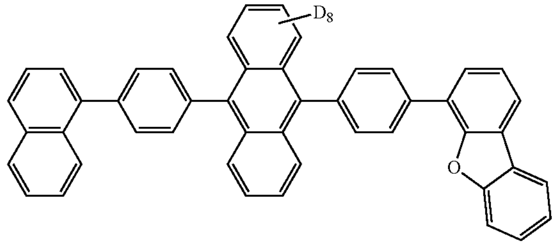
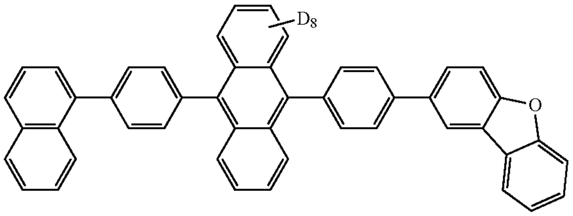
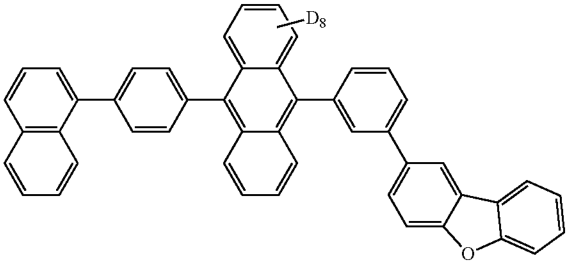
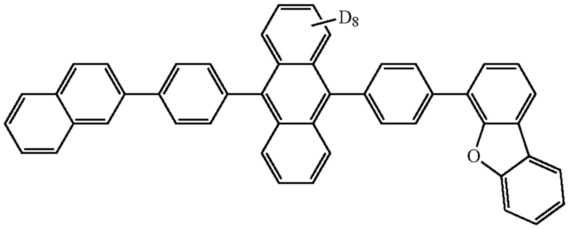
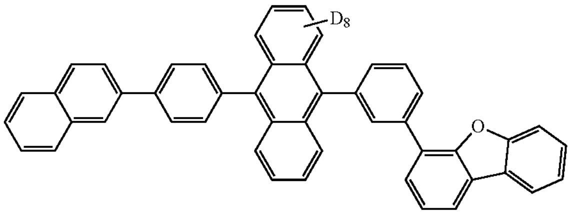
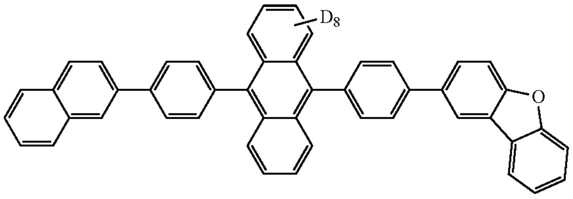

-continued
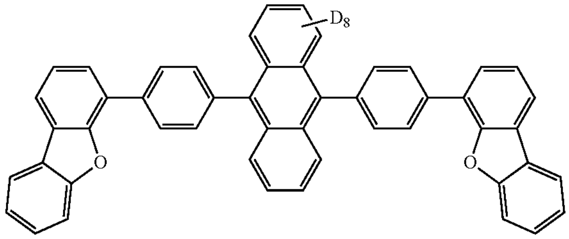
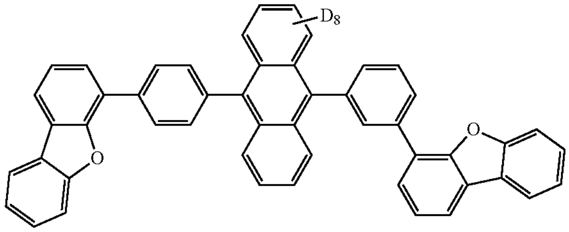
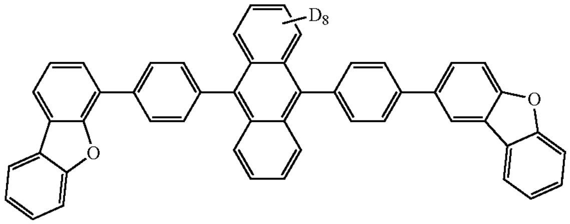
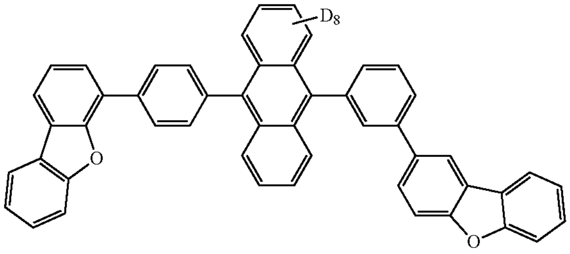
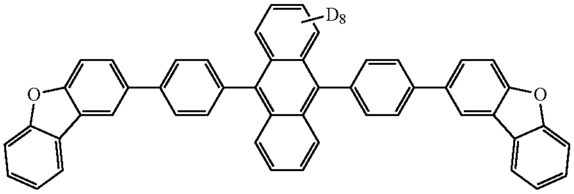
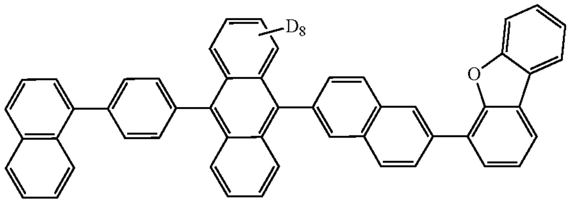
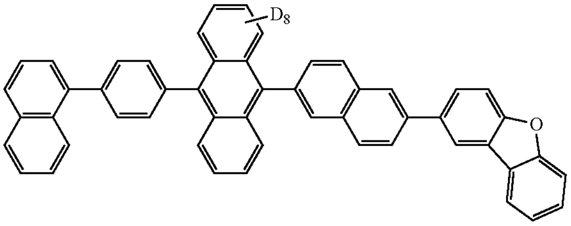
-continued
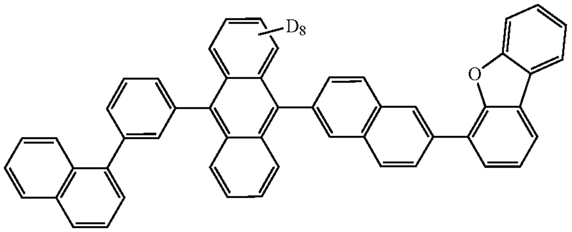
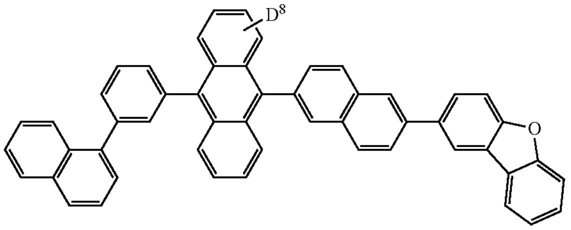
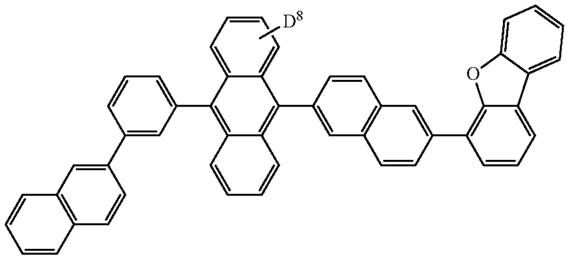
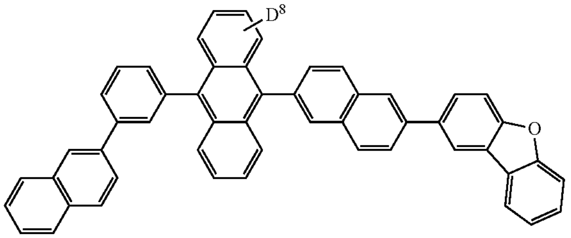
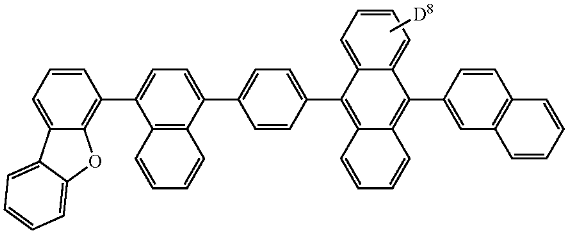
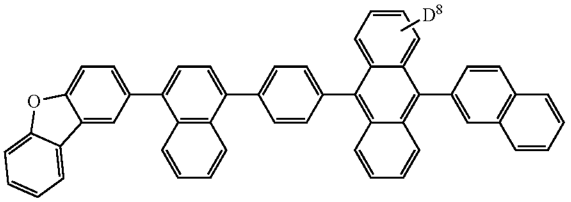

-continued
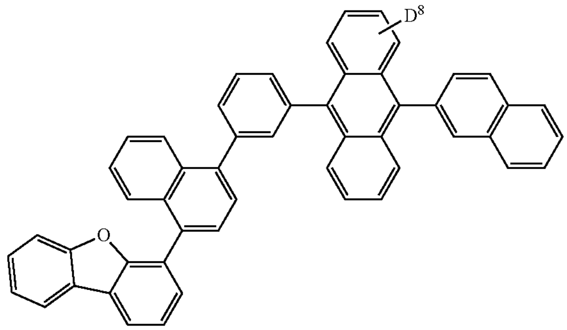
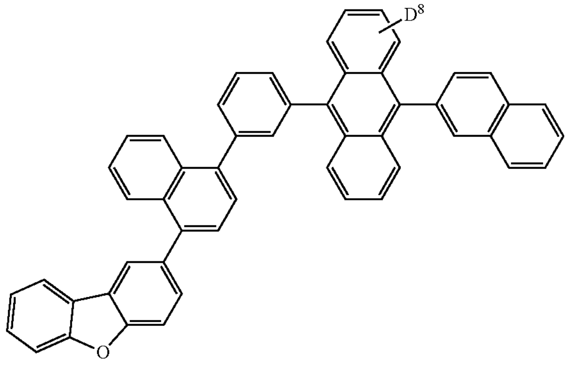
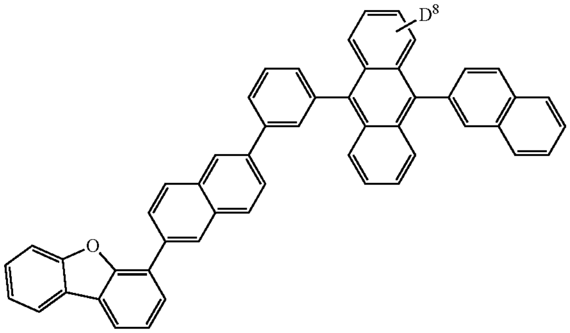
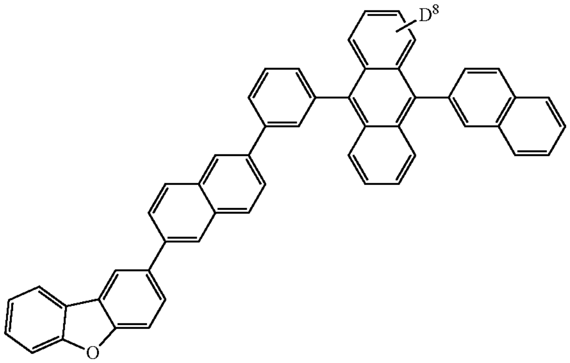
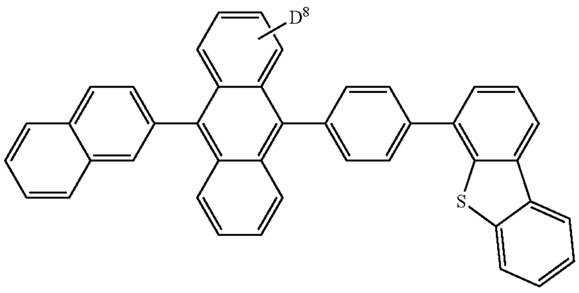
-continued
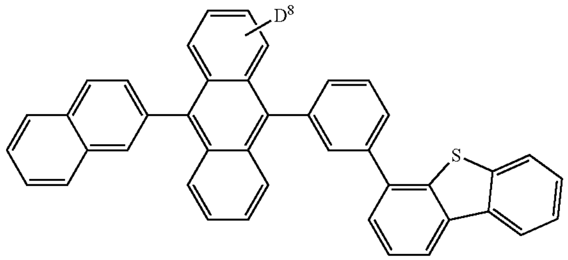
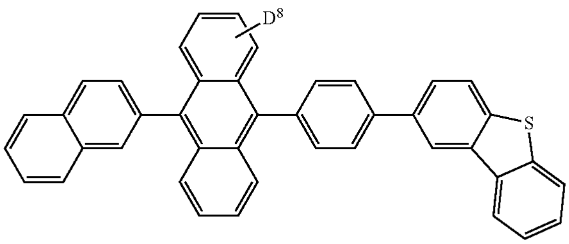
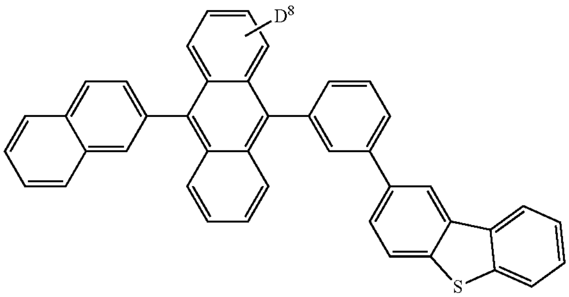
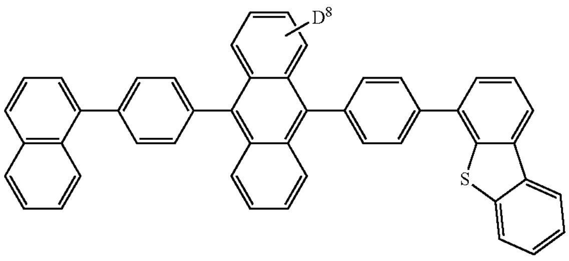
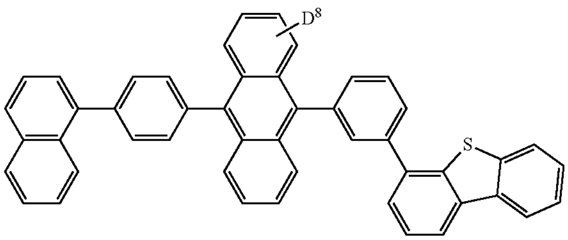
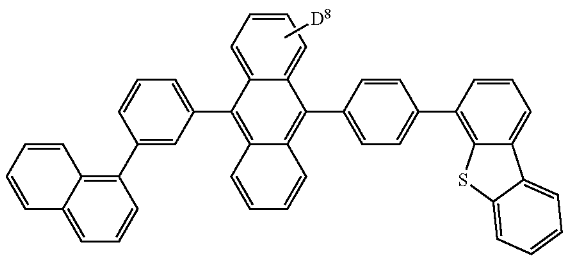

-continued
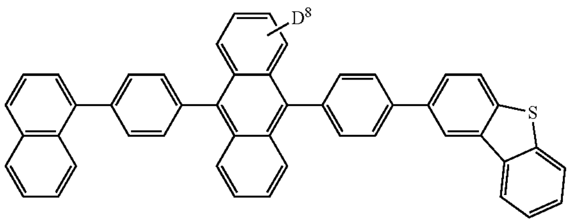
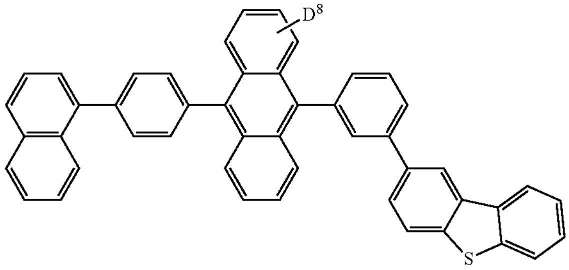
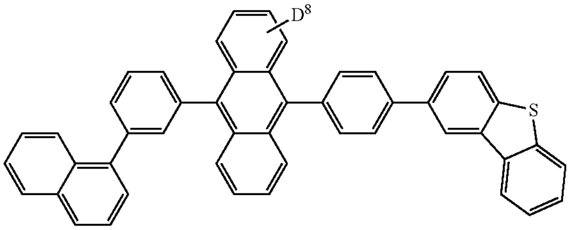
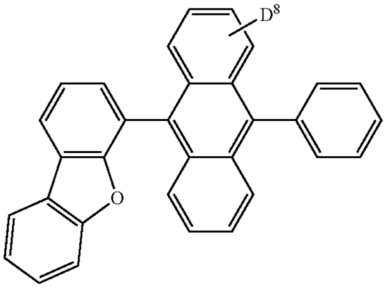
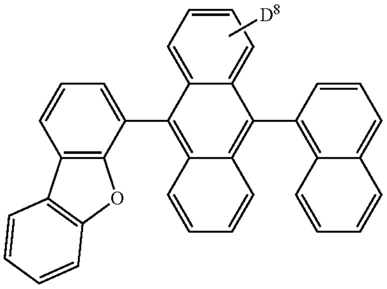
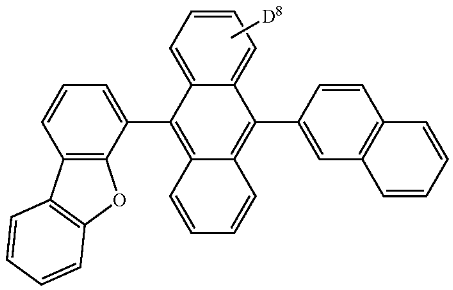
-continued
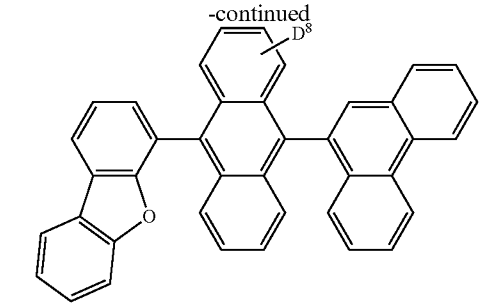
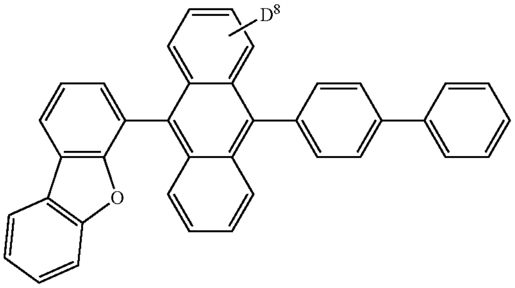
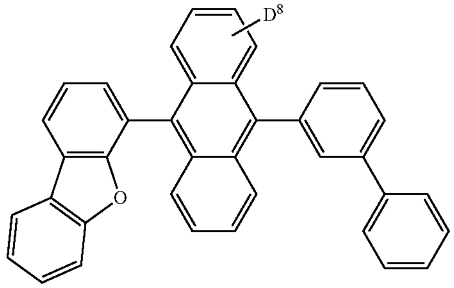
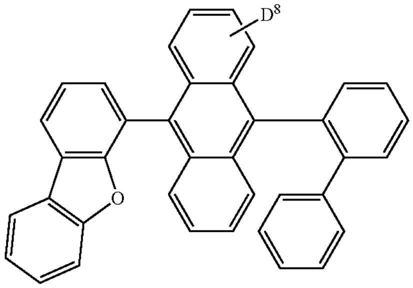
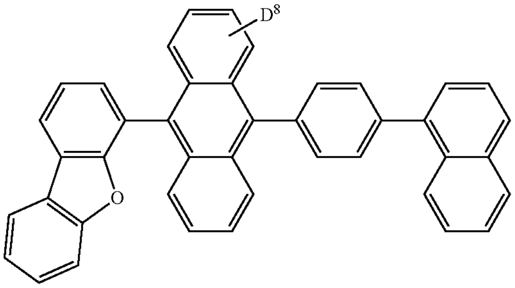
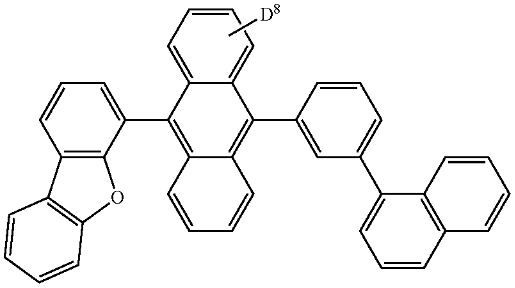

-continued
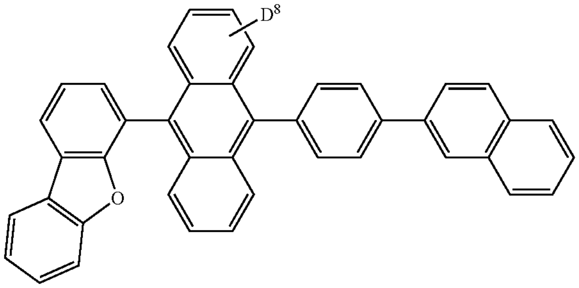
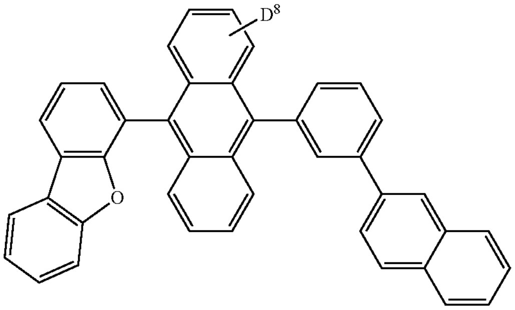
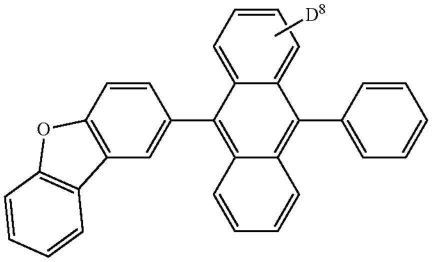
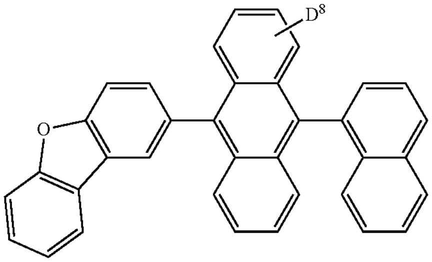
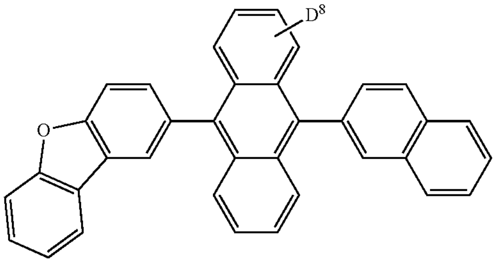
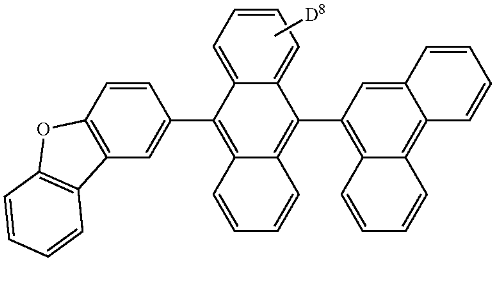
-continued
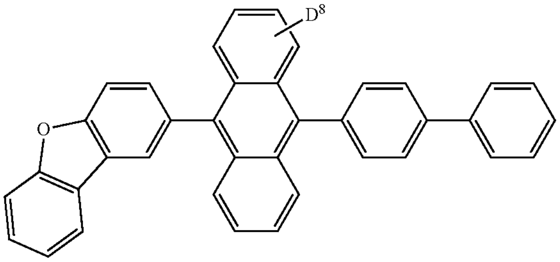
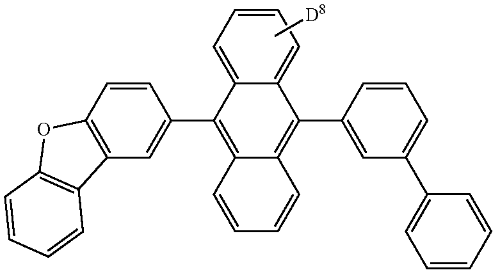
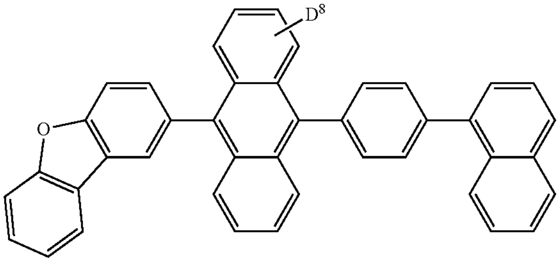
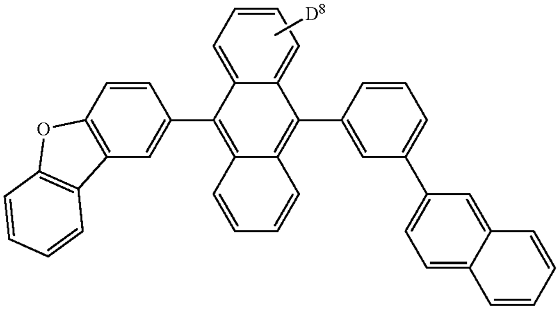
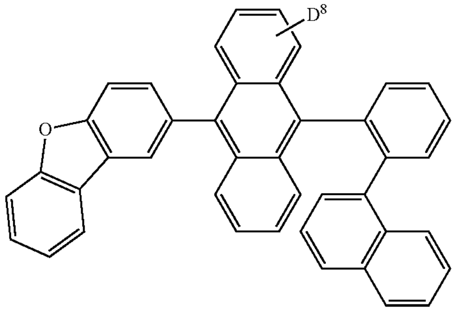
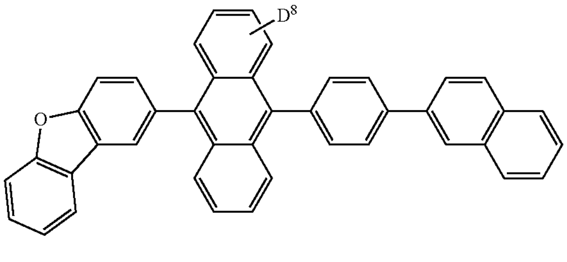

-continued
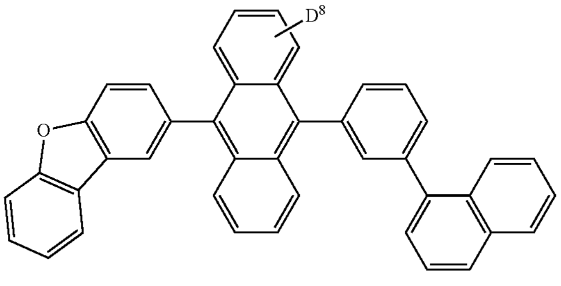
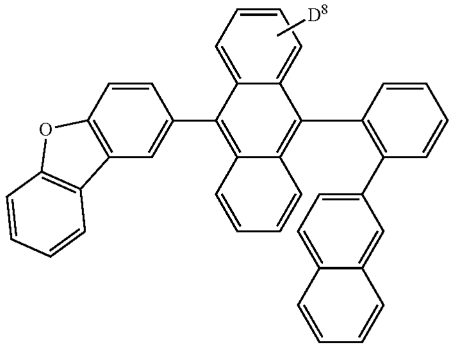
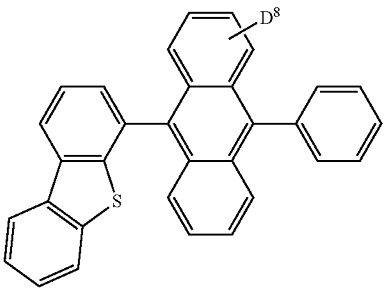
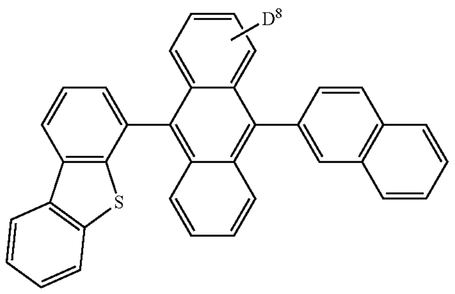
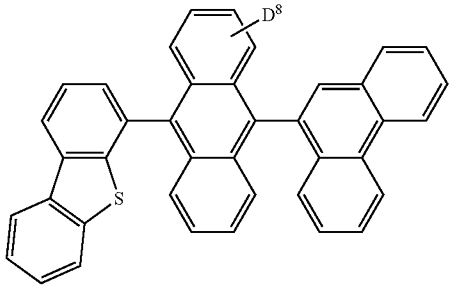
-continued
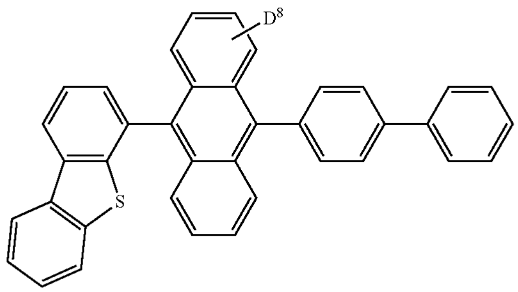
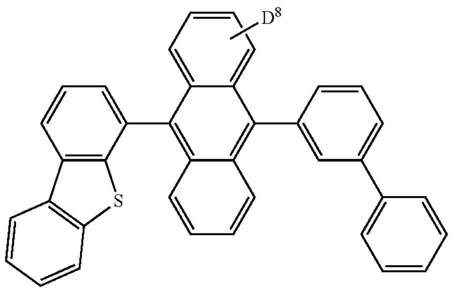
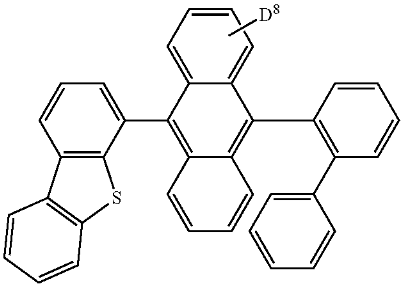
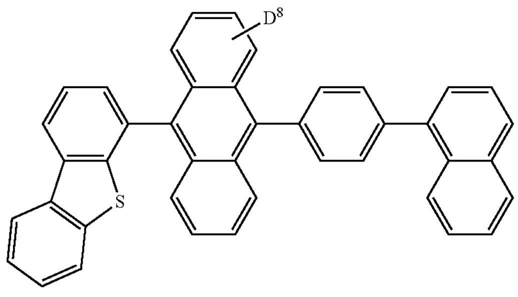
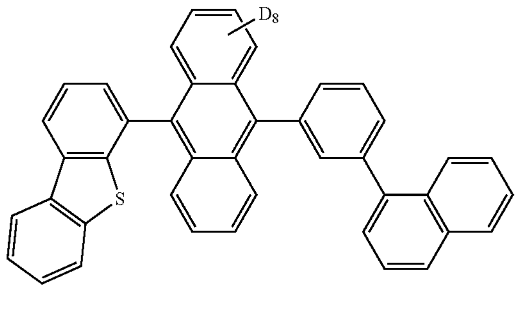

-continued
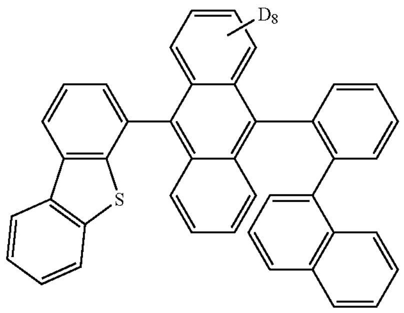
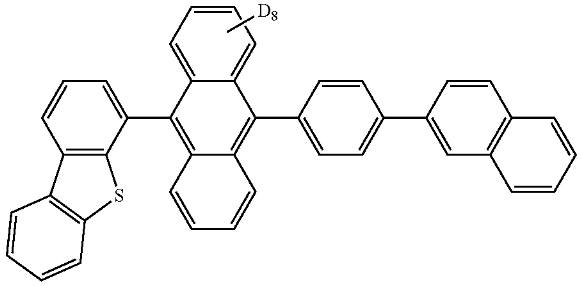
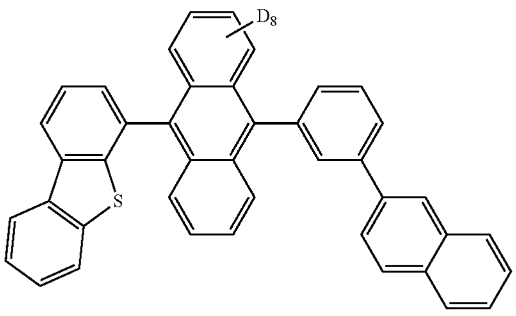
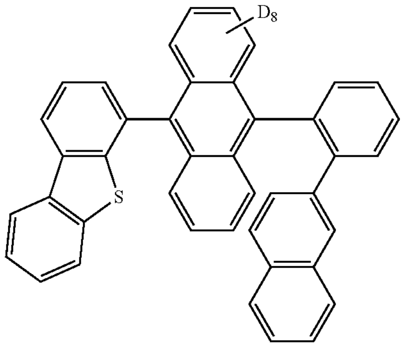
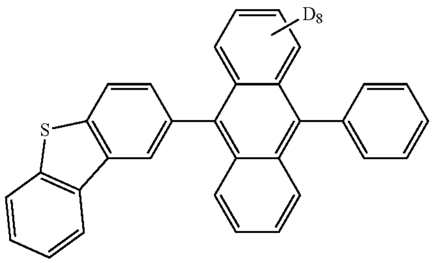
-continued
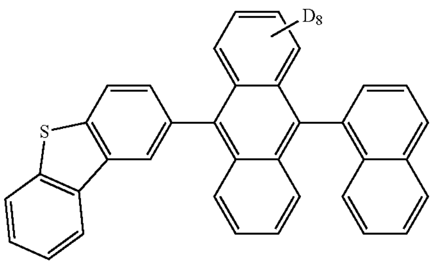
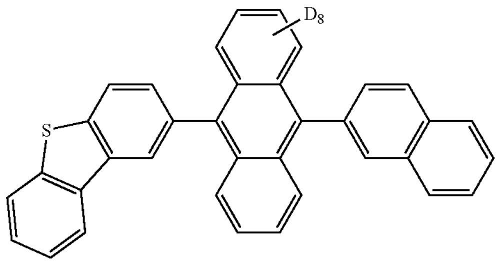
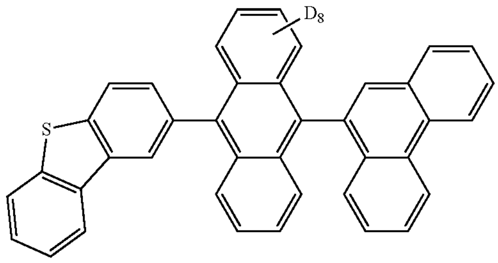
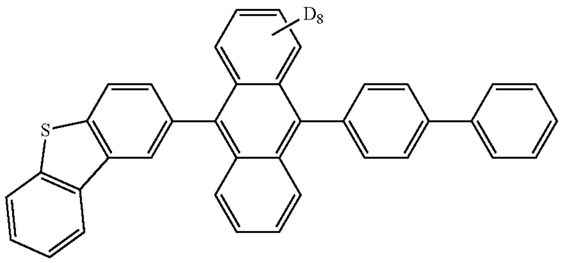
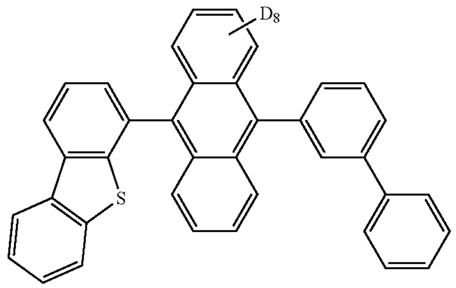
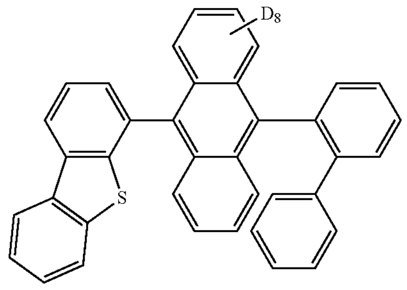

-continued
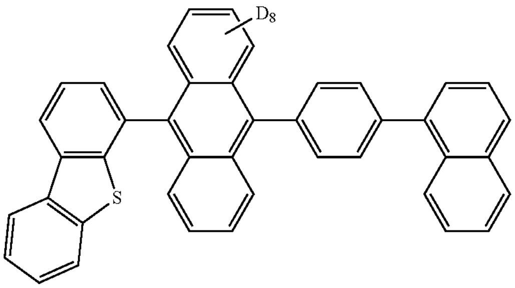
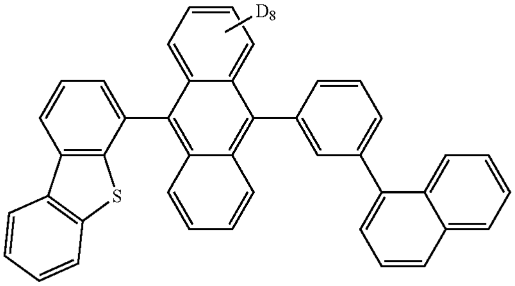
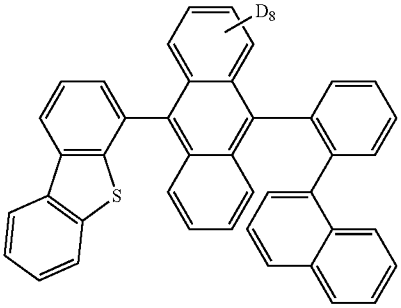
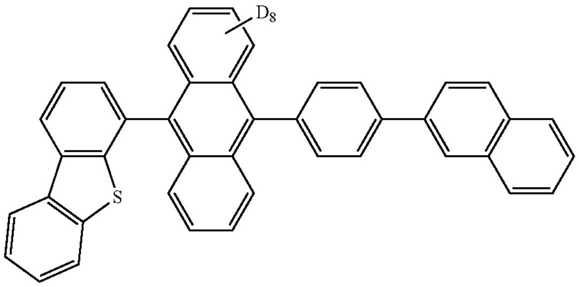
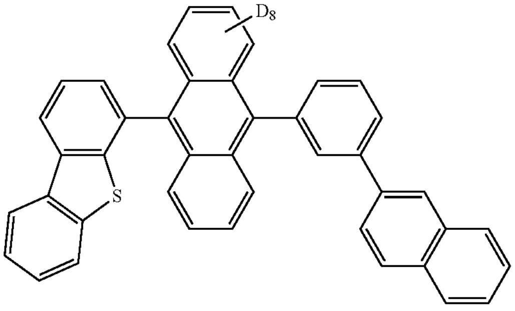
-continued
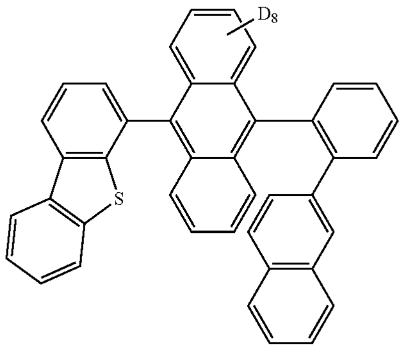
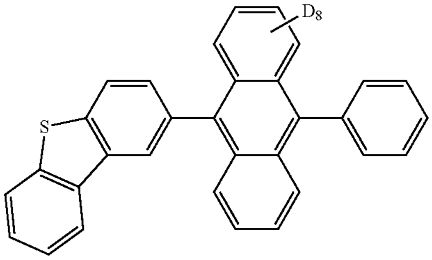
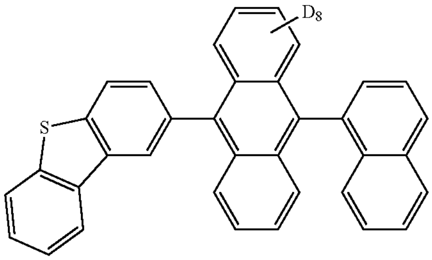
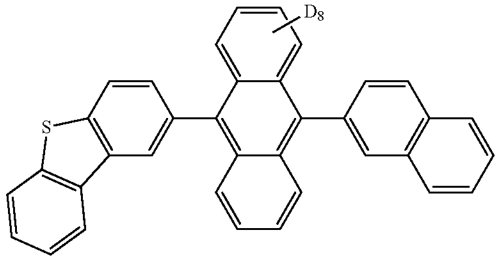
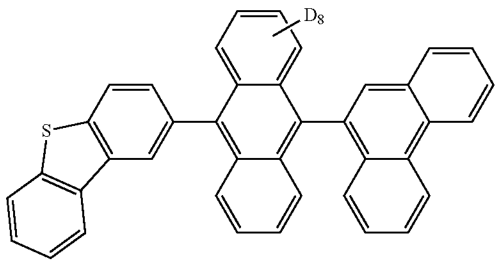
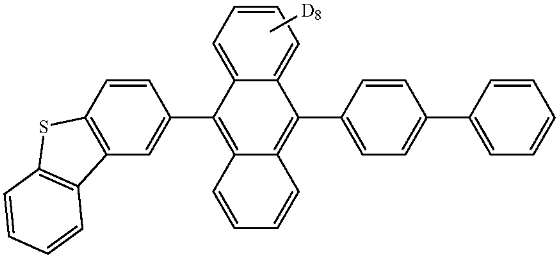

-continued
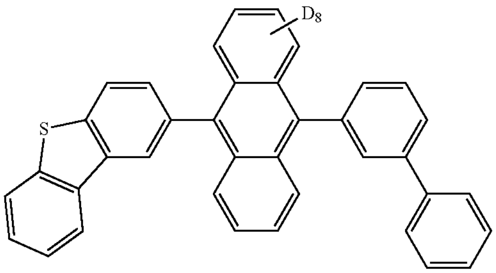
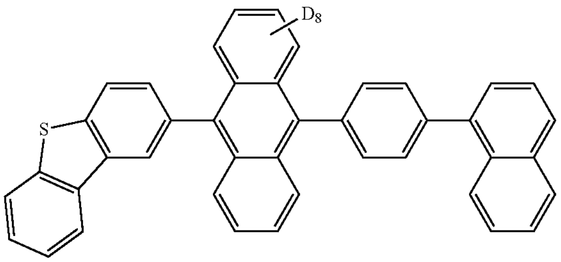
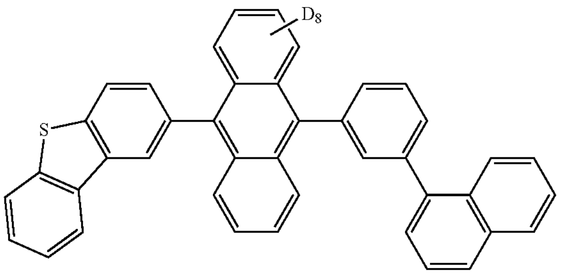
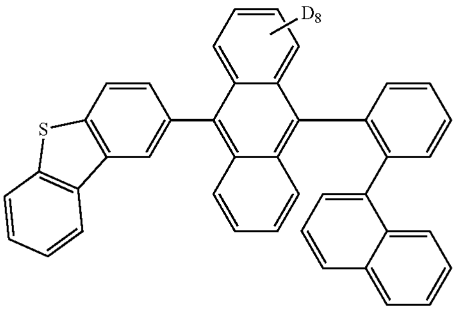
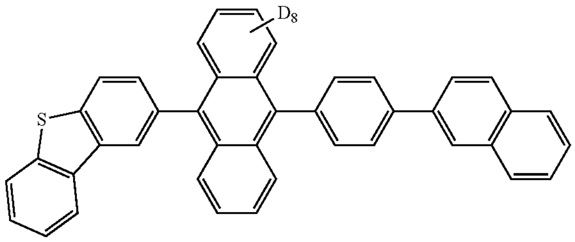
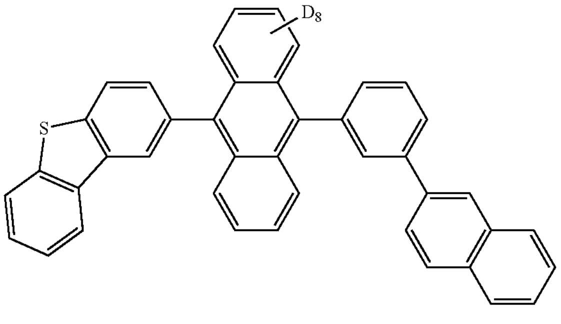
-continued
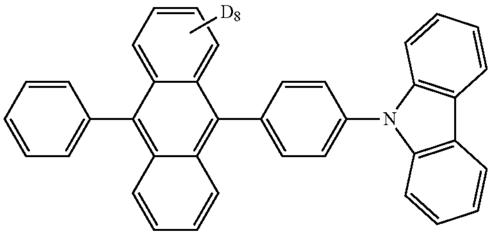
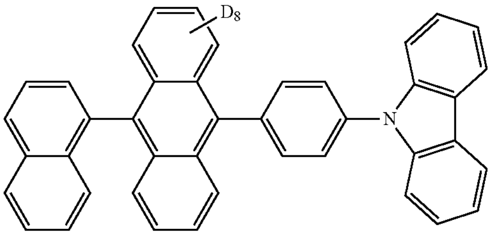
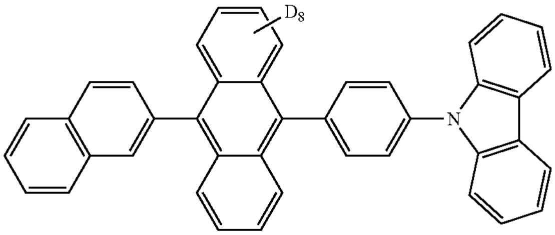
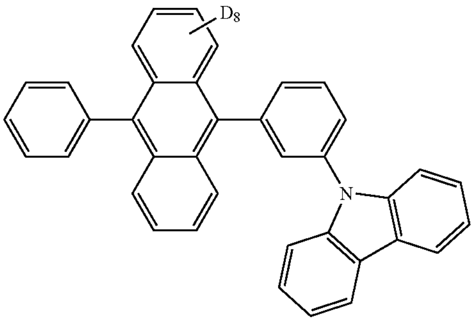
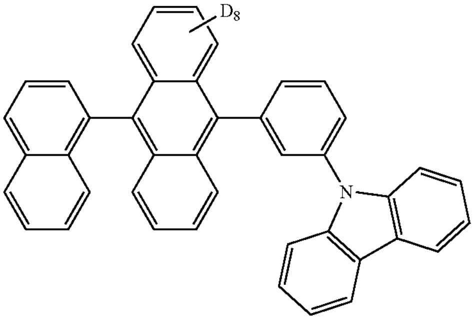
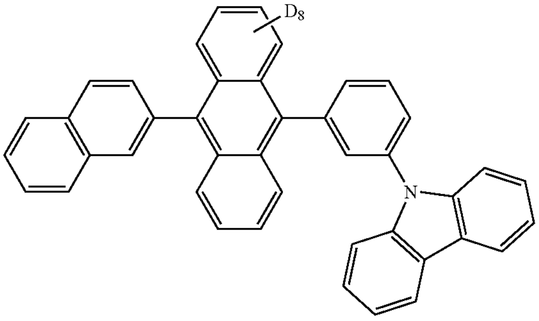

-continued
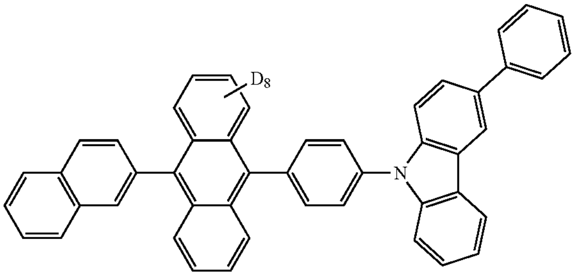
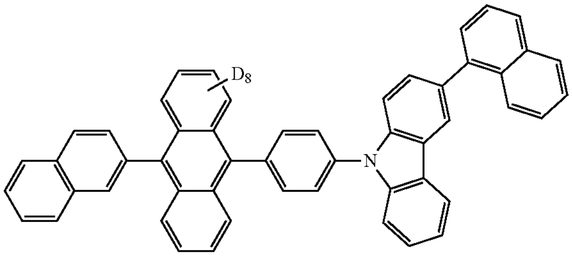
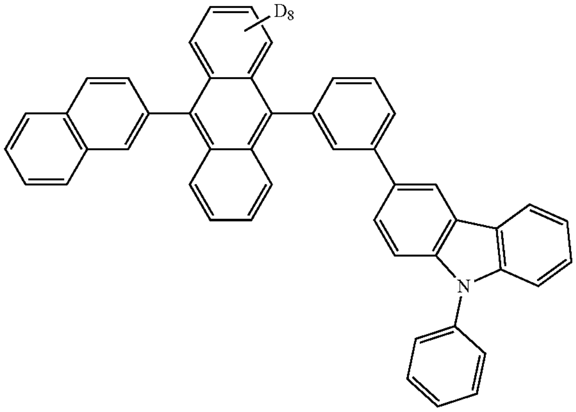
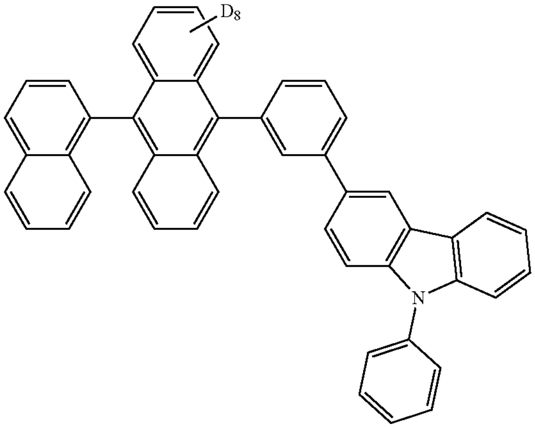
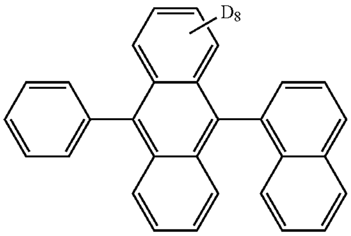
-continued
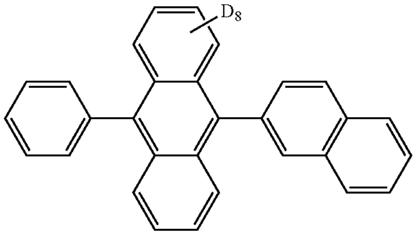
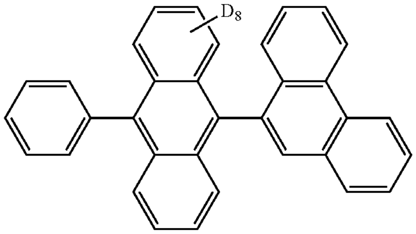
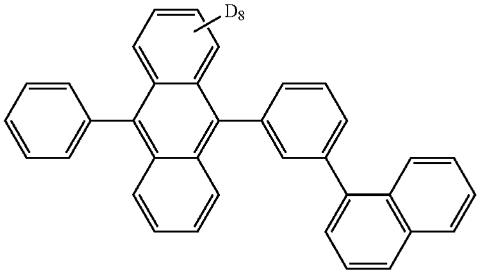
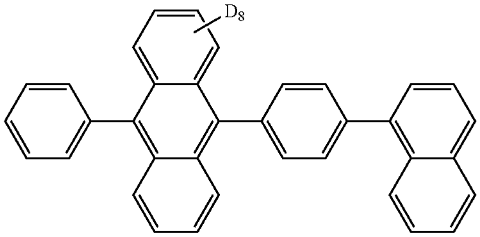
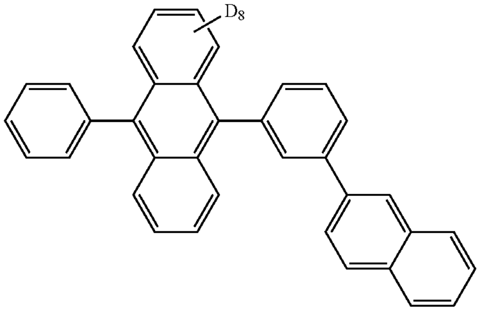
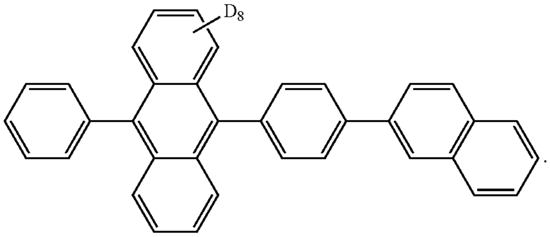.
28. The organic light emitting device of claim 15, wherein the pyrene derivative is a compound being one of the followings of Formula 4:

Formula 4
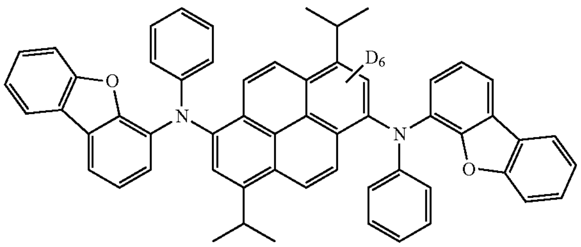
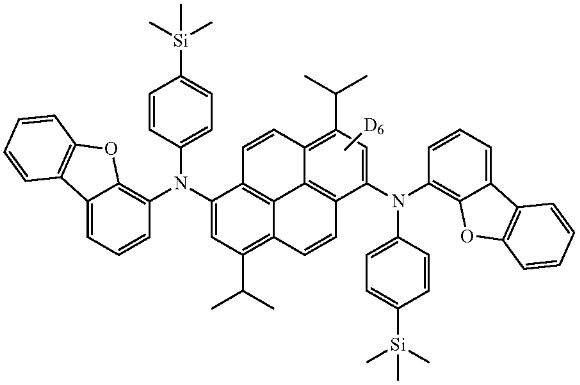
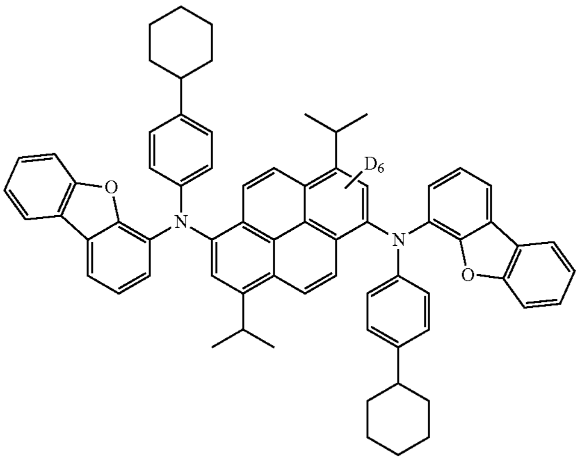
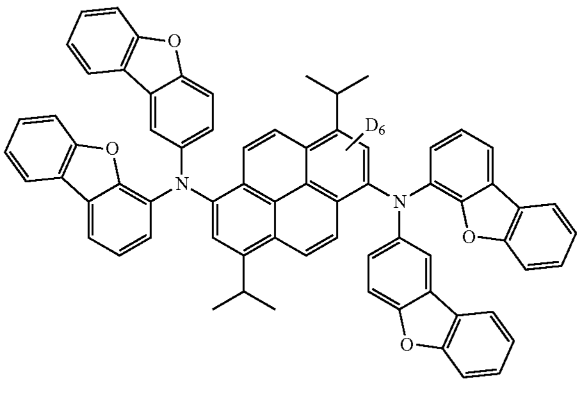
-continued
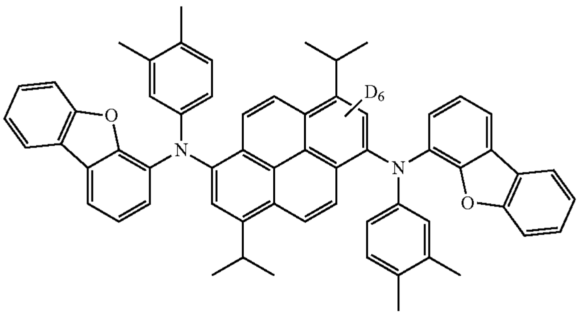
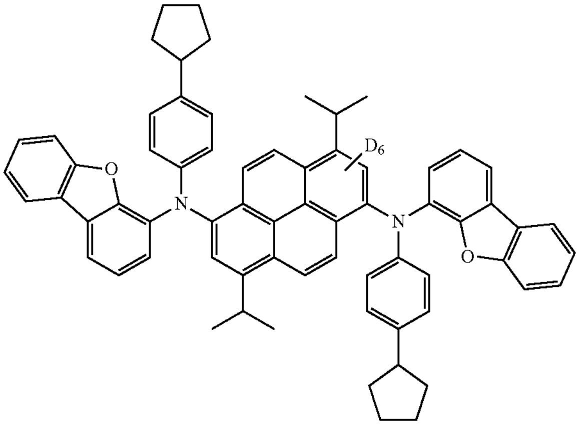
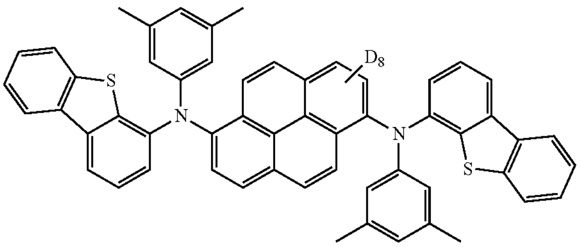
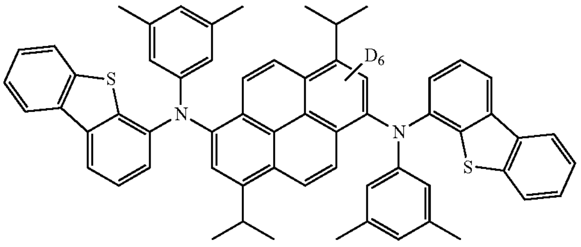
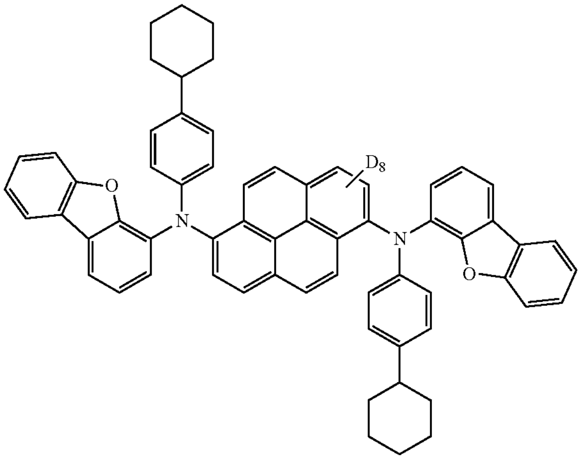

-continued
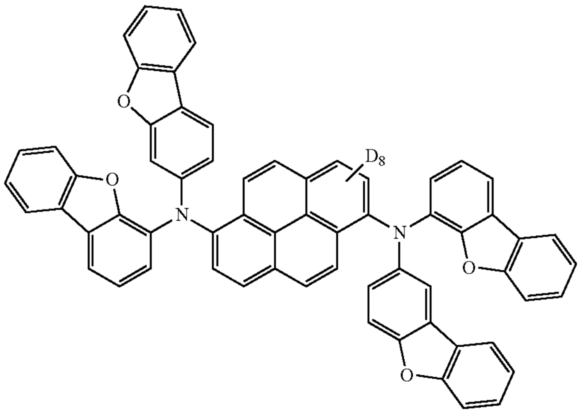
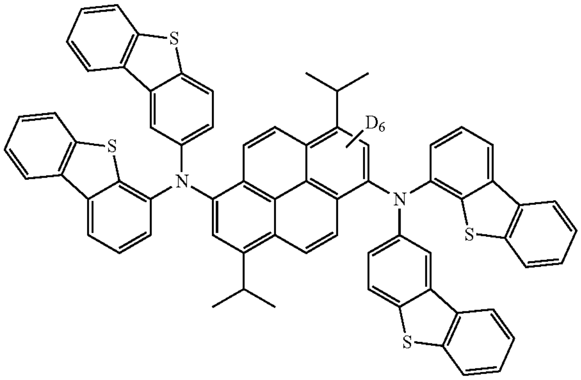
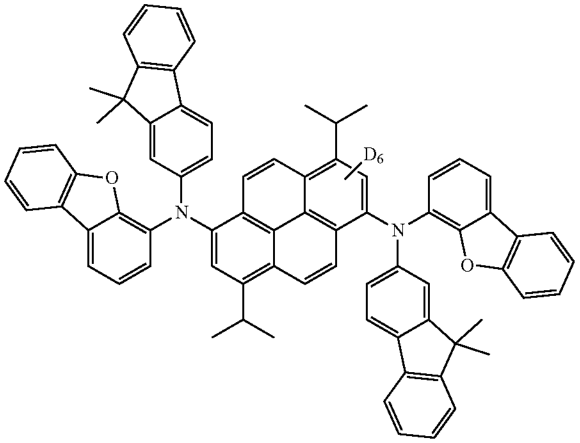
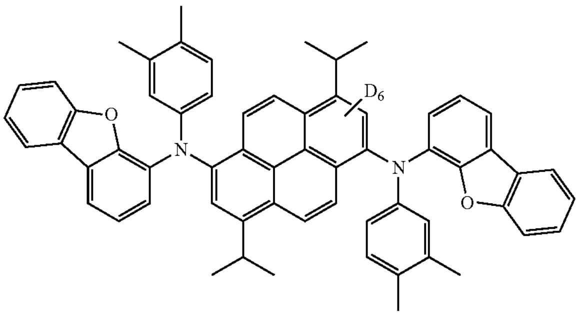
-continued
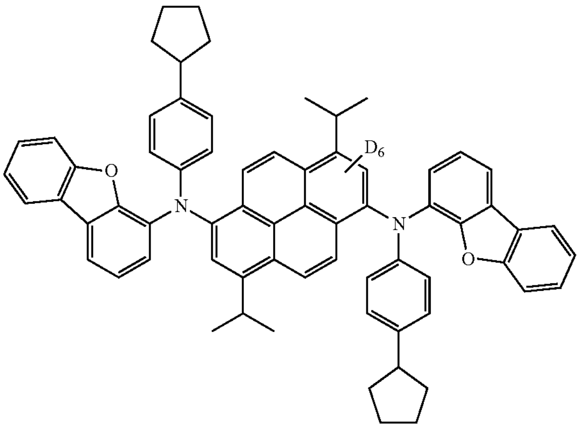
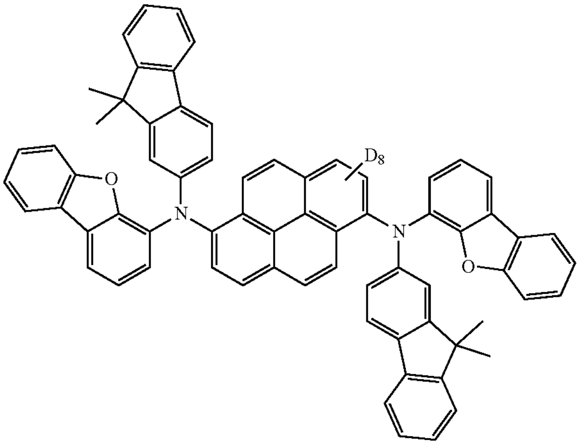
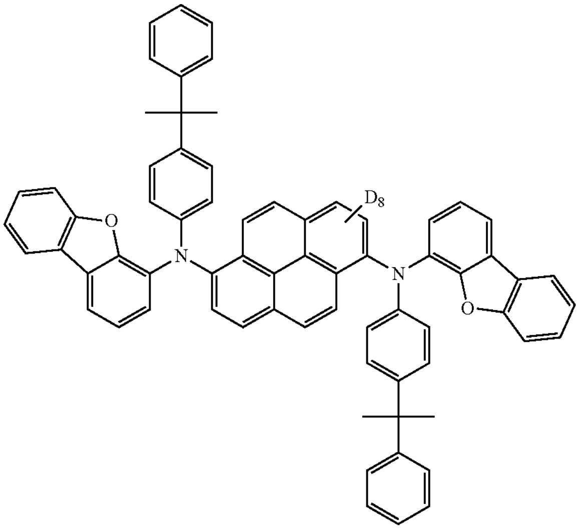

-continued
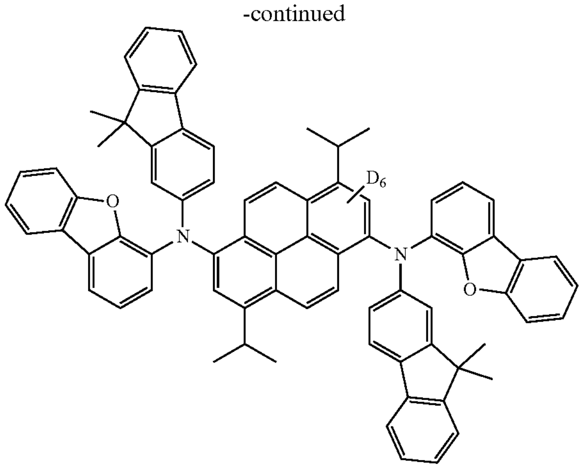
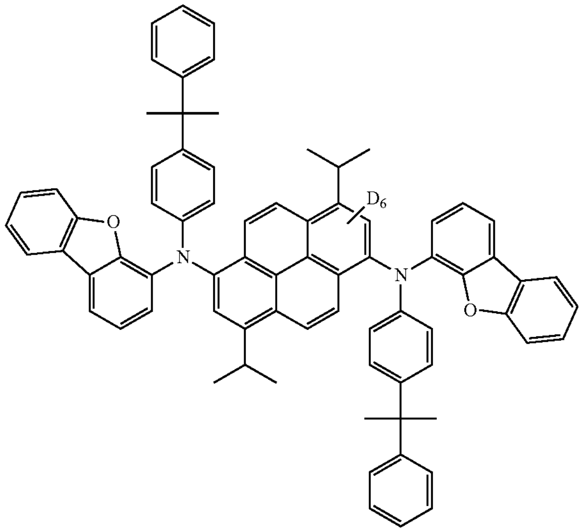
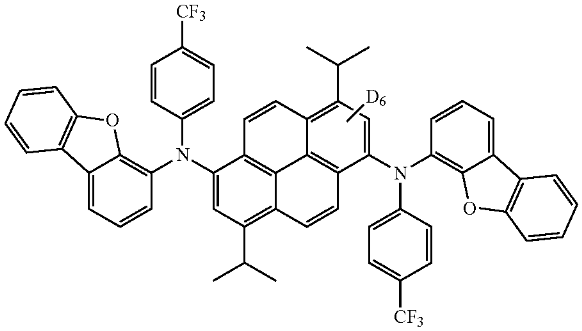
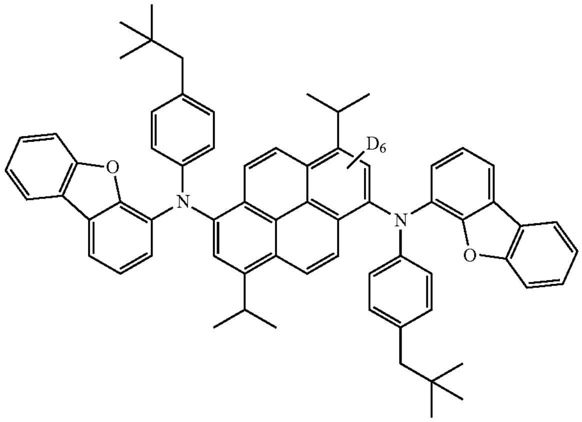
-continued
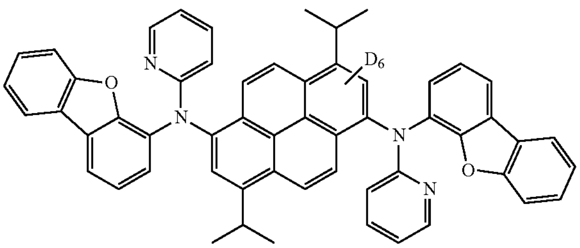
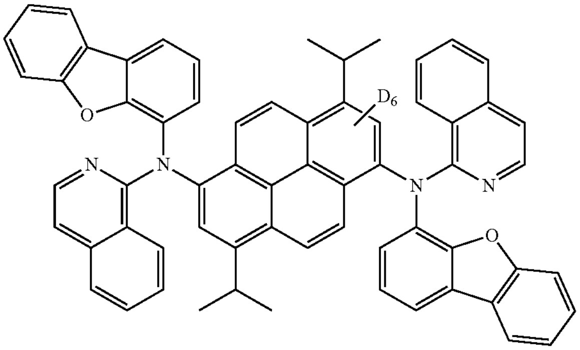
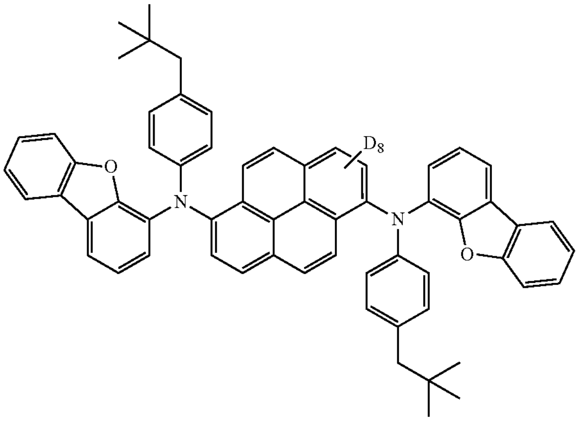
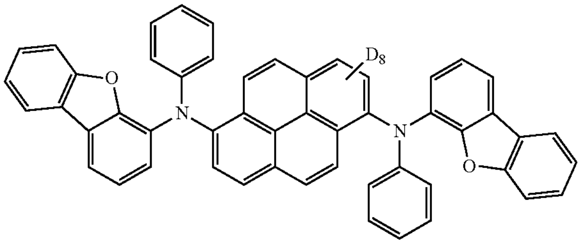
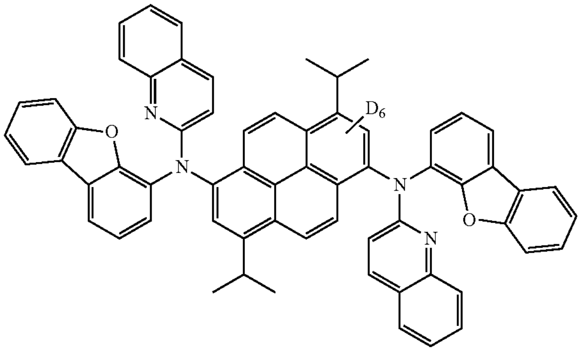

-continued
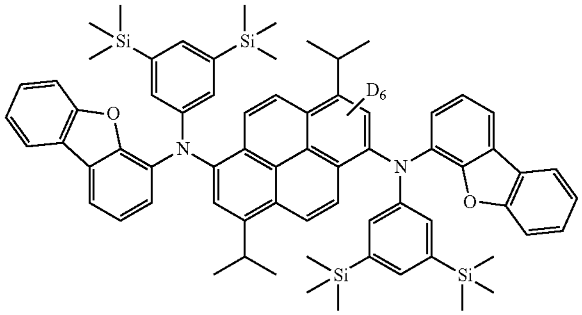
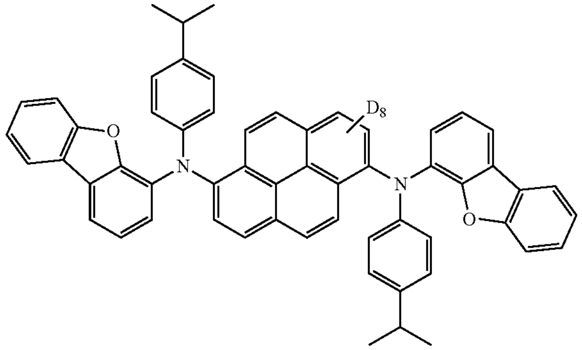
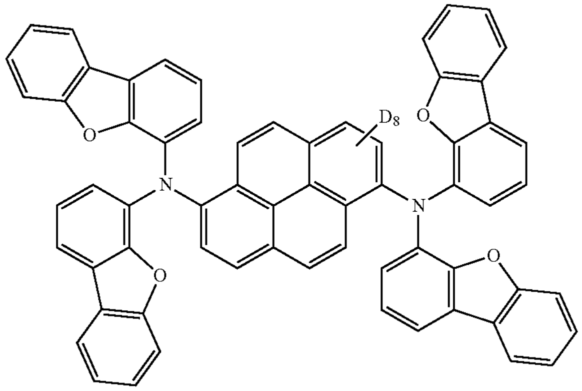
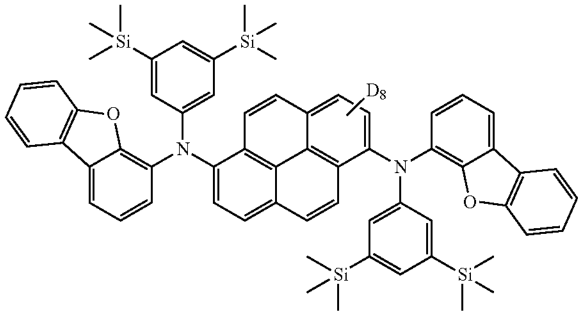
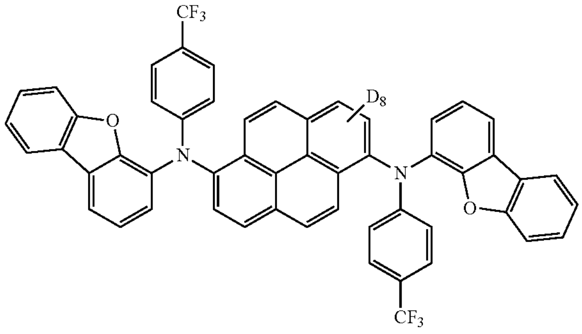
-continued
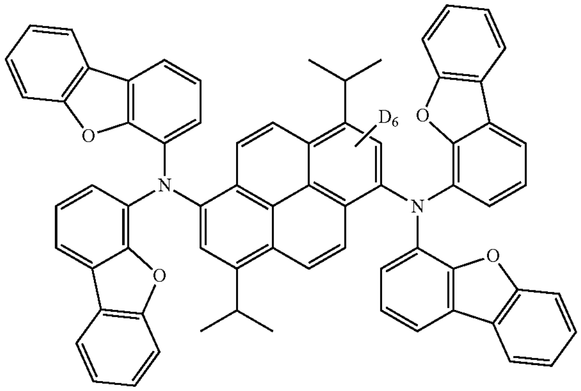
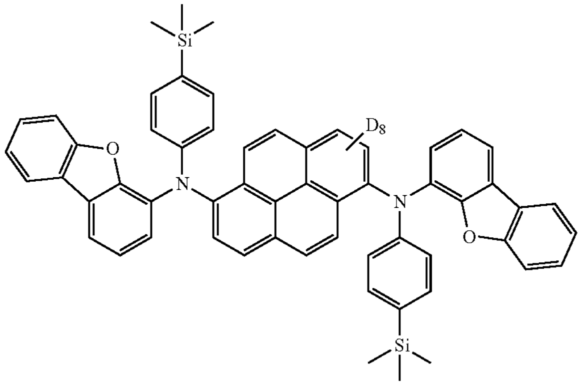
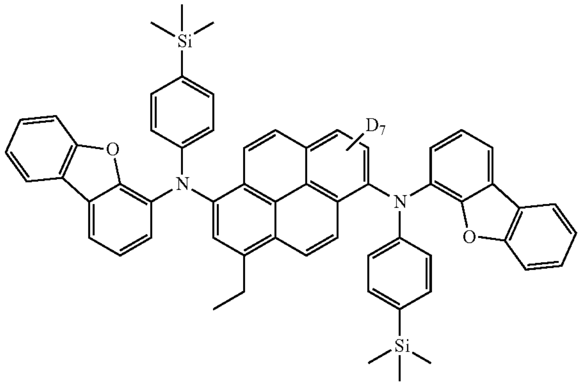
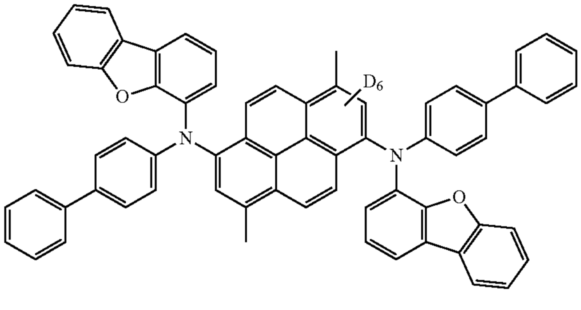

-continued
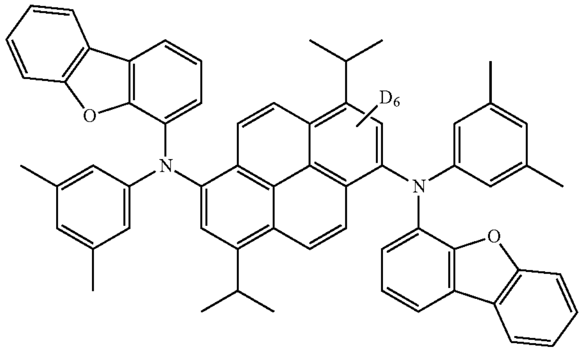
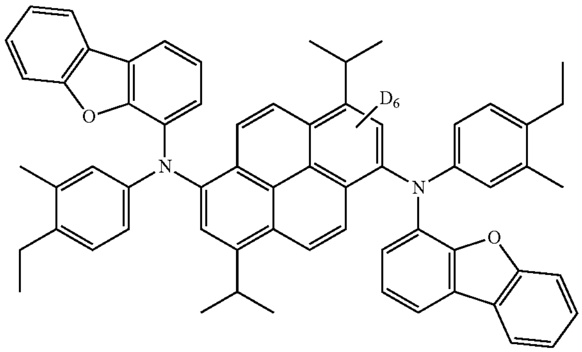
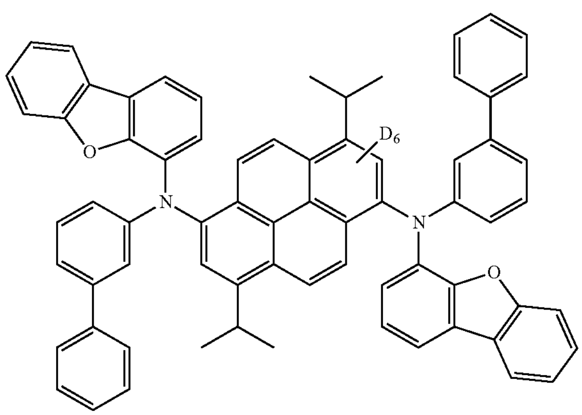
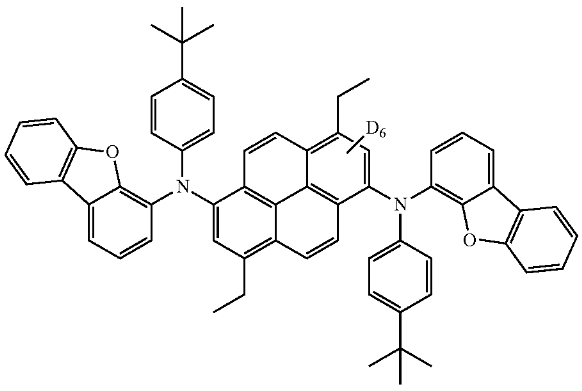
-continued
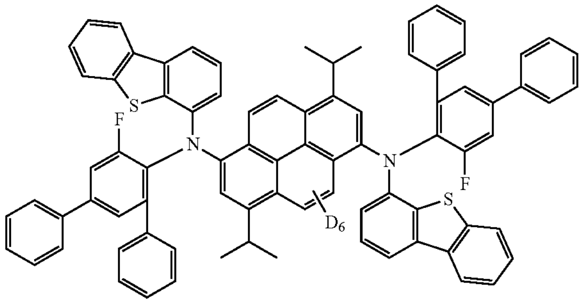
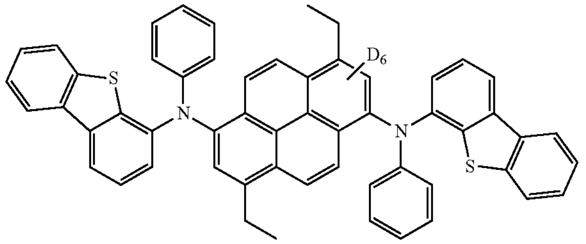
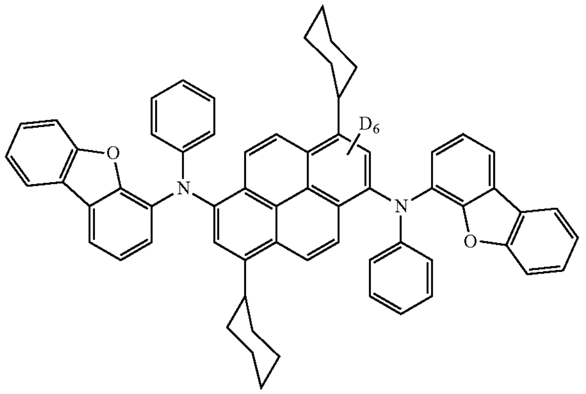
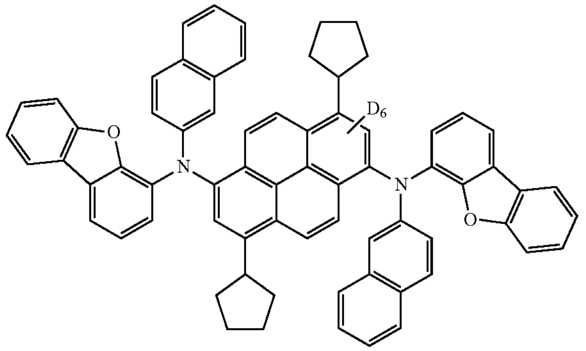
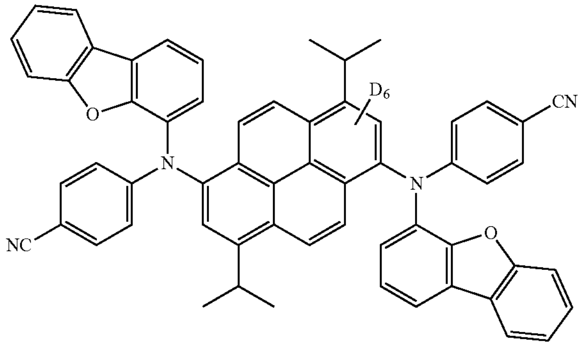

-continued
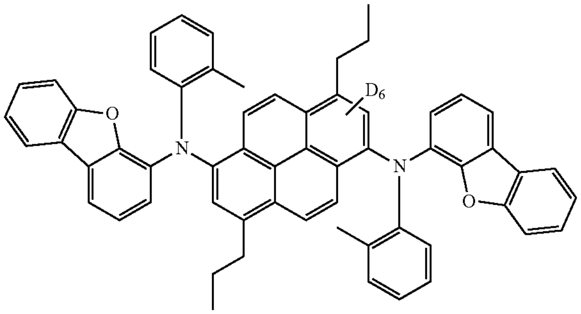
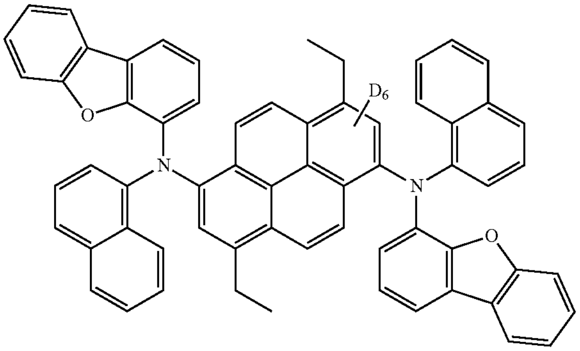
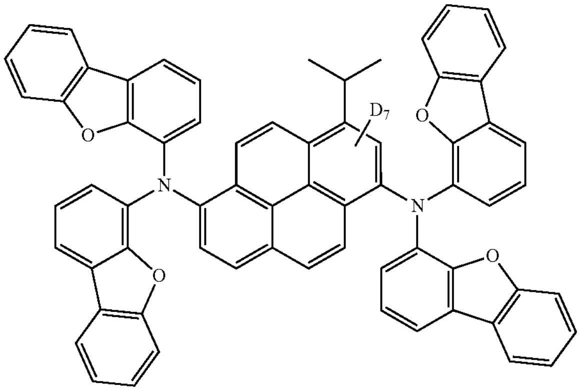
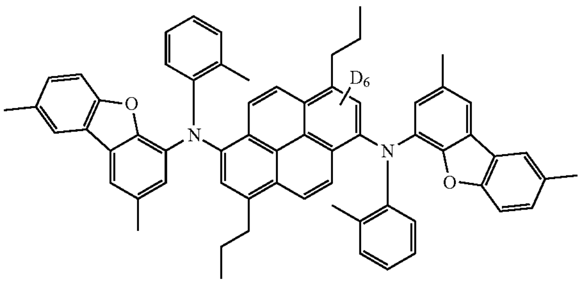
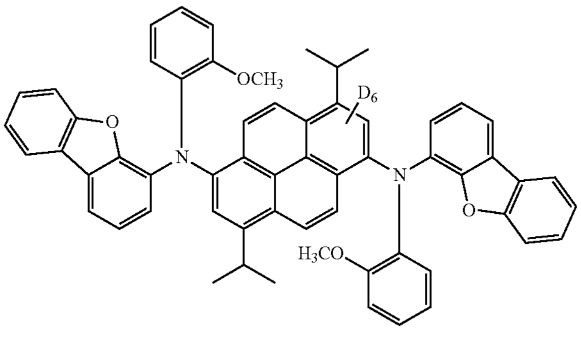
-continued
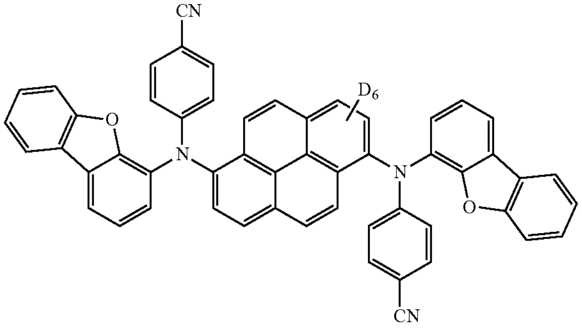
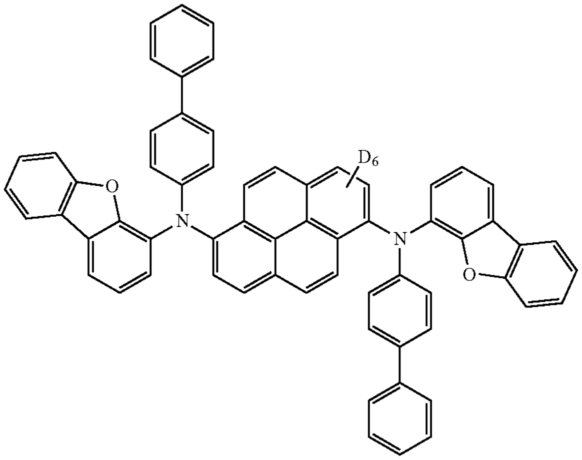
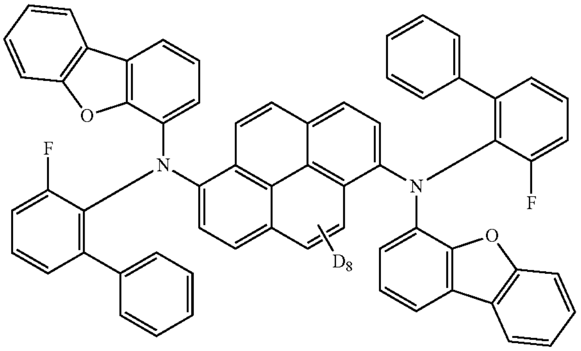
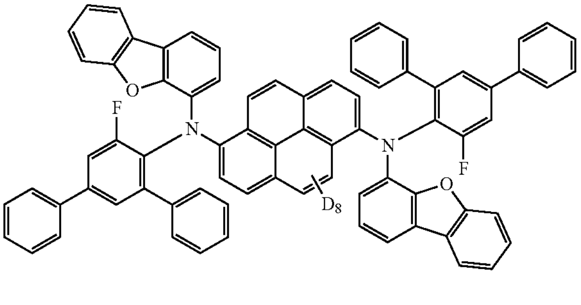

-continued
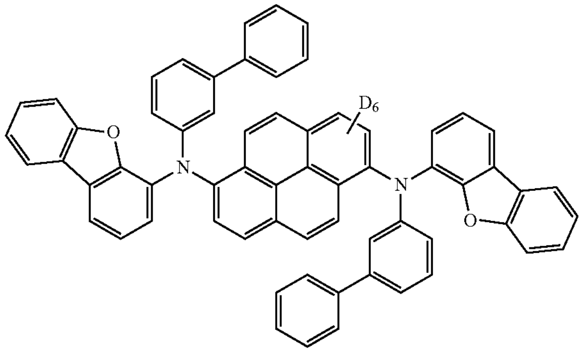
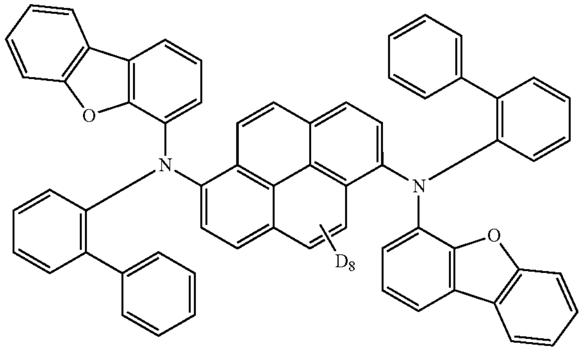
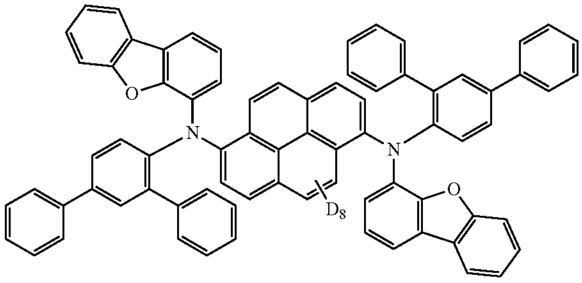
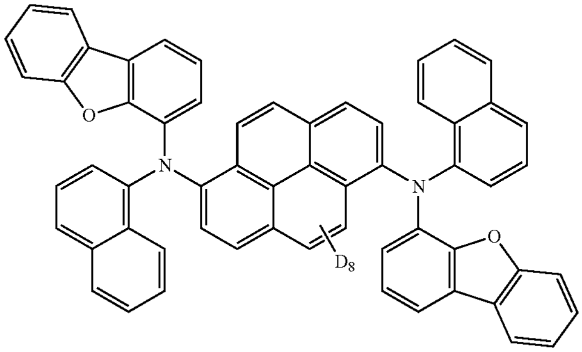
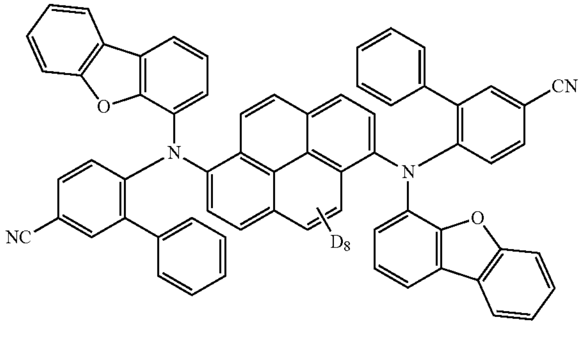
-continued
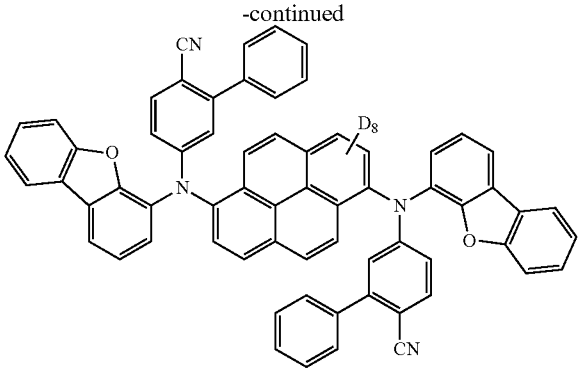
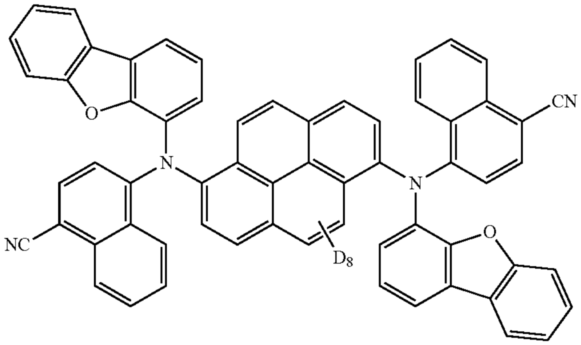
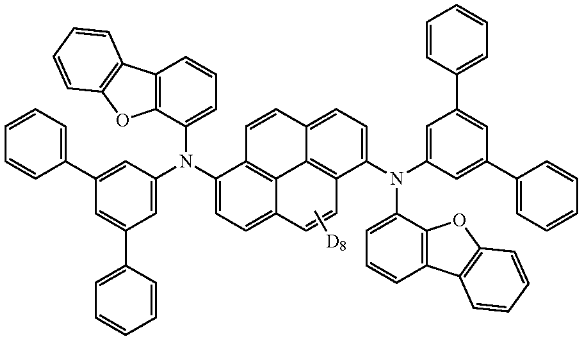
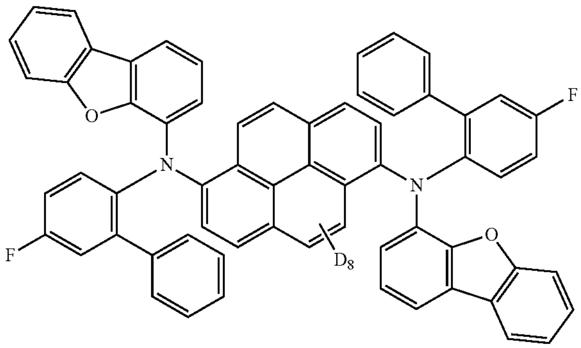
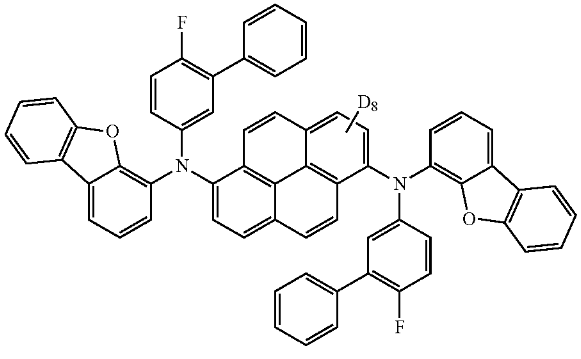

-continued
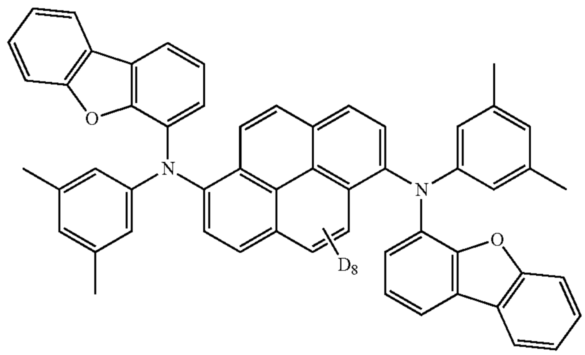
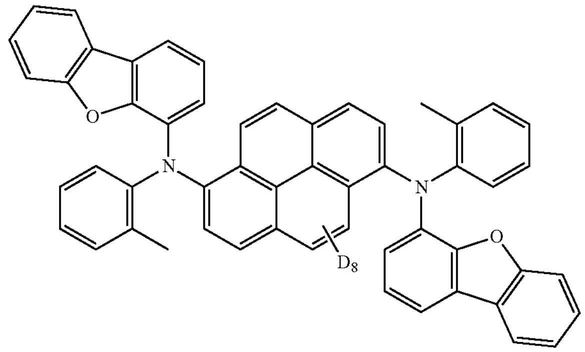
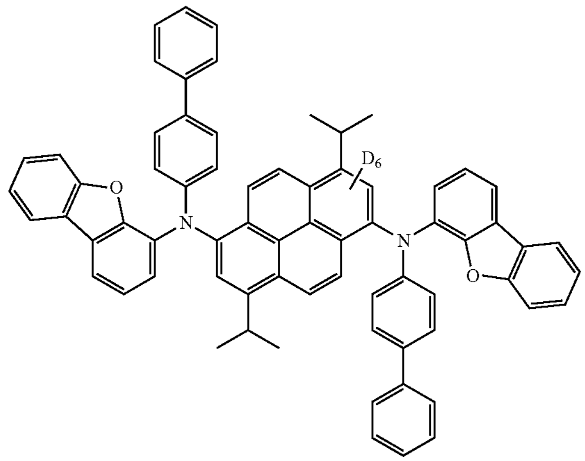
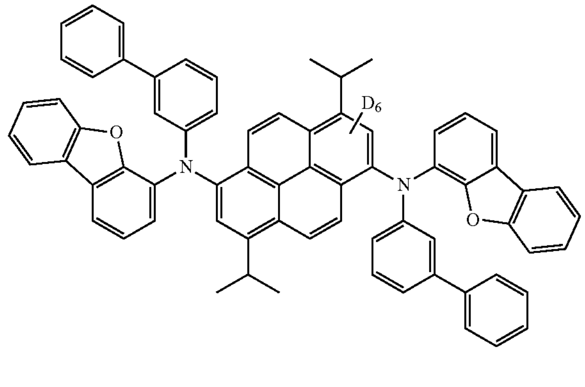
-continued
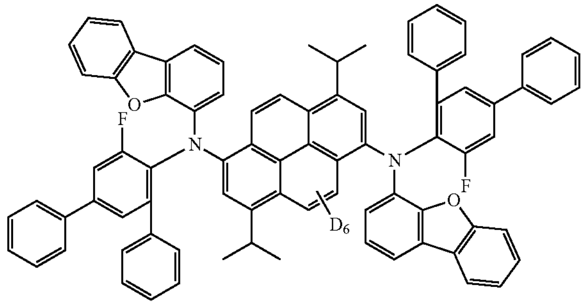
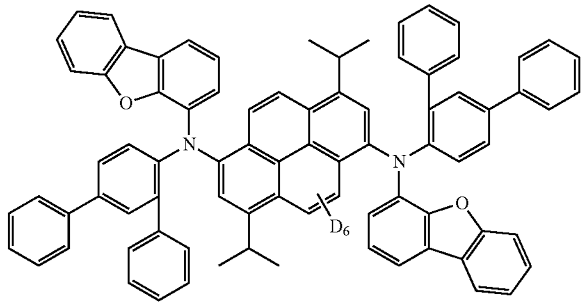
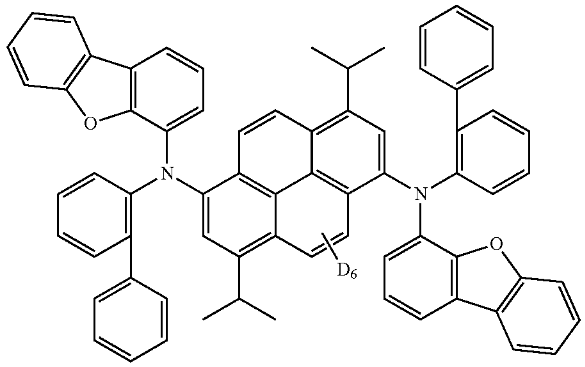
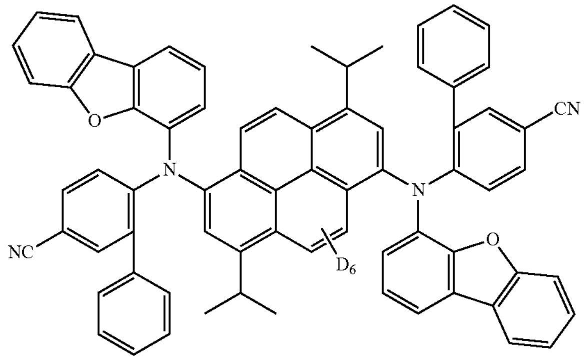
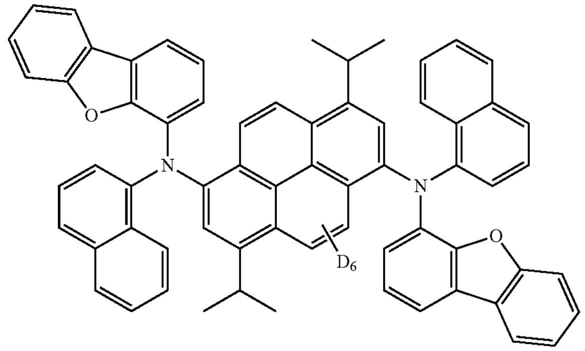

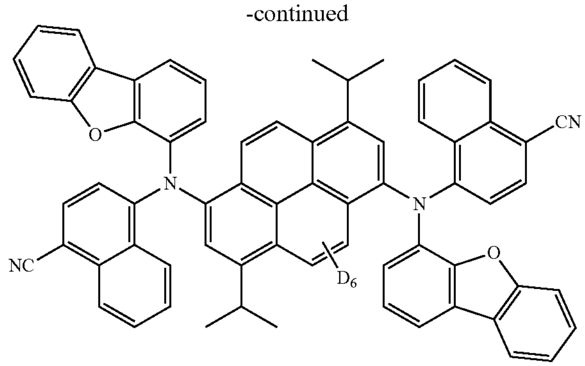
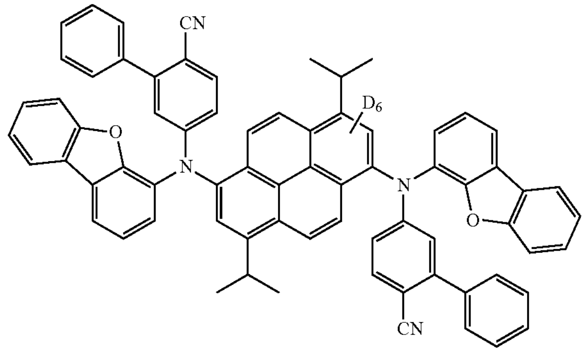
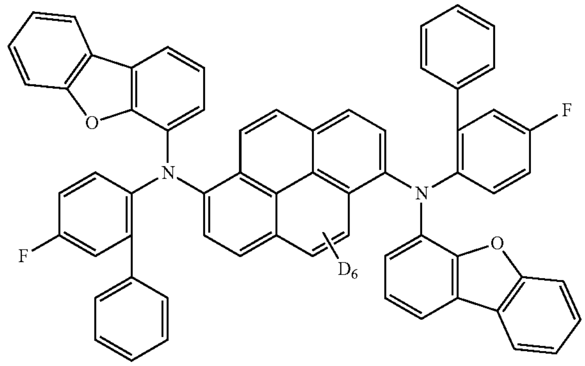
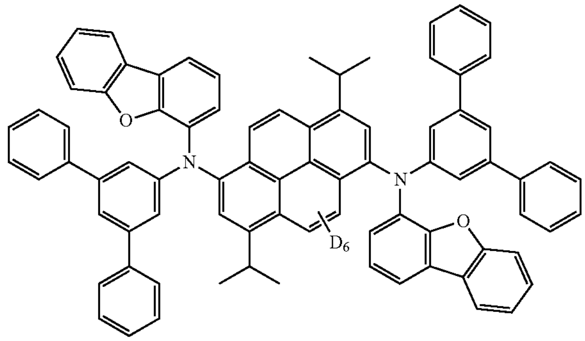
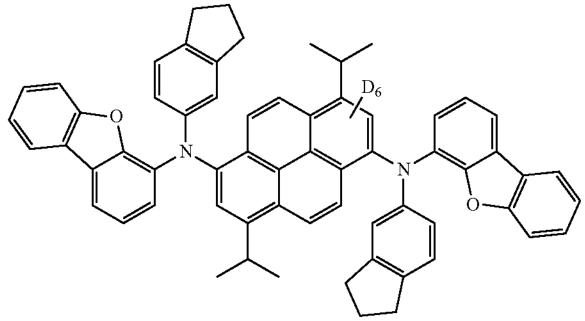
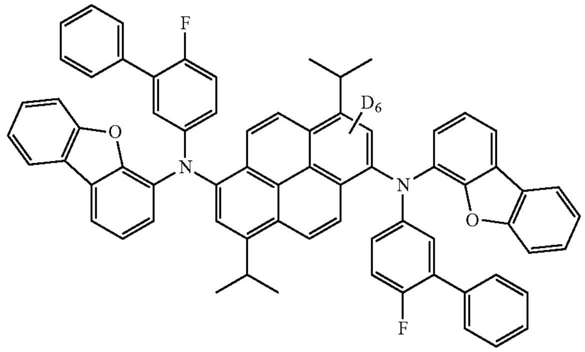
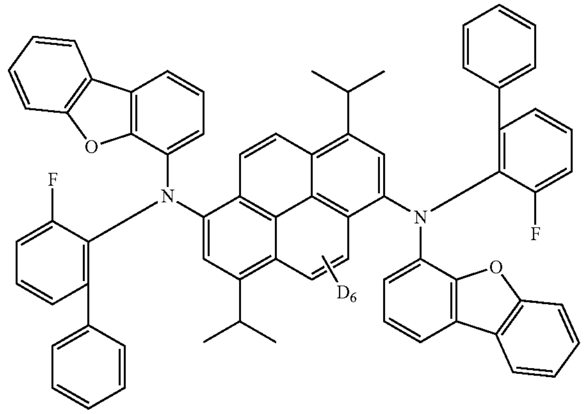
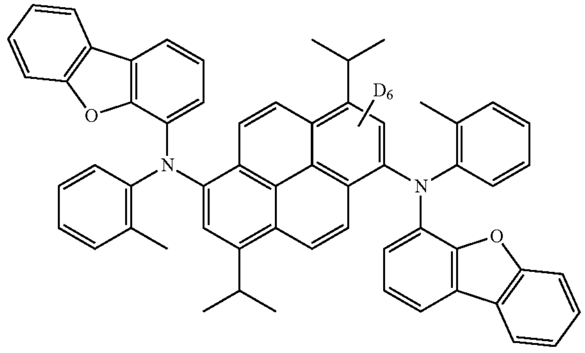
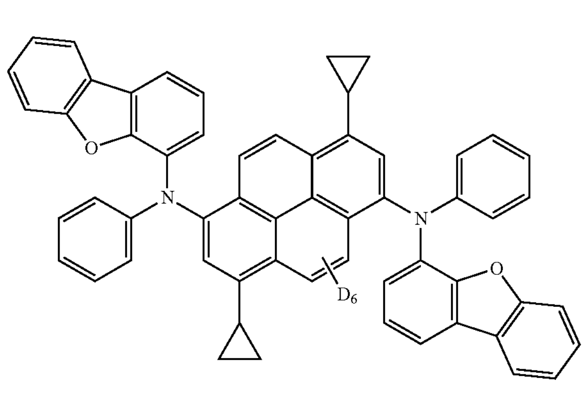

-continued
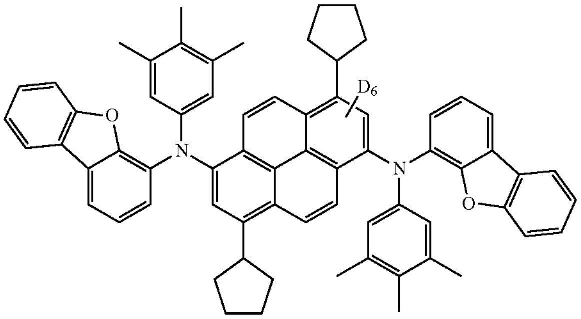
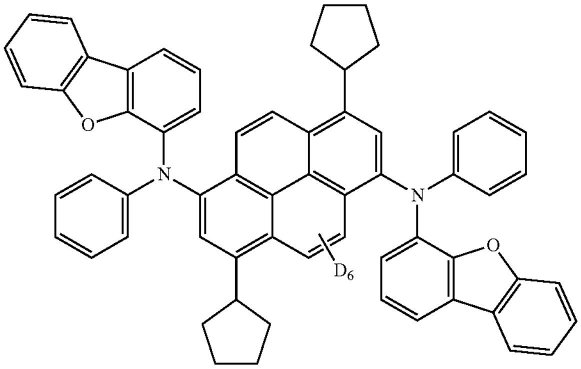
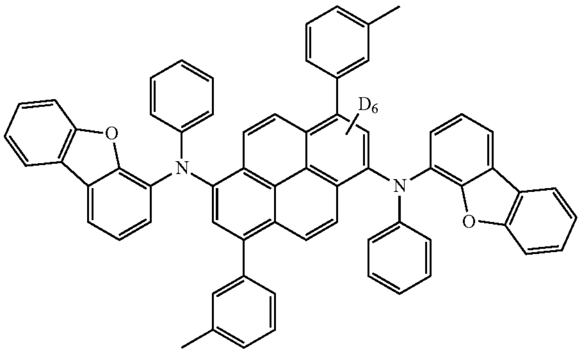
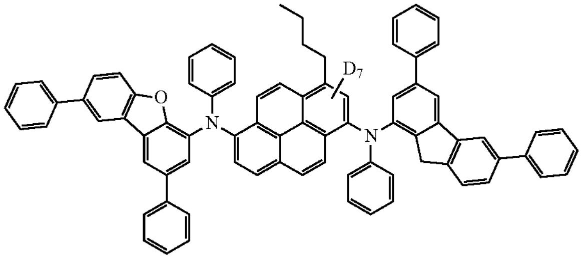
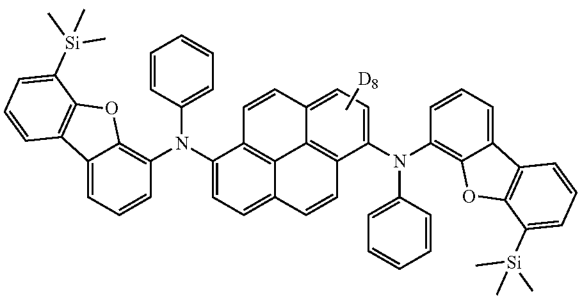
-continued
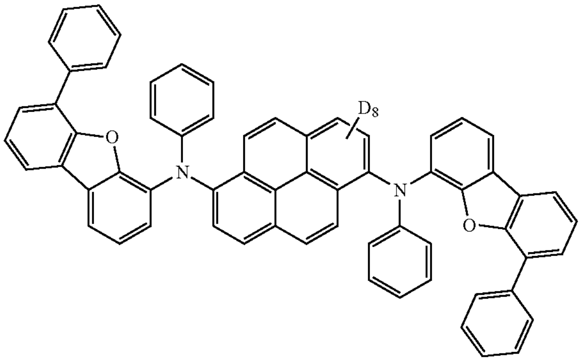
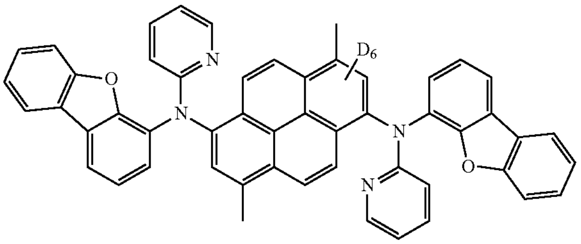
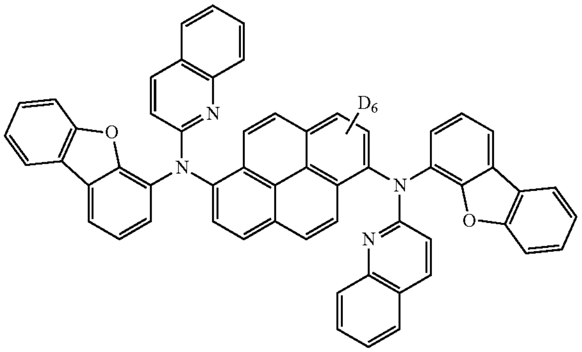
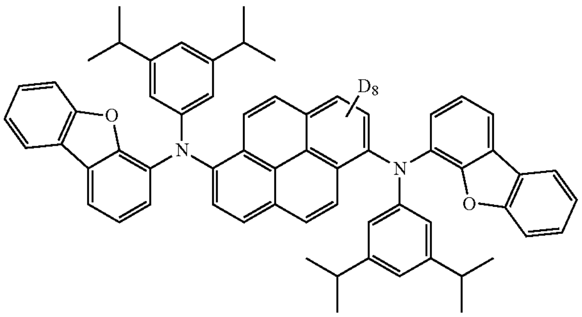

-continued
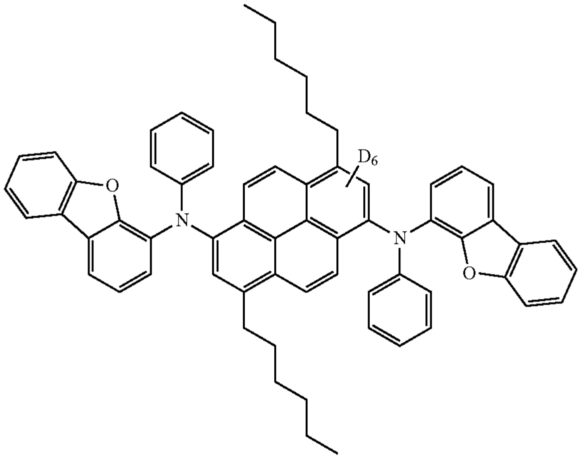
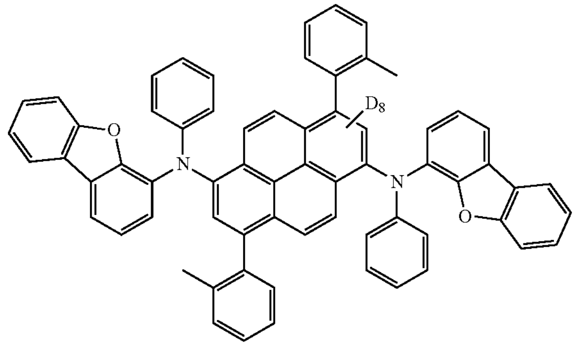
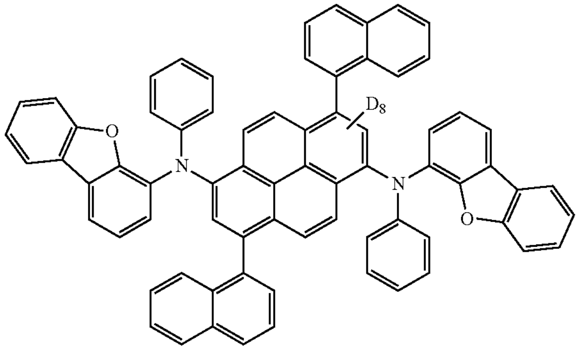
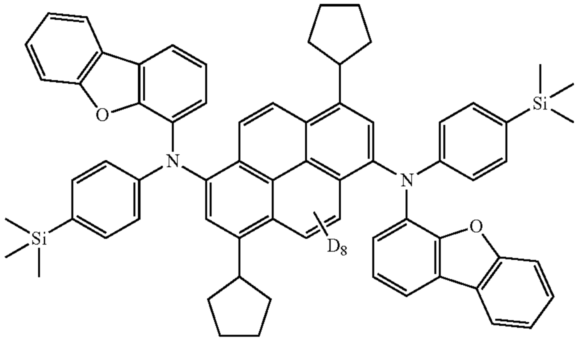
-continued
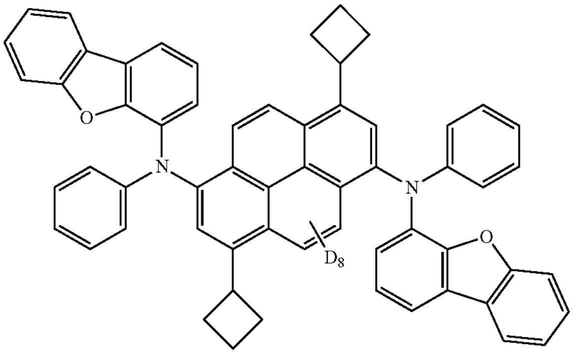
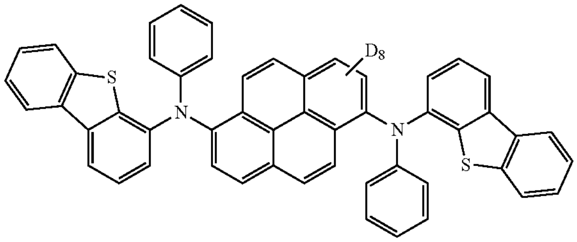
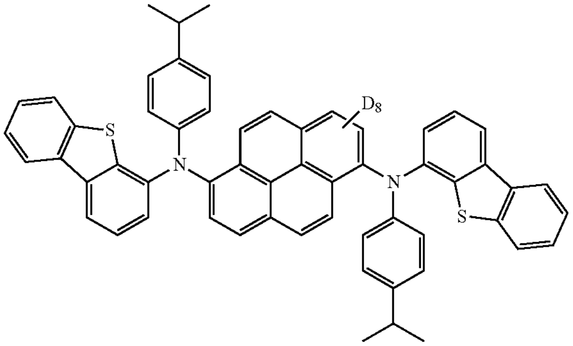
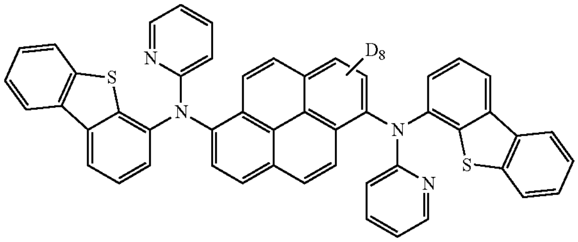
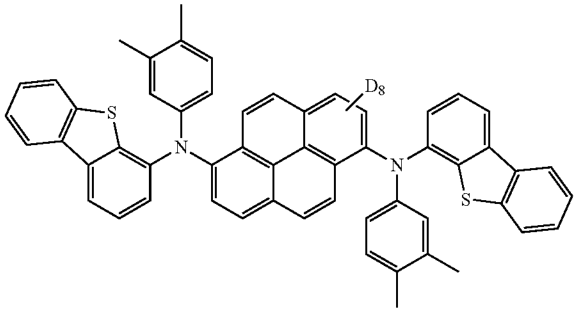

-continued
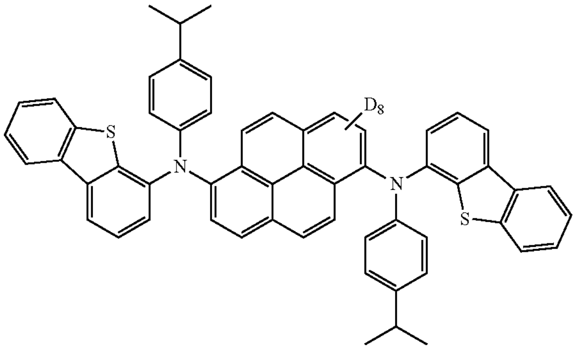
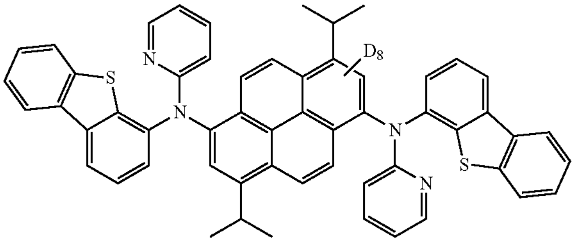
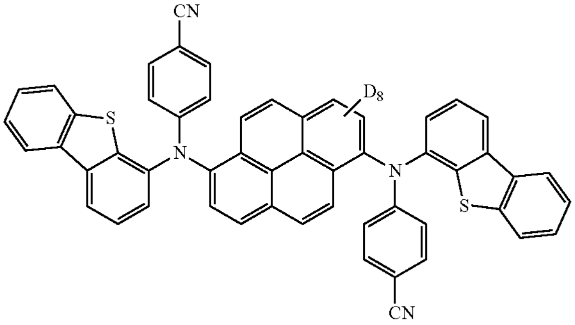
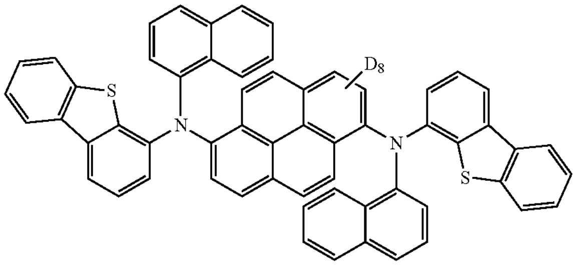
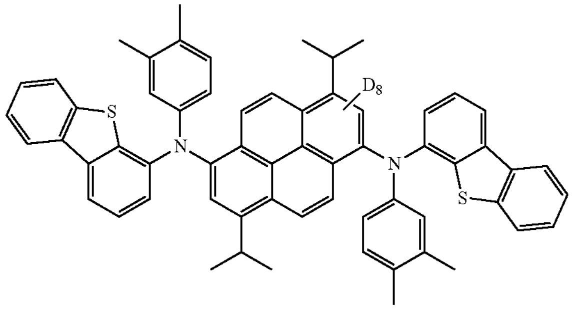
-continued
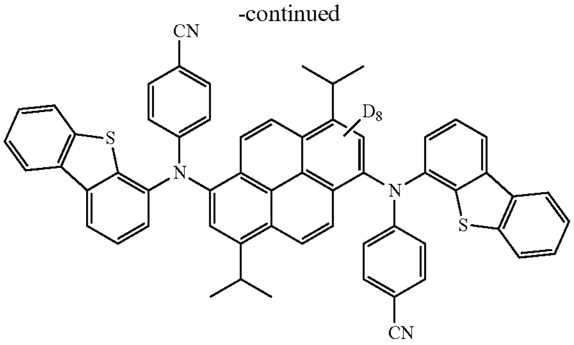
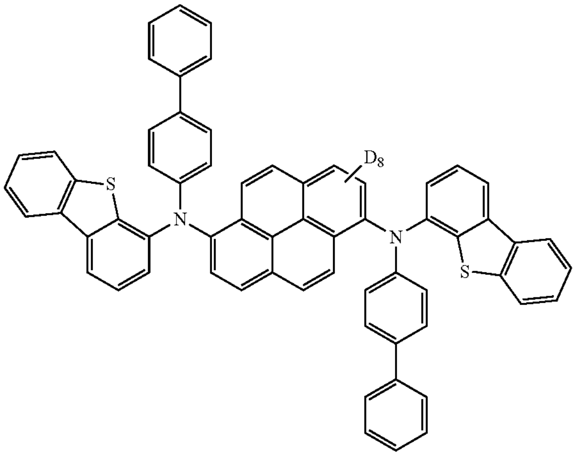
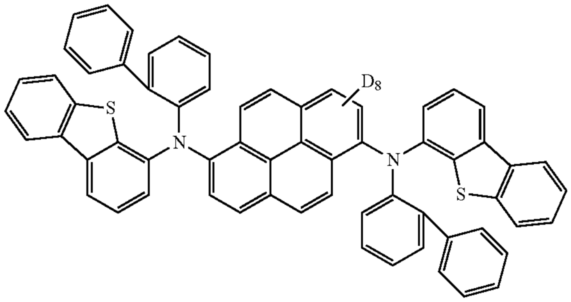
29. The organic light emitting device of claim 28, wherein the first hole blocking material is a compound being one of the followings of Formula 8:

Formula 8
E1
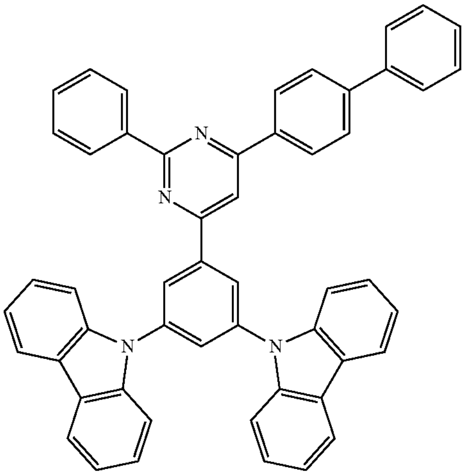
E2
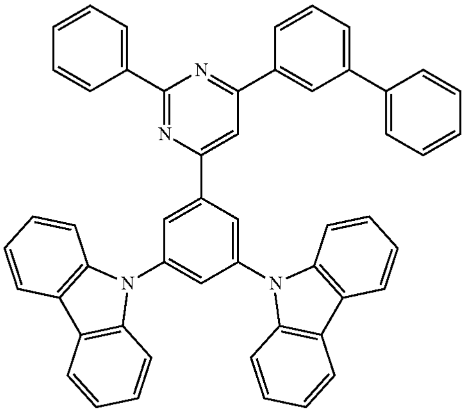
E3
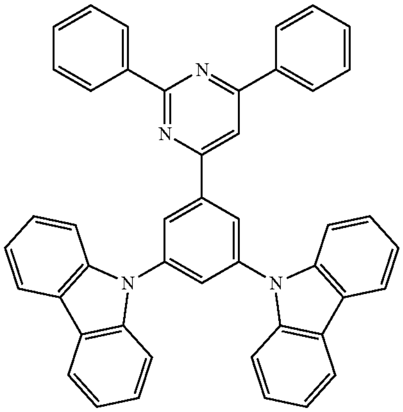
-continued
E4
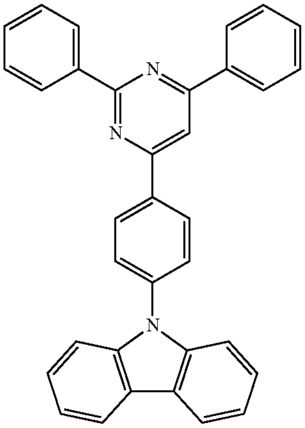
E5
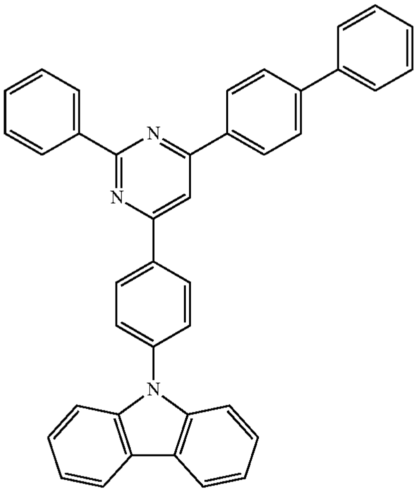
E6
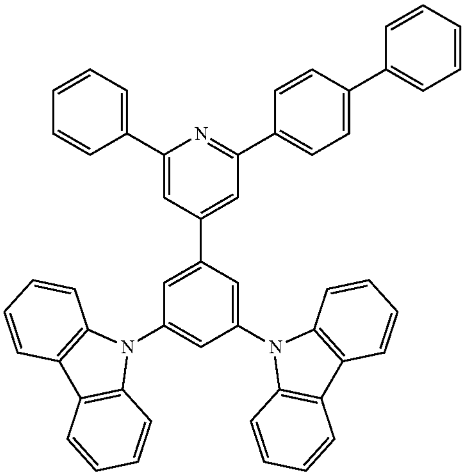

-continued
E7
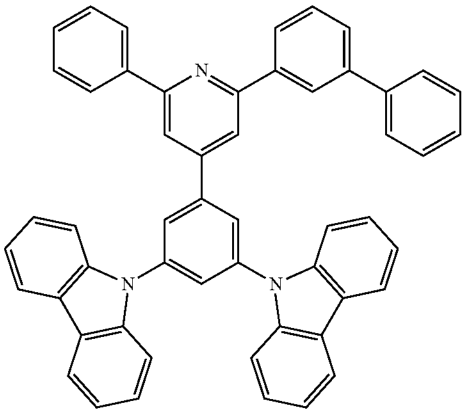
E8
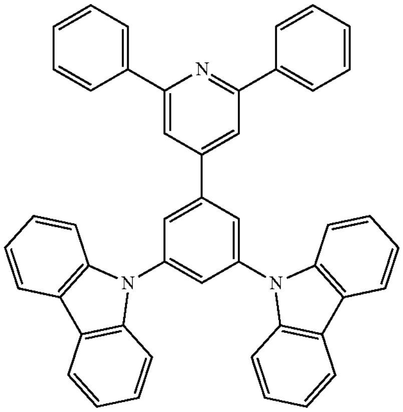
E9
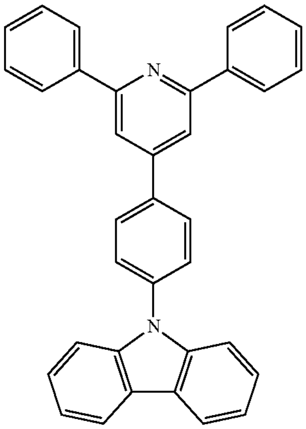
-continued
E10
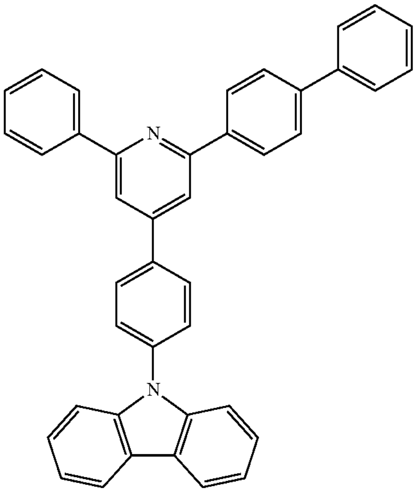
E11
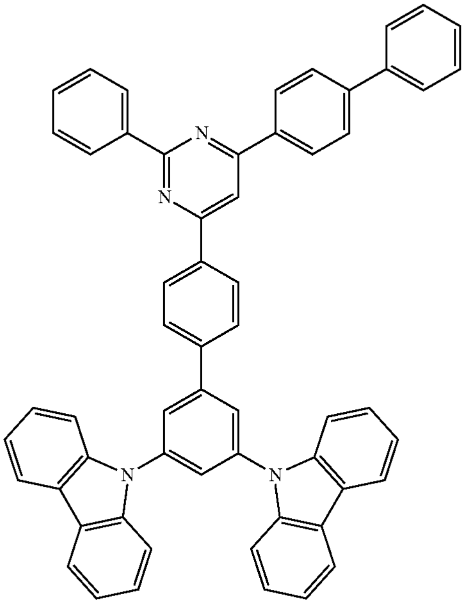
E12
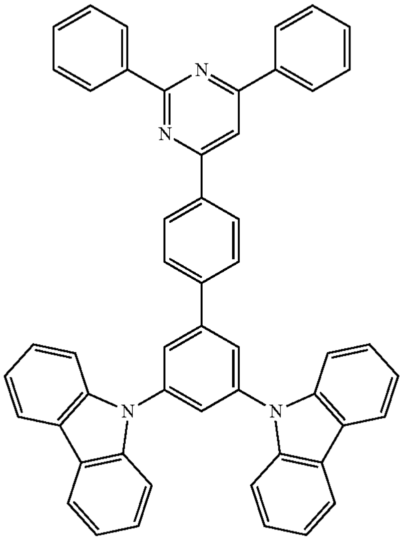

-continued
E13
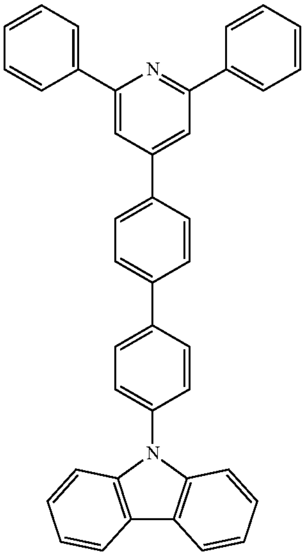
E14
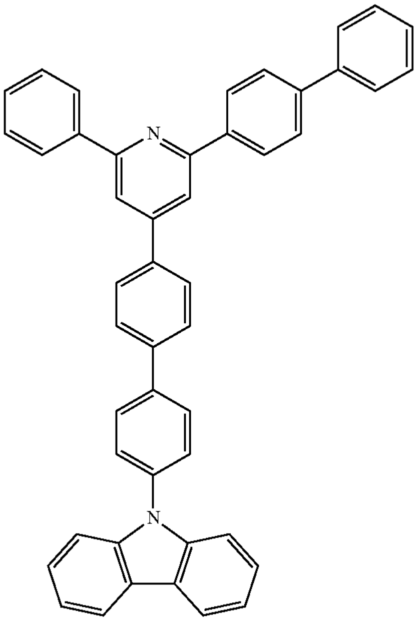
E15
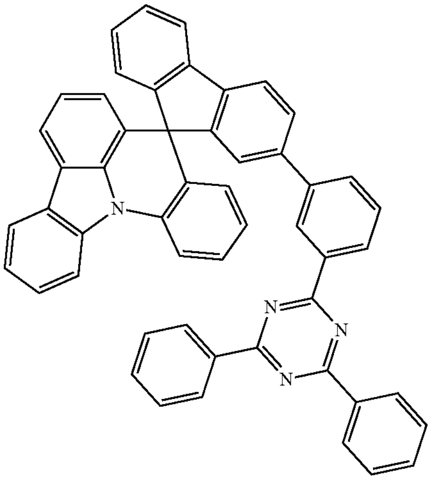
-continued
E16
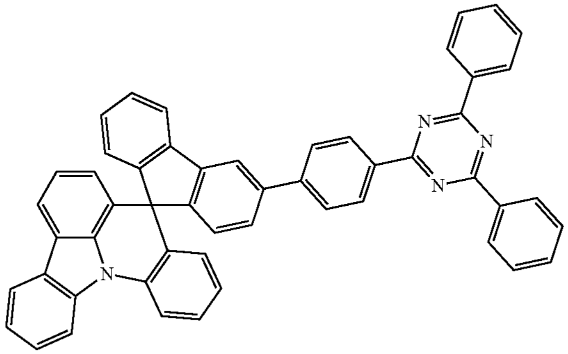
E17
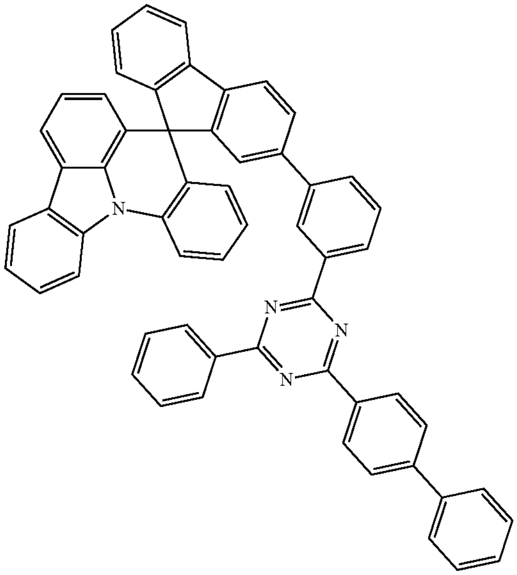
E18
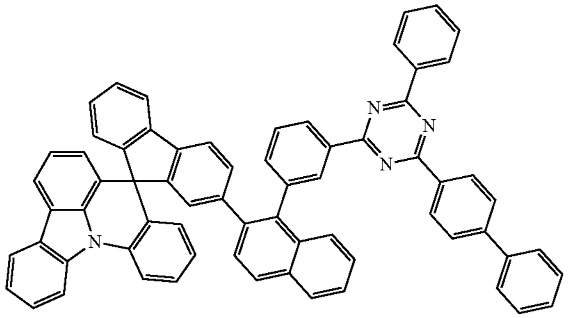
E19
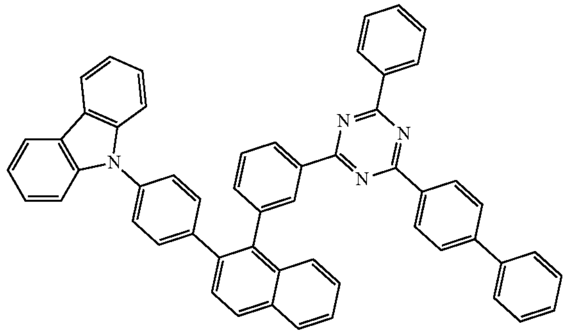

-continued
E20
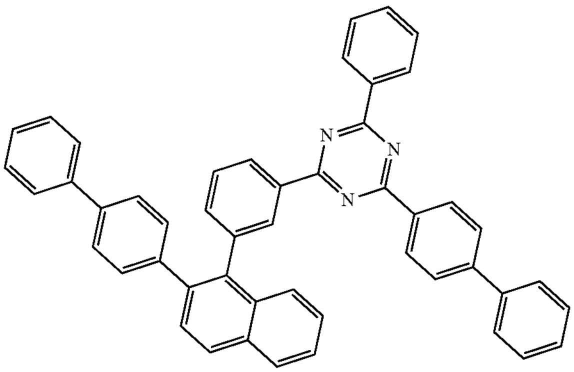
E21
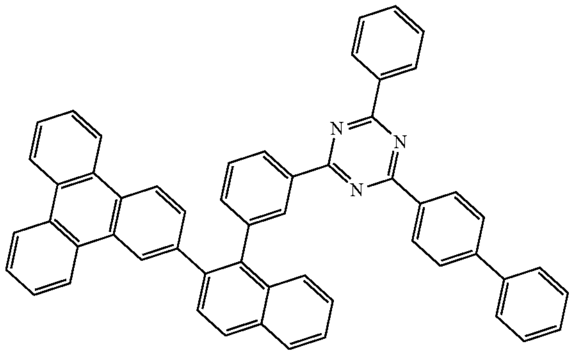
E22
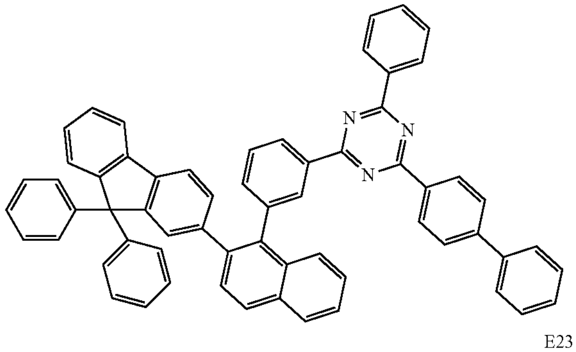
E23
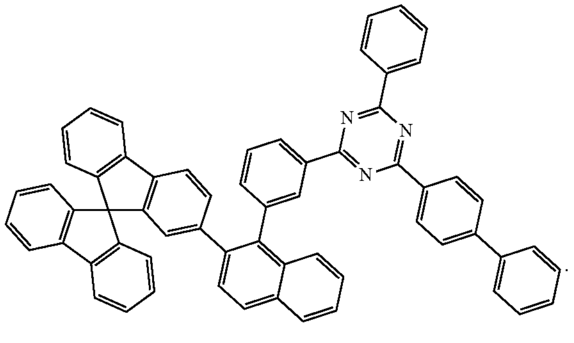
30. The organic light emitting device of claim 18, wherein the second hole blocking material is a compound being one of the followings of Formula 10:
Formula 10
F1
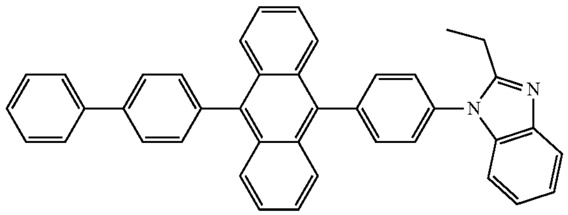
F2
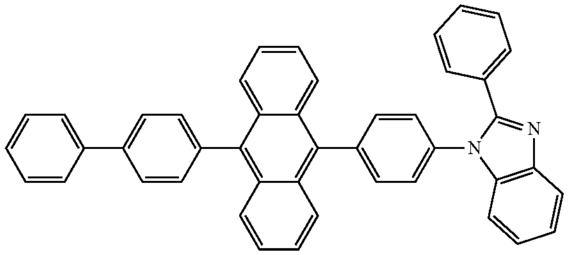
F3
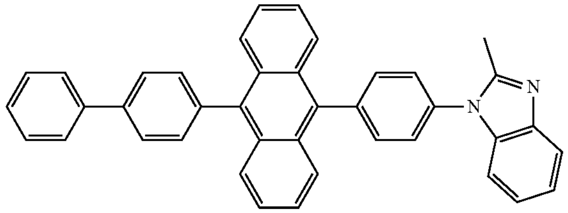
F4
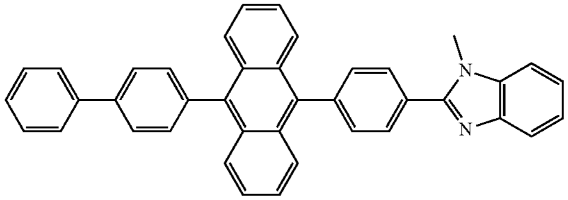
F5
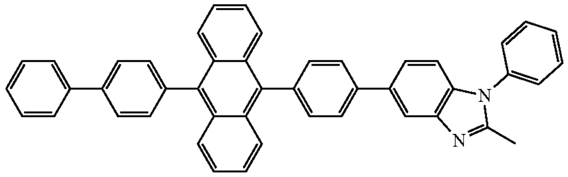
F6
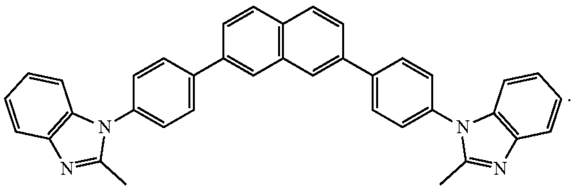
* * * * *